(12) United States Patent
Tamaki et al.

(10) Patent No.: US 6,750,648 B1
(45) Date of Patent: *Jun. 15, 2004

(54) MAGNETIC FIELD DETECTOR HAVING A DIELECTRIC LOOPED FACE

(75) Inventors: Naoya Tamaki, Tokyo (JP); Norio Masuda, Tokyo (JP)

(73) Assignee: NEC Corporation, Tokyo (JP)

( * ) Notice: Subject to any disclaimer, the term of this patent is extended or adjusted under 35 U.S.C. 154(b) by 33 days.

This patent is subject to a terminal disclaimer.

(21) Appl. No.: 09/709,636

(22) Filed: Nov. 13, 2000

Related U.S. Application Data

(63) Continuation-in-part of application No. 09/144,344, filed on Aug. 31, 1998, now abandoned.

(30) Foreign Application Priority Data

Aug. 29, 1997 (JP) .............................................. 9-235107

(51) Int. Cl.⁷ .............................................. G01R 33/02
(52) U.S. Cl. ...................................... 324/244; 324/258
(58) Field of Search ................................ 324/244, 256, 324/251, 258, 260, 234, 236, 237, 238, 239, 240; 343/700 MS

(56) References Cited

U.S. PATENT DOCUMENTS 5,821,902 A * 10/1998 Keen ........................... 343/803
6,320,376 B1 * 11/2001 Tamaki et al. ............... 324/258

FOREIGN PATENT DOCUMENTS

| JP | 62-184384 | 8/1987 |
| JP | 1-291182 | 11/1989 |
| JP | 5-37122 | 2/1993 |
| JP | 8-129058 | 5/1996 |
| JP | 8-248080 | 9/1996 |

OTHER PUBLICATIONS

John Dyson, "Measurement of Near Fields of Antennas and Scatters", IEEE Transactions on Antennas and Propagation, vol. AP–21, No. 4, Jul. 1973, pp. 446–460.
M. Yamaguchi et al., "A New Permeance Meter Based on Both Lumped Elements/Transmission Line Theories", IEEE Transactions on Magnets, vol. 32, No. 5, Sep. 1996, pp. 4941–4943.
D. Kacprzak, "The Analysis of Eddy–Current Distribution and Sensing Voltage of Micro ECT Probe for Inspection of PCB", pp. 59–64, MAG–98–115.

* cited by examiner

*Primary Examiner*—Walter E. Snow
(74) *Attorney, Agent, or Firm*—Young & Thompson

(57) ABSTRACT

The present invention provides a device for detecting a magnetic field comprising: a dielectric body; an electrically conductive pattern; and an electrically conductive ground region. The electrically conductive pattern so extends in the dielectric body as to form a dielectric looped face at least partially surrounded by the electrically conductive pattern, and the electrically conductive pattern having a first end electrically connected to an external electrically conductive line and a second end. The electrically conductive ground region is formed in the dielectric body. The electrically conductive ground region is electrically connected to the second end of the electrically conductive pattern and is electrically isolated from other parts of the electrically conductive pattern than the second end, so that the electrically conductive ground region serves as a ground to the electrically conductive pattern.

166 Claims, 78 Drawing Sheets

D: constant

US 6,750,648 B1

MAGNETIC FIELD DETECTOR HAVING A DIELECTRIC LOOPED FACE

CROSS-REFERENCE TO RELATED APPLICATIONS

This application is a continuation-in-part of application Ser. No. 09/144,344, filed Aug. 31, 1998 now abandoned.

BACKGROUND OF THE INVENTION

The present invention relates to a magnetic field sensor, and more particularly to a magnetic field sensor suitable for sensing a magnetic field generated by an objective one of interconnections formed at a high density without receiving any substantive influence of a magnetic field generated by an adjacent interconnection positioned very close to the objective interconnection.

Various types of the magnetic field detectors have been proposed to measure the magnetic field generated by the interconnection on the printed circuit boards. A semi-rigid coaxial line shielded loop magnetic field detector is disclosed in "IEEE Transactions on Antenna and Propagation" vol. AP-21, No. 4, pp. 446–461, July 1973. This semi-rigid coaxial line shielded loop magnetic field detector is illustrated in FIG. 1. This semi-rigid coaxial line shielded loop magnetic field detector comprises a coaxial line in the form of a circular-shaped loop. The right half of the semi-rigid coaxial line shielded loop magnetic field detector comprises a coaxial line 51 which is half-circular shaped, wherein an end of the coaxial line 51 is positioned at the bottom of the circular-shaped loop, where a center conductive line 53 is striped thereby to form a gap 14 at the bottom of the circular-shaped loop. The left half of the semi-rigid coaxial line shielded loop magnetic field detector comprises a conductive line 52 which provides an electrical connection between the center conductive line 53 to an external line.

In measurement of the magnetic field generated by the objective interconnection 54, the semi-rigid coaxial line shielded loop magnetic field detector is positioned just over the objective interconnection 54 so that the circular-shaped dielectric looped face is in parallel to the objective interconnection 54, whereby magnetic flux generated by the objective interconnection 54 penetrates the circular-shaped dielectric looped face. As a result, a voltage output signal can be obtained from the semi-rigid coaxial line shielded loop magnetic field detector.

Another type of the magnetic field detector is disclosed in "IEEE Transactions on Magnetics" vol. 32, No. 5, pp. 4941–4943, September 1996.

The first conventional detector is unsuitable for selectively detecting a magnetic field generated by an objective interconnection 54 only without receiving any substantive influence of a magnetic field generated by an adjacent interconnection 55 positioned very close to the objective interconnection 54 as illustrated in FIG. 2. The dielectric looped face of the detector receives the superimposed magnetic fields of the objective and adjacent interconnections 54 and 55.

In order to solve the above problem, it is required to approach the loop center of the detector as close to the objective interconnection 54 as possible. A pitch of the adjacent two of the interconnections on the printed circuit board is very narrow, for example, 0.1 millimeter order. Notwithstanding, the first conventional semi-rigid coaxial line shielded loop magnetic field detector is hared to be scaled down due to difficulty in keeping a mechanical strength of the loop and not so small diameter of coaxial line of about 1 millimeter. The first conventional semi-rigid coaxial line shielded loop magnetic field detector is handmade. This further makes it difficult to scale down of the detector.

In the meantime, the second conventional sensor comprises a planer circuit which is relatively suitable for scaling down the detector. Notwithstanding, the second conventional sensor is hard to be connected directly to a measuring apparatus without using a jig. The use of the jig for connecting the external coaxial line to the sensor makes it inconvenient to position the loop center as close to the objective interconnection as required to selectively detect the magnetic field of the objective interconnection only without receiving any influence due to the disturbing magnetic field generated by the adjacent interconnection.

In the above circumstances, it had been required to develop a novel magnetic field detector free from the above problems.

SUMMARY OF THE INVENTION

Accordingly, it is an object of the present invention to provide a novel device for detecting a magnetic field free from the above problems.

It is a further object of the present invention to provide a novel device for detecting a magnetic field, which is largely scaled down to enable a dielectric looped face to be positioned adjacent to an objective source of generating a magnetic field to be detected.

It is a still further object of the present invention to provide a novel device for detecting only a magnetic field generated by an objective magnetic field generating source.

It is yet a further object of the present invention to provide a novel device for detecting a magnetic field which is highly sensitive.

It is a further more object of the present invention to provide a novel device for detecting a magnetic field which is capable of electrically and mechanically secure connection to an external coaxial line.

The present invention provides a device for detecting a magnetic field comprising: a dielectric body; an electrically conductive pattern; and an electrically conductive ground region. The electrically conductive pattern so extends in the dielectric body as to form a dielectric looped face at least partially surrounded by the electrically conductive pattern, and the electrically conductive pattern having a first end electrically connected to an external electrically conductive line and a second end. The electrically conductive ground region is formed in the dielectric body. The electrically conductive ground region is electrically connected to the second end of the electrically conductive pattern and is electrically isolated from other parts of the electrically conductive pattern than the second end, so that the electrically conductive ground region serves as a ground to the electrically conductive pattern.

The above and other objects, features and advantages of the present invention will be apparent from the following descriptions.

BRIEF DESCRIPTION OF THE DRAWINGS

Preferred embodiments according to the present invention will be described in detail with reference to the accompanying drawings.

DISCLOSURE OF THE INVENTION

Figure 1:
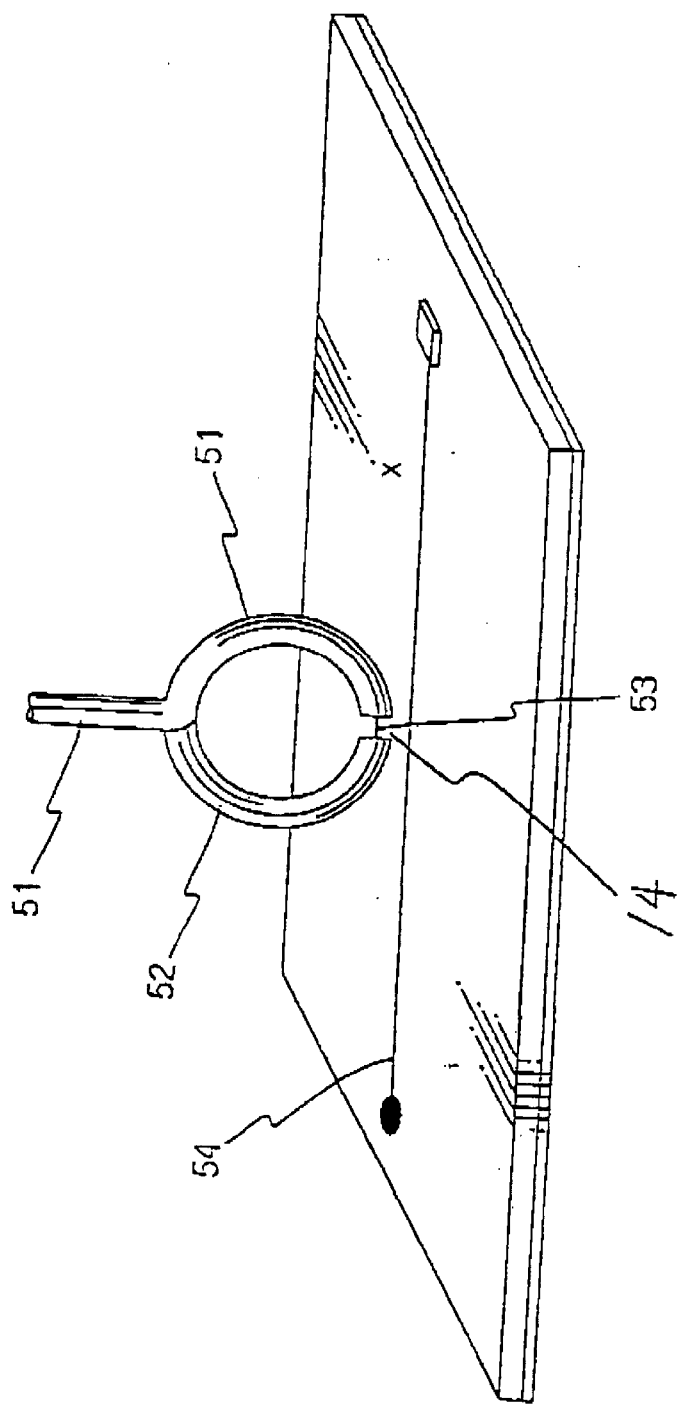
FIG. 1 is a schematic perspective view illustrative of the conventional coaxial line shielded loop magnetic detector set over an objective interconnection generating a magnetic field to be measured.
Figure 2:
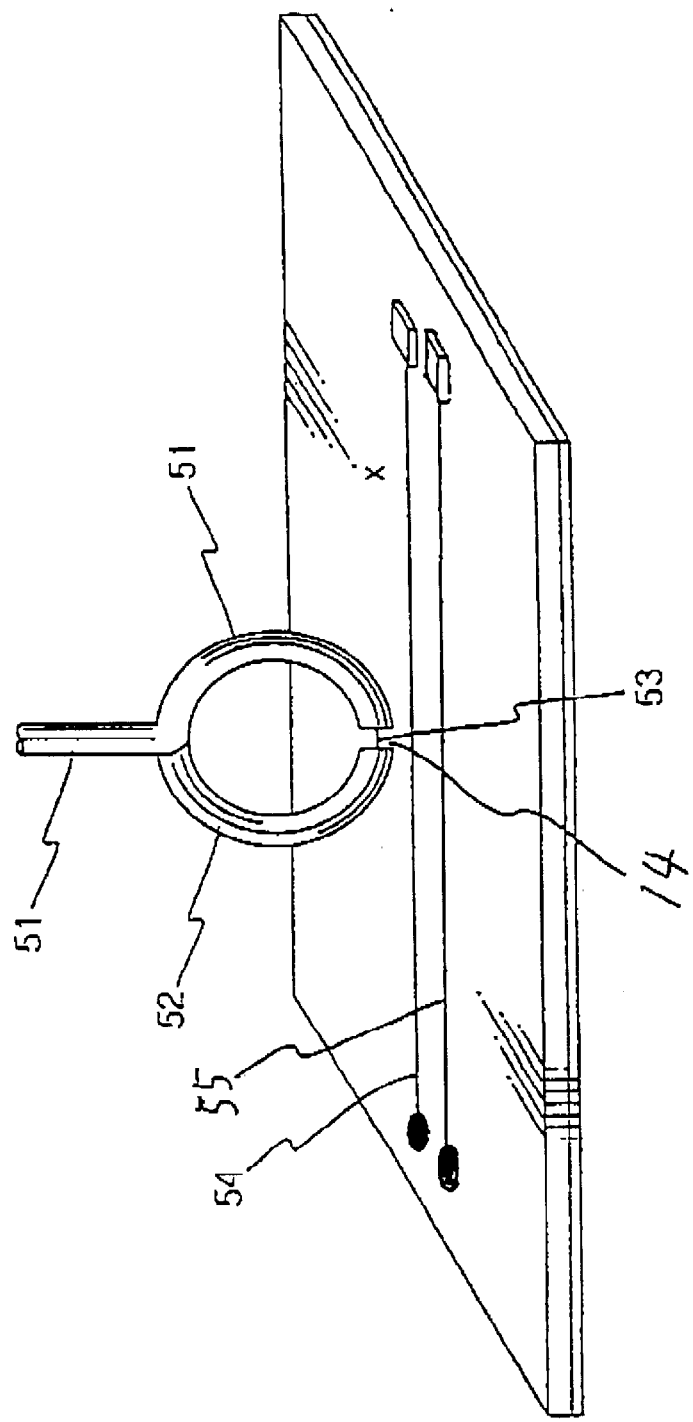
FIG. 2 is a schematic perspective view illustrative of the conventional coaxial line shielded loop magnetic detector set over an objective interconnection generating a magnetic field to be measured, wherein an adjacent interconnection is formed which generates a magnetic field which disturbs the required measurement of the magnetic field of the objective interconnection.

The first present invention provides a device for detecting a magnetic field comprising: a dielectric body; an electrically conductive pattern; and an electrically conductive ground region. The electrically conductive pattern so extends in the dielectric body as to form a dielectric looped face at least partially surrounded by the electrically conductive pattern, and the electrically conductive pattern having a first end electrically connected to an external electrically conductive line and a second end. The electrically conductive ground region is formed in the dielectric body. The electrically conductive ground region is electrically connected to the second end of the electrically conductive pattern and is electrically isolated from other parts of the electrically conductive pattern than the second end, so that the electrically conductive ground region serves as a ground to the electrically conductive pattern.

The above electrically conductive pattern may be formed by an etching process or a sputtering process on or in the dielectric body, for example, in a dielectric multilayer substrate. The above structure enables a remarkable scaling down of the detector. Particularly, the above structure enables the dielectric looped face surrounded by the electrically conductive pattern to be positioned extremely adjacent to an objective interconnection which generates a magnetic field to be measured, so that even if an adjacent interconnection is positioned very close to the objective interconnection, the above novel magnetic field detector is capable of detecting only the magnetic field generated by the objective interconnection without, however, receiving any influence of a disturbing magnetic field generated by the adjacent interconnection. The above electrically conductive pattern may comprise a strip line or a micro-strip line. The electrically conductive pattern is formed to position the dielectric looped face closer to a contact side of the device so that the dielectric looped face is positioned closer to the objective interconnection, whereby the detector can detect only the magnetic field extremely adjacent to the objective interconnection. The above electrically conductive pattern is formed by the etching or sputtering process without being hand-made, for which reason it is possible to form highly accurate and largely scaled down magnetic field detector. The electrically conductive pattern may comprise any electrically conductive material, for example, not only any available metals, but also any available alloys, superconductors, refractory metal silicide materials and elemental and compound semiconductors. Further, the dielectric region defined by the dielectric looped face may comprise a dielectric which further exhibits a magnetic property to cause a magnetic flux concentration into the dielectric looped face, whereby a sensitivity of the device is further improved. In detection of the magnetic field, the device is positioned just over the objective interconnection so that the dielectric looped face is in parallel to the objective interconnection and positioned just over the objective interconnection. In order to increase the sensitivity, it is preferable that the electrically conductive pattern extends as long as possible in the direction along which the objective interconnection extends unless a spatial resolution of the detector is deteriorated due to a high frequency of the magnetic field generated by the objective interconnection. In order to ensure a high spatial resolution, it is preferable that the electrically conductive pattern extends as close as possible to the contact side of the device so that the dielectric looped face receives the magnetic field in the vicinity of the objective interconnection without, however, receiving any substantive influence of the disturbing magnetic field generated by the adjacent interconnection.

It is preferable that the dielectric body includes a magnetic region made of a dielectric substance exhibiting a magnetic property, and the magnetic region extends in correspondence with at least a part of said dielectric looped face, so that a magnetic flux is concentrated to penetrate the at least part of the dielectric looped face.

It is further preferable that the magnetic region extends in correspondence with an entire part of said dielectric looped face.

It is furthermore preferable that an entire part of the dielectric body, except for the electrically conductive pattern and the electrically conductive ground region, comprises a dielectric substance exhibiting a magnetic property.

It is also preferable that the electrically conductive pattern comprises an electrically conductive strip line pattern.

It is further preferable that the electrically conductive strip line pattern extends to form a kind of spiral so that the dielectric looped face is omni-directionally surrounded by the electrically conductive strip line pattern.

It is furthermore preferable that the kind of spiral of the electrically conductive strip line pattern comprises series connections of plural straight line segments.

It is still further preferable that the kind of spiral of the electrically conductive strip line pattern comprises series connections of plural straight line segments and plural curved line segments.

It is yet further preferable that the kind of spiral of the electrically conductive strip line pattern comprises series connections of plural curved line segments.

It is also preferable that the electrically conductive strip line pattern extends to form a generally U-shape, so that the dielectric looped face is surrounded in three quarter of omni-directions.

It is further preferable that the generally U-shape of the electrically conductive strip line pattern comprises series connections of plural straight line segments.

It is still further preferable that the generally U-shape of the electrically conductive strip line pattern comprises series connections of plural straight line segments and plural curved line segments.

It is yet further preferable that the generally U-shape of the electrically conductive strip line pattern comprises series connections of plural curved line segments.

It is also preferable that the electrically conductive strip line pattern extends to form a generally circuit so that the dielectric looped face is omni-directionally surrounded by the electrically conductive strip line pattern.

It is further preferable that the generally circuit of the electrically conductive strip line pattern comprises series connections of plural straight line segments.

It is still further preferable that the generally circuit of the electrically conductive strip line pattern comprises series connections of at least a plurality of straight and curved line segments.

It is also preferable that the second end of the electrically conductive pattern is connected through a resistance to the electrically conductive ground region.

It is also preferable that the dielectric body comprises laminations of a signal layer and first and second ground layers sandwiching the signal layer so that interfaces between the signal layer and the first and second ground layers are parallel to the dielectric looped face. The signal layer is made of a dielectric substance. The electrically conductive strip line pattern is formed only within the signal layer and comprises series connections of three straight strip line segments extending to form a generally U-shape. Each of the first and second ground layers comprises an electrically conductive region so that the each of the first and second ground layers serves as a ground. The each of the first and second ground layers has a dielectric region being almost omni-directionally surrounded by the electrically conductive region so that the dielectric region is positioned to be partially surrounded by the generally U-shape of the electrically conductive strip line pattern in a view vertical to the dielectric looped face which is in parallel to an interface between the signal layer and each of the first and second ground layers.

It is further preferable that the dielectric region has a rectangular shaped part having a longitudinal direction in parallel to a contact side of each of the first and second ground layers. The dielectric region further has an additionally extending region which extends from the rectangular shaped part to the contact side so as to form a gap in a contact side region of the electrically conductive region. The first end of the electrically conductive strip line pattern is connected through a first hole to the external conductive line. The first hole penetrates the first and second ground layers. The first hole in the first and second ground layers is surrounded by an isolation region to be isolated from the electrically conductive region. The electrically conductive strip line pattern extends to pass over the gap in the view vertical to the dielectric looped face so that the second end of the electrically conductive strip line pattern is connected through a second hole to the electrically conductive region of each of the first and second ground layers.

It is furthermore preferable that the dielectric body further comprises a fixing layer laminated on any one of the first and second ground layers. The fixing layer has a connector for connecting the external conductive line to the first hole so as to connect the external conductive line to the electrically conductive strip line pattern. The fixing layer comprises a dielectric region and an electrically conductive region extending in the vicinity of the connector and being surrounded the dielectric region.

It is moreover preferable that the dielectric looped face of the signal layer is made of a dielectric substance which exhibits a magnetic property, and the dielectric region of each of the first and second ground layers is also made of a dielectric substance which exhibits a magnetic property.

It is also preferable that the electrically conductive pattern comprises an electrically conductive micro-strip line pattern.

It is further preferable that the electrically conductive micro-strip line pattern extends to form a kind of spiral so that the dielectric looped face is omni-directionally surrounded by the electrically conductive strip line pattern.

It is furthermore preferable that the kind of spiral of the electrically conductive micro-strip line pattern comprises series connections of plural straight line segments.

It is still further preferable that the kind of spiral of the electrically conductive micro-strip line pattern comprises series connections of plural straight line segments and plural curved line segments.

It is yet further preferable that the kind of spiral of the electrically conductive micro-strip line pattern comprises series connections of plural curved line segments.

It is also preferable that the electrically conductive micro-strip line pattern extends to form a generally U-shape.

It is further preferable that the generally U-shape of the electrically conductive micro-strip line pattern comprises series connections of plural straight line segments.

It is still further preferable that the generally U-shape of the electrically conductive micro-strip line pattern comprises series connections of plural straight line segments and plural curved line segments.

It is yet further preferable that the generally U-shape of the electrically conductive micro-strip line pattern comprises series connections of plural curved line segments.

It is also preferable that the electrically conductive micro-strip line pattern extends to form a generally circuit so that the dielectric looped face is omni-directionally surrounded by the electrically conductive strip line pattern.

It is furthermore preferable that the generally circuit of the electrically conductive micro-strip line pattern comprises series connections of plural straight line segments.

It is moreover preferable that the generally circuit of the electrically conductive micro-strip line pattern comprises series connections of plural straight line segments and plural curved line segments.

It is still further preferable that the generally circuit of the electrically conductive micro-strip line pattern comprises series connections of plural curved line segments.

It is also preferable that the dielectric body comprises laminations of at least a ground layer and at least a signal layer so that an interface between the at least ground layer and the at least signal layer is vertical to the dielectric looped face. The at least signal layer is made of a dielectric substance, and the at least signal layer has an opposite surface to a contact surface in contact with the at least ground layer. The electrically conductive micro-strip line pattern extends in a shape of a first straight line segment on the opposite surface. The at least signal layer has first and second holes formed at first and second ends respectively of the first straight line segment of the electrically conductive micro-strip line pattern. The at least ground layer comprises an electrically conductive region having first and second holes which are positioned in correspondence with the first and second holes of the at least signal layer. The electrically conductive micro-strip line pattern further has second and third straight line segments which extend within the first and second holes respectively to penetrate both the at least signal layer and the at least ground layer. The second straight line segment provides a connection between the external conductive line and the first end of the first straight line segment whilst the third straight line segment provides a connection between the electrically conductive region of the at least ground layer and the second end of the first straight line segment. Series connections of the first, second and third straight line segments of the electrically conductive micro-strip line pattern form a U-shape. The dielectric looped face is surrounded in three quarter of omni-directions by the series connections of the first, second and third straight line segments.

It is further preferable that the dielectric body further comprises a secondary signal layer laminated on the at least ground layer so that the signal layer and the secondary signal layer sandwich the at least ground layer. The secondary signal layer has first and second holes formed at corresponding positions to the first and second holes of the at least ground layer so that the second and third straight line segments further extend through the first and second holes of the secondary signal layer. The at least ground layer has at least a first isolation region extending around the first hole so that the second straight line segment of the electrically conductive micro-strip line pattern is isolated by the first isolation region from the electrically conductive region of the at least ground layer.

It is further preferable that the dielectric body further comprises a fixing layer laminated on the secondary signal layer so that the secondary signal layer is sandwiched by the at least ground layer and the fixing layer. The fixing layer has a connector for connecting the external conductive line to the first hole so as to connect the external conductive line to the electrically conductive strip line pattern. The fixing layer comprises a dielectric region and an electrically conductive region extending in the vicinity of the connector and being surrounded the dielectric region.

It is furthermore preferable that the fixing layer and the secondary signal layer have third holes formed at corresponding positions to each other. The second and third holes of the fixing layer are connected through a resistance to each other. The electrically conductive micro-strip line pattern further has a fourth straight line segment extending in the third holes of the fixing layer and the secondary signal layer. The fourth straight line segment extends to connect the resistance to the electrically conductive region of the at least ground layer. The at least ground layer further has a second isolation region extending around the second hole so that the third straight line segment of the electrically conductive micro-strip line pattern is isolated by the second isolation region from the electrically conductive region of the at least ground layer.

It is also preferable that the dielectric looped face of the at least signal layer is made of a dielectric substance which exhibits a magnetic property.

It is also preferable that the dielectric body comprises laminations of a signal layer and a ground layer so that an interface between the signal layer and the ground layer is parallel to the dielectric looped face. The signal layer is made of a dielectric substance. The signal layer has an opposite surface to a contact surface in contact with the ground layer. The electrically conductive micro-strip line pattern extends in a generally rectangular shape comprising series connections of at least four straight line segments on the opposite surface. The signal layer has first and second holes formed at first and second ends of the electrically conductive micro-strip line pattern. The ground layer comprises an electrically conductive region so that the second end of the electrically conductive micro-strip line pattern is electrically connected to the electrically conductive region of the ground layer whereby the ground layer serves as a ground. The ground layer has at least a first hole formed at a corresponding position to the first hole of the signal layer. The first end of the electrically conductive micro-strip line pattern is electrically connected to the external conductive line. The ground layer further has an isolation region around the first hole so that the first hole of the ground layer is electrically isolated by the isolation region from the electrically conductive region of the ground layer.

It is further preferable that the opposite surface of the signal layer has a resistance in the vicinity of the second hole so that the second end of the electrically conductive microstrip line pattern is connected through the resistance to the electrically conductive region of the ground layer.

It is furthermore preferable that the dielectric body further comprises a fixing layer laminated on the ground layer so that the ground layer is sandwiched by the signal layer and the fixing layer, and the fixing layer has a connector for connecting the external conductive line to the first hole so as to connect the external conductive line to the first end of the electrically conductive micro-strip line pattern, and the fixing layer comprises a dielectric region and an electrically conductive region extending in the vicinity of the connector and being surrounded the dielectric region.

It is still further preferable that the dielectric looped face of the signal layer surrounded by the electrically conductive micro-strip line pattern is made of a dielectric which exhibits a magnetic property.

It is yet further preferable that the dielectric body comprises laminations of a signal layer and a ground layer so that an interface between the signal layer and the ground layer is parallel to the dielectric looped face. The signal layer is made of a dielectric substance. The signal layer has an opposite surface to a contact surface in contact with the ground layer. The electrically conductive micro-strip line pattern extends in a generally spiral shape comprising series connections of plural straight line segments on the opposite surface. The signal layer has first and second holes formed at first and second ends of the electrically conductive micro-strip line pattern. The ground layer comprises an electrically conductive region so that the second end of the electrically conductive micro-strip line pattern is electrically connected to the electrically conductive region of the ground layer whereby the ground layer serves as a ground. The ground layer has at least a first hole formed at a corresponding position to the first hole of the signal layer so that the first end of the electrically conductive micro-strip line pattern is electrically connected to the external conductive line. The ground layer further has an isolation region around the first hole so that the first hole of the ground layer is electrically isolated by the isolation region from the electrically conductive region of the ground layer.

It is further preferable that the opposite surface of the signal layer has a resistance in the vicinity of the second hole so that the second end of the electrically conductive micro-strip line pattern is connected through the resistance to the electrically conductive region of the ground layer.

It is furthermore preferable that the dielectric body further comprises a fixing layer laminated on the ground layer so that the ground layer is sandwiched by the signal layer and the fixing layer, and the fixing layer has a connector for connecting the external conductive line to the first hole so as to connect the external conductive line to the first end of the electrically conductive micro-strip line pattern, and the fixing layer comprises a dielectric region and an electrically conductive region extending in the vicinity of the connector and being surrounded the dielectric region.

It is still further preferable that the dielectric looped face of the signal layer surrounded by the electrically conductive micro-strip line pattern is made of a dielectric which exhibits a magnetic property.

It is also preferable that the electrically conductive pattern is made of a metal.

It is also preferable that the electrically conductive pattern is made of an alloy.

It is also preferable that the electrically conductive pattern is made of an elemental semiconductor.

It is also preferable that the electrically conductive pattern is made of a compound semiconductor.

It is also preferable that the electrically conductive pattern is made of a refractory metal silicide.

It is also preferable that the electrically conductive pattern is made of a superconductor.

It is also preferable that the electrically conductive pattern so extends that the dielectric looped face is positioned close to a contact side of the dielectric body, so that a magnetic flux close to a magnetic field source generating a magnetic field penetrates the dielectric looped face, so that the device has a high spatial resolution.

It is further preferable that the dielectric looped face has a low aspect ratio of a vertical size to the contact side to a horizontal size to the contact side, so that the device has a high spatial resolution and a high sensitivity.

It is also preferable that the electrically conductive ground region extends not to cover the dielectric looped face in a view vertical to the dielectric looped face, thereby to allow a magnetic flux penetrate an entire region of the dielectric looped face.

It is also preferable that the electrically conductive ground region selectively extends to have a necessary minimum area for allowing the electrically conductive ground region to serve as a ground to the electrically conductive pattern.

It is further preferable that the electrically conductive pattern is buried in the dielectric body to be shielded, and wherein the electrically conductive ground region selectively extends to cover the electrically conductive pattern so as to reduce an area of the electrically conductive ground region, provided that only the second end of the electrically conductive ground region is electrically connected to the electrically conductive ground region.

It is also preferable that the dielectric body comprises multilayer-structured printed circuit boards.

It is also preferable that the dielectric body comprises multilayer-structured silicon dioxide layers, and at least one of the multilayer-structured silicon dioxide layers has the electrically conductive pattern.

It is further preferable that the multilayer-structured silicon dioxide layers are provided on a silicon dioxide substrate.

It is also preferable that the external conductive line comprises an external coaxial line.

The second present invention provides a structure for fixing an external conductive line to a magnetic field detector which comprises a dielectric body, an electrically conductive pattern having first and second ends and so extending in the dielectric body as to form a dielectric looped face at least partially surrounded by the electrically conductive pattern, and an electrically conductive ground region being formed in the dielectric body and being electrically connected to only the second end of the electrically conductive pattern, so that the electrically conductive ground region serves as a ground to the electrically conductive pattern. The structure comprises a fixing layer provided on the dielectric body; a via hole extending between the first end of the electrically conductive pattern and an opposite surface of the fixing layer to an interface with the dielectric body; and a connector being provided on the opposite surface of the fixing layer and covering the via hole for connecting the external conductive line to the via hole so as to electrically connect the external conductive line to the fist end of the electrically conductive pattern.

It is preferable that the fixing layer comprises a dielectric region extending except in the vicinity of the connector and an electrically conductive region extending in the vicinity of the connector.

It is also preferable that the external conductive line comprises an external coaxial line.

The third present invention provides a structure for fixing an external conductive line to a magnetic field detector which comprises a dielectric body, an electrically conductive pattern having first and second ends and so extending in the dielectric body as to form a dielectric looped face at least partially surrounded by the electrically conductive pattern, and an electrically conductive ground region being formed in the dielectric body and being electrically connected to only the second end of the electrically conductive pattern, so that the electrically conductive ground region serves as a ground to the electrically conductive pattern. The structure comprises a through hole being formed in the dielectric body to penetrate between first and second surfaces opposite to each other; an electrically conductive pad being provided on the first surface of the dielectric body and also having an opening positioned in correspondence with the through hole; and a connector being provided on the first surface of the dielectric body and covering the through hole for connecting the external conductive line to the through hole, so that the external conductive line extends through the through hole and the opening of the electrically conductive pad, whereby an end of the external conductive line is electrically connected with the electrically conductive pad.

It is also preferable that the external conductive line comprises an external coaxial line.

The fourth present invention provides a device for detecting a magnetic field comprising laminations of a signal layer and first and second ground layers sandwiching the signal layer. The signal layer is made of a dielectric substance. The signal layer has an electrically conductive strip line pattern which comprises series connections of three straight strip line segments extending to form a generally U-shape and also form a dielectric looped face surrounded by the generally U-shape of the electrically conductive strip line pattern in three quarter of omni-directions. The dielectric looped face is in parallel to interfaces between the signal layer and the first and second ground layers, thereby to allow a magnetic flux to penetrate the dielectric looped face. The electrically conductive strip line pattern has a first end electrically connected to an external conductive line and a second end. Each of the first and second ground layers comprises an electrically conductive region which is electrically connected to the second end of the electrically conductive strip line pattern. The each of the first and second ground layers serves as a ground. The each of the first and second ground layers has a dielectric region being almost omni-directionally surrounded by the electrically conductive region so that the dielectric region is positioned to be partially surrounded by the generally U-shape of the electrically conductive strip line pattern in a view vertical to the dielectric looped face.

The above electrically conductive pattern may be formed by an etching process or a sputtering process on or in the dielectric body, for example, in a dielectric multilayer substrate. The above structure enables a remarkable scaling down of the detector. Particularly, the above structure enables the dielectric looped face surrounded by the electrically conductive pattern to be positioned extremely adjacent to an objective interconnection which generates a magnetic field to be measured, so that even if an adjacent interconnection is positioned very close to the objective interconnection, the above novel magnetic field detector is capable of detecting only the magnetic field generated by the objective interconnection without, however, receiving any influence of a disturbing magnetic field generated by the adjacent interconnection. The above electrically conductive pattern may comprise a strip line or a micro-strip line. The electrically conductive pattern is formed to position the dielectric looped face closer to a contact side of the device so that the dielectric looped face is positioned closer to the objective interconnection, whereby the detector can detect only the magnetic field extremely adjacent to the objective interconnection. The above electrically conductive pattern is formed by the etching or sputtering process without being hand-made, for which reason it is possible to form highly accurate and largely scaled down magnetic field detector. The electrically conductive pattern may comprise any electrically conductive material, for example, not only any available metals, but also any available alloys, superconductors, refractory metal silicide materials and elemental and compound semiconductors. Further, the dielectric region defined by the dielectric looped face may comprise a dielectric which further exhibits a magnetic property to cause a magnetic flux concentration into the dielectric looped face, whereby a sensitivity of the device is further improved. In detection of the magnetic field, the device is positioned just over the objective interconnection so that the dielectric looped face is in parallel to the objective interconnection and positioned just over the objective interconnection. In order to increase the sensitivity, it is preferable that the electrically conductive pattern extends as long as possible in the direction along which the objective interconnection extends unless a spatial resolution of the detector is deteriorated due to a high frequency of the magnetic field generated by the objective interconnection. In order to ensure a high spatial resolution, it is preferable that the electrically conductive pattern extends as close as possible to the contact side of the device so that the dielectric looped face receives the magnetic field in the vicinity of the objective interconnection without, however, receiving any substantive influence of the disturbing magnetic field generated by the adjacent interconnection.

It is preferable that the dielectric region has a rectangular shaped part having a longitudinal direction in parallel to a contact side of each of the first and second ground layers. The dielectric region further has an additionally extending region which extends from the rectangular shaped part to the contact side so as to form a gap in a contact side region of the electrically conductive region. The first end of the electrically conductive strip line pattern is connected through a first hole to the external conductive line. The first hole penetrates the first and second ground layers. The through hole in the first and second ground layers is surrounded by an isolation region to be isolated from the electrically conductive region. The electrically conductive strip line pattern extends to pass over the gap in the view vertical to the dielectric looped face so that the second end of the electrically conductive strip line pattern is connected through a second hole to the electrically conductive region of each of the first and second ground layers.

It is preferable to further comprise a fixing layer laminated on any one of the first and second ground layers. The fixing layer has a connector for connecting the external conductive line to the first hole so as to connect the external conductive line to the first end of the electrically conductive strip line pattern. The fixing layer comprises a dielectric region and an electrically conductive region extending in the vicinity of the connector and being surrounded the dielectric region.

It is also preferable that the dielectric looped face of the signal layer is made of a dielectric substance which exhibits a magnetic property. The dielectric region of each of the first and second ground layers is also made of a dielectric substance which exhibits a magnetic property.

The fifth present invention provides a device for detecting a magnetic field comprising laminations of at least a ground layer and at least a signal layer. The at least signal layer is made of a dielectric substance. The at least signal layer has an opposite surface to a contact surface in contact with the at least ground layer. The at least signal layer has an electrically conductive micro-strip line pattern which extends in a shape of a first straight line segment on the opposite surface. The at least signal layer has first and second holes formed at first and second ends of the first straight line segment of the electrically conductive micro-strip line pattern respectively. The at least ground layer comprises an electrically conductive region having first and second holes which are positioned in correspondence with the first and second holes of the at least signal layer. The electrically conductive micro-strip line pattern further has second and third straight line segments which extend within the first and second holes respectively to penetrate both the at least signal layer and the at least ground layer. The second straight line segment provides a connection between an external conductive line and the first end of the first straight line segment whilst the third straight line segment provides a connection between the electrically conductive region of the at least ground layer and the second end of the first straight line segment. Series connections of the first, second and third straight line segments of the electrically conductive micro-strip line pattern form a U-shape and also form a dielectric looped face surrounded in three quarter of omni-directions by the series connections of the first, second and third straight line segments. The dielectric looped face is vertical to an interface between the at least ground layer and the at least signal layer.

The above electrically conductive pattern may be formed by an etching process or a sputtering process on or in the dielectric body, for example, in a dielectric multilayer substrate. The above structure enables a remarkable scaling down of the detector. Particularly, the above structure enables the dielectric looped face surrounded by the electrically conductive pattern to be positioned extremely adjacent to an objective interconnection which generates a magnetic field to be measured, so that even if an adjacent interconnection is positioned very close to the objective interconnection, the above novel magnetic field detector is capable of detecting only the magnetic field generated by the objective interconnection without, however, receiving any influence of a disturbing magnetic field generated by the adjacent interconnection. The above electrically conductive pattern may comprise a strip line or a micro-strip line. The electrically conductive pattern is formed to position the dielectric looped face closer to a contact side of the device so that the dielectric looped face is positioned closer to the objective interconnection, whereby the detector can detect only the magnetic field extremely adjacent to the objective interconnection. The above electrically conductive pattern is formed by the etching or sputtering process without being hand-made, for which reason it is possible to form highly accurate and largely scaled down magnetic field detector. The electrically conductive pattern may comprise any electrically conductive material, for example, not only any available metals, but also any available alloys, superconductors, refractory metal silicide materials and elemental and compound semiconductors. Further, the dielectric region defined by the dielectric looped face may comprise a dielectric which further exhibits a magnetic property to cause a magnetic flux concentration into the dielectric looped face, whereby a sensitivity of the device is further improved. In detection of the magnetic field, the device is positioned just over the objective interconnection so that the dielectric looped face is in parallel to the objective interconnection and positioned just over the objective interconnection. In order to increase the sensitivity, it is preferable that the electrically conductive pattern extends as long as possible in the direction along which the objective interconnection extends unless a spatial resolution of the detector is deteriorated due to a high frequency of the magnetic field generated by the objective interconnection. In order to ensure a high spatial resolution, it is preferable that the electrically conductive pattern extends as close as possible to the contact side of the device so that the dielectric looped face receives the magnetic field in the vicinity of the objective interconnection without, however, receiving any substantive influence of the disturbing magnetic field generated by the adjacent interconnection.

It is preferable to further comprise a secondary signal layer laminated on the at least ground layer. The signal layer and the secondary signal layer sandwich the at least ground layer. The secondary signal layer has first and second holes formed at corresponding positions to the first and second holes of the at least ground layer so that the second and third straight line segments further extend through the first and second holes of the secondary signal layer. The at least ground layer has at least a first isolation region extending around the first hole. The second straight line segment of the electrically conductive micro-strip line pattern is isolated by the first isolation region from the electrically conductive region of the at least ground layer.

It is preferable to further comprise a fixing layer laminated on the secondary signal layer. The secondary signal layer is sandwiched by the at least ground layer and the fixing layer. The fixing layer has a connector for connecting the external conductive line to the first hole so as to connect the external conductive line to the first end of the electrically conductive strip line pattern. The fixing layer comprises a dielectric region and an electrically conductive region extending in the vicinity of the connector and being surrounded the dielectric region.

It is further preferable that the fixing layer and the secondary signal layer have third holes formed at corresponding positions to each other. The second and third holes of the fixing layer are connected through a resistance to each other. The electrically conductive micro-strip line pattern further has a fourth straight line segment extending in the third holes of the fixing layer and the secondary signal layer, and the fourth straight line segment extends to connect the resistance to the electrically conductive region of the at least ground layer. The at least ground layer further has a second isolation region extending around the second hole so that the third straight line segment of the electrically conductive micro-strip line pattern is isolated by the second isolation region from the electrically conductive region of the at least ground layer.

It is also preferable that the dielectric looped face of the at least signal layer is made of a dielectric substance which exhibits a magnetic property.

The sixth present invention provides a device for detecting a magnetic field comprising laminations of a signal layer and a ground layer. The signal layer is made of a dielectric substance. The signal layer has an opposite surface to a contact surface in contact with the ground layer. The signal layer has an electrically conductive micro-strip line pattern which extends in a generally rectangular shape comprising series connections of at least four straight line segments on the opposite surface, thereby to form a dielectric looped face surrounded in almost omni-directions by the four straight line segments. The dielectric looped face is parallel to an interface between the signal layer and the ground layer. The signal layer has first and second holes formed at first and second ends of the electrically conductive micro-strip line pattern. The ground layer comprises an electrically conductive region so that the second end of the electrically conductive micro-strip line pattern is electrically connected to the electrically conductive region of the ground layer whereby the ground layer serves as a ground. The ground layer has at least a first hole formed at a corresponding position to the first hole of the signal layer so that the first end of the electrically conductive micro-strip line pattern is electrically connected to the external conductive line. The ground layer further has an isolation region around the first hole so that the first hole of the ground layer is electrically isolated by the isolation region from the electrically conductive region of the ground layer.

The above electrically conductive pattern may be formed by an etching process or a sputtering process on or in the dielectric body, for example, in a dielectric multilayer substrate. The above structure enables a remarkable scaling down of the detector. Particularly, the above structure enables the dielectric looped face surrounded by the electrically conductive pattern to be positioned extremely adjacent to an objective interconnection which generates a magnetic field to be measured, so that even if an adjacent interconnection is positioned very close to the objective interconnection, the above novel magnetic field detector is capable of detecting only the magnetic field generated by the objective interconnection without, however, receiving any influence of a disturbing magnetic field generated by the adjacent interconnection. The above electrically conductive pattern may comprise a strip line or a micro-strip line. The electrically conductive pattern is formed to position the dielectric looped face closer to a contact side of the device so that the dielectric looped face is positioned closer to the objective interconnection, whereby the detector can detect only the magnetic field extremely adjacent to the objective interconnection. The above electrically conductive pattern is formed by the etching or sputtering process without being hand-made, for which reason it is possible to form highly accurate and largely scaled down magnetic field detector. The electrically conductive pattern may comprise any electrically conductive material, for example, not only any available metals, but also any available alloys, superconductors, refractory metal silicide materials and elemental and compound semiconductors. Further, the dielectric region defined by the dielectric looped face may comprise a dielectric which further exhibits a magnetic property to cause a magnetic flux concentration into the dielectric looped face, whereby a sensitivity of the device is further improved. In detection of the magnetic field, the device is positioned just over the objective interconnection so that the dielectric looped face is in parallel to the objective interconnection and positioned just over the objective interconnection. In order to increase the sensitivity, it is preferable that the electrically conductive pattern extends as long as possible in the direction along which the objective interconnection extends unless a spatial resolution of the detector is deteriorated due to a high frequency of the magnetic field generated by the objective interconnection. In order to ensure a high spatial resolution, it is preferable that the electrically conductive pattern extends as close as possible to the contact side of the device so that the dielectric looped face receives the magnetic field in the vicinity of the objective interconnection without, however, receiving any substantive influence of the disturbing magnetic field generated by the adjacent interconnection.

It is further preferable that the opposite surface of the signal layer has a resistance in the vicinity of the second hole so that the second end of the electrically conductive micro-strip line pattern is connected through the resistance to the electrically conductive region of the ground layer.

It is preferable to further comprise a fixing layer laminated on the ground layer. The ground layer is sandwiched by the signal layer and the fixing layer. The fixing layer has a connector for connecting the external conductive line to the first hole so as to connect the external conductive line to the electrically conductive micro-strip line pattern. The fixing layer comprises a dielectric region and an electrically conductive region extending in the vicinity of the connector and being surrounded the dielectric region.

It is further preferable that the dielectric looped face of the signal layer surrounded by the electrically conductive micro-strip line pattern is made of a dielectric which exhibits a magnetic property.

The seventh present invention provides a device for detecting a magnetic field comprising laminations of a signal layer and a ground layer. The signal layer is made of a dielectric substance. The signal layer has an opposite surface to a contact surface in contact with the ground layer. The signal layer has an electrically conductive micro-strip line pattern which extends in a generally spiral shape comprising series connections of plural straight line segments on the opposite surface, thereby to form a dielectric looped face surrounded in omni-directions by the plural straight line segments so that the dielectric looped face is parallel to an interface between the signal layer and the ground layer. The signal layer has first and second holes formed at first and second ends of the electrically conductive micro-strip line pattern. The ground layer comprises an electrically conductive region so that the second end of the electrically conductive micro-strip line pattern is electrically connected to the electrically conductive region of the ground layer whereby the ground layer serves as a ground. The ground layer has at least a first hole formed at a corresponding position to the first hole of the signal layer so that the first end of the electrically conductive micro-strip line pattern is electrically connected to the external conductive line. The ground layer further has an isolation region around the first hole so that the first hole of the ground layer is electrically isolated by the isolation region from the electrically conductive region of the ground layer.

The above electrically conductive pattern may be formed by an etching process or a sputtering process on or in the dielectric body, for example, in a dielectric multilayer substrate. The above structure enables a remarkable scaling down of the detector. Particularly, the above structure enables the dielectric looped face surrounded by the electrically conductive pattern to be positioned extremely adjacent to an objective interconnection which generates a magnetic field to be measured, so that even if an adjacent interconnection is positioned very close to the objective interconnection, the above novel magnetic field detector is capable of detecting only the magnetic field generated by the objective interconnection without, however, receiving any influence of a disturbing magnetic field generated by the adjacent interconnection. The above electrically conductive pattern may comprise a strip line or a micro-strip line. The electrically conductive pattern is formed to position the dielectric looped face closer to a contact side of the device so that the dielectric looped face is positioned closer to the objective interconnection, whereby the detector can detect only the magnetic field extremely adjacent to the objective interconnection. The above electrically conductive pattern is formed by the etching or sputtering process without being hand-made, for which reason it is possible to form highly accurate and largely scaled down magnetic field detector. The electrically conductive pattern may comprise any electrically conductive material, for example, not only any available metals, but also any available alloys, superconductors, refractory metal silicide materials and elemental and compound semiconductors. Further, the dielectric region defined by the dielectric looped face may comprise a dielectric which further exhibits a magnetic property to cause a magnetic flux concentration into the dielectric looped face, whereby a sensitivity of the device is further improved. In detection of the magnetic field, the device is positioned just over the objective interconnection so that the dielectric looped face is in parallel to the objective interconnection and positioned just over the objective interconnection. In order to increase the sensitivity, it is preferable that the electrically conductive pattern extends as long as possible in the direction along which the objective interconnection extends unless a spatial resolution of the detector is deteriorated due to a high frequency of the magnetic field generated by the objective interconnection. In order to ensure a high spatial resolution, it is preferable that the electrically conductive pattern extends as close as possible to the contact side of the device so that the dielectric looped face receives the magnetic field in the vicinity of the objective interconnection without, however, receiving any substantive influence of the disturbing magnetic field generated by the adjacent interconnection.

It is further preferable that the opposite surface of the signal layer has a resistance in the vicinity of the second hole so that the second end of the electrically conductive micro-strip line pattern is connected through the resistance to the electrically conductive region of the ground layer.

It is preferable to further comprise a fixing layer laminated on the ground layer, wherein the ground layer is sandwiched by the signal layer and the fixing layer. The fixing layer has a connector for connecting the external conductive line to the first hole so as to connect the external conductive line to the electrically conductive micro-strip line pattern. The fixing layer comprises a dielectric region and an electrically conductive region extending in the vicinity of the connector and being surrounded the dielectric region.

It is also preferable that the dielectric looped face of the signal layer surrounded by the electrically conductive microstrip line pattern is made of a dielectric which exhibits a magnetic property.

The eighth present invention provides a device for detecting a magnetic field comprising laminations of a signal layer and first and second ground layers sandwiching the signal layer. The signal layer is made of a dielectric substance. The signal layer has an electrically conductive strip line pattern which comprises series connections of at least three straight strip line segments extending to form a generally U-shape and also form a dielectric looped face surrounded in three quarter of omni-directions by the generally U-shape of the electrically conductive strip line pattern. The dielectric looped face is in parallel to interfaces between the signal layer and the first and second ground layers, thereby to allow a magnetic flux to penetrate the dielectric looped face. The electrically conductive strip line pattern has a first end electrically connected to an external conductive line and a second end. Each of the first and second ground layers comprises: a dielectric region extending not to cover the U-shape of the electrically conductive strip line pattern in a view vertical to the dielectric looped face and an electrically conductive region extending to cover the generally U-shape of the electrically conductive strip line pattern in the view vertical to the dielectric looped face. The electrically conductive region is electrically connected to the second end of the electrically conductive strip line pattern, so that the each of the first and second ground layers serves as a ground. The electrically conductive region almost omni-directionally surrounds the dielectric region positioned to be partially surrounded by the generally U-shape of the electrically conductive strip line pattern in the view vertical to the dielectric looped face.

The above electrically conductive pattern may be formed by an etching process or a sputtering process on or in the dielectric body, for example, in a dielectric multilayer substrate. The above structure enables a remarkable scaling down of the detector. Particularly, the above structure enables the dielectric looped face surrounded by the electrically conductive pattern to be positioned extremely adjacent to an objective interconnection which generates a magnetic field to be measured, so that even if an adjacent interconnection is positioned very close to the objective interconnection, the above novel magnetic field detector is capable of detecting only the magnetic field generated by the objective interconnection without, however, receiving any influence of a disturbing magnetic field generated by the adjacent interconnection. The above electrically conductive pattern may comprise a strip line or a micro-strip line. The electrically conductive pattern is formed to position the dielectric looped face closer to a contact side of the device so that the dielectric looped face is positioned closer to the objective interconnection, whereby the detector can detect only the magnetic field extremely adjacent to the objective interconnection. The above electrically conductive pattern is formed by the etching or sputtering process without being hand-made, for which reason it is possible to form highly accurate and largely scaled down magnetic field detector. The electrically conductive pattern may comprise any electrically conductive material, for example, not only any available metals, but also any available alloys, superconductors, refractory metal silicide materials and elemental and compound semiconductors. Further, the dielectric region defined by the dielectric looped face may comprise a dielectric which further exhibits a magnetic property to cause a magnetic flux concentration into the dielectric looped face, whereby a sensitivity of the device is further improved. In detection of the magnetic field, the device is positioned just over the objective interconnection so that the dielectric looped face is in parallel to the objective interconnection and positioned just over the objective interconnection. In order to increase the sensitivity, it is preferable that the electrically conductive pattern extends as long as possible in the direction along which the objective interconnection extends unless a spatial resolution of the detector is deteriorated due to a high frequency of the magnetic field generated by the objective interconnection. In order to ensure a high spatial resolution, it is preferable that the electrically conductive pattern extends as close as possible to the contact side of the device so that the dielectric looped face receives the magnetic field in the vicinity of the objective interconnection without, however, receiving any substantive influence of the disturbing magnetic field generated by the adjacent interconnection.

It is preferable that the dielectric region positioned to be partially surrounded by the generally U-shape of the electrically conductive strip line pattern has a rectangular shaped part having a longitudinal direction in parallel to a contact side of each of the first and second ground layers. The dielectric region further has an additionally extending region which extends from the rectangular shaped part to the contact side so as to form a gap in a contact side region of the electrically conductive region. The first end of the electrically conductive strip line pattern is connected through a first hole to the external conductive line and the first hole penetrates the first and second ground layers, and the first hole in the first and second ground layers is surrounded by an isolation region to be isolated from the electrically conductive region. The electrically conductive strip line pattern extends to pass over the gap in the view vertical to the dielectric looped face so that the second end of the electrically conductive strip line pattern is connected through a second hole to the electrically conductive region of each of the first and second ground layers.

It is preferable to further comprise a fixing layer laminated on any one of the first and second ground layers. The fixing layer has a connector for connecting the external conductive line to the first hole so as to connect the external conductive line to the first end of the electrically conductive strip line pattern. The fixing layer comprises a dielectric region which has an electrically conductive region extending in the vicinity of the connector and is surrounded the dielectric region.

It is also preferable that the dielectric looped face of the signal layer is made of a dielectric substance which exhibits a magnetic property. The dielectric region of each of the first and second ground layers is also made of a dielectric substance which exhibits a magnetic property.

It is also preferable that the electrically conductive pattern is made of a metal.

It is also preferable that the electrically conductive pattern is made of an alloy.

It is also preferable that the electrically conductive pattern is made of an elemental semiconductor.

It is also preferable that the electrically conductive pattern is made of a compound semiconductor.

It is also preferable that the electrically conductive pattern is made of a refractory metal silicide.

It is also preferable that the electrically conductive pattern is made of a superconductor.

It is also preferable that the electrically conductive pattern so extends that the dielectric looped face is positioned close to a contact side of the dielectric body. A magnetic flux close to a magnetic field source generating a magnetic field penetrates the dielectric looped face. The device has a high spatial resolution.

It is further preferable that the dielectric looped face has a low aspect ratio of a vertical size to the contact side to a horizontal size to the contact side, so that the device has a high spatial resolution and a high sensitivity.

It is also preferable that the external conductive line comprises an external coaxial line.

The ninth present invention provides a device for detecting a magnetic field comprising: a dielectric body comprising laminations of silicon dioxide layers; a through hole being formed in the dielectric body to penetrate between first and second surfaces opposite to each other; an electrically conductive pad being provided on the first surface of the dielectric body and having an opening positioned in correspondence with the through hole; a connector being provided on the second surface of the dielectric body and covering the through hole for connecting an external conductive line to the through hole. The external conductive line extends through the through hole and the opening of the electrically conductive pad. An end of the external conductive line is electrically connected with the electrically conductive pad. At least an interface between the silicon dioxide layers has an electrically conductive pattern extending to form a dielectric looped face surrounded by the electrically conductive pattern. The dielectric looped face is in parallel to the interface between the silicon dioxide layers, thereby to allow a magnetic flux to penetrate the dielectric looped face. The electrically conductive pattern has a first end which is electrically connected through a first contact hole to the electrically conductive pad so that the electrically conductive pattern is electrically connected to the external conductive line. The electrically conductive pattern also has a second end. At least another interface between the silicon dioxide layers has an electrically conductive ground pattern which is electrically connected through a second contact hole to the second end of the electrically conductive pattern. The electrically conductive ground pattern serves as a ground.

The above electrically conductive pattern may be formed by an etching process or a sputtering process on or in the dielectric body, for example, in a dielectric multilayer substrate. The above structure enables a remarkable scaling down of the detector. Particularly, the above structure enables the dielectric looped face surrounded by the electrically conductive pattern to be positioned extremely adjacent to an objective interconnection which generates a magnetic field to be measured, so that even if an adjacent interconnection is positioned very close to the objective interconnection, the above novel magnetic field detector is capable of detecting only the magnetic field generated by the objective interconnection without, however, receiving any influence of a disturbing magnetic field generated by the adjacent interconnection. The above electrically conductive pattern may comprise a strip line or a micro-strip line. The electrically conductive pattern is formed to position the dielectric looped face closer to a contact side of the device so that the dielectric looped face is positioned closer to the objective interconnection, whereby the detector can detect only the magnetic field extremely adjacent to the objective interconnection. The above electrically conductive pattern is formed by the etching or sputtering process without being hand-made, for which reason it is possible to form highly accurate and largely scaled down magnetic field detector. The electrically conductive pattern may comprise any electrically conductive material, for example, not only any available metals, but also any available alloys, superconductors, refractory metal silicide materials and elemental and compound semiconductors. In detection of the magnetic field, the device is positioned just over the objective interconnection so that the dielectric looped face is in parallel to the objective interconnection and positioned just over the objective interconnection. In order to increase the sensitivity, it is preferable that the electrically conductive pattern extends as long as possible in the direction along which the objective interconnection extends unless a spatial resolution of the detector is deteriorated due to a high frequency of the magnetic field generated by the objective interconnection. In order to ensure a high spatial resolution, it is preferable that the electrically conductive pattern extends as close as possible to the contact side of the device so that the dielectric looped face receives the magnetic field in the vicinity of the objective interconnection without, however, receiving any substantive influence of the disturbing magnetic field generated by the adjacent interconnection.

It is preferable that a plurality of the interfaces between the silicon dioxide layers have the same electrically conductive pattern.

It is also preferable that the electrically conductive pattern comprises an electrically conductive strip line pattern.

It is further preferable that the electrically conductive strip line pattern extends to form a kind of spiral so that the dielectric looped face is omni-directionally surrounded by the electrically conductive strip line pattern.

It is also preferable that the electrically conductive strip line pattern extends to form a generally U-shape, so that the dielectric looped face is surrounded in three quarter of omni-directions.

It is also preferable that the electrically conductive strip line pattern extends to form generally a circuit so that the dielectric looped face is omni-directionally surrounded by the electrically conductive strip line pattern.

It is also preferable that the second end of the electrically conductive pattern is connected through a resistance to the electrically conductive ground region.

It is also preferable that the electrically conductive pattern is made of a metal.

It is also preferable that the electrically conductive pattern is made of an alloy.

It is also preferable that the electrically conductive pattern is made of an elemental semiconductor.

It is also preferable that the electrically conductive pattern is made of a compound semiconductor.

It is also preferable that the electrically conductive pattern is made of a refractory metal silicide.

It is also preferable that the electrically conductive pattern is made of a superconductor.

It is also preferable that the electrically conductive pattern so extends that the dielectric looped face is positioned close to a contact side of the dielectric body, so that a magnetic flux close to a magnetic field source generating a magnetic field penetrates the dielectric looped face, so that the device has a high spatial resolution.

It is further preferable that the dielectric looped face has a low aspect ratio of a vertical size to the contact side to a horizontal size to the contact side, so that the device has a high spatial resolution and a high sensitivity.

It is also preferable that the electrically conductive ground region extends not to cover the dielectric looped face in a view vertical to the dielectric looped face, thereby to allow a magnetic flux penetrate an entire region of the dielectric looped face.

It is also preferable that the electrically conductive ground region selectively extends to have a necessary minimum area for allowing the electrically conductive ground region to serve as a ground to the electrically conductive pattern.

It is also preferable that the external conductive line comprises an external coaxial line.

PREFERRED EMBODIMENTS

First Embodiment

Figure 3A:
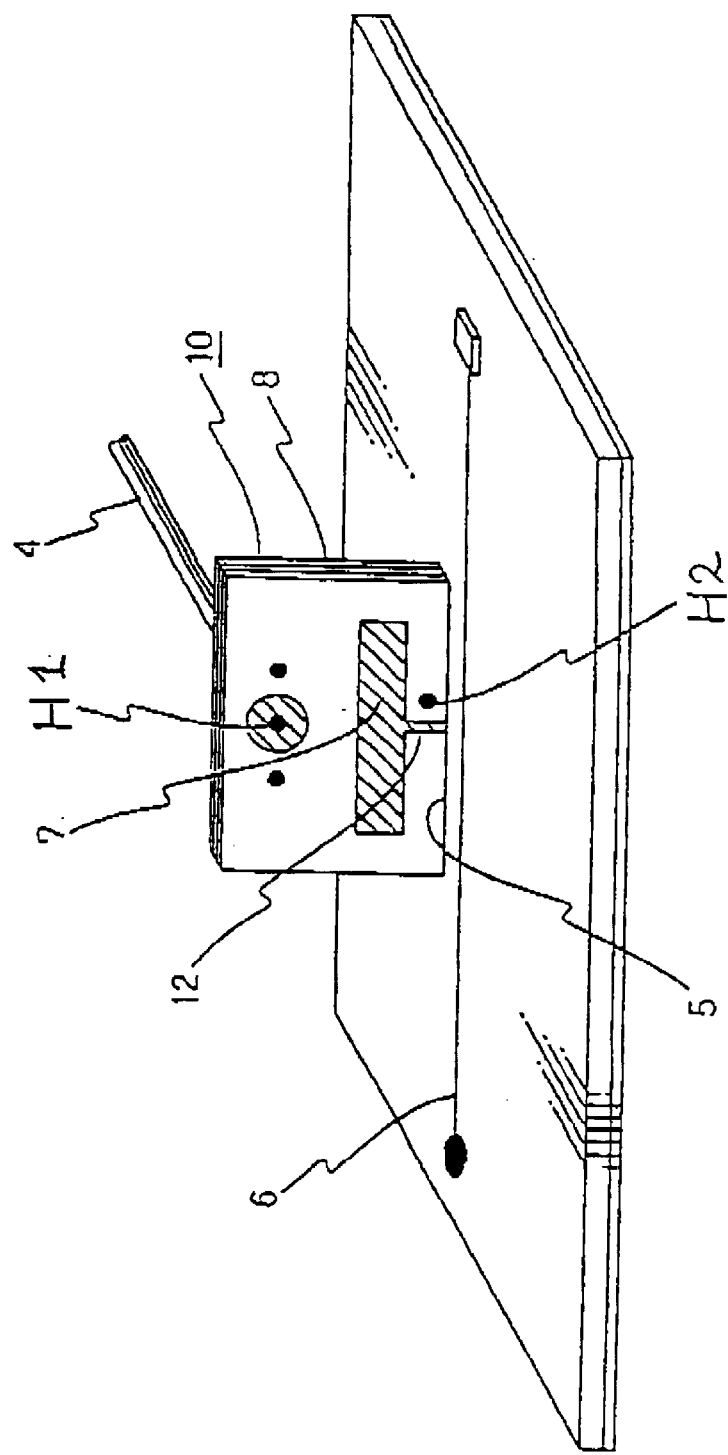
FIG. 3A is a schematic perspective view illustrative of a novel strip line shielded loop magnetic detector having a multilayer substrate body comprising two ground layers, a signal layer and a fixing layer in a first embodiment in accordance with the present invention.
Figure 4A:
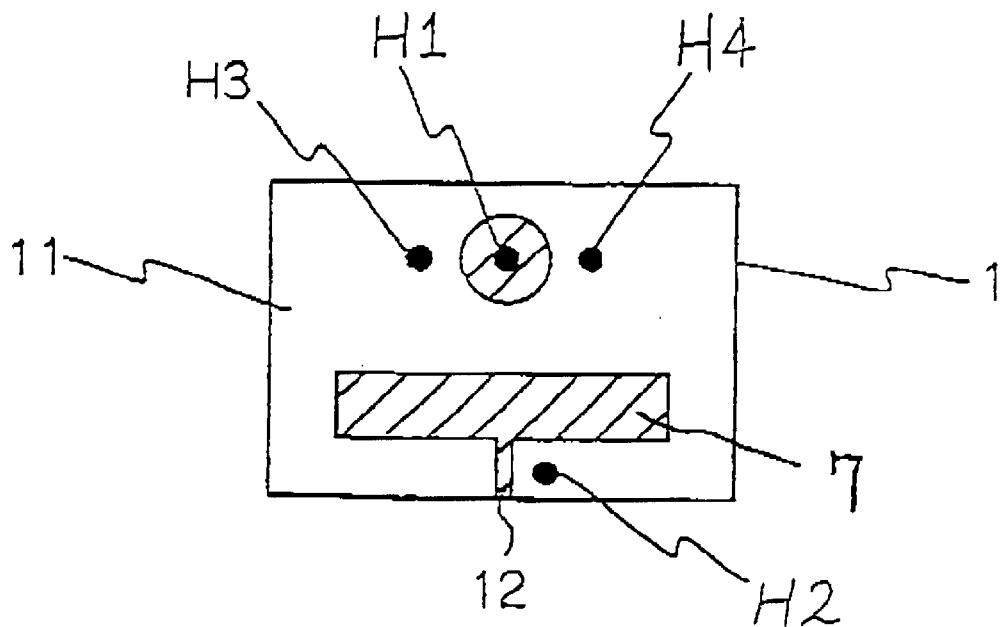
FIG. 4A is a plane view illustrative of each of two ground layers in a multilayer substrate body of a novel strip line shielded loop magnetic detector in a first embodiment in accordance with the present invention.
Figure 4B:
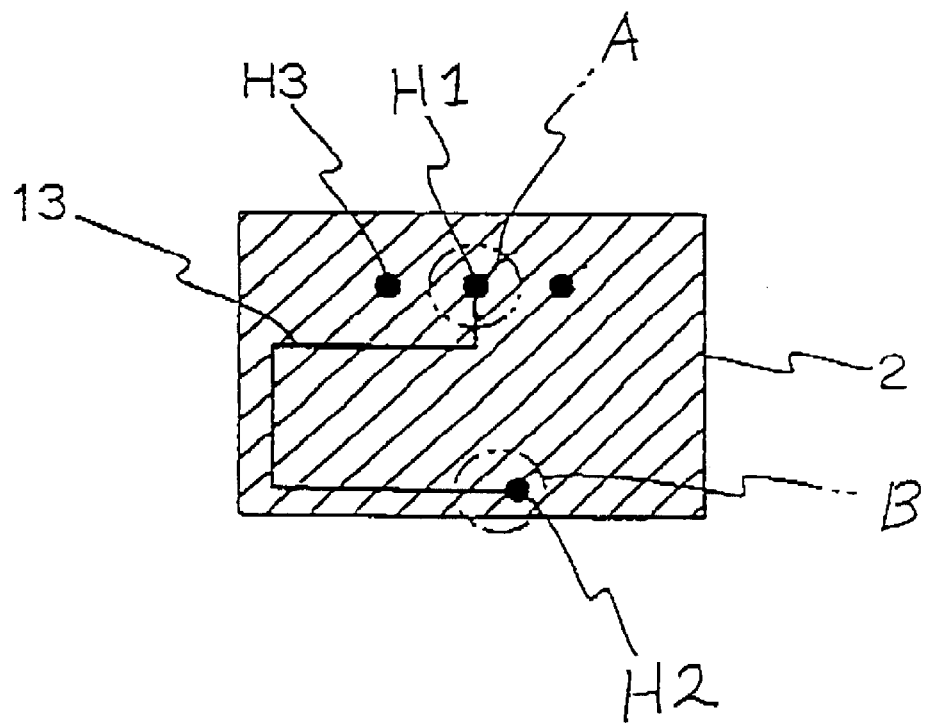
FIG. 4B is a plane view illustrative of a signal layer in a multilayer substrate body of a novel strip line shielded loop magnetic detector in a first embodiment in accordance with the present invention.
Figure 4C:
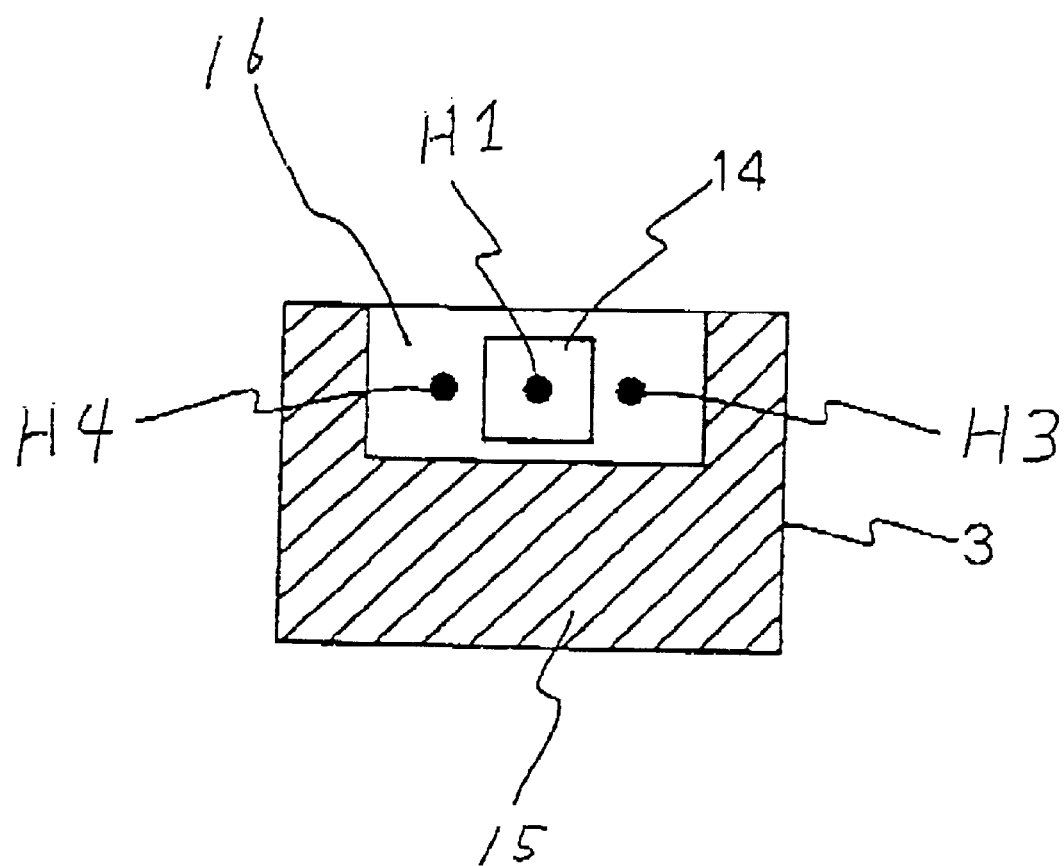
FIG. 4C is a plane view illustrative of a fixing layer in a multilayer substrate body of a novel strip line shielded loop magnetic detector in a first embodiment in accordance with the present invention.

A first embodiment according to the present invention will be described in detail with reference to FIGS. 3A, 4A, 4B and 4C. FIG. 3A is a schematic perspective view illustrative of a novel strip line shielded loop magnetic detector having a multilayer substrate body comprising two ground layers, a signal layer and a fixing layer in a first embodiment in accordance with the present invention. FIG. 4A is a plane view illustrative of each of two ground layers in a multilayer substrate body of a novel strip line shielded loop magnetic detector in a first embodiment in accordance with the present invention. FIG. 4B is a plane view illustrative of a signal layer in a multilayer substrate body of a novel strip line shielded loop magnetic detector in a first embodiment in accordance with the present invention. FIG. 4C is a plane view illustrative of a fixing layer in a multilayer substrate body of a novel strip line shielded loop magnetic detector in a first embodiment in accordance with the present invention.

The novel strip line shielded loop magnetic detector 10 for detecting a magnetic field has a multilayer substrate body 8 which comprises laminations of a signal layer 2 and first and second ground layers 1 sandwiching the signal layer 2 as well as a fixing layer 3.

The signal layer 2 is made of a dielectric substance. The signal layer 2 has an electrically conductive strip line pattern 13 which comprises series connections of the following first to fourth straight strip line segments extending to form a modified U-shape and also form a dielectric looped face 7 surrounded by the modified U-shape of the electrically conductive strip line pattern 13 in three quarter of omni-directions. The dielectric looped face 7 is in parallel to interfaces between the signal layer 2 and the first and second ground layers 1, thereby to allow a magnetic flux to penetrate the dielectric looped face 7. The electrically conductive strip line pattern 13 has a first end "A" and a second end "B". A first via hole H1 is formed at the first end of the electrically conductive strip line pattern 13 in the signal layer 2. A second via hole H2 is formed at the second end of the electrically conductive strip line pattern 13 in the signal layer 2. Third and fourth via holes H3 and H4 are further formed at opposite side positions of said first via hole H1 so that the first, third and fourth via holes H1, H3 and H4 are aligned in a horizontal direction and positioned at upper positions of the signal layer 2. The second via hole is positioned at a lower position of the signal layer 2. The first via hole H1 is positioned on a vertical center line. The third and fourth via holes H3 and H4 are positioned in opposite sides of the first via hole H1 at the same level as the first via hole H1 so that the first, third and fourth via holes H1, H3 and H4 are aligned horizontally and symmetrically with reference to the vertical center line of the signal layer 2. The second via hole H2 is displaced from the vertical center line to the same side as the fourth via hole. The electrically conductive strip line pattern 13 mainly extends in the same side as the third via hole H3. The electrically conductive strip line pattern 13 extends from the first end "A" at the first via hole H1 downwardly and further extends in the horizontal direction into the same side as the third via hole H3, and furthermore extends downwardly along the side of the signal layer 2, and moreover extends in the horizontal direction toward the opposite side to pass through the vertical center line and to reach the second via hole H2, whereby the dielectric looped face is defined to be rectangular-shaped and positioned mainly in the same side as the third via hole H3. As described above, the electrically conductive strip line pattern 13 has the following first to fourth straight strip line segments. A first straight strip line segment of the electrically conductive strip line pattern 13 is connected to the first end "A" and extends in a direction vertical to the contact side of the detector 1 and has a level over the dielectric region 7. A second straight strip line segment of the electrically conductive strip line pattern 13 is connected to the first straight strip line segment and also extends in a direction parallel to the contact side of the detector 1 and has a level over the dielectric region 7. A third straight strip line segment of the electrically conductive strip line pattern 13 is connected to the second straight strip line segment and also extends in a direction vertical to the contact side of the detector 1 and also extends on a vertically extending intermediate line between the edge of the rectangle-shaped dielectric region 7 and the side edge of the detector 1. A fourth straight strip line segment of the electrically conductive strip line pattern 13 is connected to the third straight strip line segment and extends in a direction parallel to the contact side of the detector 1 on a horizontally extending intermediate line between the bottom side of the rectangle-shaped dielectric region 7 and the contact side of the detector 1. Consequently, it is preferable that the electrically conductive strip line pattern 13 extends in the signal layer 2 so that, in the vertical view to the interfaces of the signal layer 2 and the ground layer 1, the electrically conductive strip line pattern 13 as a signal line extends along a center line of the electrically conductive pattern 11 of the ground layer 1 in order to ensure stable transmission characteristics. It is also preferable that a left side width of the electrically conductive pattern 11 defined to be the distance between the left side edge of the rectangle-shaped dielectric region 7 and the left side of the ground layer is not more than approximately 10 times of a width of the electrically conductive strip line pattern 13 as a signal line in order to improve the stability of the transmission characteristics. The electrically conductive pattern 11 may optionally comprise a metal foil.

Each of the first and second ground layers 1 comprises an electrically conductive pattern 11 which is electrically connected only to the second end "B" of the electrically conductive strip line pattern 13 so that the each of the first and second ground layers 1 serves as a ground. The each of the first and second ground layers 1 has a dielectric region 7 being almost omni-directionally surrounded by the electrically conductive pattern 11 so that the dielectric region 7 is positioned in correspondence with the center part of the dielectric looped face defined by the electrically conductive strip line pattern 13. A magnetic flux penetrates the dielectric region 7 almost omni-directionally surrounded by the electrically conductive pattern 11 and also penetrates a center region of the dielectric looped face defined by the electrically conductive strip line pattern 13 of the signal layer 2. In accordance with the shape of the dielectric looped face defined by the electrically conductive strip line pattern 13 of the signal layer 2, the dielectric region 7 of each of the first and second ground layers 1 is shaped and positioned to introduce the magnetic flux to the center region of the dielectric looped face. The dielectric region 7 has a slender rectangular shape having a horizontally longitudinal direction and is symmetrical with reference to the center vertical line of each of the first and second ground layers 1. The dielectric region 7 comprises not only the slender rectangular shaped main part but also an additionally extending part which extends from the slender rectangular shaped main part to the bottom side of each of the first and second ground layers 1 so as to form a gap 12 in the bottom side region of the electrically conductive pattern 11. The each of the first and second ground layers 1 has a first via hole H1 at a position corresponding to the first via hole H1 of the signal layer 2. The each of the first and second ground layers 1 also has a second via hole H2 at a position corresponding to the second via hole H2 of the signal layer 2. The each of the first and second ground layers 1 also has a third via hole H3 at a position corresponding to the third via hole H3 of the signal layer 2. The each of the first and second ground layers 1 also has a fourth via hole H4 at a position corresponding to the fourth via hole H4 of the signal layer 2. The each of the first and second ground layers 1 further has an isolation region around the first via hole H1 so that the first via hole H1 is electrically isolated from the electrically conductive pattern 11. The second, third and fourth via holes H2, H3 and H4 are electrically and structurally connected with the electrically conductive pattern 11.

The fixing layer 3 is provided in contact with the second ground layer 1 for the purpose exclusively of fixing the external coaxial line 4. The fixing layer 3 has a connector 14 for connecting the external coaxial line 4. The fixing layer 3 also has a first via hole H1 which is positioned in correspondence with the first via hole H1 of the second ground layer 1. The fixing layer 3 also has a third via hole H3 which is positioned in correspondence with the third via hole H3 of the second ground layer 1. The fixing layer 3 also has a fourth via hole H4 which is positioned in correspondence with the fourth via hole H4 of the second ground layer 1. The connector 14 is positioned in correspondence with the first via hole H1 so that the first end "A" of the electrically conductive strip line pattern 13 is electrically connected through the first via hole H1 to the external coaxial line 4 connected by the connector 14 to the first via hole H1. The fixing layer 3 has a dielectric region 15 entirely extending except for a rectangle-shaped conductive region 16 which includes the first, third and fourth via holes H1, H3 and H4 as well as the connector 14.

The first end "A" of the electrically conductive strip line pattern 13 of the signal layer 2 is connected through the first via hole H1 to the external coaxial line 4. The electrically conductive strip line pattern 13 extends to pass through the corresponding position to the gap 12, so that the second end "B" of the electrically conductive strip line pattern 13 is connected through the second via hole H2 to the electrically conductive pattern of each of the first and second ground layers 1.

The measurement of the magnetic field generated by an objective interconnection 6 is carried out by use of the above novel magnetic field detector 10 as follows.

With reference again to FIG. 3, the novel magnetic field detector 10 is positioned so that the bottom side 5 of the multilayer substrate body 8 is just over the objective interconnection 6 generating the magnetic field which is intended to be measured, wherein the bottom side 5 of the multilayer substrate body 8 is in parallel to the objective interconnection 6, so that the dielectric looped face defined by the electrically conductive strip line pattern 13 of the signal layer 2 is also in parallel to the objective interconnection 6. Further, the dielectric region 7 of the ground layers 1 and the dielectric looped face defined by the electrically conductive strip line pattern 13 of the signal layer 2 are positioned in the vicinity of the objective interconnection 6, so that the magnetic flux in the vicinity of the objective interconnection 6 penetrates the dielectric region 7 of the ground layers 1 and the dielectric looped face defined by the electrically conductive strip line pattern 13. As a result, even if an adjacent interconnection not illustrated is positioned very close to the objective interconnection 6 and this adjacent interconnection generates an additional magnetic field, then the magnetic flux generated by the objective interconnection 6 penetrates the dielectric region 7 of the ground layers 1 and the dielectric looped face defined by the electrically conductive strip line pattern 13, whilst the magnetic flux generated by the adjacent interconnection does not penetrate the dielectric region 7 of the ground layers 1 and the dielectric looped face defined by the electrically conductive strip line pattern 13, for which reason the novel magnetic field detector 10 is capable of selectively detecting only the magnetic field generated by the objective interconnection 6 without receiving any substantive disturbance due to the magnetic field generated by the adjacent interconnection.

The above electrically conductive strip line pattern 13 may be formed by an etching process or a sputtering process. This structure enables a remarkable scaling down of the detector body 8. Particularly, the above structure enables the dielectric looped face surrounded by the electrically conductive strip line pattern 13 to be positioned extremely adjacent to the objective interconnection 6 which generates the magnetic field to be measured, so that even if any adjacent interconnection not illustrated is positioned very close to the objective interconnection 6, the above novel magnetic field detector 10 is capable of detecting only the magnetic field generated by the objective interconnection 6 without, however, receiving any influence of a disturbing magnetic field generated by the adjacent interconnection. The above electrically conductive strip line pattern is formed to position the dielectric looped face and the dielectric region 7 closer to the bottom side of the multilayer substrate body 8 so that the dielectric looped face and the dielectric region 7 are positioned closer to the objective interconnection 6, whereby the detector 10 can detect only the magnetic field extremely adjacent to the objective interconnection 6 without, however, receiving any influence of a disturbing magnetic field generated by the adjacent interconnection. This improves the spatial resolution of the detector 10.

The above electrically conductive strip line pattern 13 is formed by the etching or sputtering process without being hand-made, for which reason it is possible to form highly accurate and largely scaled down magnetic field detector 10.

In detection of the magnetic field, the device 10 is positioned just over the objective interconnection 6 so that the dielectric looped face is in parallel to the objective interconnection 6 and positioned just over the objective interconnection 6. In order to increase the sensitivity of the device 10, it is preferable that the electrically conductive strip line pattern 13 extends as long as possible in the direction along which the objective interconnection 6 extends unless a spatial resolution of the detector is deteriorated due to a high frequency of the magnetic field generated by the objective interconnection 6. In order to ensure a high spatial resolution of the device 10, it is preferable that the electrically conductive strip line pattern 13 extends as close as possible to the bottom side of the multilayer substrate body 8 of the device 10 so that the dielectric looped face receives the magnetic field in the vicinity of the objective interconnection 6 without, however, receiving any substantive influence of the disturbing magnetic field generated by the adjacent interconnection.

The provision of the fixing layer 3 allows securely electrical and mechanical connection of the detector 10 to the external coaxial line 4.

As a modification, it is also possible to provide a terminating resistance at the second end "B" of the electrically conductive strip line pattern 13 to obtain a non-reflective terminal.

Figure 3B:
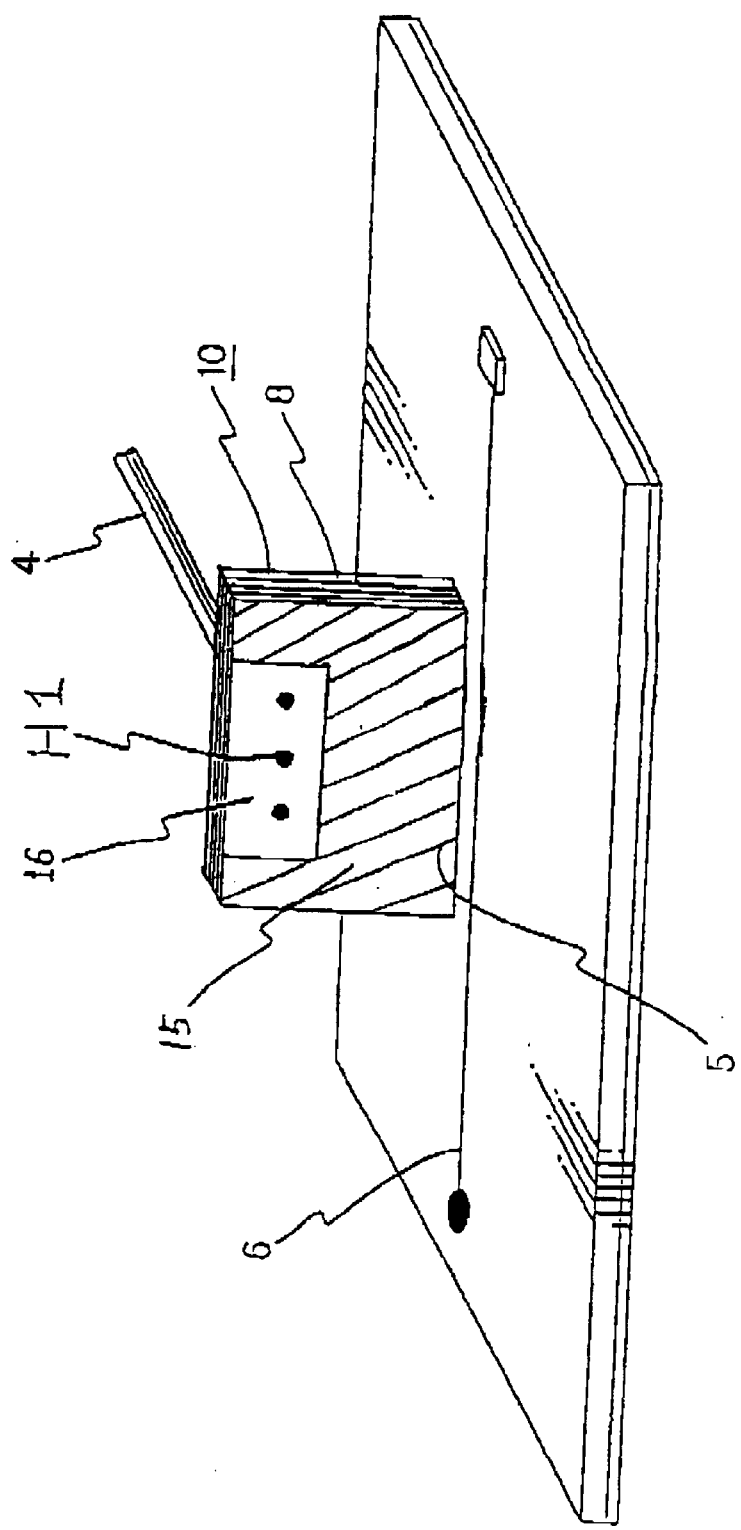
FIG. 3B is a schematic perspective view illustrative of a novel strip line shielded loop magnetic detector having a multilayer substrate body comprising two ground layers, a signal layer and two fixing layers in a first preferred modification to the first embodiment in accordance with the present invention.
Figure 4D:
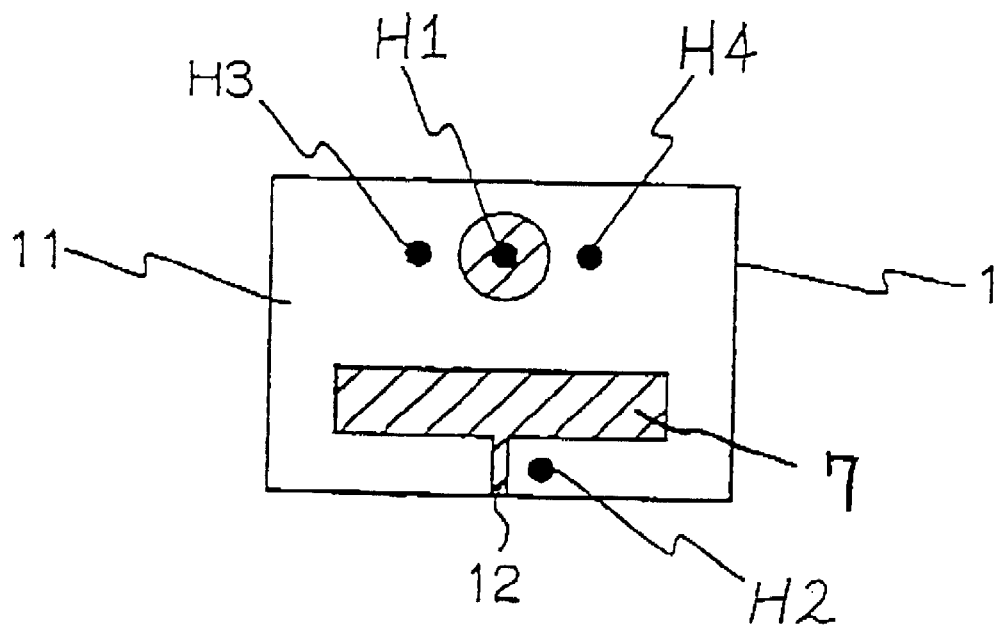
FIG. 4D is a plane view illustrative of each of two ground layers in a multilayer substrate body of a novel strip line shielded loop magnetic detector in a first preferred modification to the first embodiment in accordance with the present invention.
Figure 4E:
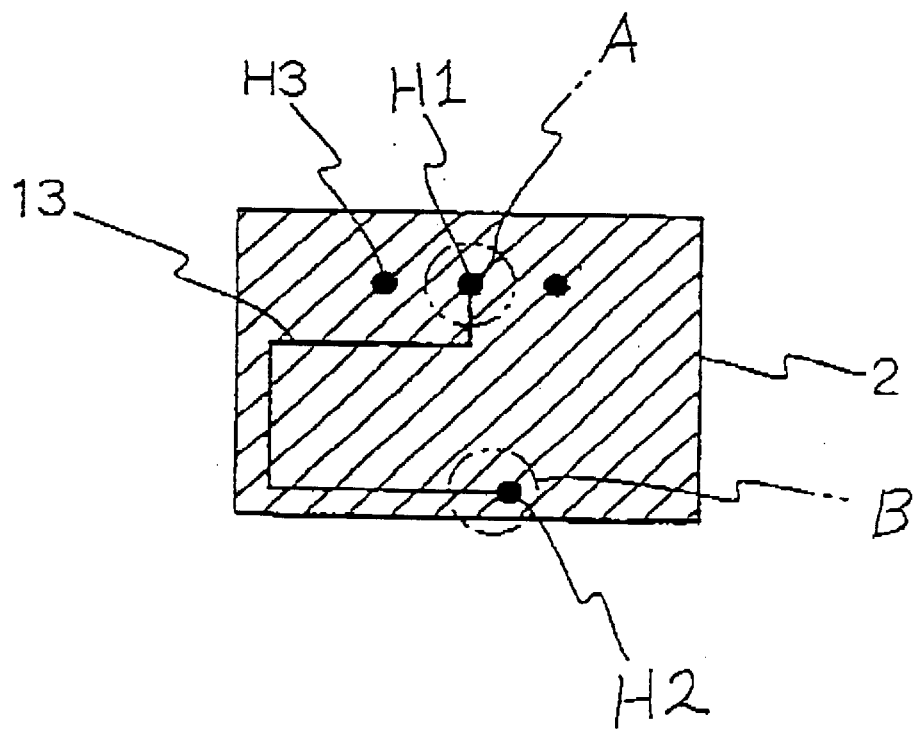
FIG. 4E is a plane view illustrative of a signal layer in a multilayer substrate body of a novel strip line shielded loop magnetic detector in a first preferred modification to the first embodiment in accordance with the present invention.
Figure 4F:
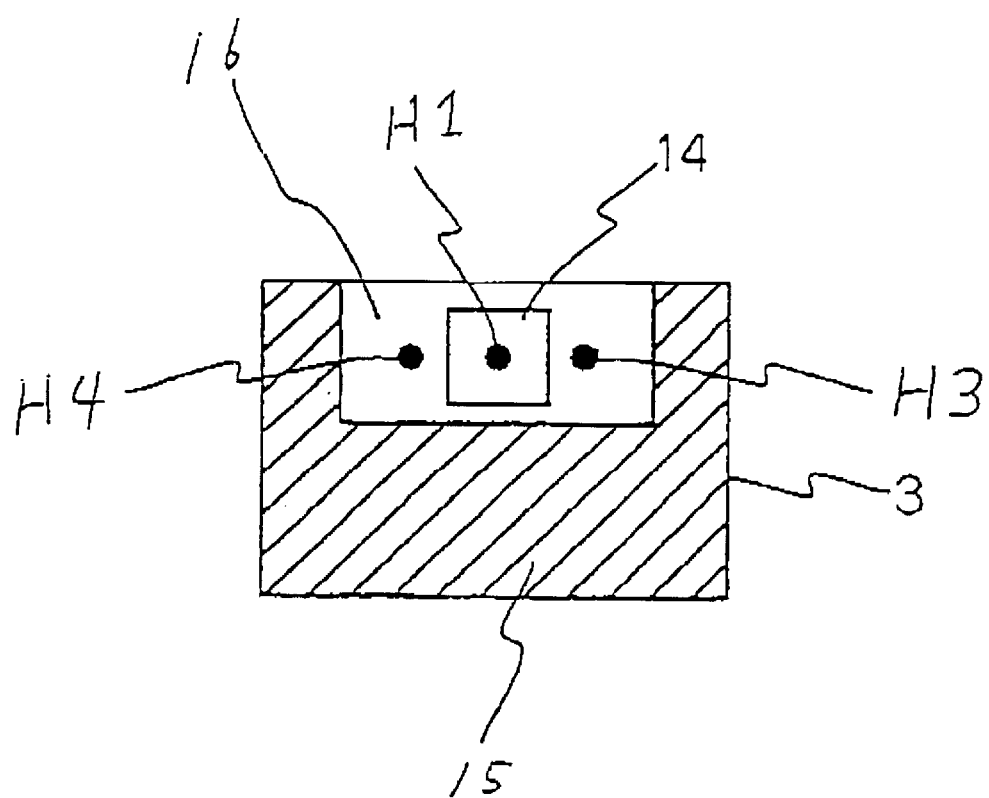
FIG. 4F is a plane view illustrative of a primary fixing layer in a multilayer substrate body of a novel strip line shielded loop magnetic detector in a first preferred modification to the first embodiment in accordance with the present invention.
Figure 4G:
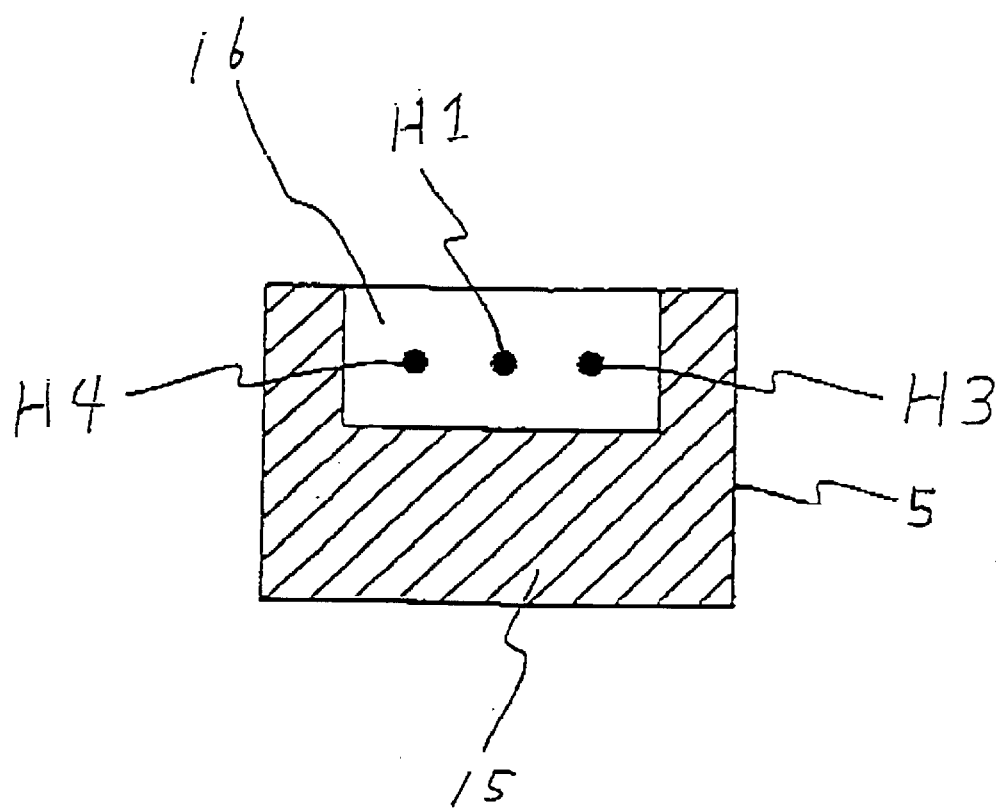
FIG. 4G is a plane view illustrative of a secondary fixing layer in a multilayer substrate body of a novel strip line shielded loop magnetic detector in a first preferred modification to the first embodiment in accordance with the present invention.
Figure 4H:
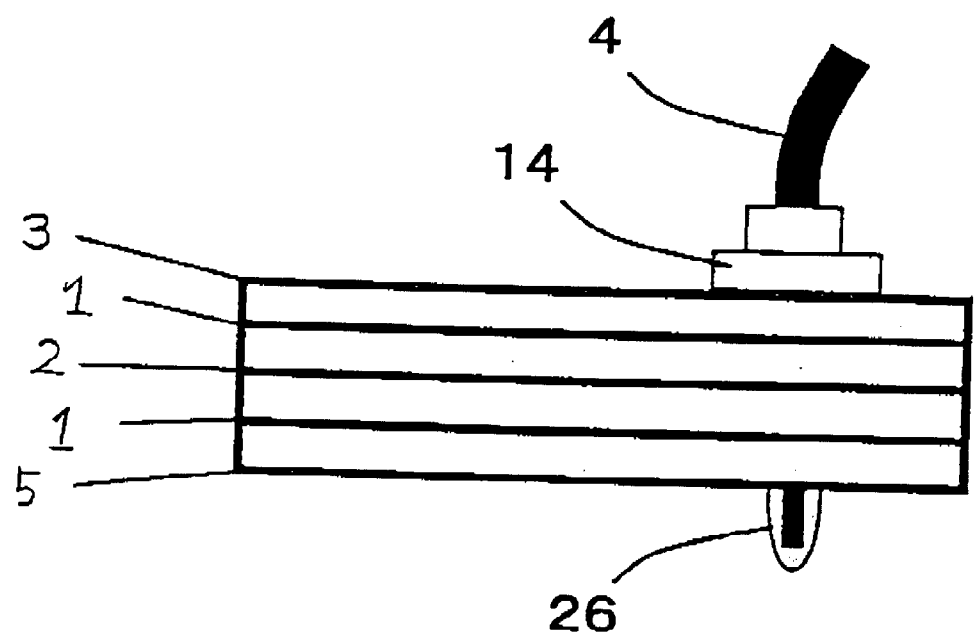
FIG. 4H is a cross sectional elevation view illustrative of a lamination structure of the multilayer substrate body of a novel strip line shielded loop magnetic detector in a first preferred modification to the first embodiment in accordance with the present invention.

A first preferred modification to the above first embodiment will subsequently be described with reference to FIGS. 3B, 4D, 4E, 4F, 4G and 4H, wherein a secondary fixing layer is additionally provided in contact with a first ground layer, so that the first layer is sandwiched between the signal layer and the secondary fixing layer, whereby the primary and secondary fixing layers sandwich the first and second ground layers which further sandwich the signal layer. FIG. 3B is a schematic perspective view illustrative of a novel strip line shielded loop magnetic detector having a multilayer substrate body comprising two ground layers, a signal layer and two fixing layers in a first preferred modification to the first embodiment in accordance with the present invention. FIG. 4D is a plane view illustrative of each of two ground layers in a multilayer substrate body of a novel strip line shielded loop magnetic detector in a first preferred modification to the first embodiment in accordance with the present invention. FIG. 4E is a plane view illustrative of a signal layer in a multilayer substrate body of a novel strip line shielded loop magnetic detector in a first preferred modification to the first embodiment in accordance with the present invention. FIG. 4F is a plane view illustrative of a primary fixing layer in a multilayer substrate body of a novel strip line shielded loop magnetic detector in a first preferred modification to the first embodiment in accordance with the present invention. FIG. 4G is a plane view illustrative of a secondary fixing layer in a multilayer substrate body of a novel strip line shielded loop magnetic detector in a first preferred modification to the first embodiment in accordance with the present invention. FIG. 4H is a cross sectional elevation view illustrative of a lamination structure of the multilayer substrate body of a novel strip line shielded loop magnetic detector in a first preferred modification to the first embodiment in accordance with the present invention.

The description of the first preferred modification will focus on the differences from the above first embodiment. With reference to FIGS. 3B, 4D, 4E, 4F, 4G, and 4H, a secondary fixing layer 5 is additionally provided in contact with the first ground layer 1, so that the first ground layer 1 is sandwiched between the signal layer 2 and the secondary fixing layer 5, provided that lamination structures of the first ground layer 1, the signal layer 2, the second ground layer 1 and the primary fixing layer 3 are the same as in the above first embodiment. Namely, in the above first embodiment, the multilayer structure comprises the single signal layer, the single fixing layer and the two ground layers. By contrast, in this first preferred modification to the above first embodiment, the multilayer structure comprises the single signal layer, the two fixing layers and the two ground layers. In detail, the signal layer 2 is sandwiched between the first and second ground layers 1. The first and second ground layers 1 are further sandwiched between the primary and secondary fixing layers 3 and 4, wherein the primary fixing layer 3 is in contact with the second ground layer 1 and the secondary fixing layer 5 is in contact with the first ground layer 1. A connector 14 is provided on the primary ground layer 1 so that a external coaxial line 4 is connected through the connector 14 and through the first via hole H1 penetrating the primary fixing layer 3, the second ground layer 1, and the signal layer 2, the first ground layer 1 and the secondary fixing layer 5 to a solder 26 on the secondary fixing layer 5. The secondary fixing layer 5 is structurally different from the primary fixing layer 3 only in that the connector 14 is not provided. Namely, the secondary fixing layer 5 also has a first via hole H1 which is positioned in correspondence with the first via hole H1 of the first ground layer 1. The secondary fixing layer 5 also has a third via hole H3 which is positioned in correspondence with the third via hole H3 of the first ground layer 1. The secondary fixing layer 5 also has a fourth via hole H4 which is positioned in correspondence with the fourth via hole H4 of the first ground layer 1. The secondary fixing layer 5 comprises a dielectric region 15 entirely extending except in the vicinity of the first, third and fourth via holes H1, H3 and H4. The secondary fixing layer 5 has a dielectric region 15 entirely extending except for a rectangle-shaped conductive region 16 which includes the third and fourth via holes H1, H3 and H4.

An additional provision of the secondary fixing layer 5 provides the following advantages. The secondary fixing layer 5 has almost the same dielectric and conductive region patterns as the primary fixing layer 3. Further, the primary and secondary fixing layers 3 and 5 sandwich the second and first ground layers 1 which further sandwich the single signal layer 2. The additional provision of the secondary fixing layer 5 improves the symmetry in conductive and dielectric region patterns in the thickness direction vertical to the surfaces of the above laminated layers 1, 2, 3 and 5, thereby improving the stability in signal transmission on the electrically conductive strip line pattern 13 of the signal layer 2. Further, the secondary fixing layer 5 is provided for covering the first ground layer 1, whereby the secondary fixing layer 5 protects the conductive and dielectric patterns of the first ground layer 1. Furthermore, the additional provision of the secondary fixing layer 5 forms five-layered lamination structures. The increase in the number of the lamination layers improves the mechanical strength of the multilayer structure, thereby suppressing the multilayer structure from being bent.

Second Embodiment

Figure 5:
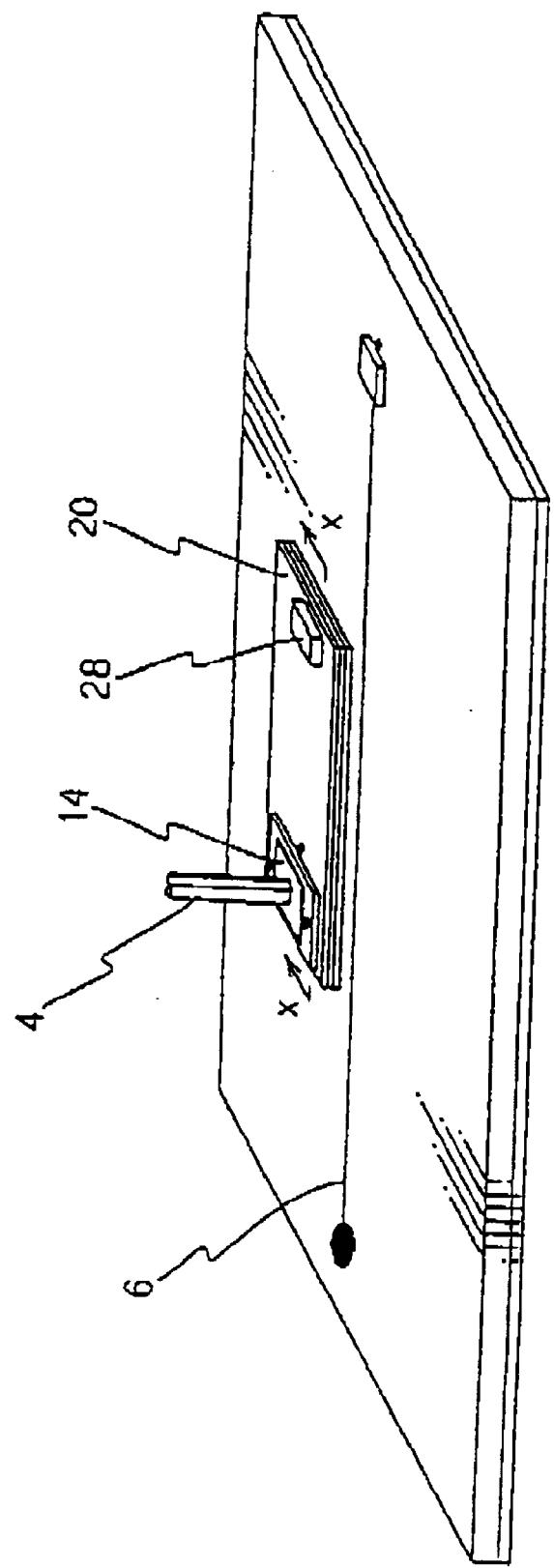
FIG. 5 is a schematic perspective view illustrative of a novel micro-strip line loop magnetic detector having a multilayer substrate body comprising a ground layer, first and second signal, layers sandwiching the ground layer and a fixing layer in contact with the second signal layer in a second embodiment in accordance with the present invention.
Figure 6A:
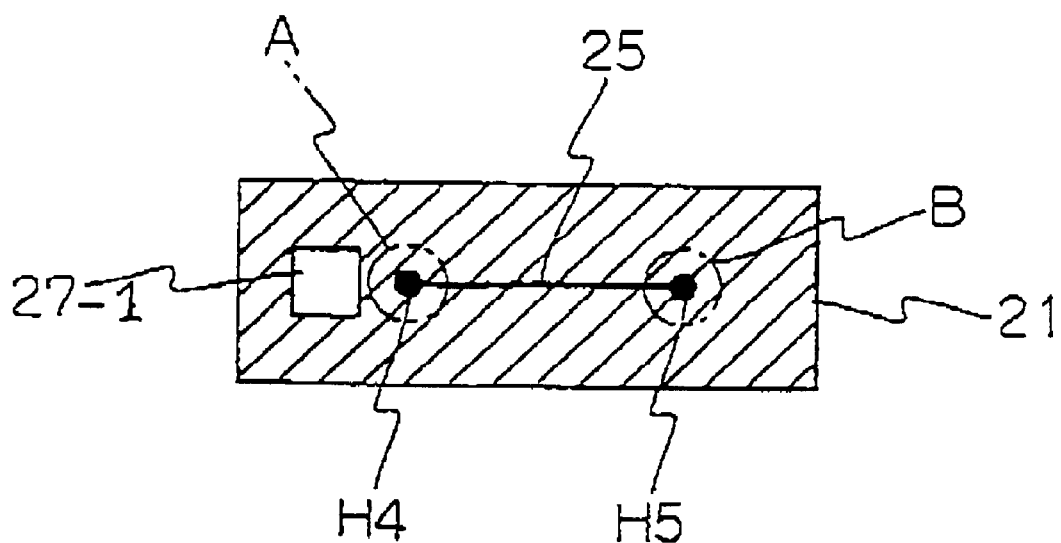
FIG. 6A is a plane view illustrative of a first signal layer in a multilayer substrate body of a novel micro-strip line loop magnetic detector in a second embodiment in accordance with the present invention.
Figure 6B:
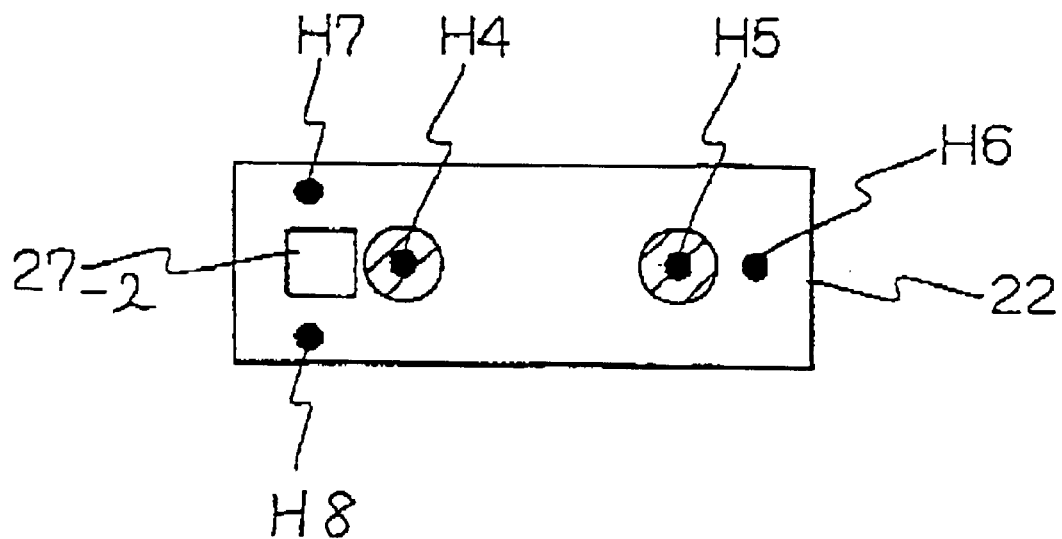
FIG. 6B is a plane view illustrative of a ground layer in a multilayer substrate body of a novel micro-strip line loop magnetic detector in a second embodiment in accordance with the present invention.
Figure 6C:
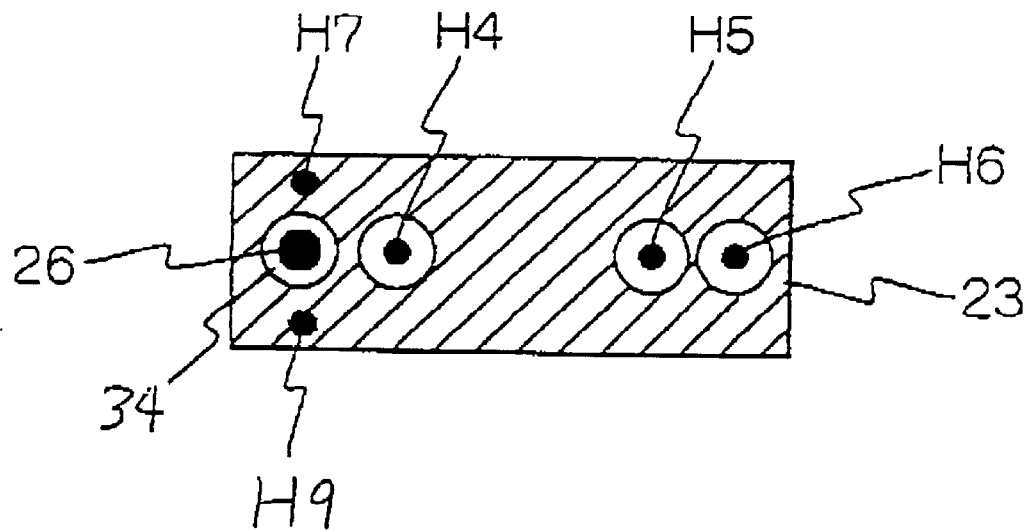
FIG. 6C is a plane view illustrative of a second signal layer in a multilayer substrate body of a novel micro-strip line loop magnetic detector in a second embodiment in accordance with the present invention.
Figure 6D:
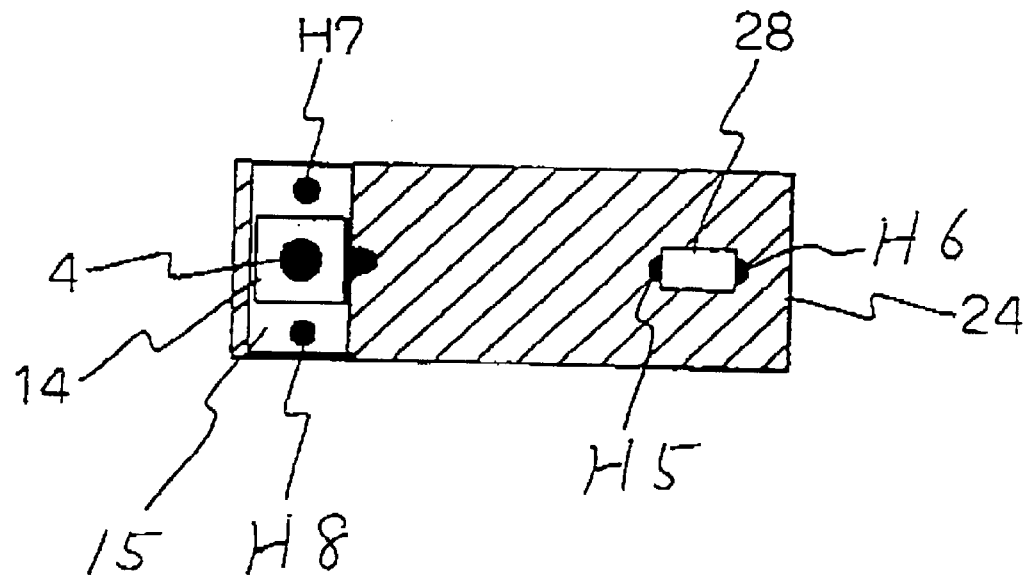
FIG. 6D is a plane view illustrative of a fixing layer in a multilayer substrate body of a novel micro-strip line loop magnetic detector in a second embodiment in accordance with the present invention.
Figure 7:
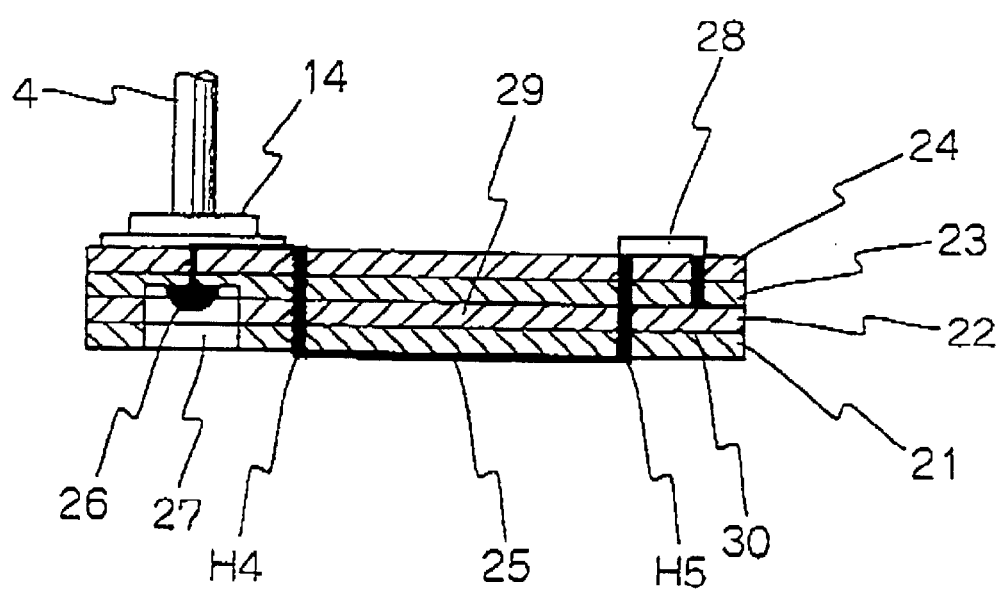
FIG. 7 is a cross sectional elevation view illustrative of a novel micro-strip line loop magnetic detector having an electrically conductive micro-strip line pattern extending through a multilayer substrate body comprising a ground layer, first and second signal layers sandwiching the ground layer and a fixing layer in contact with the second signal layer in a second embodiment in accordance with the present invention.

A second embodiment according to the present invention will be described in detail with reference to FIGS. 5, 6A, 6B, 6C, 6D and 7. FIG. 5 is a schematic perspective view illustrative of a novel micro-strip line loop magnetic detector having a multilayer substrate body comprising a ground layer, first and second signal layers sandwiching the ground layer and a fixing layer in contact with the second signal layer in a second embodiment in accordance with the present invention. FIG. 6A is a plane view illustrative of a first signal layer in a multilayer substrate body of a novel micro-strip line loop magnetic detector in a second embodiment in accordance with the present invention. FIG. 6B is a plane view illustrative of a ground layer in a multilayer substrate body of a novel micro-strip line loop magnetic detector in a second embodiment in accordance with the present invention. FIG. 6C is a plane view illustrative of a second signal layer in a multilayer substrate body of a novel micro-strip line loop magnetic detector in a second embodiment in accordance with the present invention. FIG. 6D is a plane view illustrative of a fixing layer in a multilayer substrate body of a novel micro-strip line loop magnetic detector in a second embodiment in accordance with the present invention. FIG. 7 is a cross sectional elevation view illustrative of a novel micro-strip line loop magnetic detector having an electrically conductive micro-strip line pattern extending through a multilayer substrate body comprising a ground layer, first and second signal layers sandwiching the ground layer and a fixing layer in contact with the second signal layer in a second embodiment in accordance with the present invention.

The novel device 20 for detecting a magnetic field has a multilayer substrate body comprising laminations of a first signal layer 21, a ground layer 22, a second signal layer 23 and a fixing layer 24.

The first signal layer 21 is made of a dielectric substance. The first signal layer 21 has an opposite surface to a contact surface in contact with the ground layer 22. The first signal layer 21 has an electrically conductive micro-strip line pattern 25 which extends in a shape of a first straight line segment on the opposite surface. The first signal layer 21 has first and second via holes H4 and H5 formed at first and second ends of the first straight line segment of the electrically conductive micro-strip line pattern 25 respectively. The first straight line segment of the electrically conductive micro-strip line pattern 25 extends on a longitudinal center line of the first signal layer 21. The first signal layer 21 further has a square-shaped opening 27-1 which is positioned outside of the first end "A" of the first straight line segment of the electrically conductive micro-strip line pattern 25. The square-shaped opening 27-1 is positioned on the longitudinal center line of the first signal layer 21.

The ground layer 22 comprises an electrically conductive region having first and second via holes H4 and H5 which are positioned in correspondence with the first and second via holes H4 and H5 of the first signal layer 21. The ground layer 22 further has first and second isolation regions around the first and second via holes H4 and H5 respectively, so that the first and second via holes H4 and H5 are electrically isolated from the electrically conductive region of the ground layer 22. The ground layer 22 furthermore has a square-shaped opening 27-2 which is positioned outside of the first isolation region around the first via hole H4. The position of the square-shaped opening 27-2 of the ground layer 22 is correspondent to the square-shaped opening 27-1 of the first signal layer 21. The ground layer 22 still further has a third via hole H6 which is positioned outside of the second isolation region around the second via hole H5. The first, second and third via holes H4, H5 and H6 and the square-shaped opening 27-2 are aligned on the longitudinal center line of the ground layer 22. The ground layer 22 further has fourth and fifth via holes H7 and H8 which are positioned in opposite sides of the square-shaped opening 27-2, so that the fourth and fifth via holes H7 and H8 and the square-shaped opening 27-2 are aligned on a line perpendicular to the longitudinal center line of the ground layer.

The second signal layer 23 is made of a dielectric substance. The second signal layer 23 has first, second, third, fourth and fifth via holes H4, H5, H6, H7 and H8 which are positioned in correspondence with the first, second, third, fourth and fifth via holes H4, H5, H6, H7 and H8 of the ground layer 22. The second signal layer 23 further has a pad 34 which is positioned in correspondence with the square-shaped opening 27-2 of the ground layer 22. A solder 26 is provided on the pad 34 for connecting a first extending micro-strip line pattern from the electrically conductive micro-strip line pattern 25 and an extending signal line from an external coaxial line 4. The second signal layer 23 has first, second and third conductive regions around the first, second and third via holes H4, H5 and H6 respectively.

The fixing layer 24 is made of a dielectric substance. The fixing layer 24 has first, second, third, fourth and fifth via holes H4, H5, H6, H7 and H8 which are positioned in correspondence with the first, second, third, fourth and fifth via holes H4, H5, H6, H7 and H8 of the second signal layer 23. The fixing layer 24 has a connector 14 for connecting the external coaxial line 4 at the corresponding position to the conductive pad 34 of the second signal layer 23. The fixing layer 24 has an electrically conductive pad 15 which extends over the fourth and fifth via holes H7 and H8. The connector 14 is provided on this electrically conductive pad 15. The fixing layer 24 furthermore has a chip resistance 28 between the second and third via holes H5 and H6.

With reference to FIG. 7, the electrically conductive micro-strip line pattern 25 has not only the above described first straight line segment on the bottom surface of the first signal layer 21 but also second and third straight line segments which extend within the first and second via holes respectively to penetrate the first signal layer 21, the ground layer 22, the second signal layer 23 and the fixing layer 24, whereby the series connection of the first, second and third line segments of the electrically conductive micro-strip line pattern 25 define a wide U-shape and a dielectric looped face which is rectangular-shaped and surrounded in three quarter of omni-directions, wherein the dielectric looped face is vertical to an interface between the first signal layer 21, the ground layer 22, the second signal layer 23 and the fixing layer 24. The electrically conductive micro-strip line pattern 25 has not only the first, second and third straight line segments but also a first extension to the solder 26 and a second extension from the chip resistance through the third via hole H6 to the ground layer 22, whereby the electrically conductive micro-strip line pattern 25 is electrically connected to the external coaxial line 4 and the electrically conductive region of the ground layer 22.

The measurement of the magnetic field generated by an objective interconnection 6 is carried out by use of the above novel magnetic field detector 20 as follows.

With reference again to FIG. 5, the novel magnetic field detector 20 is positioned so that the bottom surface of the first signal layer 21 of the multilayer substrate body is just over the objective interconnection 6 generating the magnetic field which is intended to be measured, wherein the bottom surface of the first signal layer 21 of the multilayer substrate body faces toward the objective interconnection 6, and further so that the dielectric looped face defined by the electrically conductive micro-strip line pattern 25 is also in parallel to the objective interconnection 6 and just over the objective interconnection 6. As a result, the magnetic flux in the vicinity of the objective interconnection 6 penetrates the rectangular-shaped dielectric looped face defined by the electrically conductive micro-strip line pattern 25. As a result, even if an adjacent interconnection not illustrated is positioned very close to the objective interconnection 6 and this adjacent interconnection generates an additional magnetic field, then the magnetic flux generated by the objective interconnection 6 penetrates the dielectric looped face defined by the electrically conductive micro-strip line pattern 25, whilst the magnetic flux generated by the adjacent interconnection does not penetrate the dielectric looped face defined by the electrically conductive micro-strip line pattern 25, for which reason the novel magnetic field detector 20 is capable of selectively detecting only the magnetic field generated by the objective interconnection 6 without receiving any substantive disturbance due to the magnetic field generated by the adjacent interconnection.

The above electrically conductive micro-strip line pattern 25 may be formed by an etching process or a sputtering process. This structure enables a remarkable scaling down of the detector body. Particularly, the above structure enables the dielectric looped face surrounded by the electrically conductive micro-strip line pattern 25 to be positioned extremely adjacent to the objective interconnection 6 which generates the magnetic field to be measured, so that even if any adjacent interconnection not illustrated is positioned very close to the objective interconnection 6, the above novel magnetic field detector 20 is capable of detecting only the magnetic field generated by the objective interconnection 6 without, however, receiving any influence of a disturbing magnetic field generated by the adjacent interconnection. The above electrically conductive micro-strip line pattern is formed to position the dielectric looped face closer to the bottom side of the multilayer substrate body so that the dielectric looped face is positioned closer to the objective interconnection 6, whereby the detector 20 can detect only the magnetic field extremely adjacent to the objective interconnection 6 without, however, receiving any influence of a disturbing magnetic field generated by the adjacent interconnection. This improves the spatial resolution of the detector 20.

The above electrically conductive micro-strip line pattern 25 is formed by the etching or sputtering process without being hand-made, for which reason it is possible to form highly accurate and largely scaled down magnetic field detector 20.

In detection of the magnetic field, the device 20 is positioned just over the objective interconnection 6 so that the dielectric looped face is in parallel to the objective interconnection 6 and positioned just over the objective interconnection 6. In order to increase the sensitivity of the device 20, it is preferable that the electrically conductive micro-strip line pattern 25 extends as long as possible in the direction along which the objective interconnection 6 extends unless a spatial resolution of the detector 20 is deteriorated due to a high frequency of the magnetic field generated by the objective interconnection 6. In order to ensure a high spatial resolution of the device 20, it is preferable that the electrically conductive micro-strip line pattern 25 extends as close as possible to the bottom surface of the first signal layer 21 of the multilayer substrate body of the device 20 so that the dielectric looped face receives the magnetic field in the vicinity of the objective interconnection 6 without, however, receiving any substantive influence of the disturbing magnetic field generated by the adjacent interconnection.

The provision of the fixing layer 23 allows securely electrical and mechanical connection of the detector 20 to the external coaxial line 4.

Third Embodiment

Figure 8:
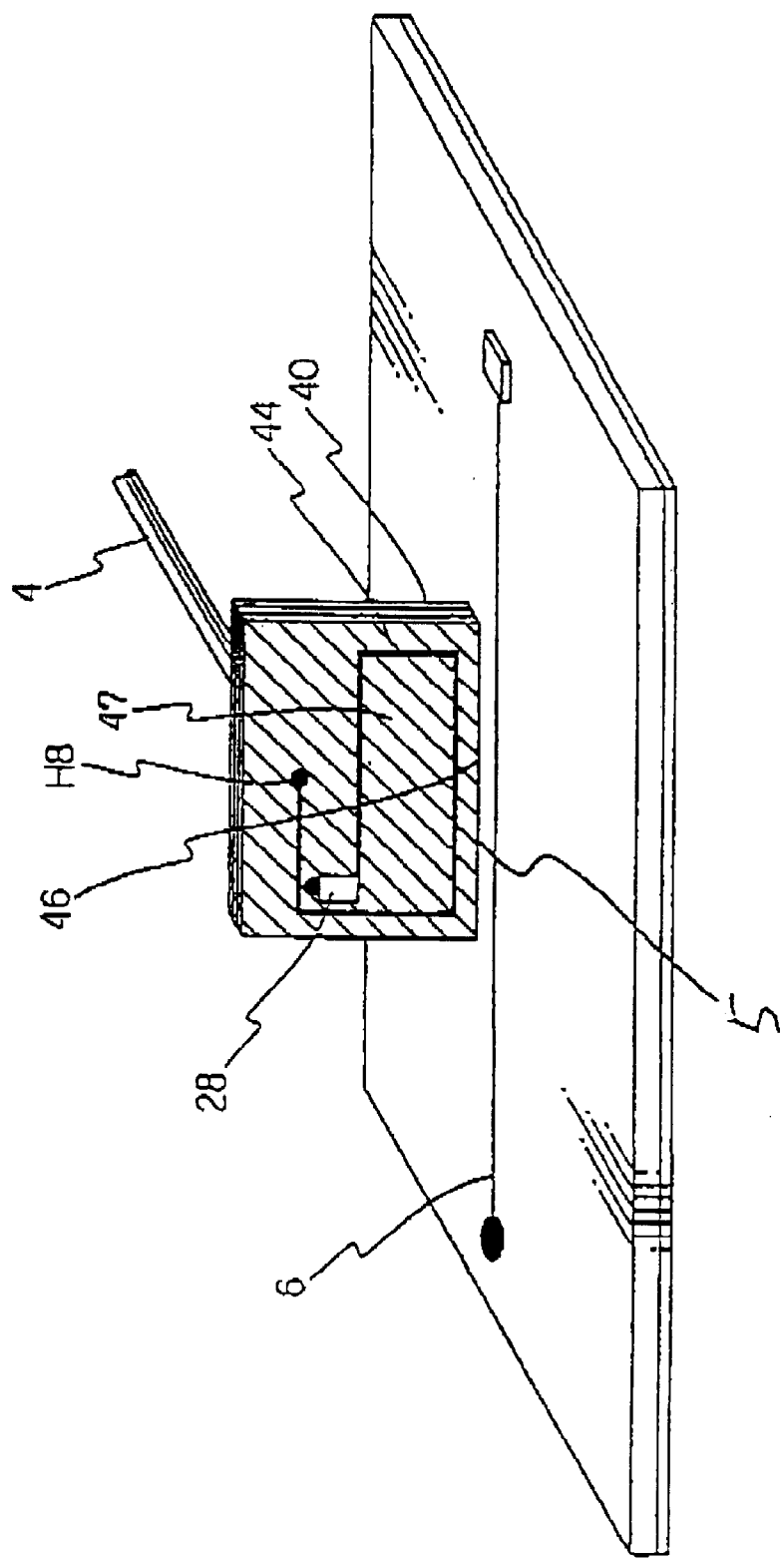
FIG. 8 is a schematic perspective view illustrative of a novel micro-strip line magnetic detector having a multilayer substrate body comprising a ground layer, a signal layer and a fixing layer in a third embodiment in accordance with the present invention.
Figure 9A:
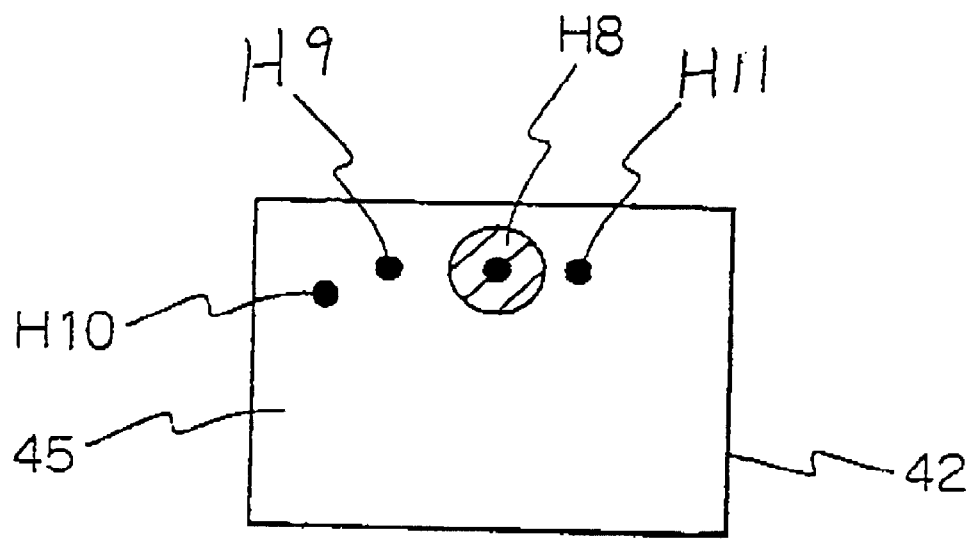
FIG. 9A is a plane view illustrative of a signal layer in a multilayer substrate body of a novel micro-strip line magnetic detector in a third embodiment in accordance with the present invention.
Figure 9B:
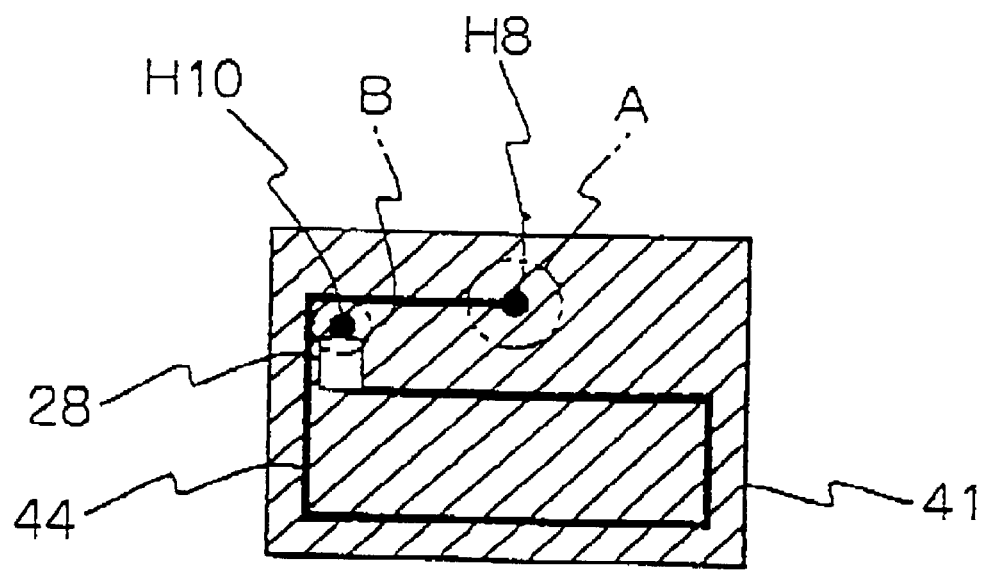
FIG. 9B is a plane view illustrative of a ground layer in a multilayer substrate body of a novel micro-strip line magnetic detector in a third embodiment in accordance with the present invention.
Figure 9C:
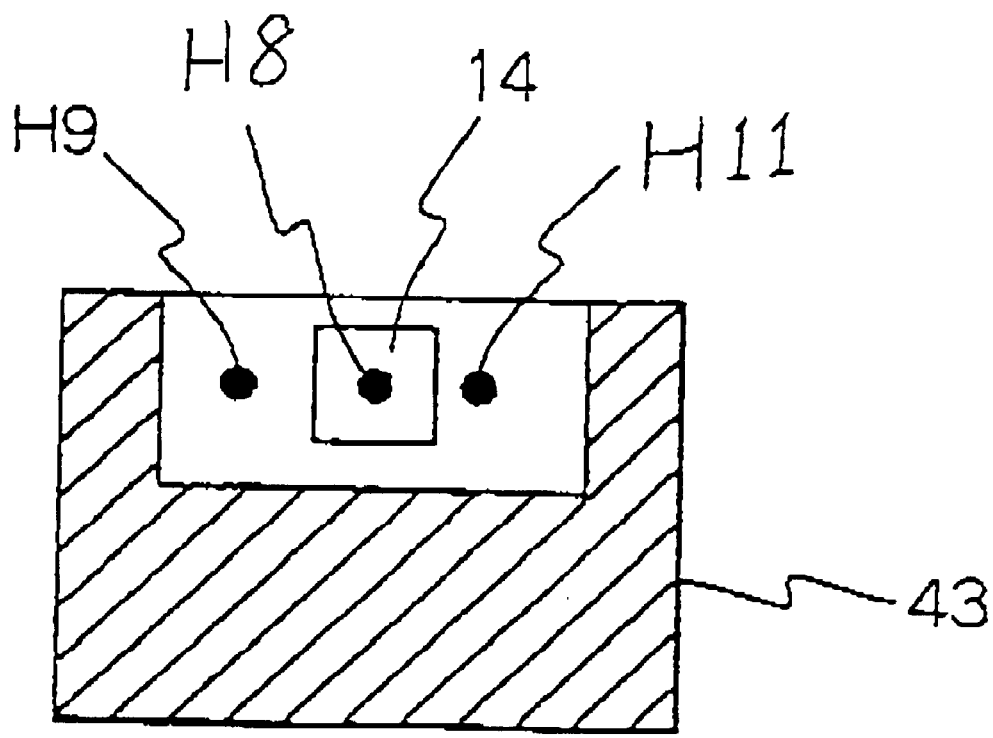
FIG. 9C is a plane view illustrative of a fixing layer in a multilayer substrate body of a novel micro-strip line magnetic detector in a third embodiment in accordance with the present invention.

A third embodiment according to the present invention will be described in detail with reference to FIGS. 8, 9A, 9B and 9C. FIG. 8 is a schematic perspective view illustrative of a novel micro-strip line magnetic detector having a multilayer substrate body comprising a ground layer, a signal layer and a fixing layer in a third embodiment in accordance with the present invention. FIG. 9A is a plane view illustrative of a signal layer in a multilayer substrate body of a novel micro-strip line magnetic detector in a third embodiment in accordance with the present invention. FIG. 9B is a plane view illustrative of a ground layer in a multilayer substrate body of a novel micro-strip line magnetic detector in a third embodiment in accordance with the present invention. FIG. 9C is a plane view illustrative of a fixing layer in a multilayer substrate body of a novel micro-strip line magnetic detector in a third embodiment in accordance with the present invention.

The device for detecting a magnetic field has a multilayer substrate body comprising laminations of a signal layer 41, a ground layer 42 and a fixing layer 43.

The signal layer 41 is made of a dielectric substance. The signal layer 41 has an opposite surface to a contact surface in contact with the ground layer 42. The signal layer 41 has an electrically conductive micro-strip line pattern 44 which extends in the form of a generally rectangular shape comprising series connections of straight line segments on the opposite surface, thereby to form a dielectric looped face surrounded in almost omni-directions by the straight line segments. The dielectric looped face is parallel to an interface between the signal layer 41 and the ground layer 42. The signal layer 41 has first and second via holes H8 and H10 formed at first and second ends "A" and "B" of the electrically conductive micro-strip line pattern 44. The signal layer 41 further has a chip resistance 28 which is connected with the second via hole H10 so that the electrically conductive micro-strip line pattern 44 is connected through the chip resistance 28 to the electrically conductive region 45 of the ground layer 42, wherein the chip resistance serves as a terminating resistance.

The ground layer 42 comprises an electrically conductive region 45 so that the second end "B" of the electrically conductive micro-strip line pattern 44 is electrically connected to the electrically conductive region 45 of the ground layer 42, whereby the electrically conductive region 45 of the ground layer 42 serves as a ground. The ground layer 42 has first and second via holes H8 and H10 at corresponding positions to the first and second via holes H8 and H10 of the signal layer 41, so that the first end "A" of the electrically conductive micro-strip line pattern 44 is electrically connected to an external coaxial line 4. The ground layer 42 further has an isolation region around the first via hole H8 so that the first via hole H8 of the ground layer 42 is electrically isolated by the isolation region from the electrically conductive region 45 of the ground layer 42. The ground layer 42 furthermore has third and fourth via holes H9 and H11 which are positioned in opposite sides of the isolation region around the first via hole H8, so that the first, third and fourth via holes H8, H9 and H11 are aligned in horizontal direction.

The fixing layer 43 is provided in contact with the ground layer 42 for the purpose exclusively of fixing the external coaxial line 4. The fixing layer 43 has a connector 14 for connecting the external coaxial line 4. The fixing layer 43 also has a first via hole H8 which is positioned in correspondence with the first via hole H8 of the ground layer 42. The fixing layer 43 also has a third via hole H9 which is positioned in correspondence with the third via hole H9 of the ground layer 42. The fixing layer 43 also has a fourth via hole H10 which is positioned in correspondence with the fourth via hole H10 of the ground layer 42. The connector 14 is positioned in correspondence with the first via hole H8 so that the first end "A" of the electrically conductive micro-strip line pattern 44 is electrically connected through the first via hole H8 to the external coaxial line 4 connected by the connector 14 to the first via hole H8. The fixing layer 43 comprises a dielectric region entirely extending except in the vicinity of the first, third and fourth via holes H8, H9 and H10.

The first end "A" of the electrically conductive micro-strip line pattern 44 of the signal layer 41 is connected through the first via hole H8 to the external coaxial line 4. The second end "B" of the electrically conductive micro-strip line pattern 44 is connected through the second via hole H10 to the electrically conductive region 45 of the ground layer 42.

The measurement of the magnetic field generated by an objective interconnection 6 is carried out by use of the above novel magnetic field detector 40 as follows.

With reference again to FIG. 8, the novel magnetic field detector 40 is positioned so that the bottom side 5 of the multilayer substrate body is just over the objective interconnection 6 generating the magnetic field which is intended to be measured, wherein the bottom side 5 of the multilayer substrate body is in parallel to the objective interconnection 6, so that the dielectric looped face defined by the electrically conductive micro-strip line pattern 44 of the signal layer 41 is also in parallel to the objective interconnection 6. Further, the dielectric looped face defined by the electrically conductive strip line pattern 44 of the signal layer 41 is positioned in the vicinity of the objective interconnection 6, so that the magnetic flux in the vicinity of the objective interconnection 6 penetrates the dielectric looped face defined by the electrically conductive micro-strip line pattern 44. As a result, even if an adjacent interconnection not illustrated is positioned very close to the objective interconnection 6 and this adjacent interconnection generates an additional magnetic field, then the magnetic flux generated by the objective interconnection 6 penetrates the dielectric looped face defined by the electrically conductive micro-strip line pattern 44, whilst the magnetic flux generated by the adjacent interconnection does not penetrate the dielectric looped face defined by the electrically conductive micro-strip line pattern 44, for which reason the novel magnetic field detector 40 is capable of selectively detecting only the magnetic field generated by the objective interconnection 6 without receiving any substantive disturbance due to the magnetic field generated by the adjacent interconnection.

The above electrically conductive micro-strip line pattern 44 may be formed by an etching process or a sputtering process. This structure enables a remarkable scaling down of the detector body. Particularly, the above structure enables the dielectric looped face surrounded by the electrically conductive micro-strip line pattern 44 to be positioned extremely adjacent to the objective interconnection 6 which generates the magnetic field to be measured, so that even if any adjacent interconnection not illustrated is positioned very close to the objective interconnection 6, the above novel magnetic field detector 40 is capable of detecting only the magnetic field generated by the objective interconnection 6 without, however, receiving any influence of a disturbing magnetic field generated by the adjacent interconnection. The above electrically conductive micro-strip line pattern 44 is formed to position the dielectric looped face closer to the bottom side of the multilayer substrate body so that the dielectric looped face is positioned closer to the objective interconnection 6, whereby the detector 40 can detect only the magnetic field extremely adjacent to the objective interconnection 6 without, however, receiving any influence of a disturbing magnetic field generated by the adjacent interconnection. This improves the spatial resolution of the detector 40.

The above electrically conductive micro-strip line pattern 44 is formed by the etching or sputtering process without being hand-made, for which reason it is possible to form highly accurate and largely scaled down magnetic field detector 40.

In detection of the magnetic field, the device 40 is positioned just over the objective interconnection 6 so that the dielectric looped face is in parallel to the objective interconnection 6 and positioned just over the objective interconnection 6. In order to increase the sensitivity of the device 40, it is preferable that the electrically conductive micro-strip line pattern 44 extends as long as possible in the direction along which the objective interconnection 6 extends unless a spatial resolution of the detector is deteriorated due to a high frequency of the magnetic field generated by the objective interconnection 6. In order to ensure a high spatial resolution of the device 40, it is preferable that the electrically conductive micro-strip line pattern 44 extends as close to the bottom side of the multilayer substrate body of the device 40 as possible so that the dielectric looped face receives the magnetic field in the vicinity of the objective interconnection 6 without, however, receiving any substantive influence of the disturbing magnetic field generated by the adjacent interconnection.

The provision of the fixing layer 43 allows securely electrical and mechanical connection of the detector 40 to the external coaxial line 4.

Characteristics

Characteristics of the above novel magnetic field detectors in the above first, second and third embodiments were confirmed by measuring a current on the objective interconnection by comparison with the conventional coaxial line shielded loop magnetic field detector under conditions of a dielectric thickness of 0.1 millimeter and a strip line width of 0.16 millimeters and a strip line thickness of 0.035 millimeters as well as a characteristic impedance of 50Ω.

Figure 10:
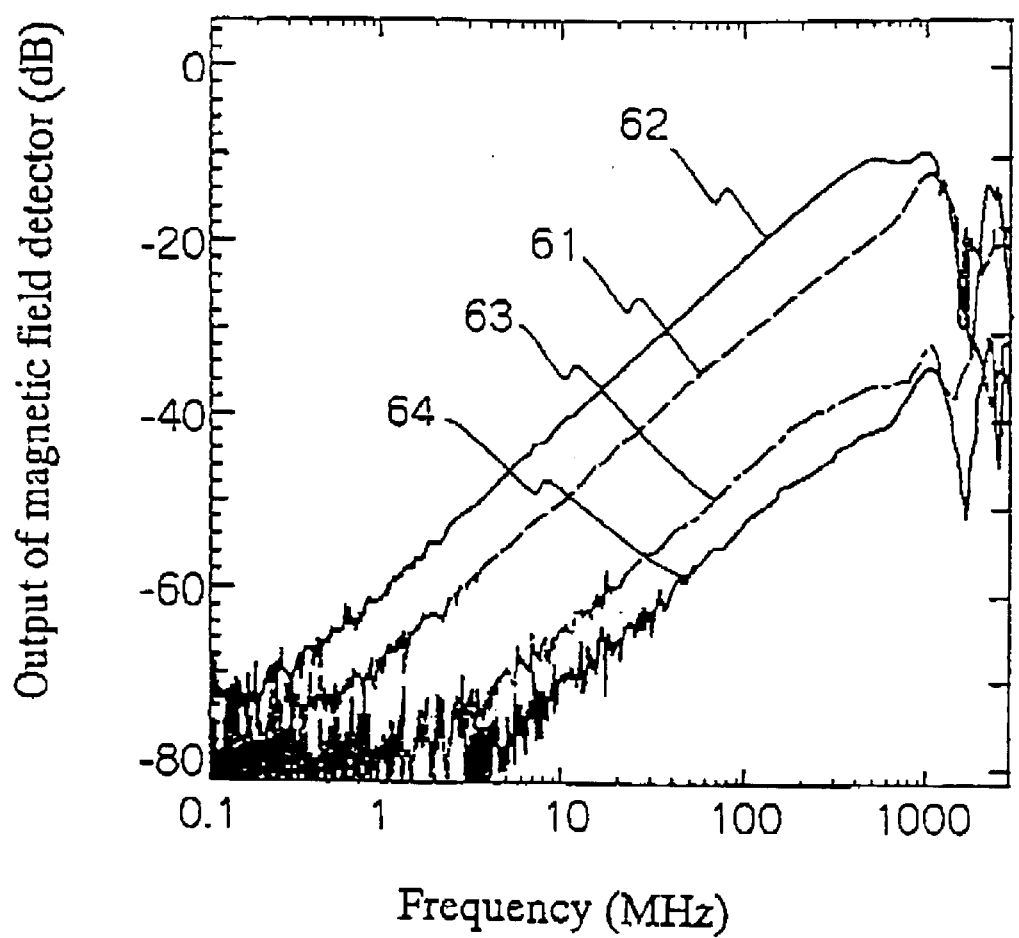
FIG. 10 is a diagram illustrative of variations in outputs of the novel magnetic field detectors of the first, second and third embodiments and the conventional coaxial line shielded loop magnetic field detector over frequencies of a magnetic field to be measured, wherein those detectors are positioned at 0.05 millimeters just over the objective interconnection.

FIG. 10 is a diagram illustrative of variations in outputs of the novel magnetic field detectors of the first, second and third embodiments and the conventional coaxial line shielded loop magnetic field detector over frequencies of a magnetic field to be measured, wherein those detectors are positioned at 0.05 millimeters just over the objective interconnection 6. Fixing those detectors are made by use of a predetermined fixing jig. An input into the objective interconnection 6 is 0 dB. In FIG. 10, a broken line 61 represents a variation in output of the novel strip line shielded loop magnetic field detector 10 in the first embodiment in accordance with the present invention. As the frequency is increased, then the output of the novel strip line shielded loop magnetic field detector 10 in the first embodiment is also simply increased. This means that the novel strip line shielded loop magnetic field detector 10 is operable and functional. A real line 62 represents a variation in output of the novel micro-strip line loop magnetic field detector 20 in the second embodiment in accordance with the present invention. As the frequency is increased, then the output of the novel micro-strip line loop magnetic field detector 20 in the second embodiment is also simply increased. This means that the novel micro-strip line loop magnetic field detector 20 is operable and functional. A short-and-long line 63 represents a variation in output of the novel micro-strip line loop magnetic field detector 40 in the third embodiment in accordance with the present invention. As the frequency is increased, then the output of the novel micro-strip line loop magnetic field detector 40 in the third embodiment is also simply increased. This means that the novel micro-strip line loop magnetic field detector 40 is operable and functional. A real line 64 represents a variation in output of the conventional coaxial shielded loop magnetic field detector in the prior art. As the frequency is increased, then the output of the conventional coaxial shielded loop magnetic field detector is also simply increased. This means that the conventional coaxial shielded loop magnetic field detector is operable and functional.

The novel micro-strip line loop magnetic field detector 20 in the second embodiment has a distance of 0.968 millimeters between a loop center and the objective interconnection 6. The novel micro-strip line loop magnetic field detector 20 in the second embodiment shows the highest output level. This shows that the novel micro-strip line loop magnetic field detector 20 shows the highest sensitivity.

The novel strip line shielded loop magnetic field detector 10 in the first embodiment has a distance of 0.153 millimeters between a loop center and the objective interconnection 6. The novel strip line shielded loop magnetic field detector 10 in the first embodiment shows the second highest output level. This shows that the novel strip line shielded loop magnetic field detector 10 shows the second highest sensitivity.

The novel micro-strip line loop magnetic field detector 40 in the third embodiment has a distance of 0.818 millimeters between a loop center and the objective interconnection 6. The novel micro-strip line loop magnetic field detector 40 in the third embodiment shows the third highest output level. This shows that the novel micro-strip line loop magnetic field detector 40 shows the third highest sensitivity.

The conventional coaxial shielded loop magnetic field detector in the prior art has a distance of 3.168 millimeters between a loop center and the objective interconnection 6. The conventional coaxial shielded loop magnetic field detector in the prior art shows the lowest output level. This shows that the conventional coaxial shielded loop magnetic field detector shows the lowest sensitivity.

The above results of measurements of the outputs of those detectors show it preferable that the loop center is as close to the objective interconnection 6 as possible for the purpose of improvement in the output of the detectors.

Figure 11:
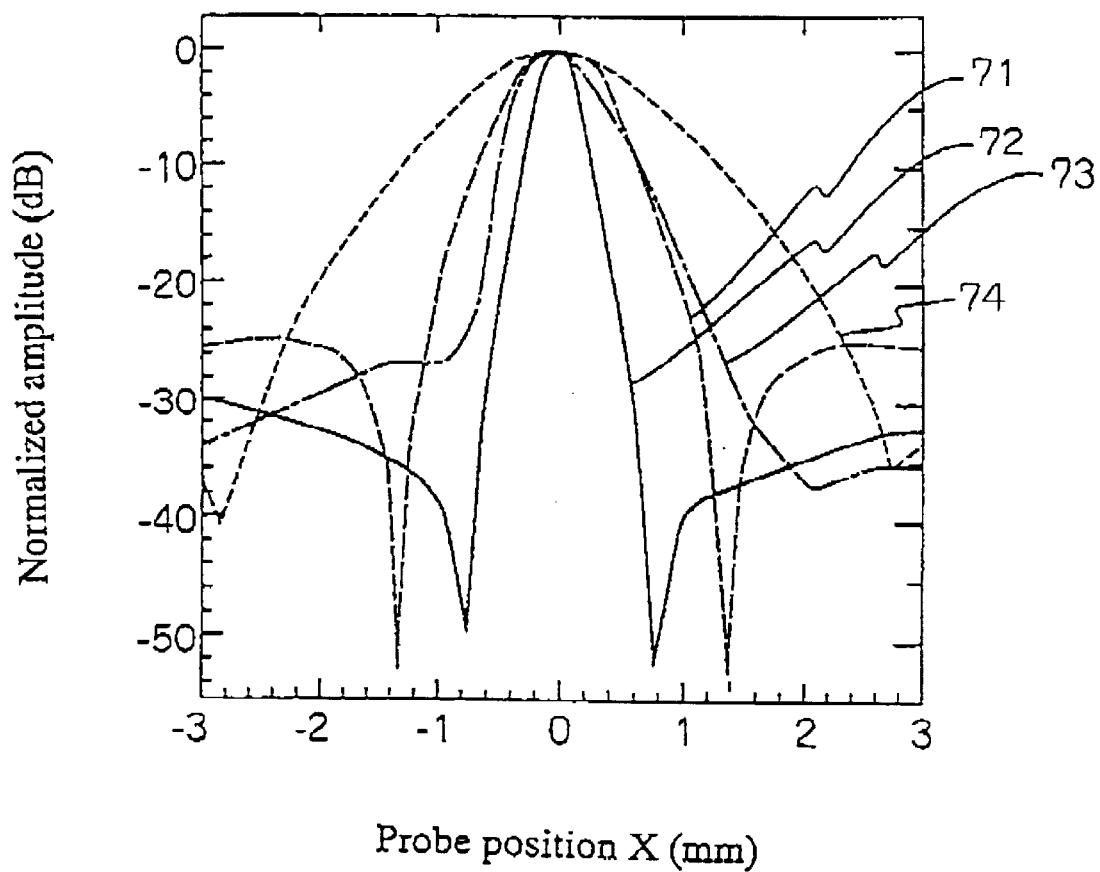
FIG. 11 is a diagram illustrative of variations in magnetic field amplitudes normalized with maximum value over probe positions in a direction perpendicular to the objective micro-strip line.

In order to evaluate the influence to the spatial resolutions of the detectors by disturbance due to the magnetic field generated by the adjacent interconnection, there were measured distributions in the horizontal direction of the magnetic field generated by a micro-strip line. FIG. 11 is a diagram illustrative of variations in magnetic filed amplitudes normalized with maximum value over probe positions in a direction perpendicular to the objective micro-strip line.

A broken line 71 represents variation in normalized amplitude of the magnetic field over probe position for the novel strip line shielded loop magnetic field detector 10 in the first embodiment. When the probe is positioned at the center (x=0 millimeter), the normalized amplitude or intensity of the magnetic field has the maximum value. As the probe position is shifted by 1.4 millimeters from the center (x=0 millimeter), then the normalized amplitude or intensity of the magnetic field is dropped to the minimum value. This means that the magnetic field is concentrated in the range of −1.4 millimeters to +1.4 millimeters.

A real line 72 represents variation in normalized amplitude of the magnetic field over probe position for the novel micro-strip line loop magnetic field detector 20 in the second embodiment. When the probe is positioned at the center (x=0 millimeter), the normalized amplitude or intensity of the magnetic field has the maximum value. As the probe position is shifted by 0.8 millimeters from the center (x=0 millimeter), then the normalized amplitude or intensity of the magnetic field is dropped to the minimum value. This means that the magnetic field is concentrated in the range of −0.8 millimeters to +0.8 millimeters.

A short-and-long line 73 represents variation in normalized amplitude of the magnetic field over probe position for the novel micro-strip line loop magnetic field detector 40 in the third embodiment. When the probe is positioned at the center (x=0 millimeter), the normalized amplitude or intensity of the magnetic field has the maximum value. As the probe position is shifted by 2.0 millimeters from the center (x=0 millimeter), then the normalized amplitude or intensity of the magnetic field is dropped to the minimum value. This means that the magnetic field is concentrated in the range of −2.0 millimeters to +2.0 millimeters.

A broken line 74 represents variation in normalized amplitude of the magnetic field over probe position for the conventional coaxial line loop magnetic field detector in the prior art. When the probe is positioned at the center (x=0 millimeter), the normalized amplitude or intensity of the magnetic field has the maximum value. As the probe position is shifted by 2.8 millimeters from the center (x=0 millimeter), then the normalized amplitude or intensity of the magnetic field is dropped to the minimum value. This means that the magnetic field is concentrated in the range of −2.8 millimeters to +2.8 millimeters.

If the range of distribution of the magnetic field in the horizontal direction is narrow, this means that the detector is unlikely to receive the influence of the magnetic field generated by the adjacent interconnection. If, however, the range of distribution of the magnetic field in the horizontal direction is wide, this means that the detector is likely to receive the influence of the magnetic field generated by the adjacent interconnection.

The novel micro-strip line loop magnetic field detector 20 in the second embodiment has the narrowest magnetic field distribution range. This means that the novel micro-strip line loop magnetic field detector 20 is most unlikely to receive the influence of the magnetic field generated by the adjacent interconnection and has the highest spatial resolution.

The novel strip line shielded loop magnetic field detector 10 in the first embodiment has the second narrowest magnetic field distribution range. This means that the novel strip line shielded loop magnetic field detector 10 is secondly unlikely to receive the influence of the magnetic field generated by the adjacent interconnection and has the second highest spatial resolution.

The novel micro-strip line loop magnetic field detector 40 in the third embodiment has the third narrowest magnetic field distribution range. This means that the novel micro-strip line loop magnetic field detector 40 is thirdly unlikely to receive the influence of the magnetic field generated by the adjacent interconnection and has the third highest spatial resolution.

The conventional coaxial line loop magnetic field detector in the prior art has the widest magnetic field distribution range. This means that the conventional coaxial line loop magnetic field detector is likely to receive the influence of the magnetic field generated by the adjacent interconnection and has the lowest spatial resolution.

Fourth Embodiment

Figure 12:
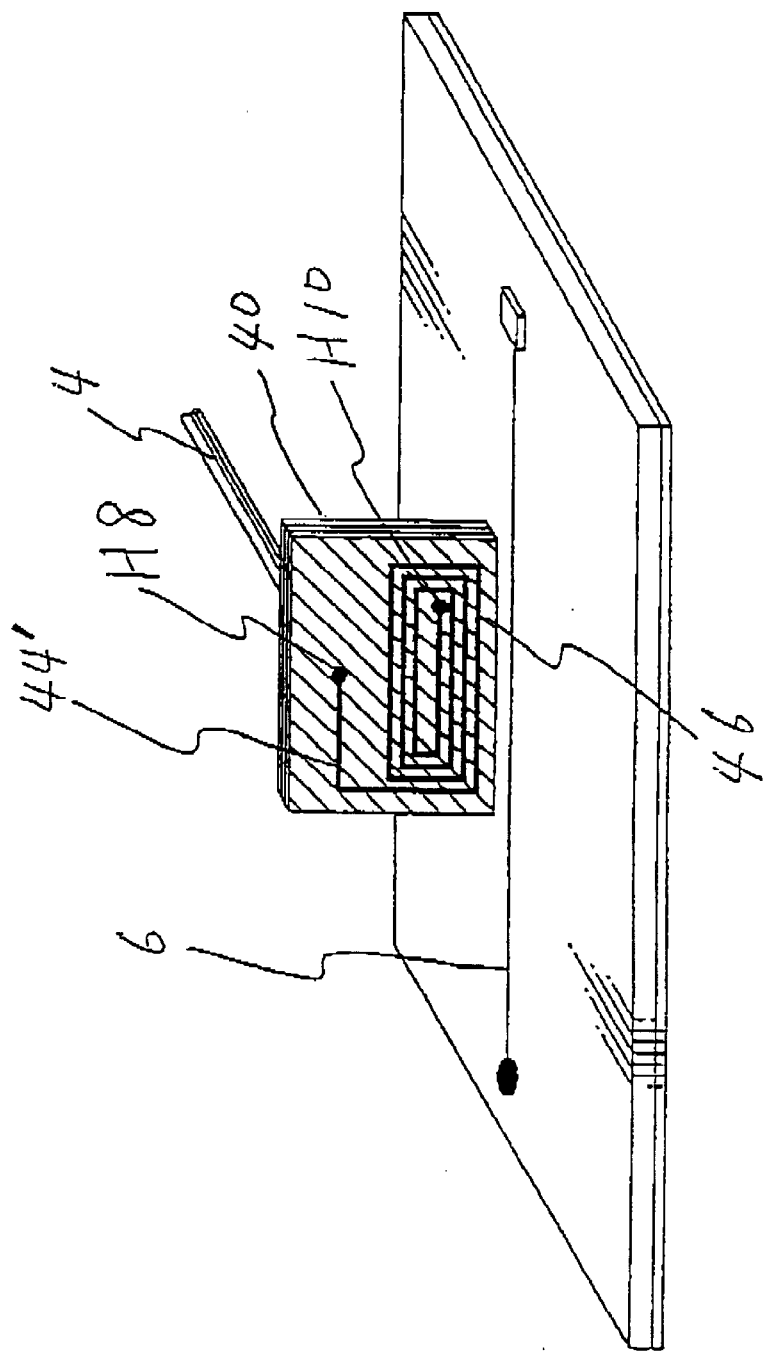
FIG. 12 is a schematic perspective view illustrative of a novel micro-strip line magnetic detector having a multilayer substrate body comprising a ground layer, a signal layer and a fixing layer in a fourth embodiment in accordance with the present invention.
Figure 13A:
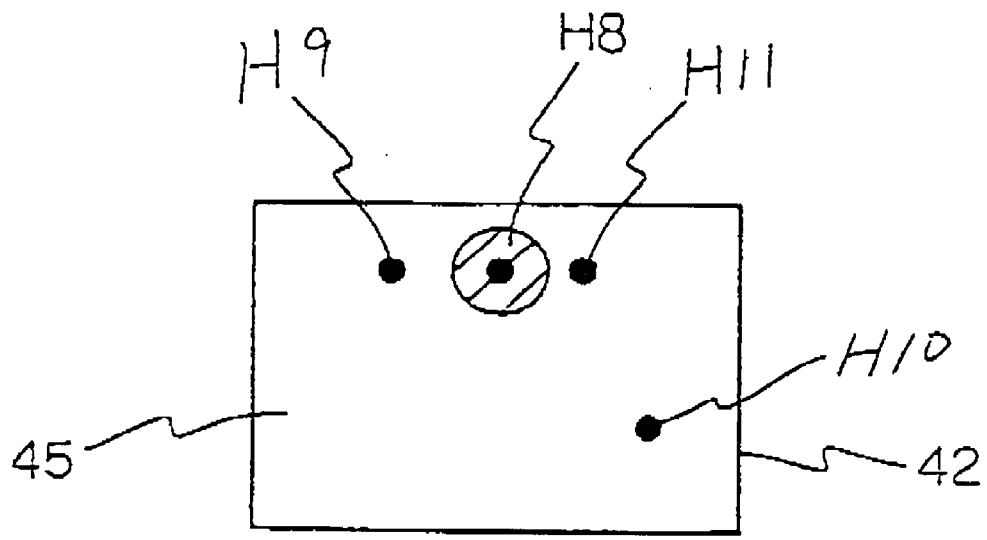
FIG. 13A is a plane view illustrative of a signal layer in a multilayer substrate body of a novel micro-strip line magnetic detector in a fourth embodiment in accordance with the present invention.
Figure 13B:
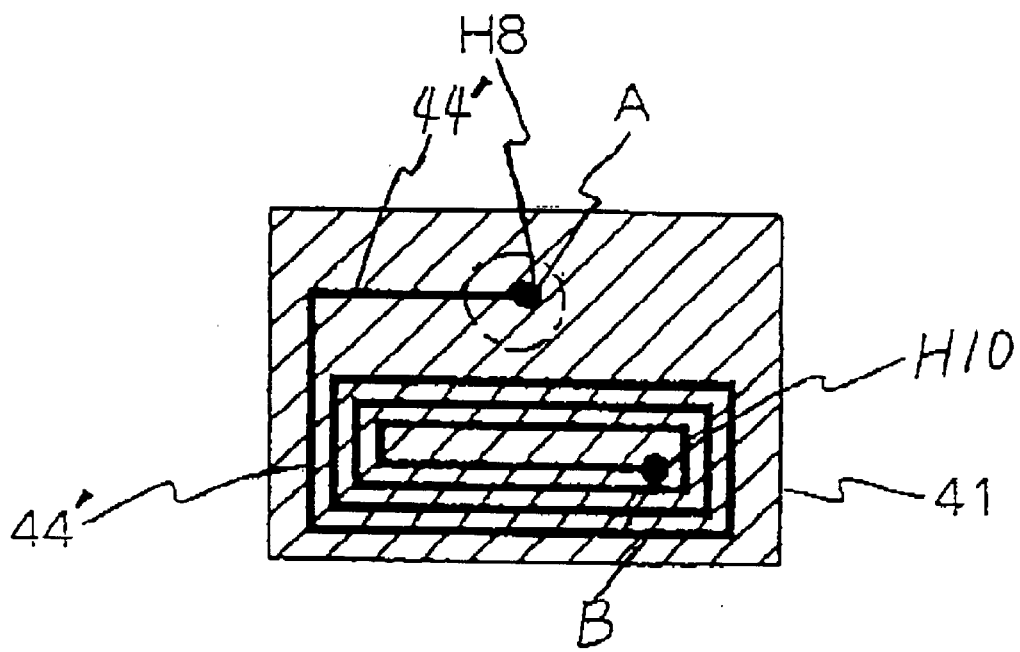
FIG. 13B is a plane view illustrative of a ground layer in a multilayer substrate body of a novel micro-strip line magnetic detector in a fourth embodiment in accordance with the present invention.
Figure 13C:
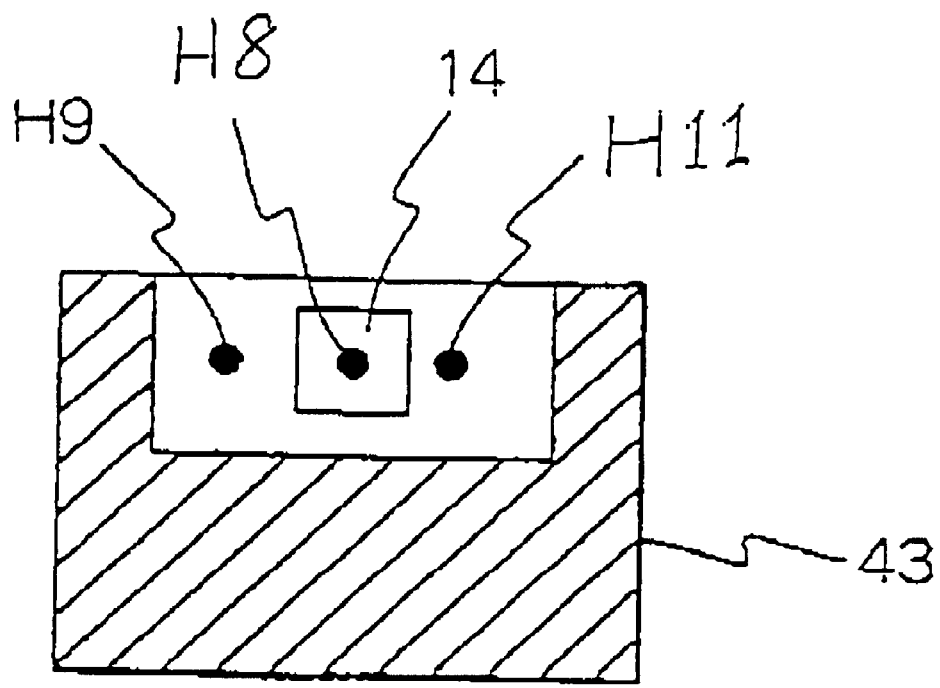
FIG. 13C is a plane view illustrative of a fixing layer in a multilayer substrate body of a novel micro-strip line magnetic detector in a fourth embodiment in accordance with the present invention.

A fourth embodiment according to the present invention will be described in detail with reference to FIGS. 12, 13A, 13B and 13C. FIG. 12 is a schematic perspective view illustrative of a novel micro-strip line magnetic detector having a multilayer substrate body comprising a ground layer, a signal layer and a fixing layer in a fourth embodiment in accordance with the present invention. FIG. 13A is a plane view illustrative of a signal layer in a multilayer substrate body of a novel micro-strip line magnetic detector in a fourth embodiment in accordance with the present invention. FIG. 13B is a plane view illustrative of a ground layer in a multilayer substrate body of a novel micro-strip line magnetic detector in a fourth embodiment in accordance with the present invention. FIG. 13C is a plane view illustrative of a fixing layer in a multilayer substrate body of a novel micro-strip line magnetic detector in a fourth embodiment in accordance with the present invention. The novel device for detecting a magnetic field in this embodiment is structurally different from that of the third embodiment in the electrically conductive micro-strip line pattern and positions of the second end of the electrically conductive micro-strip line pattern and the second via hole as well as no provision of a chip resistance. The electrically conductive micro-strip line pattern extends to form a rectangular-shaped spiral.

The device for detecting a magnetic field has a multilayer substrate body comprising laminations of a signal layer 41, a ground layer 42 and a fixing layer 43.

The signal layer 41 is made of a dielectric substance. The signal layer 41 has an opposite surface to a contact surface in contact with the ground layer 42. The signal layer 41 has an electrically conductive micro-strip line pattern 44' which extends in the form of a rectangular-shaped spiral comprising series connections of straight line segments on the opposite surface, thereby to form a dielectric looped face surrounded in omni-directions by the rectangular-shaped spiral. The dielectric looped face is parallel to an interface between the signal layer 41 and the ground layer 42. The signal layer 41 has first and second via holes H8 and H10 formed at first and second ends "A" and "B" of the electrically conductive micro-strip line pattern 44'.

The ground layer 42 comprises an electrically conductive region 45 so that the second end "B" of the electrically conductive micro-strip line pattern 44' is electrically connected to the electrically conductive region 45 of the ground layer 42, whereby the electrically conductive region 45 of the ground layer 42 serves as a ground. The ground layer 42 has first and second via holes H8 and H10 at corresponding positions to the first and second via holes H8 and H10 of the signal layer 41, so that the first end "A" of the electrically conductive micro-strip line pattern 44' is electrically connected to an external coaxial line 4. The ground layer 42 further has an isolation region around the first via hole H8 so that the first via hole H8 of the ground layer 42 is electrically isolated by the isolation region from the electrically conductive region 45 of the ground layer 42. The ground layer 42 furthermore has third and fourth via holes H9 and H11 which are positioned in opposite sides of the isolation region around the first via hole H8, so that the first, third and fourth via holes H8, H9 and H11 are aligned in horizontal direction.

The fixing layer 43 is provided in contact with the ground layer 42 for the purpose exclusively of fixing the external coaxial line 4. The fixing layer 43 has a connector 14 for connecting the external coaxial line 4. The fixing layer 43 also has a first via hole H8 which is positioned in correspondence with the first via hole H8 of the ground layer 42. The fixing layer 43 also has a third via hole H9 which is positioned in correspondence with the third via hole H9 of the ground layer 42. The fixing layer 43 also has a fourth via hole H10 which is positioned in correspondence with the fourth via hole H10 of the ground layer 42. The connector 14 is positioned in correspondence with the first via hole H8 so that the first end "A" of the electrically conductive micro-strip line pattern 44' is electrically connected through the first via hole H8 to the external coaxial line 4 connected by the connector 14 to the first via hole H8. The fixing layer 43 comprises a dielectric region entirely extending except in the vicinity of the first, third and fourth via holes H8, H9 and H10.

The first end "A" of the electrically conductive micro-strip line pattern 44' of the signal layer 41 is connected through the first via hole H8 to the external coaxial line 4. The second end "B" of the electrically conductive micro-strip line pattern 44' is connected through the second via hole H10 to the electrically conductive region 45 of the ground layer 42.

The measurement of the magnetic field generated by an objective interconnection 6 is carried out by use of the above novel magnetic field detector 40 as follows.

With reference again to FIG. 12, the novel magnetic field detector 40 is positioned so that the bottom side 46 of the multilayer substrate body is just over the objective interconnection 6 generating the magnetic field which is intended to be measured, wherein the bottom side 46 of the multilayer substrate body is in parallel to the objective interconnection 6, so that the dielectric looped face defined by the electrically conductive micro-strip line pattern 44' of the signal layer 41 is also in parallel to the objective interconnection 6. Further, the dielectric looped face defined by the electrically conductive strip line pattern 44' of the signal layer 41 is positioned in the vicinity of the objective interconnection 6, so that the magnetic flux in the vicinity of the objective interconnection 6 penetrates the dielectric looped face defined by the electrically conductive micro-strip line pattern 44'. As a result, even if an adjacent interconnection not illustrated is positioned very close to the objective interconnection 6 and this adjacent interconnection generates an additional magnetic field, then the magnetic flux generated by the objective interconnection 6 penetrates the dielectric looped face defined by the electrically conductive micro-strip line pattern 44', whilst the magnetic flux generated by the adjacent interconnection does not penetrate the dielectric looped face defined by the electrically conductive micro-strip line pattern 44', for which reason the novel magnetic field detector 40 is capable of selectively detecting only the magnetic field generated by the objective interconnection 6 without receiving any substantive disturbance due to the magnetic field generated by the adjacent interconnection.

The above electrically conductive micro-strip line pattern 44' may be formed by an etching process or a sputtering process. This structure enables a remarkable scaling down of the detector body. Particularly, the above structure enables the dielectric looped face surrounded by the electrically conductive micro-strip line pattern 44' to be positioned extremely adjacent to the objective interconnection 6 which generates the magnetic field to be measured, so that even if any adjacent interconnection not illustrated is positioned very close to the objective interconnection 6, the above novel magnetic field detector 40 is capable of detecting only the magnetic field generated by the objective interconnection 6 without, however, receiving any influence of a disturbing magnetic field generated by the adjacent interconnection. The above electrically conductive micro-strip line pattern 44' is formed to position the dielectric looped face closer to the bottom side of the multilayer substrate body so that the dielectric looped face is positioned closer to the objective interconnection 6, whereby the detector 40 can detect only the magnetic field extremely adjacent to the objective interconnection 6 without, however, receiving any influence of a disturbing magnetic field generated by the adjacent interconnection. This improves the spatial resolution of the detector 40.

The above electrically conductive micro-strip line pattern 44' is formed by the etching or sputtering process without being hand-made, for which reason it is possible to form highly accurate and largely scaled down magnetic field detector 40.

In detection of the magnetic field, the device 40 is positioned just over the objective interconnection 6 so that the dielectric looped face is in parallel to the objective interconnection 6 and positioned just over the objective interconnection 6. In order to increase the sensitivity of the device 40, it is preferable that the electrically conductive micro-strip line pattern 44' extends as long as possible in the direction along which the objective interconnection 6 extends unless a spatial resolution of the detector is deteriorated due to a high frequency of the magnetic field generated by the objective interconnection 6. In order to ensure a high spatial resolution of the device 40, it is preferable that the electrically conductive micro-strip line pattern 44' extends as close to the bottom side of the multilayer substrate body of the device 40 as possible so that the dielectric looped face receives the magnetic field in the vicinity of the objective interconnection 6 without, however, receiving any substantive influence of the disturbing magnetic field generated by the adjacent interconnection.

The provision of the fixing layer 43 allows securely electrical and mechanical connection of the detector 40 to the external coaxial line 4.

Fifth Embodiment

Figure 14A:
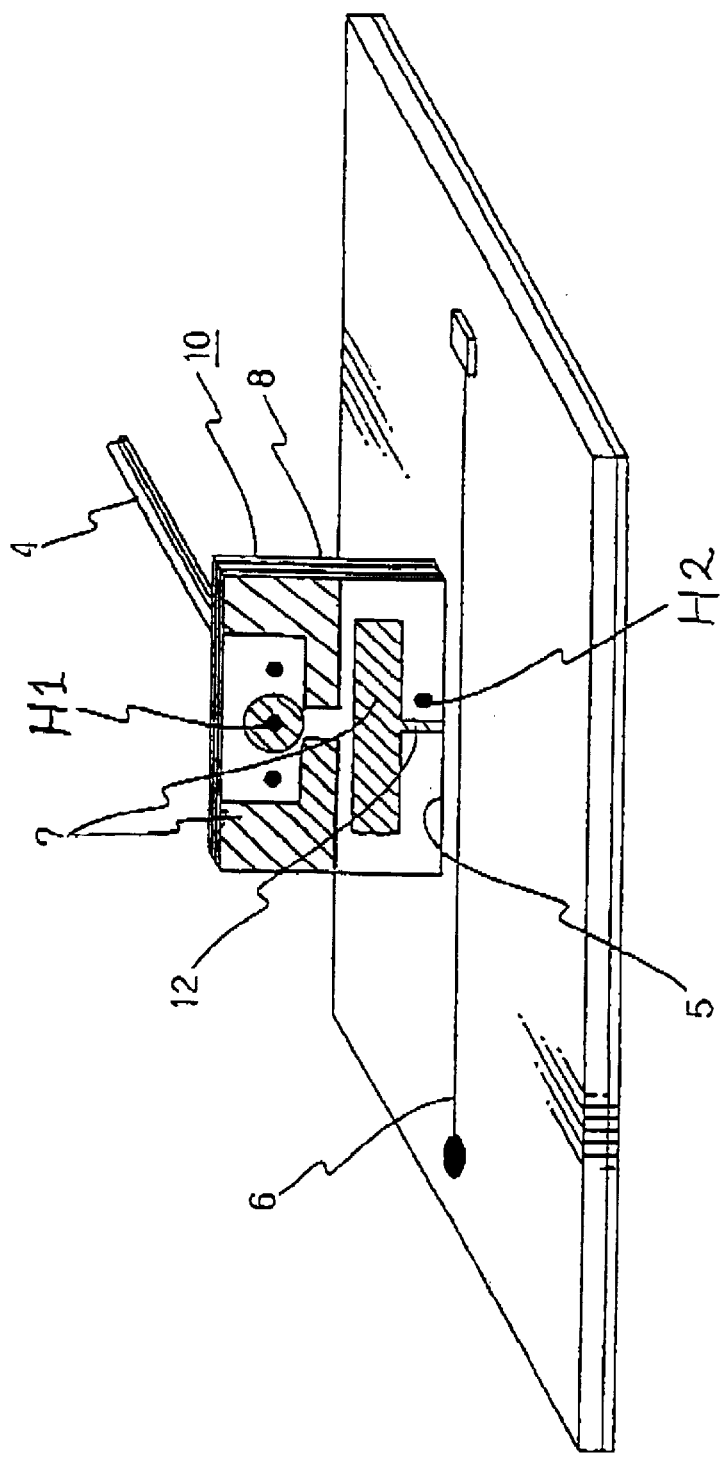
FIG. 14A is a schematic perspective view illustrative of a novel strip line shielded loop magnetic detector having a multilayer substrate body comprising two ground layers, a signal layer and a fixing layer in a fifth embodiment in accordance with the present invention.
Figure 15A:
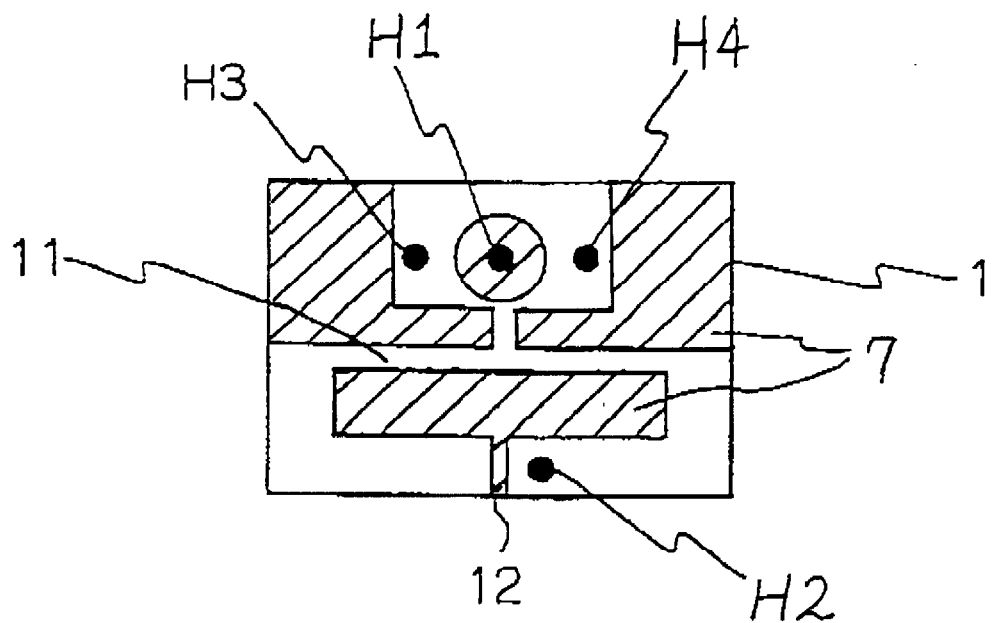
FIG. 15A is a plane view illustrative of each of two ground layers in a multilayer substrate body of a novel strip line shielded loop magnetic detector in a fifth embodiment in accordance with the present invention.
Figure 15B:
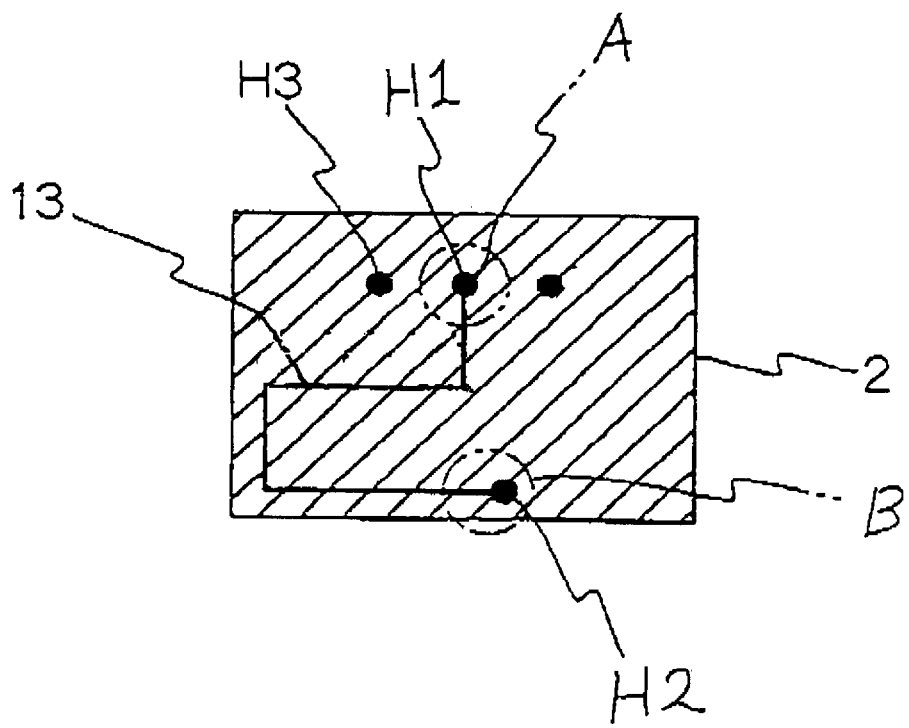
FIG. 15B is a plane view illustrative of a signal layer in a multilayer substrate body of a novel strip line shielded loop magnetic detector in a fifth embodiment in accordance with the present invention.
Figure 15C:
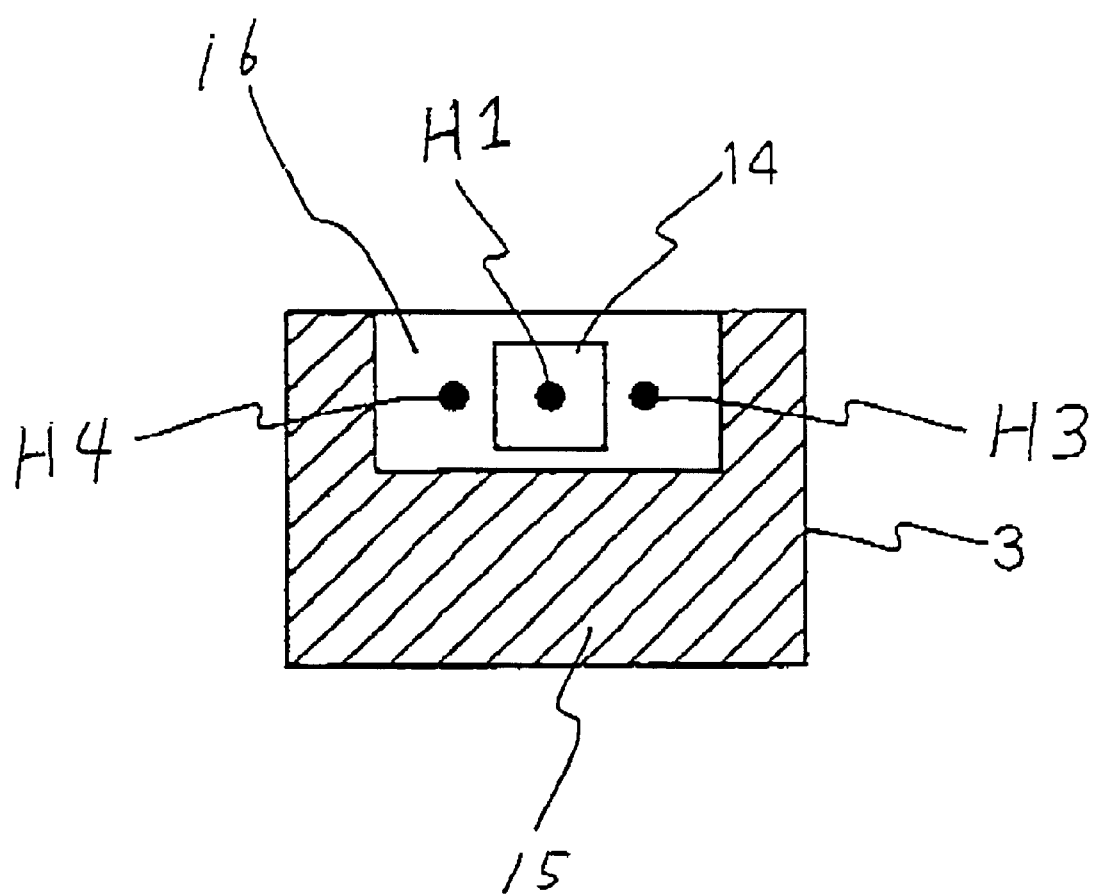
FIG. 15C is a plane view illustrative of a fixing layer in a multilayer substrate body of a novel strip line shielded loop magnetic detector in a fifth embodiment in accordance with the present invention.

A fifth embodiment according to the present invention will be described in detail with reference to FIGS. 14A, 15A, 15B and 15C. FIG. 14A is a schematic perspective view illustrative of a novel strip line shielded loop magnetic detector having a multilayer substrate body comprising two ground layers, a signal layer and a fixing layer in a fifth embodiment in accordance with the present invention. FIG. 15A is a plane view illustrative of each of two ground layers in a multilayer substrate body of a novel strip line shielded loop magnetic detector in a fifth embodiment in accordance with the present invention. FIG. 15B is a plane view illustrative of a signal layer in a multilayer substrate body of a novel strip line shielded loop magnetic detector in a fifth embodiment in accordance with the present invention. FIG. 15C is a plane view illustrative of a fixing layer in a multilayer substrate body of a novel strip line shielded loop magnetic detector in a fifth embodiment in accordance with the present invention. The novel device for detecting a magnetic field in this embodiment is structurally different from that of the first embodiment in an increased area of the dielectric region and a decreased area of the electrically conductive region of each of the first and second ground layers. It is preferable that the electrically conductive region of each of the first and second ground layers has a minimum area necessary for allowing the electrically conductive region to serve as a ground to the electrically conductive strip line pattern.

The novel strip line shielded loop magnetic detector 10 for detecting a magnetic field has a multilayer substrate body 8 which comprises laminations of a signal layer 2 and first and second ground layers 1 sandwiching the signal layer 2 as well as a fixing layer 3.

The signal layer 2 is made of a dielectric substance. The signal layer 2 has an electrically conductive strip line pattern 13 which comprises series connections of the following first to fourth straight strip line segments extending to form a modified U-shape and also form a dielectric looped face 7 surrounded by the modified U-shape of the electrically conductive strip line pattern 13 in three quarter of omni-directions. The dielectric looped face 7 is in parallel to interfaces between the signal layer 2 and the first and second ground layers 1, thereby to allow a magnetic flux to penetrate the dielectric looped face 7. The electrically conductive strip line pattern 13 has a first end "A" and a second end "B". A first via hole H1 is formed at the first end of the electrically conductive strip line pattern 13 in the signal layer 2. A second via hole H2 is formed at the second end of the electrically conductive strip line pattern 13 in the signal layer 2. Third and fourth via holes H3 and H4 are further formed at opposite side positions of said first via hole H1 so that the first, third and fourth via holes H1, H3 and H4 are aligned in a horizontal direction and positioned at upper positions of the signal layer 2. The second via hole is positioned at a lower position of the signal layer 2. The first via hole H1 is positioned on a vertical center line. The third and fourth via holes H3 and H4 are positioned in opposite sides of the first via hole H1 at the same level as the first via hole H1 so that the first, third and fourth via holes H1, H3 and H4 are aligned horizontally and symmetrically with reference to the vertical center line of the signal layer 2. The second via hole H2 is displaced from the vertical center line to the same side as the fourth via hole. The electrically conductive strip line pattern 13 mainly extends in the same side as the third via hole H3. The electrically conductive strip line pattern 13 extends from the first end "A" at the first via hole H1 downwardly and further extends in the horizontal direction into the same side as the third via hole H3, and furthermore extends downwardly along the side of the signal layer 2, and moreover extends in the horizontal direction toward the opposite side to pass through the vertical center line and to reach the second via hole H2, whereby the dielectric looped face is defined to be rectangular-shaped and positioned mainly in the same side as the third via hole H3. As described above, the electrically conductive strip line pattern 13 has the following first to fourth straight strip line segments. A first straight strip line segment of the electrically conductive strip line pattern 13 is connected to the first end "A" and extends in a direction vertical to the contact side of the detector 1 and has a level over the dielectric region 7. A second straight strip line segment of the electrically conductive strip line pattern 13 is connected to the first straight strip line segment and also extends in a direction parallel to the contact side of the detector 1 and has a level over the dielectric region 7. A third straight strip line segment of the electrically conductive strip line pattern 13 is connected to the second straight strip line segment and also extends in a direction vertical to the contact side of the detector 1 and also extends on a vertically extending intermediate line between the edge of the rectangle-shaped dielectric region 7 and the side edge of the detector 1. A fourth straight strip line segment of the electrically conductive strip line pattern 13 is connected to the third straight strip line segment and extends in a direction parallel to the contact side of the detector 1 on a horizontally extending intermediate line between the bottom side of the rectangle-shaped dielectric region 7 and the contact side of the detector 1. Consequently, it is preferable that the electrically conductive strip line pattern 13 extends in the signal layer 2 so that, in the vertical view to the interfaces of the signal layer 2 and the ground layer 1, the electrically conductive strip line pattern 13 as a signal line extends along a center line of the electrically conductive pattern 11 of the ground layer 1 in order to ensure stable transmission characteristics. It is also preferable that a left side width of the electrically conductive pattern 11 defined to be the distance between the left side edge of the rectangle-shaped dielectric region 7 and the left side of the ground layer is not more than approximately 10 times of a width of the electrically conductive strip line pattern 13 as a signal line in order to improve the stability of the transmission characteristics. The electrically conductive pattern 11 may optionally comprise a metal foil.

Each of the first and second ground layers 1 comprises an electrically conductive pattern 11 which is electrically connected only to the second end "B" of the electrically conductive strip line pattern 13 so that the each of the first and second ground layers 1 serves as a ground. The each of the first and second ground layers 1 has a first via hole H1 at a position corresponding to the first via hole H1 of the signal layer 2. The each of the first and second ground layers 1 also has a second via hole H2 at a position corresponding to the second via hole H2 of the signal layer 2. The each of the first and second ground layers 1 also has a third via hole H3 at a position corresponding to the third via hole H3 of the signal layer 2. The each of the first and second ground layers 1 also has a fourth via hole H4 at a position corresponding to the fourth via hole H4 of the signal layer 2. The each of the first and second ground layers 1 further has an isolation region around the first via hole H1 so that the first via hole H1 is electrically isolated from the electrically conductive pattern 11. The second, third and fourth via holes H2, H3 and H4 are electrically and structurally connected with the electrically conductive pattern 11. The electrically conductive pattern 11 extends in the vicinity of the first, third and fourth via holes H1, H3 and H4 and also extends on a selected region in correspondence with the electrically conductive strip line pattern 13 in a view vertical to the interface between the signal layer 2 and each of the first and second ground layers 1. Namely, the electrically conductive pattern 11 comprises a rectangular-shaped small top region and a looping region connected through a vertically extending connecting region to the rectangular-shaped small top region. The each of the first and second ground layers 1 has three dielectric regions 7. The first one of the three dielectric regions 7 extends on a right top region of each of the first and second ground layers 1. The second one of the three dielectric regions 7 extends on a left top region of each of the first and second ground layers 1. The first and second ones of the three dielectric regions 7 define the rectangular-shaped small top region and the vertically extending connecting region of the electrically conductive pattern 11. The third one of the three dielectric regions 7 has a slender rectangle shape of a horizontal longitudinal axis with an additional region vertically extending from the slender rectangle shape to a contact side of each of the first and second ground layers 1 so as to form a gap 12 in the bottom side region of the electrically conductive pattern 11. The third one of the three dielectric regions 7 is almost omni-directionally surrounded by the looping region of the electrically conductive pattern 11, so that the third one of the three dielectric regions 7 is positioned in correspondence with the center part of the dielectric looped face defined by the electrically conductive strip line pattern 13. A magnetic flux penetrates the dielectric region 7 almost omni-directionally surrounded by the third one of the electrically conductive pattern 11 and also penetrates a center region of the dielectric looped face defined by the electrically conductive strip line pattern 13 of the signal layer 2. In accordance with the shape of the dielectric looped face defined by the electrically conductive strip line pattern 13 of the signal layer 2, the third one of the three dielectric regions 7 of each of the first and second ground layers 1 are shaped and positioned to introduce the magnetic flux to the center region of the dielectric looped face. The first and second ones of the three dielectric regions 7 are provided to increase an area of the dielectric region of each of the first and second ground layers 1 and also decrease an area of the electrically conductive pattern 11 of each of the first and second ground layers 1.

The fixing layer 3 is provided in contact with the second ground layer 1 for the purpose exclusively of fixing the external coaxial line 4. The fixing layer 3 has a connector 14 for connecting the external coaxial line 4. The fixing layer 3 also has a first via hole H1 which is positioned in correspondence with the first via hole H1 of the second ground layer 1. The fixing layer 3 also has a third via hole H3 which is positioned in correspondence with the third via hole H3 of the second ground layer 1. The fixing layer 3 also has a fourth via hole H4 which is positioned in correspondence with the fourth via hole H4 of the second ground layer 1. The connector 14 is positioned in correspondence with the first via hole H1 so that the first end "A" of the electrically conductive strip line pattern 13 is electrically connected through the first via hole H1 to the external coaxial line 4 connected by the connector 14 to the first via hole H1. The fixing layer 3 comprises a dielectric region 15 entirely extending except in the vicinity of the first, third and fourth via holes H1, H3 and H4.

The first end "A" of the electrically conductive strip line pattern 13 of the signal layer 2 is connected through the first via hole H1 to the external coaxial line 4. The electrically conductive strip line pattern 13 extends to pass through the corresponding position to the gap 12, so that the second end "B" of the electrically conductive strip line pattern 13 is connected through the second via hole H2 to the electrically conductive pattern of each of the first and second ground layers 1.

The measurement of the magnetic field generated by an objective interconnection 6 is carried out by use of the above novel magnetic field detector 10 as follows.

With reference again to FIG. 14A, the novel magnetic field detector 10 is positioned so that the bottom side 5 of the multilayer substrate body 8 is just over the objective interconnection 6 generating the magnetic field which is intended to be measured, wherein the bottom side 5 of the multilayer substrate body 8 is in parallel to the objective interconnection 6, so that the dielectric looped face defined by the electrically conductive strip line pattern 13 of the signal layer 2 is also in parallel to the objective interconnection 6. Further, the third one of the slender rectangular shape of the three dielectric regions 7 of the ground layers 1 and the dielectric looped face defined by the electrically conductive strip line pattern 13 of the signal layer 2 are positioned in the vicinity of the objective interconnection 6, so that the magnetic flux in the vicinity of the objective interconnection 6 penetrates the third one of the slender rectangular shape of the three dielectric regions 7 of the ground layers 1 and the dielectric looped face defined by the electrically conductive strip line pattern 13. As a result, even if an adjacent interconnection not illustrated is positioned very close to the objective interconnection 6 and this adjacent interconnection generates an additional magnetic field, then the magnetic flux generated by the objective interconnection 6 penetrates the third one of the slender rectangular shape of the three dielectric regions 7 of the ground layers 1 and the dielectric looped face defined by the electrically conductive strip line pattern 13, whilst the magnetic flux generated by the adjacent interconnection does not penetrate the third one of the slender rectangular shape of the three dielectric regions 7 of the ground layers 1 and the dielectric looped face defined by the electrically conductive strip line pattern 13, for which reason the novel magnetic field detector 10 is capable of selectively detecting only the magnetic field generated by the objective interconnection 6 without receiving any substantive disturbance due to the magnetic field generated by the adjacent interconnection.

The above electrically conductive strip line pattern 13 may be formed by an etching process or a sputtering process. This structure enables a remarkable scaling down of the detector body 8. Particularly, the above structure enables the dielectric looped face surrounded by the electrically conductive strip line pattern 13 to be positioned extremely adjacent to the objective interconnection 6 which generates the magnetic field to be measured, so that even if any adjacent interconnection not illustrated is positioned very close to the objective interconnection 6, the above novel magnetic field detector 10 is capable of detecting only the magnetic field generated by the objective interconnection 6 without, however, receiving any influence of a disturbing magnetic field generated by the adjacent interconnection. The above electrically conductive strip line pattern is formed to position the dielectric looped face and the third one of the slender rectangular shape of the three dielectric regions 7 closer to the bottom side of the multilayer substrate body 8 so that the dielectric looped face and the third one of the slender rectangular shape of the three dielectric regions 7 are positioned closer to the objective interconnection 6, whereby the detector 10 can detect only the magnetic field extremely adjacent to the objective interconnection 6 without, however, receiving any influence of a disturbing magnetic field generated by the adjacent interconnection. This improves the spatial resolution of the detector 10.

The above electrically conductive strip line pattern 13 is formed by the etching or sputtering process without being hand-made, for which reason it is possible to form highly accurate and largely scaled down magnetic field detector 10.

In detection of the magnetic field, the device 10 is positioned just over the objective interconnection 6 so that the dielectric looped face is in parallel to the objective interconnection 6 and positioned just over the objective interconnection 6. In order to increase the sensitivity of the device 10, it is preferable that the electrically conductive strip line pattern 13 extends as long as possible in the direction along which the objective interconnection 6 extends unless a spatial resolution of the detector is deteriorated due to a high frequency of the magnetic field generated by the objective interconnection 6. In order to ensure a high spatial resolution of the device 10, it is preferable that the electrically conductive strip line pattern 13 extends as close as possible to the bottom side of the multilayer substrate body 8 of the device 10 so that the dielectric looped face receives the magnetic field in the vicinity of the objective interconnection 6 without, however, receiving any substantive influence of the disturbing magnetic field generated by the adjacent interconnection.

The provision of the fixing layer 3 allows securely electrical and mechanical connection of the detector 10 to the external coaxial line 4.

As a modification, it is also possible to provide a terminating resistance at the second end "B" of the electrically conductive strip line pattern 13 to obtain a non-reflective terminal.

Figure 14B:
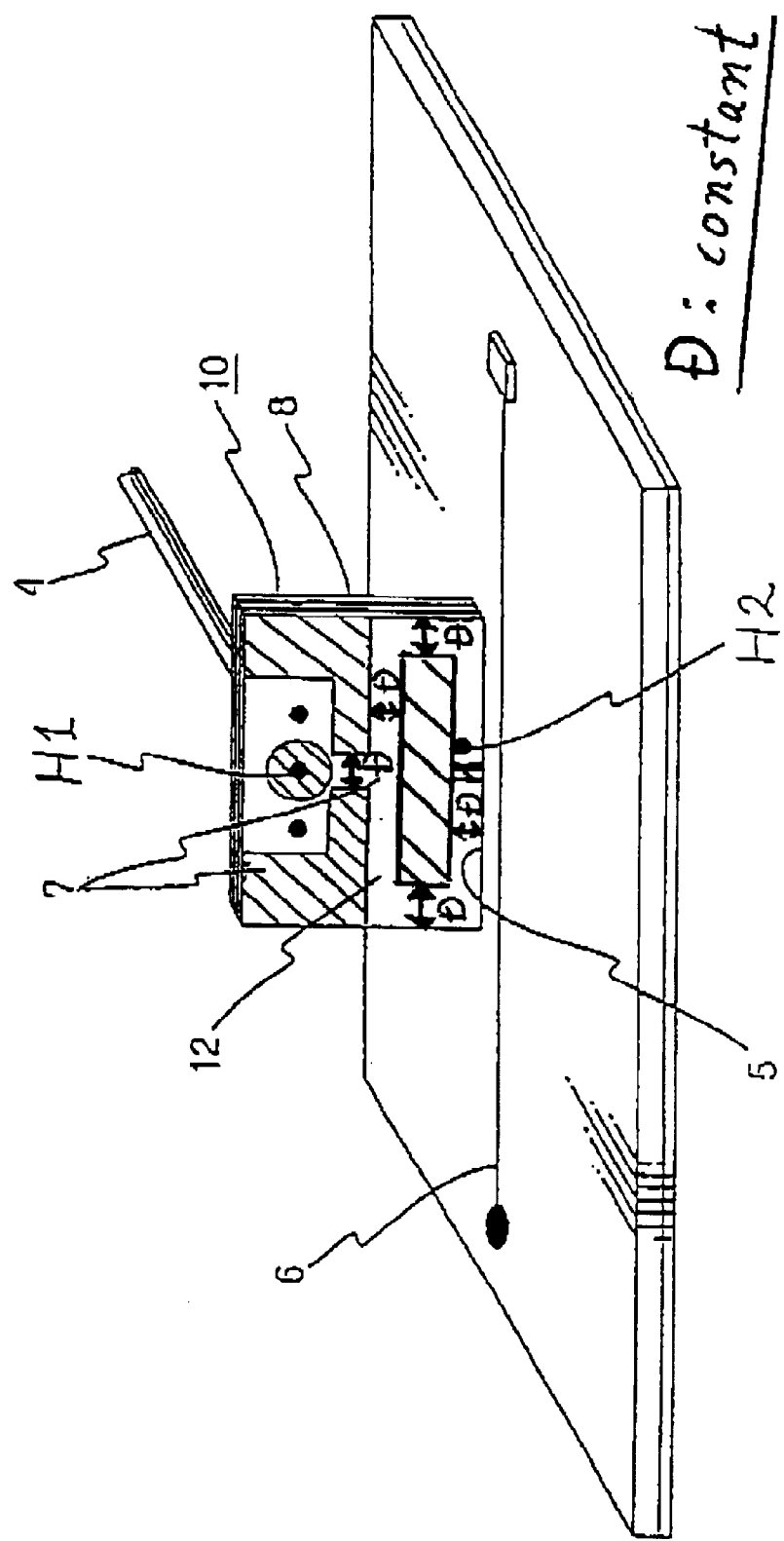
FIG. 14B is a schematic perspective view illustrative of a novel strip line shielded loop magnetic detector having a multilayer substrate body comprising two ground layers, a signal layer and a fixing layer in a first preferred modification to the fifth embodiment in accordance with the present invention.
Figure 15D:
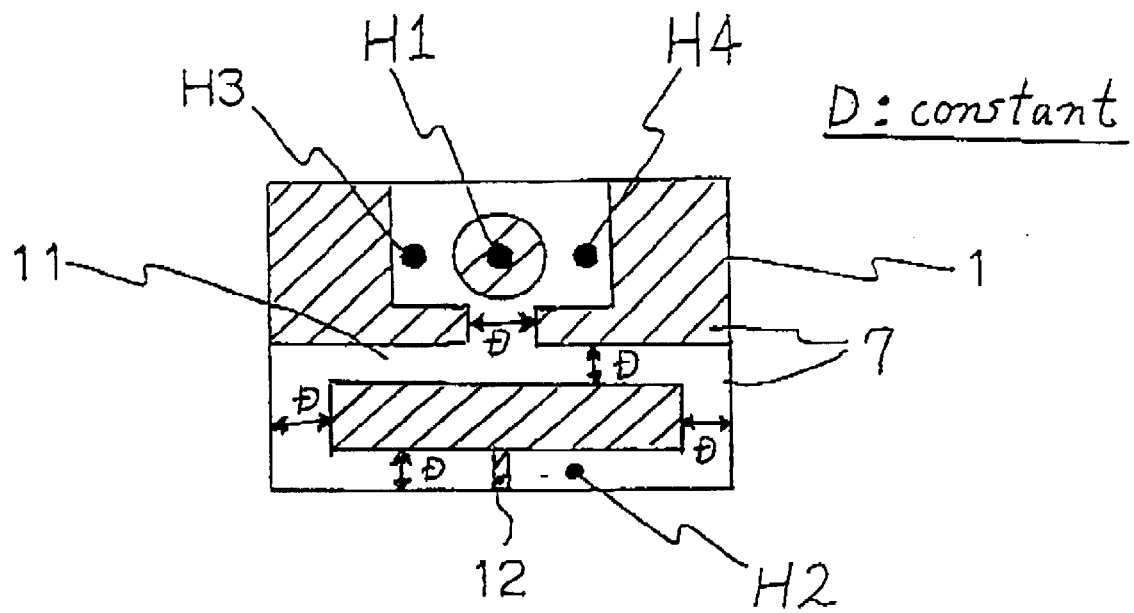
FIG. 15D is a plane view illustrative of each of two ground layers in a multilayer substrate body of a novel strip line shielded loop magnetic detector in a first preferred modification to the fifth embodiment in accordance with the present invention.
Figure 15E:
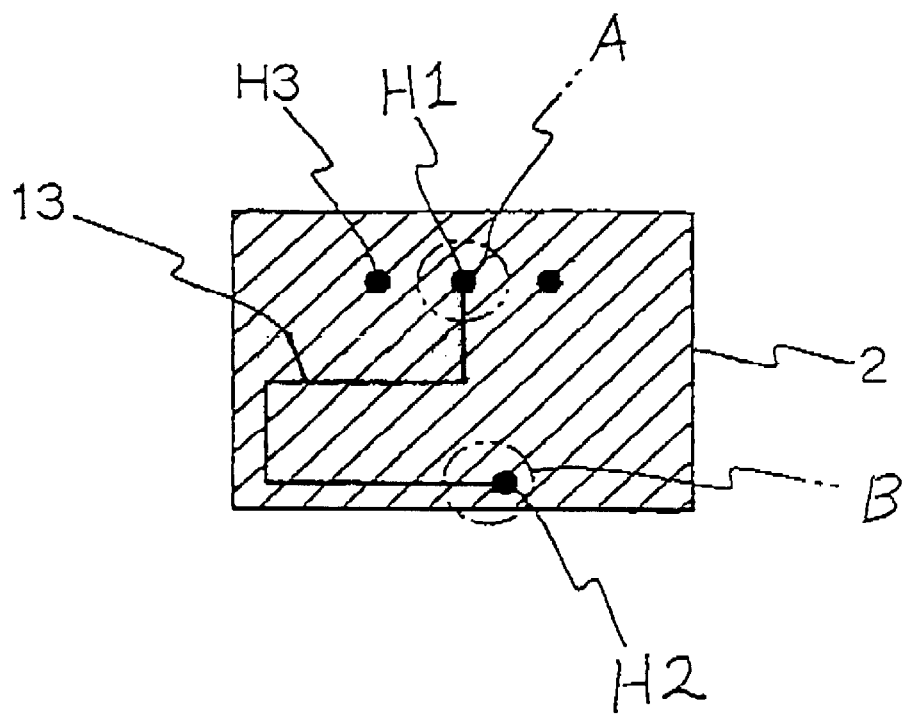
FIG. 15E is a plane view illustrative of a signal layer in a multilayer substrate body of a novel strip line shielded loop magnetic detector in a first preferred modification to the fifth embodiment in accordance with the present invention.
Figure 15F:
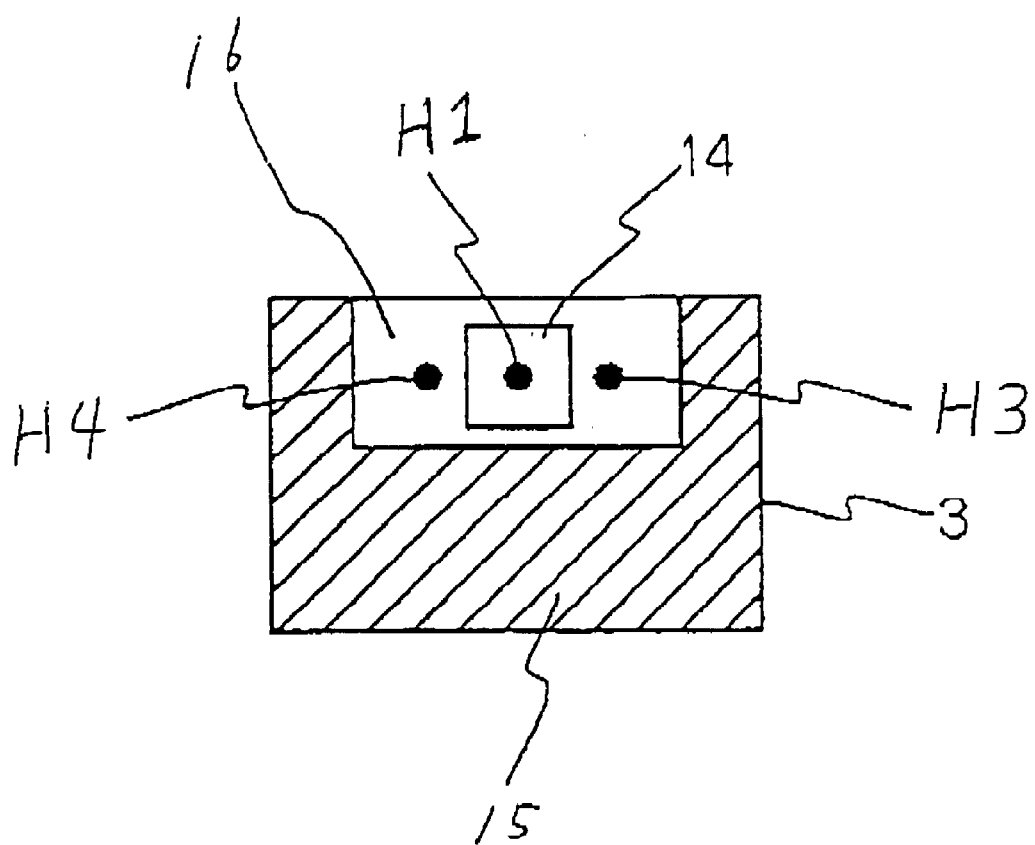
FIG. 15F is a plane view illustrative of a fixing layer in a multilayer substrate body of a novel strip line shielded loop magnetic detector in a first preferred modification to the fifth embodiment in accordance with the present invention.

A first preferred modification to the above fifth embodiment will subsequently be described with reference to FIGS. 14B, 15D, 15E and 15F, wherein the electrically conductive pattern 11 has a constant width "D" in order to ensure the stability of the transmission characteristics. FIG. 14B is a schematic perspective view illustrative of a novel strip line shielded loop magnetic detector having a multilayer substrate body comprising two ground layers, a signal layer and a fixing layer in a first preferred modification to the fifth embodiment in accordance with the present invention. FIG. 15D is a plane view illustrative of each of two ground layers in a multilayer substrate body of a novel strip line shielded loop magnetic detector in a first preferred modification to the fifth embodiment in accordance with the present invention. FIG. 15E is a plane view illustrative of a signal layer in a multilayer substrate body of a novel strip line shielded loop magnetic detector in a first preferred modification to the fifth embodiment in accordance with the present invention. FIG. 15F is a plane view illustrative of a fixing layer in a multilayer substrate body of a novel strip line shielded loop magnetic detector in a first preferred modification to the fifth embodiment in accordance with the present invention.

The description of the first preferred modification will focus on the differences from the above fifth embodiment. The electrically conductive pattern 11 of each of the first and second ground layers 1 has a lead portion and a looping portion. The lead portion of the electrically conductive pattern 11 extends in a direction vertical to the contact side of the detector 1 between the first hole H1 and the rectangle-shaped dielectric region 7. The looping portion of the electrically conductive pattern 11 of the ground layer 1 extends to loop or surround the rectangle-shaped dielectric region 7. In accordance with this first preferred modification, the electrically conductive pattern 11 is constant in width "D" throughout the lead portion and the looping portion. Namely, the lead portion and the looping portion of the electrically conductive pattern 11 have the constant width "D" to improve the stability of the transmission characteristic. The constant width "D" of the lead portion and the looping portion of the electrically conductive pattern 11 of each of the first and second ground layers 1 is not more than approximately 10 times of the width of the electrically conductive strip line pattern 13. Further, the electrically conductive strip line pattern 13 extends along center lines of the lead portion and the looping portion of the electrically conductive pattern 11, in the vertical view to the interfaces of the signal layer 2 and the ground layers 1, in order to ensure stable transmission characteristics. The electrically conductive pattern 11 may optionally comprise a metal foil.

Figure 14C:
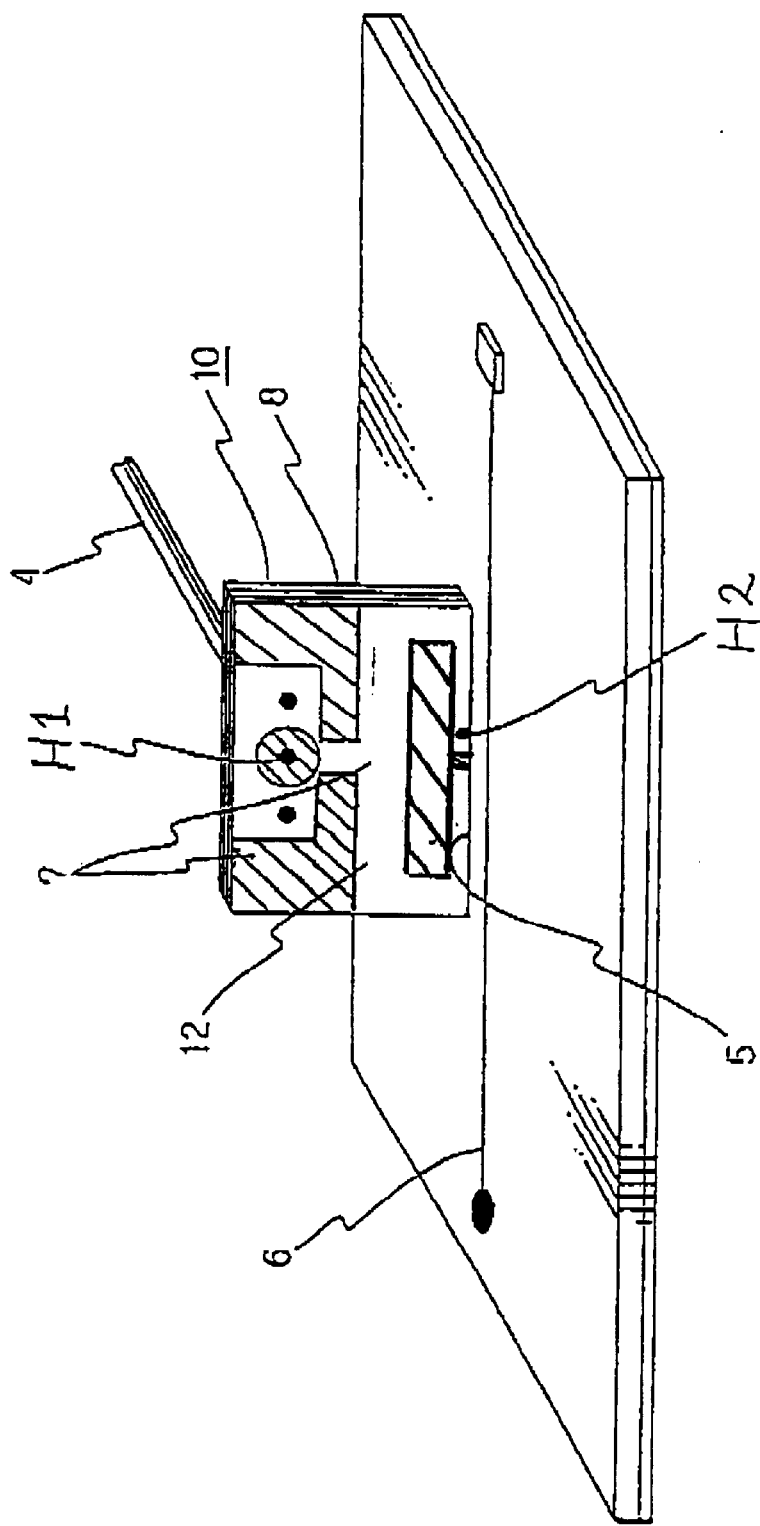
FIG. 14C is a schematic perspective view illustrative of a novel strip line shielded loop magnetic detector having a multilayer substrate body comprising two ground layers, a signal layer and a fixing layer in a second preferred modification to the fifth embodiment in accordance with the present invention.
Figure 15G:
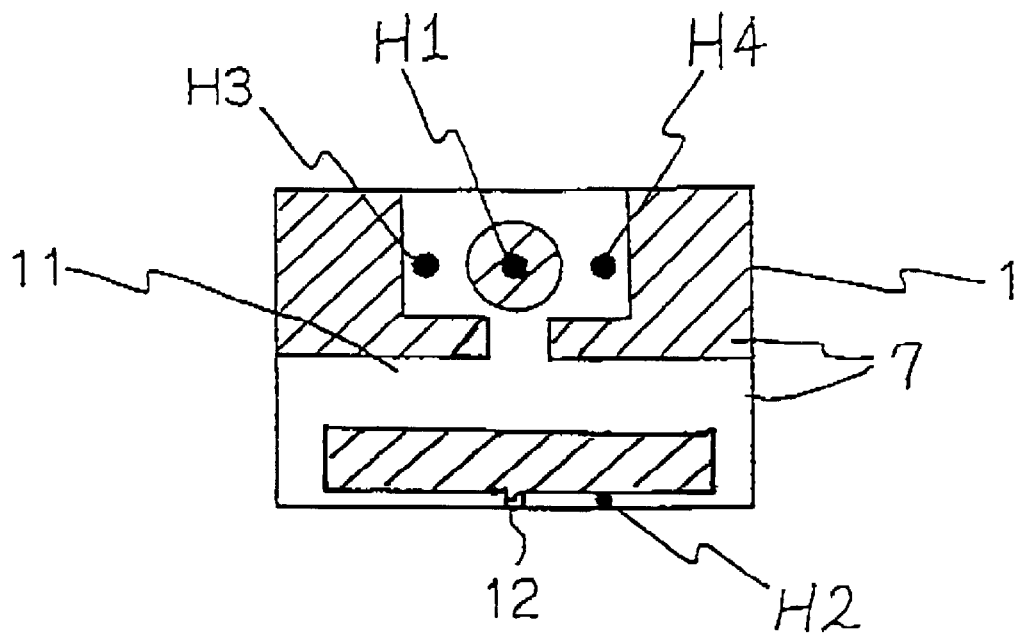
FIG. 15G is a plane view illustrative of each of two ground layers in a multilayer substrate body of a novel strip line shielded loop magnetic detector in a second preferred modification to the fifth embodiment in accordance with the present invention.
Figure 15H:
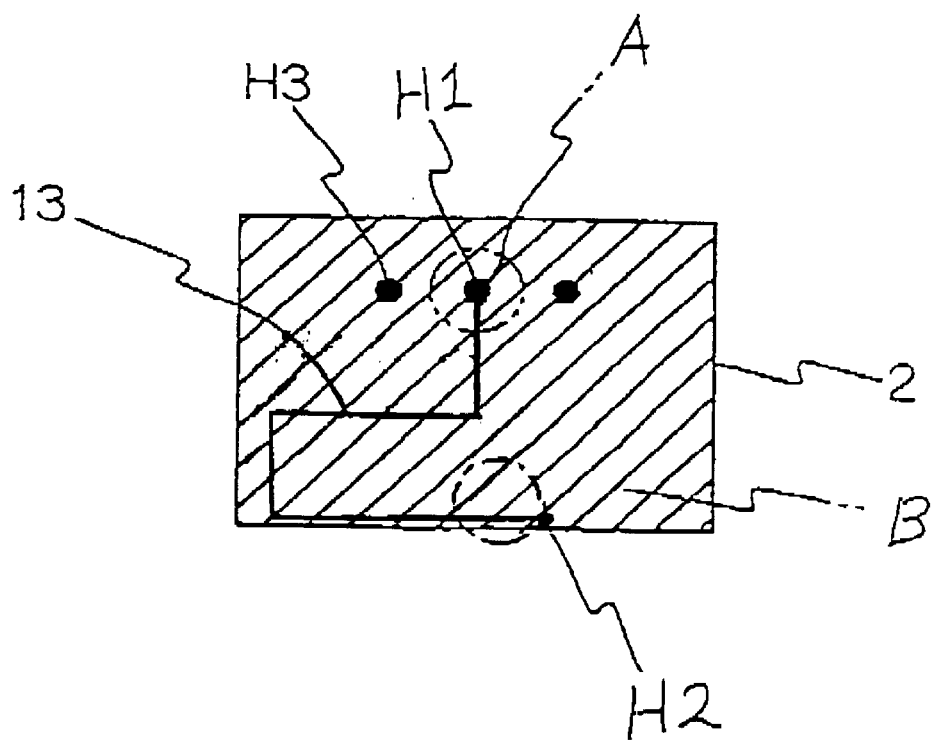
FIG. 15H is a plane view illustrative of a signal layer in a multilayer substrate body of a novel strip line shielded loop magnetic detector in a second preferred modification to the fifth embodiment in accordance with the present invention.
Figure 15I:
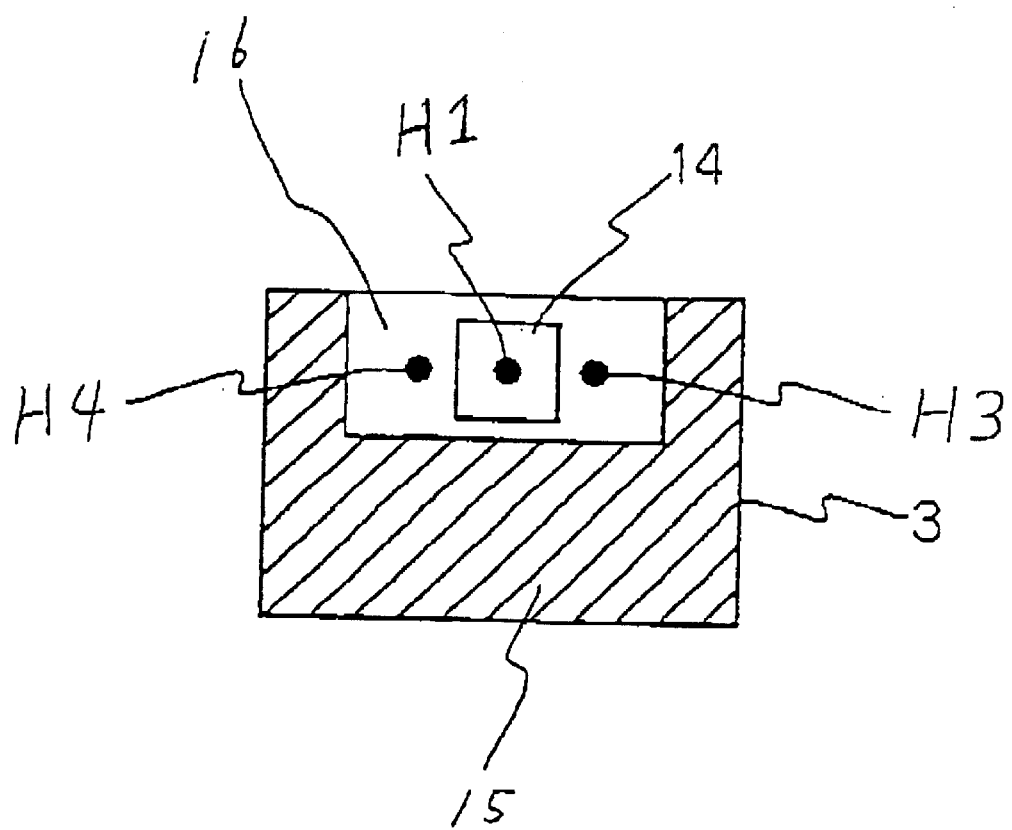
FIG. 15I is a plane view illustrative of a fixing layer in a multilayer substrate body of a novel strip line shielded loop magnetic detector in a second preferred modification to the fifth embodiment in accordance with the present invention.

A second preferred modification to the above fifth embodiment will subsequently be described with reference to FIGS. 14C, 15G, 15H and 15I, wherein the rectangle-shaped dielectric region 7 forming the looped face defined by the electrically conductive pattern 11 of each of the first and second ground layers 1 is positioned so closer to the contact side of the detector 10 as possible to shorten the distance between the looped face and the objective interconnection 6 for the purpose of a possible large improvement in spatial resolution of the detector 1, provided that in the view vertical to the interface between the signal layer 2 and the ground layer 1, the electrically conductive strip line pattern 13 extends in the signal layer along a center line of the electrically conductive pattern 11 of the ground layer 1. FIG. 14C is a schematic perspective view illustrative of a novel strip line shielded loop magnetic detector having a multilayer substrate body comprising two ground layers, a signal layer and a fixing layer in a second preferred modification to the fifth embodiment in accordance with the present invention. FIG. 15G is a plane view illustrative of each of two ground layers in a multilayer substrate body of a novel strip line shielded loop magnetic detector in a second preferred modification to the fifth embodiment in accordance with the present invention. FIG. 15H is a plane view illustrative of a signal layer in a multilayer substrate body of a novel strip line shielded loop magnetic detector in a second preferred modification to the fifth embodiment in accordance with the present invention. FIG. 15I is a plane view illustrative of a fixing layer in a multilayer substrate body of a novel strip line shielded loop magnetic detector in a second preferred modification to the fifth embodiment in accordance with the present invention.

The description of the second preferred modification will focus on the differences from the above first preferred modification. The rectangle-shaped dielectric region 7 forms the looped face defined by the looping portion of the electrically conductive pattern 11 of each of the first and second ground layers 1. In accordance with this second preferred modification, the rectangle-shaped dielectric region 7 as the looped face, through which the magnetic flux penetrates, is positioned so closer to the contact side of the detector 10 as possible to shorten the distance between the looped face and the objective interconnection 6 for the purpose of a possible large improvement in spatial resolution of the detector 10, provided that in the view vertical to the interface between the signal layer 2 and the ground layer 1, the electrically conductive strip line pattern 13 extends in the signal layer along center lines of the lead portion and the looping portion of the electrically conductive pattern 11 of each of the first and second ground layers 1. Namely, as the rectangle-shaped dielectric region 7 as the looped face is displaced closer to the contact side to the objective interconnection 6 to shorten the distance between the looped face and the objective interconnection 6 for the purpose of the large improvement in spatial resolution of the detector 1, then the electrically conductive strip line pattern 13 extending in the signal layer 2 is also displaced closer to the contact side, so that the electrically conductive strip line pattern 13 extends along the center lines of the looping portion of the electrically conductive pattern 11 of each of the first and second ground layers 1 in the vertical view to the interface between the signal layer 2 and the ground layer 1.

Figure 14D:
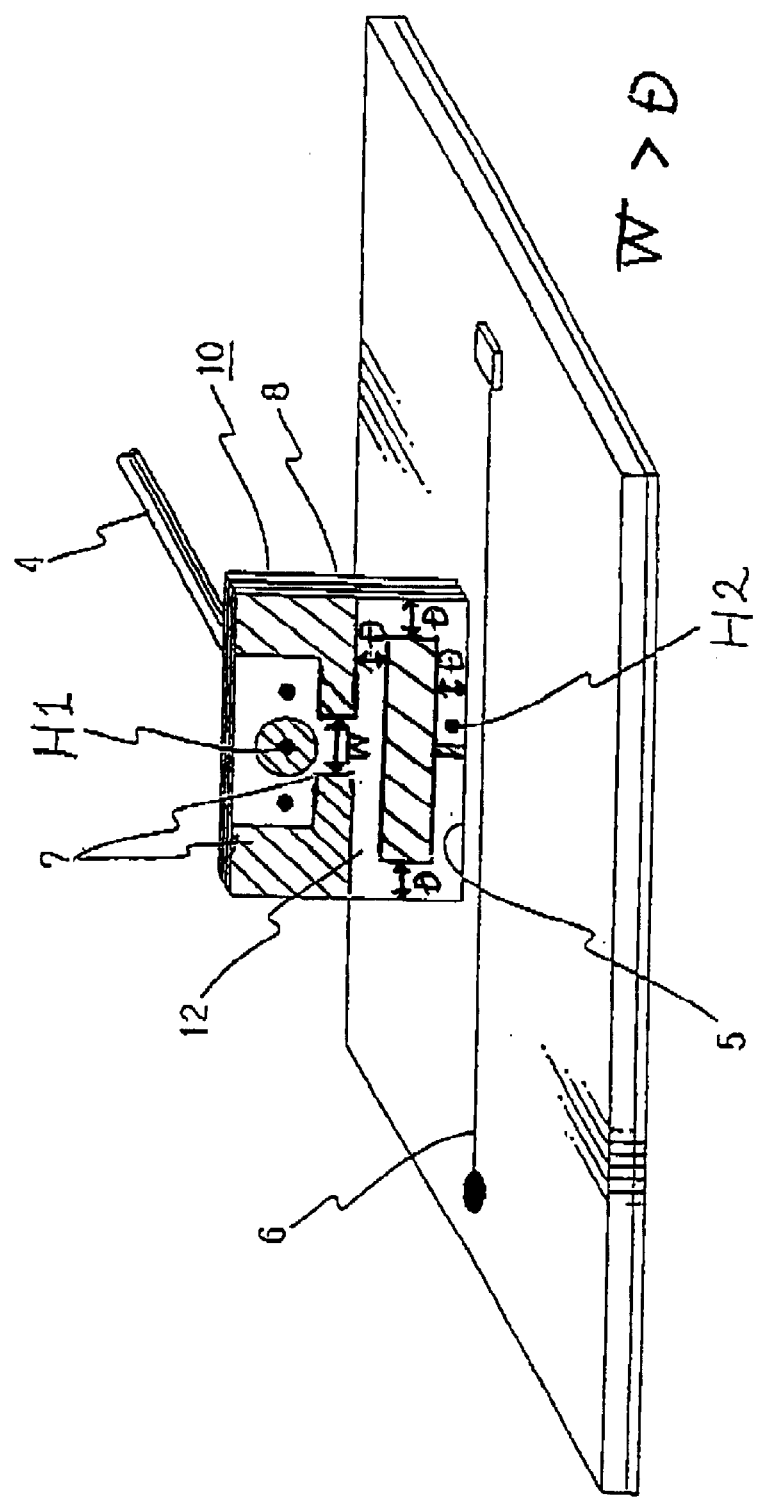
FIG. 14D is a schematic perspective view illustrative of a novel strip line shielded loop magnetic detector having a multilayer substrate body comprising two ground layers, a signal layer and a fixing layer in a third preferred modification to the fifth embodiment in accordance with the present invention.
Figure 15J:
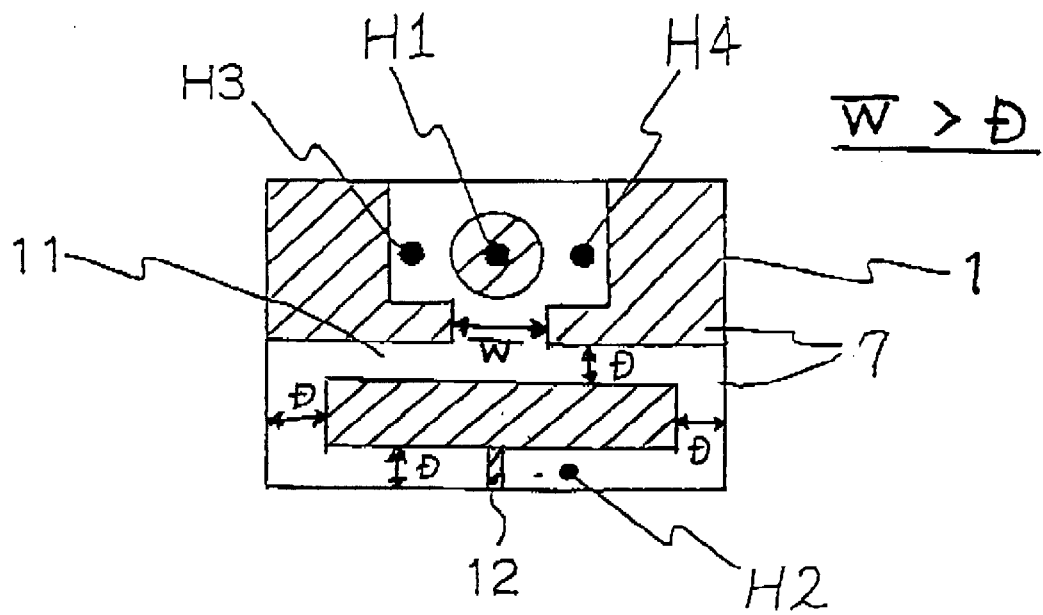
FIG. 15J is a plane view illustrative of each of two ground layers in a multilayer substrate body of a novel strip line shielded loop magnetic detector in a third preferred modification to the fifth embodiment in accordance with the present invention.
Figure 15K:
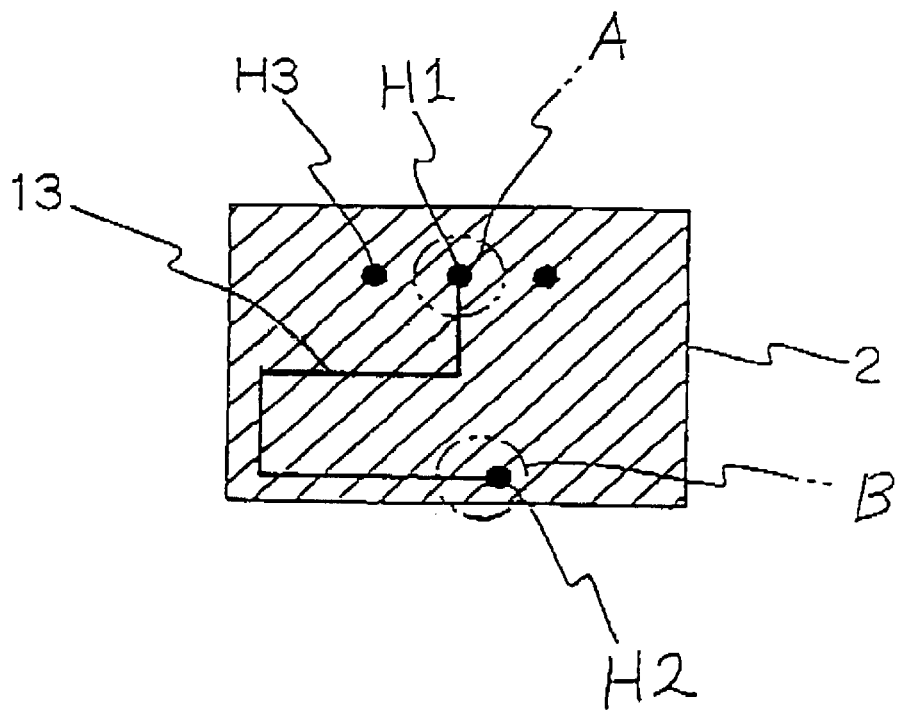
FIG. 15K is a plane view illustrative of a signal layer in a multilayer substrate body of a novel strip line shielded loop magnetic detector in a third preferred modification to the fifth embodiment in accordance with the present invention.
Figure 15L:
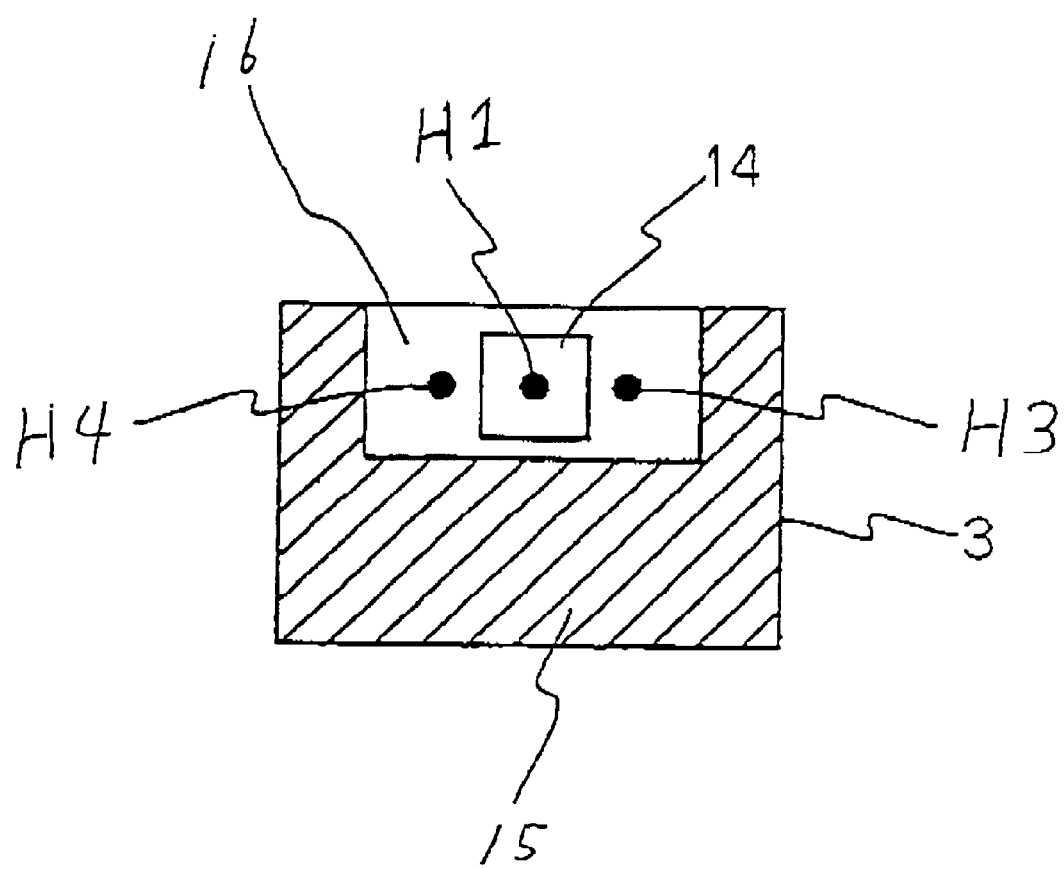
FIG. 15L is a plane view illustrative of a fixing layer in a multilayer substrate body of a novel strip line shielded loop magnetic detector in a third preferred modification to the fifth embodiment in accordance with the present invention.

A third preferred modification to the above fifth embodiment will subsequently be described with reference to FIGS. 14D, 15J, 15K and 15L, wherein the lead portion of the electrically conductive pattern 11 of each of the first and second ground layers 1 vertically extends between the first hole H1 and the rectangle-shaped dielectric region 7 and the width "W" of the lead portion is increased to be wider but within a few times than the width "D" of the looping portion of the electrically conductive pattern 11 which loops or surrounds the rectangle-shaped dielectric region 7 in order to improve the shielding characteristic for shielding the electrically conductive strip line pattern 13 as a stripe line from a majority of the electric field as the unnecessary component from the objective interconnection 6. FIG. 14D is a schematic perspective view illustrative of a novel strip line shielded loop magnetic detector having a multilayer substrate body comprising two ground layers, a signal layer and a fixing layer in a third preferred modification to the fifth embodiment in accordance with the present invention. FIG. 15J is a plane view illustrative of each of two ground layers in a multilayer substrate body of a novel strip line shielded loop magnetic detector in a third preferred modification to the fifth embodiment in accordance with the present invention. FIG. 15K is a plane view illustrative of a signal layer in a multilayer substrate body of a novel strip line shielded loop magnetic detector in a third preferred modification to the fifth embodiment in accordance with the present invention. FIG. 15L is a plane view illustrative of a fixing layer in a multilayer substrate body of a novel strip line shielded loop magnetic detector in a third preferred modification to the fifth embodiment in accordance with the present invention.

The description of the third preferred modification will focus on the differences from the above first preferred modification. The lead portion of the electrically conductive pattern 11 of each of the first and second ground layers 1 vertically extends between the first hole H1 and the rectangle-shaped dielectric region 7 and the width "W" of the lead portion is increased to be wider but within a few times than the width "D" of the looping portion of the electrically conductive pattern 11 which loops or surrounds the rectangle-shaped dielectric region 7 in order to improve the shielding characteristic for shielding the electrically conductive strip line pattern 13 as a stripe line from a majority of the electric field as the unnecessary component from the objective interconnection 6. The lead portion of the electrically conductive pattern 11 has the constant width "W", whilst the looping portion of the electrically conductive pattern 11 has the other constant width "D" which is narrower by not more than a few times than the constant width "W" of the lead portion. Differently from the looping portion of the electrically conductive pattern 11, the variation in width "W" of the lead portion of the electrically conductive pattern 11 provides almost no influence to the spatial resolution of the detector. For this reason, the lead portion of the electrically conductive pattern 11 is widen to improve the shielding characteristic of the electrically conductive strip line pattern 13 without any substantive deterioration in the spatial resolution of the detector. Not only the necessary magnetic field but also the unnecessary electric field generated by the objective interconnection 6 are applied to the detector. The unnecessary electric field has a larger vertical component than a horizontal component, for which reason the vertically extending lead portion of the electrically conductive pattern 11 is likely to receive a greater influence from the unnecessary electric field than the looping portion of the electrically conductive pattern 11. Therefore, the looping portion of the electrically conductive pattern 11 remains in width at "D", whilst the lead portion of the electrically conductive pattern 11 is widen from "D" to "W" to improve the shielding characteristic of the electrically conductive strip line pattern 13 for shielding the electrically conductive strip line pattern 13 from the influence of the unnecessary electric field without any substantive deterioration in the spatial resolution of the detector.

Figure 14E:
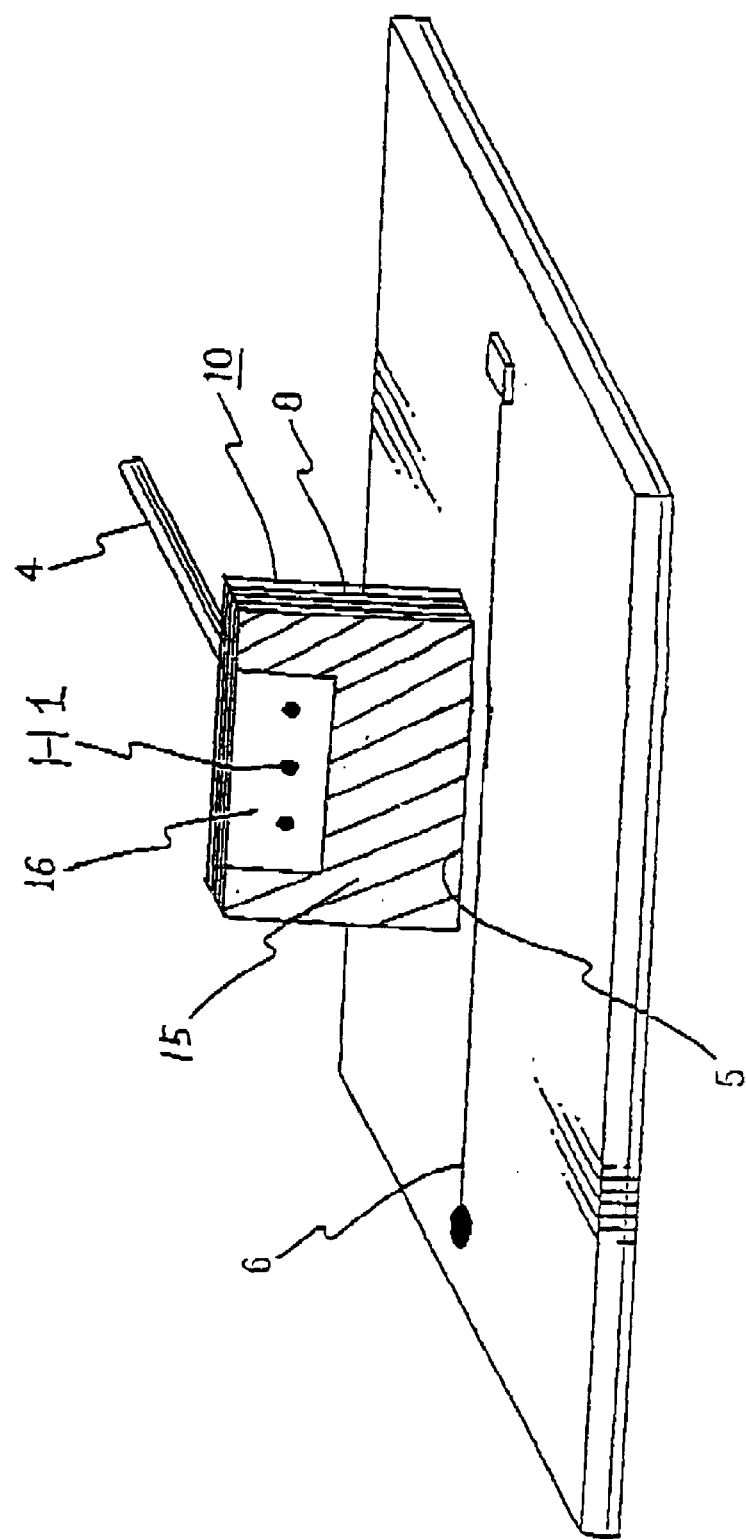
FIG. 14E is a schematic perspective view illustrative of a novel strip line shielded loop magnetic detector having a multilayer substrate body comprising two ground layers, a signal layer and two fixing layers in a fourth preferred modification to the above fifth embodiment and also to the above first, second and third preferred modifications in accordance with the present invention.
Figure 15M:
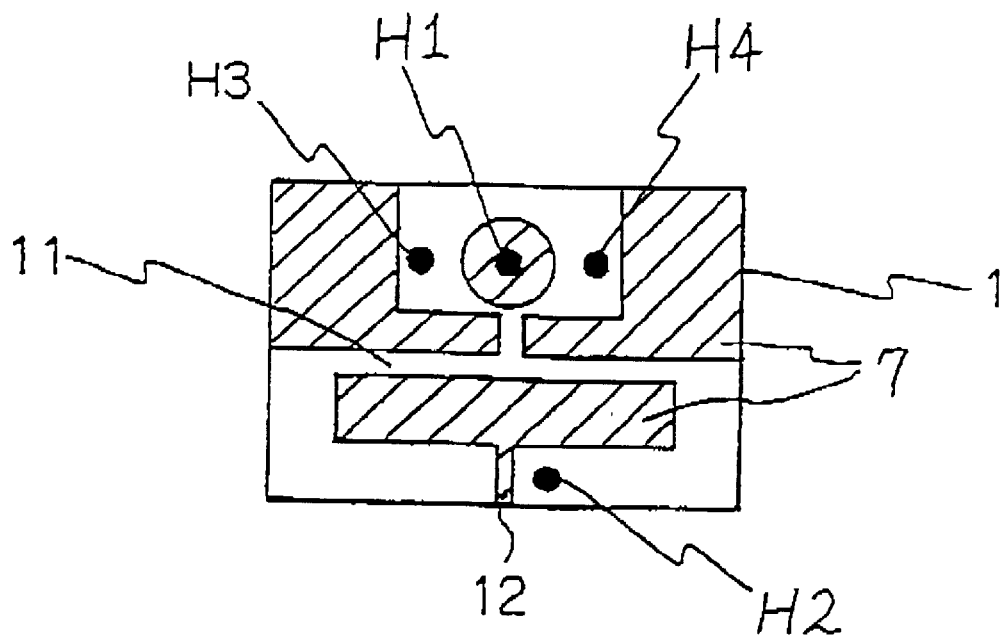
FIG. 15M is a plane view illustrative of each of two ground layers in a multilayer substrate body of a novel strip line shielded loop magnetic detector in a fourth preferred modification to the above fifth embodiment and also to the above first, second and third preferred modifications in accordance with the present invention.
Figure 15N:
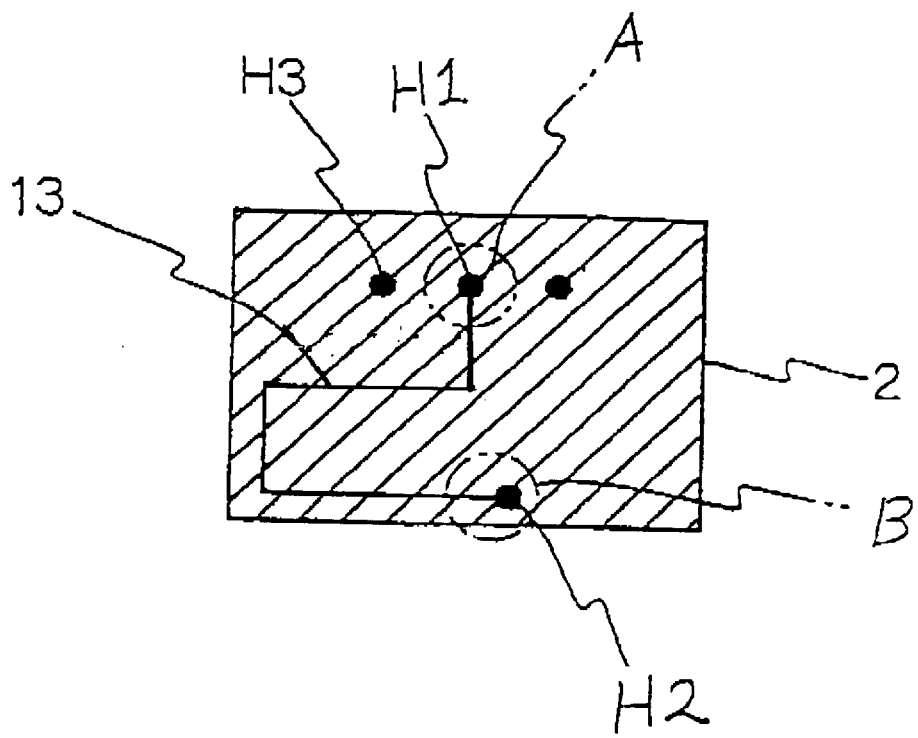
FIG. 15N is a plane view illustrative of a signal layer in a multilayer substrate body of a novel strip line shielded loop magnetic detector in a fourth preferred modification to the above fifth embodiment and also to the above first, second and third preferred modifications in accordance with the present invention.
Figure 15O:
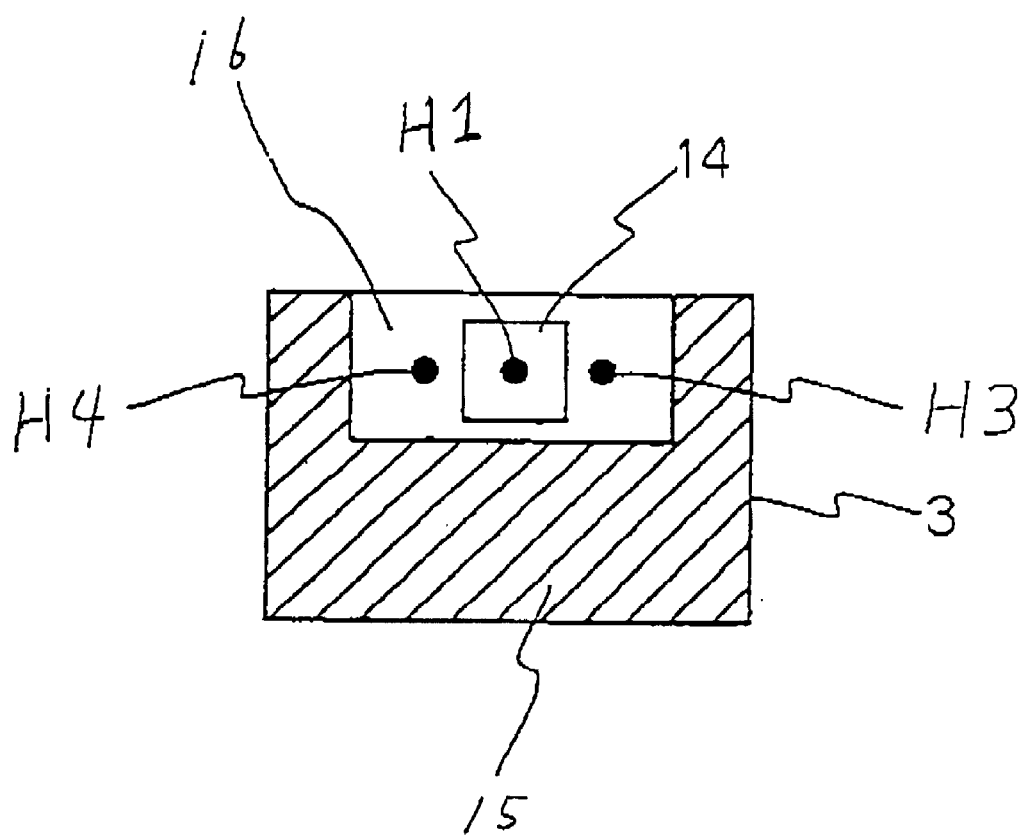
FIG. 15O is a plane view illustrative of a primary fixing layer in a multilayer substrate body of a novel strip line shielded loop magnetic detector in a fourth preferred modification to the above fifth embodiment and also to the above first, second and third preferred modifications in accordance with the present invention.
Figure 15P:
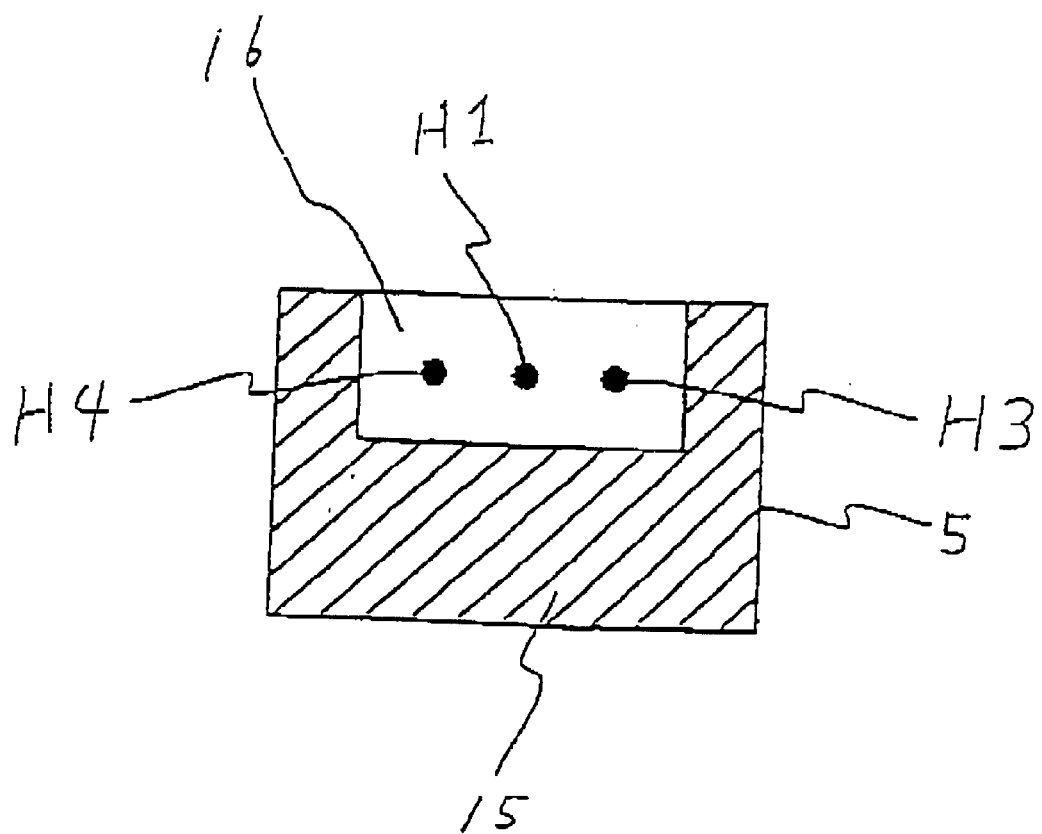
FIG. 15P is a plane view illustrative of a secondary fixing layer in a multilayer substrate body of a novel strip line shielded loop magnetic detector in a fourth preferred modification to the above fifth embodiment and also to the above first, second and third preferred modifications in accordance with the present invention.
Figure 15Q:
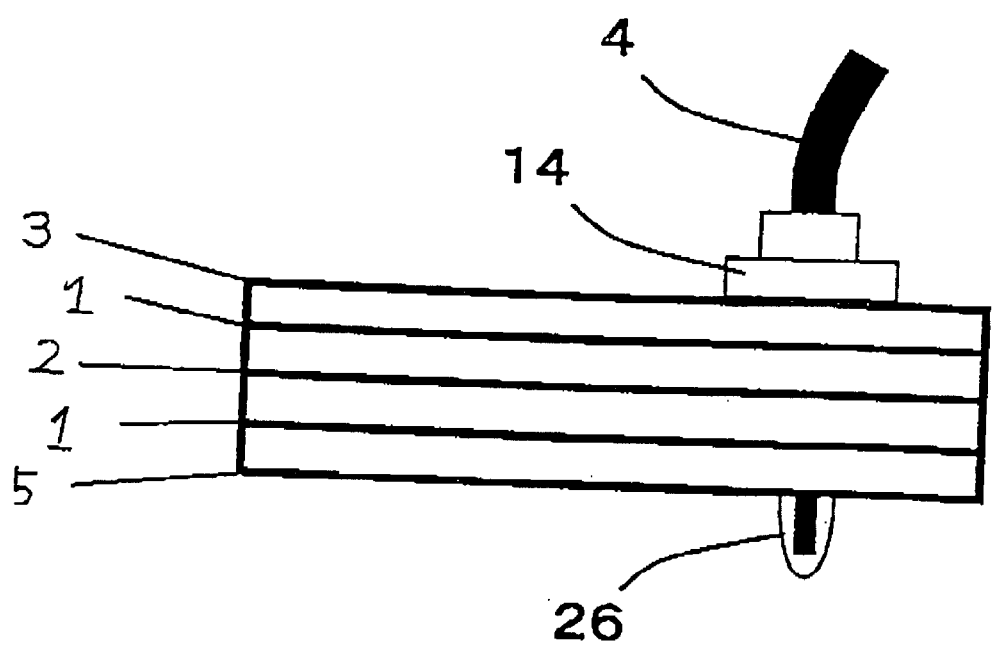
FIG. 15Q is a cross sectional elevation view illustrative of a lamination structure of the multilayer substrate body of a novel strip line shielded loop magnetic detector in a fourth preferred modification to the above fifth embodiment and also to the above first, second and third preferred modifications in accordance with the present invention.

A fourth preferred modification to the above fifth embodiment and also to the above first, second and third preferred modifications will subsequently be described with reference to FIGS. 14E, 15M, 15N, 15O, 15P and 15Q, wherein a secondary fixing layer is additionally provided in contact with a first ground layer, so that the first layer is sandwiched between the signal layer and the secondary fixing layer, whereby the primary and secondary fixing layers sandwich the first and second ground layers which further sandwich the signal layer. FIG. 14E is a schematic perspective view illustrative of a novel strip line shielded loop magnetic detector having a multilayer substrate body comprising two ground layers, a signal layer and two fixing layers in a fourth preferred modification to the above fifth embodiment and also to the above first, second and third preferred modifications in accordance with the present invention. FIG. 15M is a plane view illustrative of each of two ground layers in a multilayer substrate body of a novel strip line shielded loop magnetic detector in a fourth preferred modification to the above fifth embodiment and also to the above first, second and third preferred modifications in accordance with the present invention. FIG. 15N is a plane view illustrative of a signal layer in a multilayer substrate body of a novel strip line shielded loop magnetic detector in a fourth preferred modification to the above fifth embodiment and also to the above first, second and third preferred modifications in accordance with the present invention. FIG. 15O is a plane view illustrative of a primary fixing layer in a multilayer substrate body of a novel strip line shielded loop magnetic detector in a fourth preferred modification to the above fifth embodiment and also to the above first, second and third preferred modifications in accordance with the present invention. FIG. 15P is a plane view illustrative of a secondary fixing layer in a multilayer substrate body of a novel strip line shielded loop magnetic detector in a fourth preferred modification to the above fifth embodiment and also to the above first, second and third preferred modifications in accordance with the present invention. FIG. 15Q is a cross sectional elevation view illustrative of a lamination structure of the multilayer substrate body of a novel strip line shielded loop magnetic detector in a fourth preferred modification to the above fifth embodiment and also to the above first, second and third preferred modifications in accordance with the present invention.

The description of the fourth preferred modification will focus on the differences from the above fifth embodiment and also from the above first, second and third preferred modifications. With reference to FIGS. 14E, 15M, 15N, 15O, 15P and 15Q, a secondary fixing layer 5 is additionally provided in contact with the first ground layer 1, so that the first ground layer 1 is sandwiched between the signal layer 2 and the secondary fixing layer 5, provided that lamination structures of the first ground layer 1, the signal layer 2, the second ground layer 1 and the primary fixing layer 3 are the same as in the above fifth embodiment and also in the above first, second and third preferred modifications. Namely, in the above fifth embodiment and also in the above first, second and third preferred modifications, the multilayer structure comprises the single signal layer, the single fixing layer and the two ground layers. By contrast, in this fourth preferred modification to the above fifth embodiment and also to the above first, second and third preferred modifications, the multilayer structure comprises the single signal layer, the two fixing layers and the two ground layers. In detail, the signal layer 2 is sandwiched between the first and second ground layers 1. The first and second ground layers 1 are further sandwiched between the primary and secondary fixing layers 3 and 4, wherein the primary fixing layer 3 is in contact with the second ground layer 1 and the secondary fixing layer 5 is in contact with the first ground layer 1. A connector 14 is provided on the primary ground layer 1 so that a external coaxial line 4 is connected through the connector 14 and through the first via hole H1 penetrating the primary fixing layer 3, the second ground layer 1, and the signal layer 2, the first ground layer 1 and the secondary fixing layer 5 to a solder 26 on the secondary fixing layer 5. The secondary fixing layer 5 is structurally different from the primary fixing layer 3 only in that the connector 14 is not provided. Namely, the secondary fixing layer 5 also has a first via hole H1 which is positioned in correspondence with the first via hole H1 of the first ground layer 1. The secondary fixing layer 5 also has a third via hole H3 which is positioned in correspondence with the third via hole H3 of the first ground layer 1. The secondary fixing layer 5 also has a fourth via hole H4 which is positioned in correspondence with the fourth via hole H4 of the first ground layer 1. The secondary fixing layer 5 comprises a dielectric region 15 entirely extending except in the vicinity of the first, third and fourth via holes H1, H3 and H4. The secondary fixing layer 5 has a dielectric region 15 entirely extending except for a rectangle-shaped conductive region 16 which includes the third and fourth via holes H1, H3 and H4.

An additional provision of the secondary fixing layer 5 provides the following advantages. The secondary fixing layer 5 has almost the same dielectric and conductive region patterns as the primary fixing layer 3. Further, the primary and secondary fixing layers 3 and 5 sandwich the second and first ground layers 1 which further sandwich the single signal layer 2. The additional provision of the secondary fixing layer 5 improves the symmetry in conductive and dielectric region patterns in the thickness direction vertical to the surfaces of the above laminated layers 1, 2, 3 and 5, thereby improving the stability in signal transmission on the electrically conductive strip line pattern 13 of the signal layer 2. Further, the secondary fixing layer 5 is provided for covering the first ground layer 1, whereby the secondary fixing layer 5 protects the conductive and dielectric patterns of the first ground layer 1. Furthermore, the additional provision of the secondary fixing layer 5 forms five-layered lamination structures. The increase in the number of the lamination layers improves the mechanical strength of the multilayer structure, thereby suppressing the multilayer structure from being bent.

Sixth Embodiment

Figure 16A:
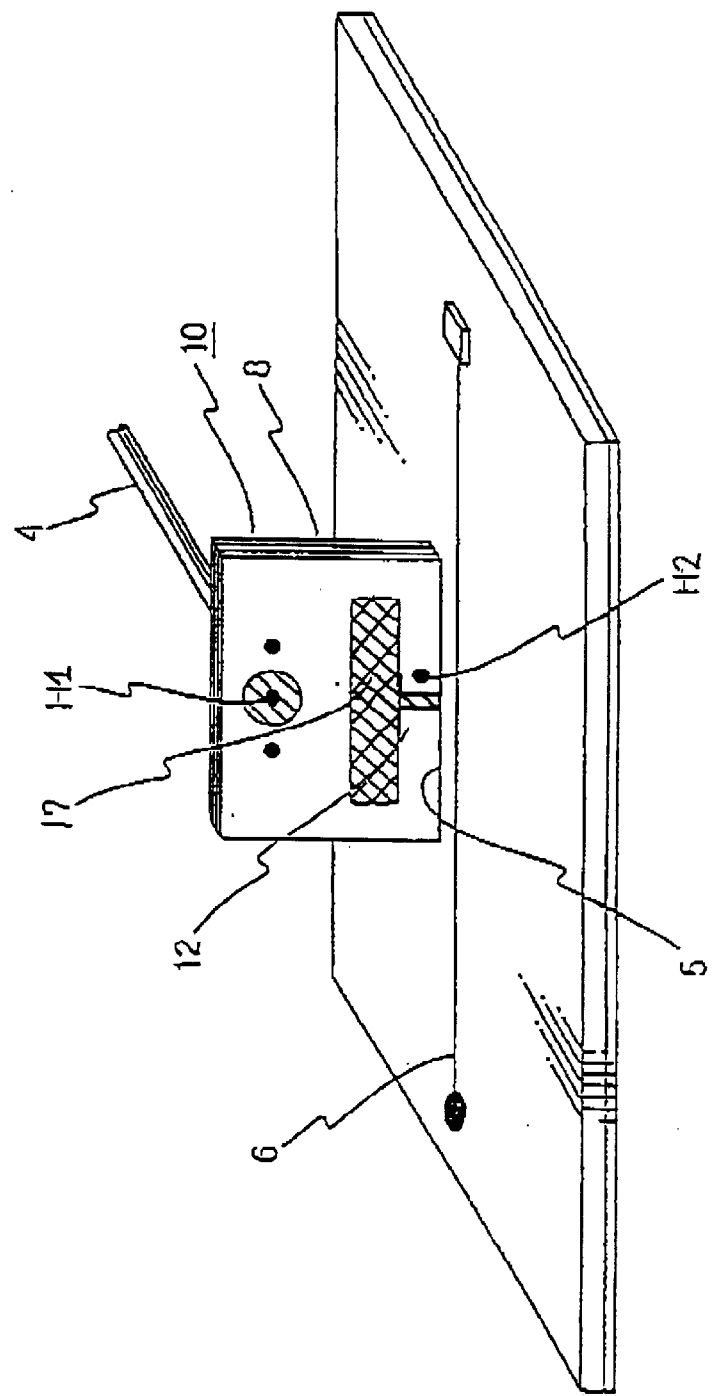
FIG. 16A is a schematic perspective view illustrative of a novel strip line shielded loop magnetic detector having a multilayer substrate body comprising two ground layers, a signal layer and a fixing layer in a sixth embodiment in accordance with the present invention.
Figure 17A:
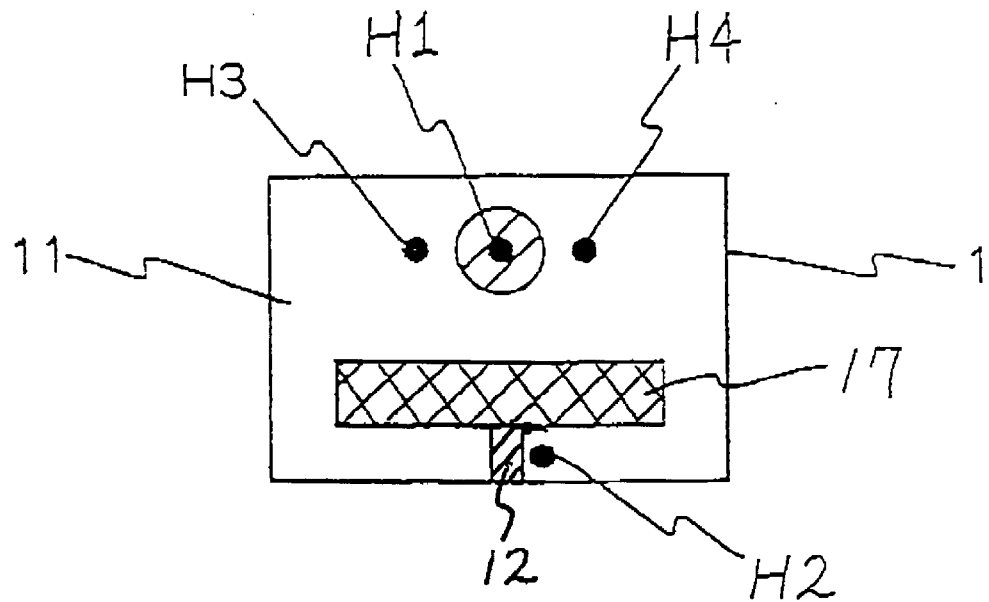
FIG. 17A is a plane view illustrative of each of two ground layers in a multilayer substrate body of a novel strip line shielded loop magnetic detector in a sixth embodiment in accordance with the present invention.
Figure 17B:
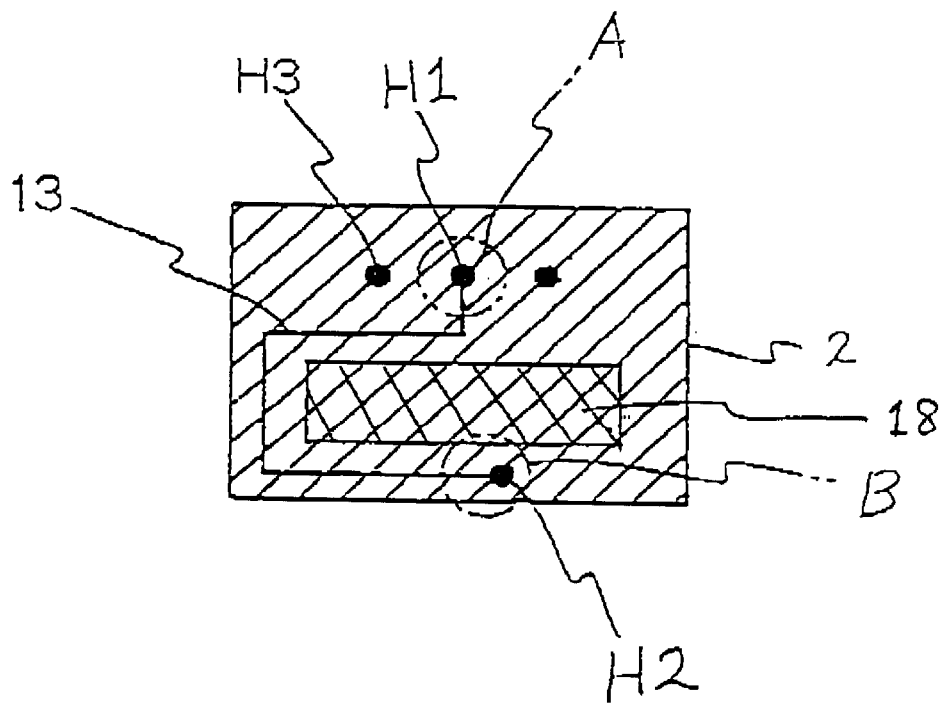
FIG. 17B is a plane view illustrative of a signal layer in a multilayer substrate body of a novel strip line shielded loop magnetic detector in a sixth embodiment in accordance with the present invention.
Figure 17C:
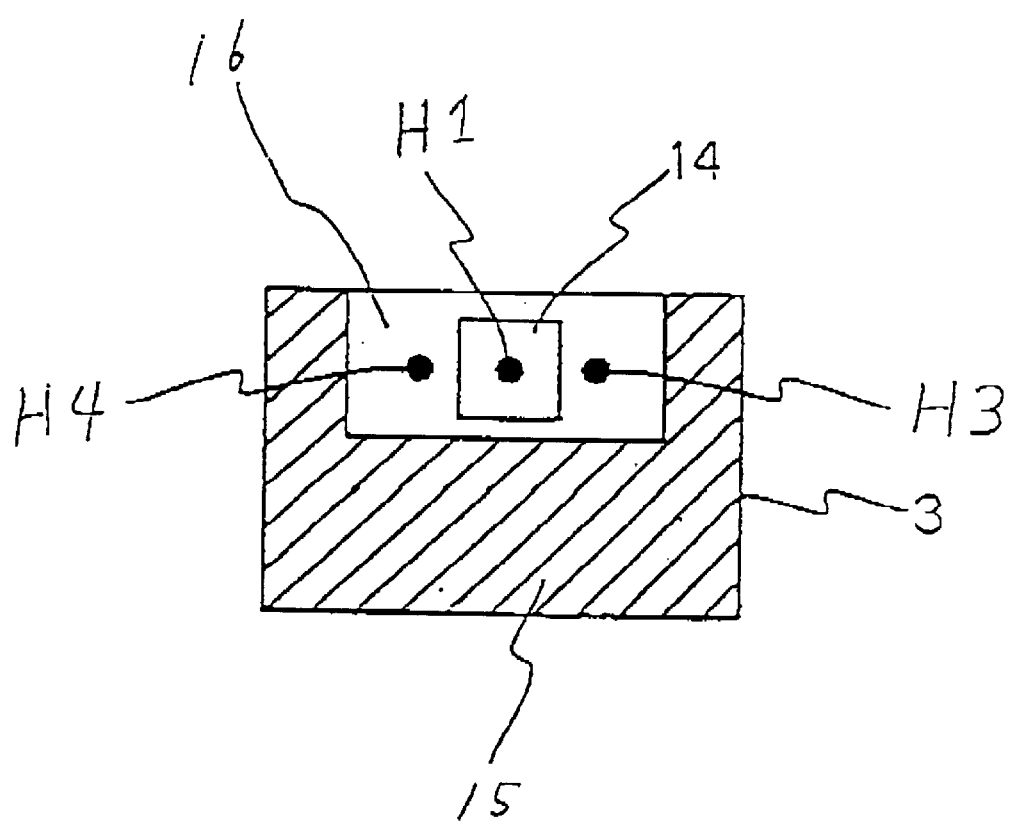
FIG. 17C is a plane view illustrative of a fixing layer in a multilayer substrate body of a novel strip line shielded loop magnetic detector in a sixth embodiment in accordance with the present invention.

A sixth embodiment according to the present invention will be described in detail with reference to FIGS. 16A, 17A, 17B and 17C. FIG. 16A is a schematic perspective view illustrative of a novel strip line shielded loop magnetic detector having a multilayer substrate body comprising two ground layers, a signal layer and a fixing layer in a sixth embodiment in accordance with the present invention. FIG. 17A is a plane view illustrative of each of two ground layers in a multilayer substrate body of a novel strip line shielded loop magnetic detector in a sixth embodiment in accordance with the present invention. FIG. 17B is a plane view illustrative of a signal layer in a multilayer substrate body of a novel strip line shielded loop magnetic detector in a sixth embodiment in accordance with the present invention. FIG. 17C is a plane view illustrative of a fixing layer in a multilayer substrate body of a novel strip line shielded loop magnetic detector in a sixth embodiment in accordance with the present invention. The novel device for detecting a magnetic field in this embodiment is structurally different from that of the first embodiment in further provision of a magnetic region in a center region of a dielectric looped face surrounded by an electrically conductive strip line pattern to cause a concentration of a magnetic flux which penetrates the dielectric looped face thereby improving a sensitivity of the device.

The novel strip line shielded loop magnetic detector 10 for detecting a magnetic field has a multilayer substrate body 8 which comprises laminations of a signal layer 2 and first and second ground layers 1 sandwiching the signal layer 2 as well as a fixing layer 3.

The signal layer 2 is made of a dielectric substance. The signal layer 2 has an electrically conductive strip line pattern 13 which comprises series connections of the following first to fourth straight strip line segments extending to form a modified U-shape and also form a dielectric looped face 7 surrounded by the modified U-shape of the electrically conductive strip line pattern 13 in three quarter of omni-directions. The dielectric looped face 7 is in parallel to interfaces between the signal layer 2 and the first and second ground layers 1. The dielectric looped face 7 has a magnetic region 18 made of a dielectric substance exhibiting a magnetic property. The magnetic region 18 causes that a magnetic flux is concentrated to penetrate the magnetic region 18. Since the magnetic region 18 is positioned on a center region of the dielectric looped face so that the concentrated magnetic flux penetrates the center region of the dielectric looped face defined by the electrically conductive strip line pattern 13. The magnetic region 18 has a slender rectangular shape having a horizontally longitudinal direction and is symmetrical with reference to the center vertical line of the signal layer 2. The electrically conductive strip line pattern 13 has a first end "A" and a second end "B". A first via hole H1 is formed at the first end of the electrically conductive strip line pattern 13 in the signal layer 2. A second via hole H2 is formed at the second end of the electrically conductive strip line pattern 13 in the signal layer 2. Third and fourth via holes H3 and H4 are further formed at opposite side positions of said first via hole H1 so that the first, third and fourth via holes H1, H3 and H4 are aligned in a horizontal direction and positioned at upper positions of the signal layer 2. The second via hole is positioned at a lower position of the signal layer 2. The first via hole H1 is positioned on a vertical center line. The third and fourth via holes H3 and H4 are positioned in opposite sides of the first via hole H1 at the same level as the first via hole H1 so that the first, third and fourth via holes H1, H3 and H4 are aligned horizontally and symmetrically with reference to the vertical center line of the signal layer 2. The second via hole H2 is displaced from the vertical center line to the same side as the fourth via hole. The electrically conductive strip line pattern 13 mainly extends in the same side as the third via hole H3. The electrically conductive strip line pattern 13 extends from the first end "A" at the first via hole H1 downwardly and further extends in the horizontal direction into the same side as the third via hole H3, and furthermore extends downwardly along the side of the signal layer 2, and moreover extends in the horizontal direction toward the opposite side to pass through the vertical center line and to reach the second via hole H2, whereby the dielectric looped face is defined to be rectangular-shaped and positioned mainly in the same side as the third via hole H3. As described above, the electrically conductive strip line pattern 13 has the following first to fourth straight strip line segments. A first straight strip line segment of the electrically conductive strip line pattern 13 is connected to the first end "A" and extends in a direction vertical to the contact side of the detector 1 and has a level over the magnetic region 18. A second straight strip line segment of the electrically conductive strip line pattern 13 is connected to the first straight strip line segment and also extends in a direction parallel to the contact side of the detector 1 and has a level over the magnetic region 18. A third straight strip line segment of the electrically conductive strip line pattern 13 is connected to the second straight strip line segment and also extends in a direction vertical to the contact side of the detector 1 and also extends on a vertically extending intermediate line between the edge of the rectangle-shaped magnetic region 18 and the side edge of the detector 1. A fourth straight strip line segment of the electrically conductive strip line pattern 13 is connected to the third straight strip line segment and extends in a direction parallel to the contact side of the detector 1 on a horizontally extending intermediate line between the bottom side of the rectangle-shaped magnetic region 18 and the contact side of the detector 1. Consequently, it is preferable that the electrically conductive strip line pattern 13 extends in the signal layer 2 so that, in the vertical view to the interfaces of the signal layer 2 and the ground layer 1, the electrically conductive strip line pattern 13 as a signal line extends along a center line of the electrically conductive pattern 11 of the ground layer 1 in order to ensure stable transmission characteristics. It is also preferable that a left side width of the electrically conductive pattern 11 defined to be the distance between the left side edge of the rectangle-shaped magnetic region 18 and the left side of the ground layer is not more than approximately 10 times of a width of the electrically conductive strip line pattern 13 as a signal line in order to improve the stability of the transmission characteristics. The electrically conductive pattern 11 may optionally comprise a metal foil.

Each of the first and second ground layers 1 comprises an electrically conductive pattern 11 which is electrically connected only to the second end "B" of the electrically conductive strip line pattern 13 so that the each of the first and second ground layers 1 serves as a ground. Each of the first and second ground layers 1 has a slender rectangle-shaped region of a horizontal longitudinal axis with an additional region vertically extending from the slender rectangle shape region to a contact side of each of the first and second ground layers 1 so that the additional region forms a gap 12 in the bottom side region of the electrically conductive pattern 11. The first ground layer 1 has a magnetic region 17 as shown in FIG. 17A, whilst the second ground layer has no magnetic region as shown in FIG. 4A. The magnetic region 17 having a rectangle-shape is formed only in the first ground layer 1 on the slender rectangle-shaped region of the third one of the three dielectric regions 7. The magnetic region 17 exists on the rectangle-shaped region of the dielectric region 7 but does not extend on the gap 12. The gap 12 comprises the dielectric substance of the dielectric regions 7. The magnetic region 17 is made of a dielectric substance showing a magnetic property. The magnetic region 17 of the first ground layer 1 is almost omni-directionally surrounded by the looping portion of the electrically conductive pattern 11. The magnetic region 17 of the first ground layer 1 is positioned in correspondence with the magnetic region 18 of the signal layer 2 in view vertical to the interface of the signal layer 2 and the ground layer 1. The structure of the second ground layer 1 is the same as shown in FIG. 15A. A magnetic flux penetrates the magnetic regions 17 and 18 on the center region of the dielectric looped face defined by the electrically conductive strip line pattern 13. The first and second ones of the three dielectric regions 7 are provided to increase an area of the dielectric region of each of the first and second ground layers 1 and also decrease an area of the electrically conductive pattern 11 of each of the first and second ground layers 1. The magnetic region 17 has a slender rectangular shape having a horizontally longitudinal direction and is symmetrical with reference to the center vertical line of each of the first and second ground layers 1. The dielectric region 7 of the first ground layer 1 comprises not only the slender rectangular shaped main part but also an additionally extending part which extends from the slender rectangular shaped main part to the bottom side of each of the first and second ground layers 1 so as to form a gap 12 in the bottom side region of the electrically conductive pattern 11. The each of the first and second ground layers 1 has a first via hole H1 at a position corresponding to the first via hole H1 of the signal layer 2. The each of the first and second ground layers 1 also has a second via hole H2 at a position corresponding to the second via hole H2 of the signal layer 2. The each of the first and second ground layers 1 also has a third via hole H3 at a position corresponding to the third via hole H3 of the signal layer 2. The each of the first and second ground layers 1 also has a fourth via hole H4 at a position corresponding to the fourth via hole H4 of the signal layer 2. The each of the first and second ground layers 1 further has an isolation region around the first via hole H1 so that the first via hole H1 is electrically isolated from the electrically conductive pattern 11. The second, third and fourth via holes H2, H3 and H4 are electrically and structurally connected with the electrically conductive pattern 11.

The fixing layer 3 is provided in contact with the second ground layer 1 for the purpose exclusively of fixing the external coaxial line 4. The fixing layer 3 has a connector 14 for connecting the external coaxial line 4. The fixing layer 3 also has a first via hole H1 which is positioned in correspondence with the first via hole H1 of the second ground layer 1. The fixing layer 3 also has a third via hole H3 which is positioned in correspondence with the third via hole H3 of the second ground layer 1. The fixing layer 3 also has a fourth via hole H4 which is positioned in correspondence with the fourth via hole H4 of the second ground layer 1. The connector 14 is positioned in correspondence with the first via hole H1 so that the first end "A" of the electrically conductive strip line pattern 13 is electrically connected through the first via hole H1 to the external coaxial line 4 connected by the connector 14 to the first via hole H1. The fixing layer 3 comprises a dielectric region 15 entirely extending except in the vicinity of the first, third and fourth via holes H1, H3 and H4. The dielectric region 15 of the fixing layer 3 further has no magnetic region.

The first end "A" of the electrically conductive strip line pattern 13 of the signal layer 2 is connected through the first via hole H1 to the external coaxial line 4. The electrically conductive strip line pattern 13 extends to pass through the corresponding position to the gap 12, so that the second end "B" of the electrically conductive strip line pattern 13 is connected through the second via hole H2 to the electrically conductive pattern of each of the first and second ground layers 1.

The measurement of the magnetic field generated by an objective interconnection 6 is carried out by use of the above novel magnetic field detector 10 as follows.

With reference again to FIG. 16A, the novel magnetic field detector 10 is positioned so that the bottom side 5 of the multilayer substrate body 8 is just over the objective interconnection 6 generating the magnetic field which is intended to be measured, wherein the bottom side 5 of the multilayer substrate body 8 is in parallel to the objective interconnection 6, so that the dielectric looped face defined by the electrically conductive strip line pattern 13 of the signal layer 2 is also in parallel to the objective interconnection 6. Further, the magnetic region 17 of the first ground layer 1 and the magnetic region 18 on the center region of the dielectric looped face defined by the electrically conductive strip line pattern 13 of the signal layer 2 are positioned in the vicinity of the objective interconnection 6, so that the magnetic flux in the vicinity of the objective interconnection 6 penetrates the magnetic region 17 of the first ground layer 1 and the magnetic region 18 on the center region of the dielectric looped face defined by the electrically conductive strip line pattern 13. As a result, even if an adjacent interconnection not illustrated is positioned very close to the objective interconnection 6 and this adjacent interconnection generates an additional magnetic field, then the magnetic flux generated by the objective interconnection 6 penetrates the magnetic region 17 of the first ground layer 1 and the magnetic region 18 on the center region of the dielectric looped face defined by the electrically conductive strip line pattern 13, whilst the magnetic flux generated by the adjacent interconnection does not penetrate the magnetic region 17 of the first ground layer 1 and the magnetic region 18 on the center region of the dielectric looped face defined by the electrically conductive strip line pattern 13, for which reason the novel magnetic field detector 10 is capable of selectively detecting only the magnetic field generated by the objective interconnection 6 without receiving any substantive disturbance due to the magnetic field generated by the adjacent interconnection.

The above electrically conductive strip line pattern 13 may be formed by an etching process or a sputtering process. This structure enables a remarkable scaling down of the detector body 8. Particularly, the above structure enables the dielectric looped face surrounded by the electrically conductive strip line pattern 13 to be positioned extremely adjacent to the objective interconnection 6 which generates the magnetic field to be measured, so that even if any adjacent interconnection not illustrated is positioned very close to the objective interconnection 6, the above novel magnetic field detector 10 is capable of detecting only the magnetic field generated by the objective interconnection 6 without, however, receiving any influence of a disturbing magnetic field generated by the adjacent interconnection. The above electrically conductive strip line pattern is formed to position the magnetic region 17 of the first ground layer 1 and the magnetic region 18 on the center region of the dielectric looped face closer to the bottom side of the multilayer substrate body 8 so that the magnetic region 17 of the first ground layer 1 and the magnetic region 18 on the center region of the dielectric looped face are positioned closer to the objective interconnection 6, whereby the detector 10 can detect only the magnetic field extremely adjacent to the objective interconnection 6 without, however, receiving any influence of a disturbing magnetic field generated by the adjacent interconnection. This improves the spatial resolution of the detector 10.

The above electrically conductive strip line pattern 13 is formed by the etching or sputtering process without being hand-made, for which reason it is possible to form highly accurate and largely scaled down magnetic field detector 10.

In detection of the magnetic field, the device 10 is positioned just over the objective interconnection 6 so that the dielectric looped face is in parallel to the objective interconnection 6 and positioned just over the objective interconnection 6. In order to increase the sensitivity of the device 10, it is preferable that the electrically conductive strip line pattern 13 extends as long as possible in the direction along which the objective interconnection 6 extends unless a spatial resolution of the detector is deteriorated due to a high frequency of the magnetic field generated by the objective interconnection 6. In order to ensure a high spatial resolution of the device 10, it is preferable that the electrically conductive strip line pattern 13 extends as close as possible to the bottom side of the multilayer substrate body 8 of the device 10 so that the dielectric looped face receives the magnetic field in the vicinity of the objective interconnection 6 without, however, receiving any substantive influence of the disturbing magnetic field generated by the adjacent interconnection.

The provision of the fixing layer 3 allows securely electrical and mechanical connection of the detector 10 to the external coaxial line 4.

As a modification, it is also possible to provide a terminating resistance at the second end "B" of the electrically conductive strip line pattern 13 to obtain a non-reflective terminal.

Figure 16B:
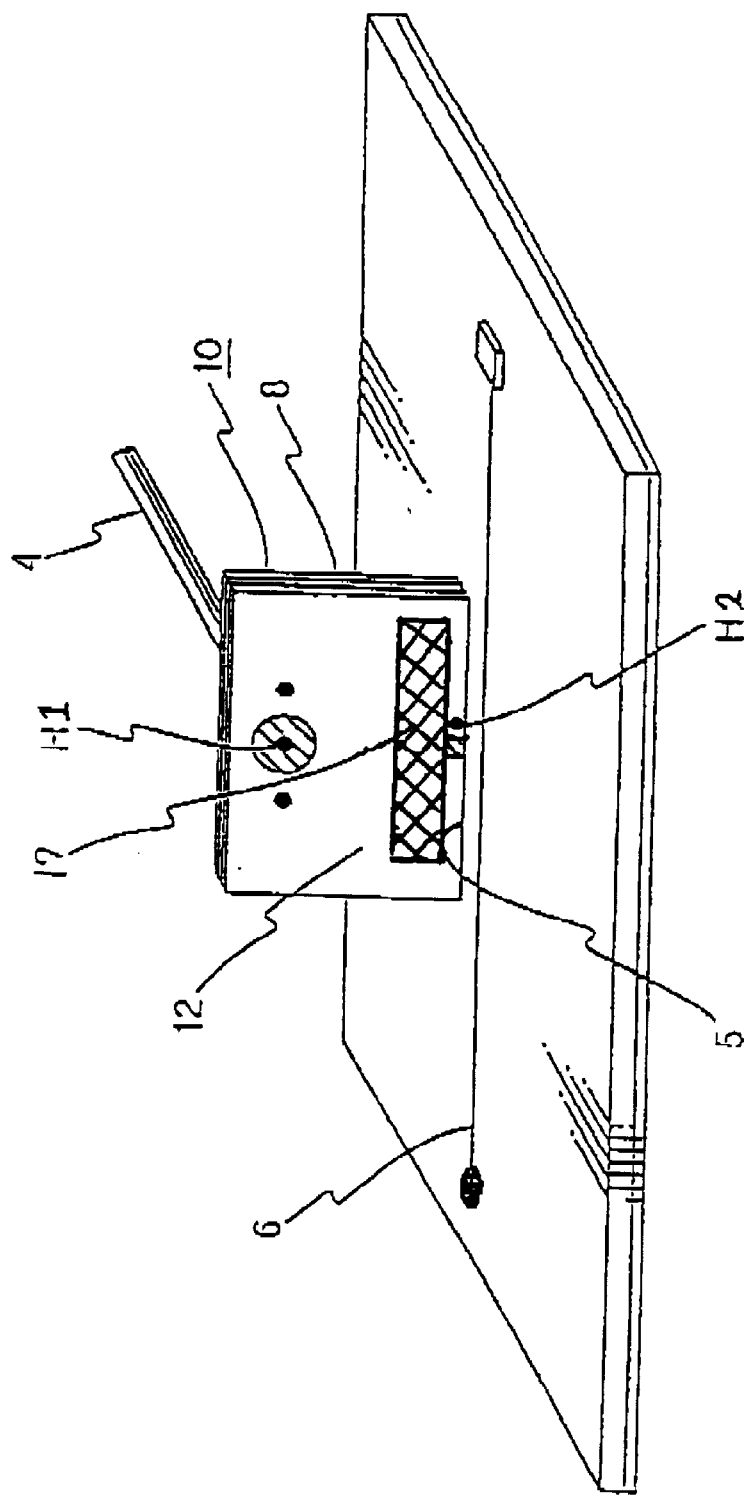
FIG. 16B is a schematic perspective view illustrative of a novel strip line shielded loop magnetic detector having a multilayer substrate body comprising two ground layers, a signal layer and a fixing layer in a first preferred modification to the sixth embodiment in accordance with the present invention.
Figure 17D:
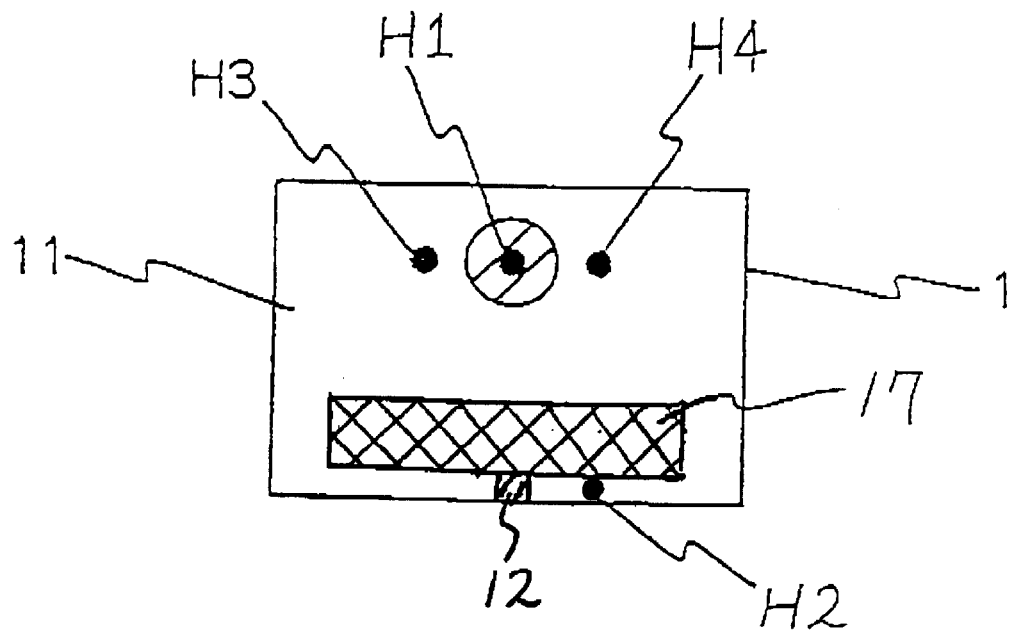
FIG. 17D is a plane view illustrative of each of two ground layers in a multilayer substrate body of a novel strip line shielded loop magnetic detector in a first preferred modification to the sixth embodiment in accordance with the present invention.
Figure 17E:
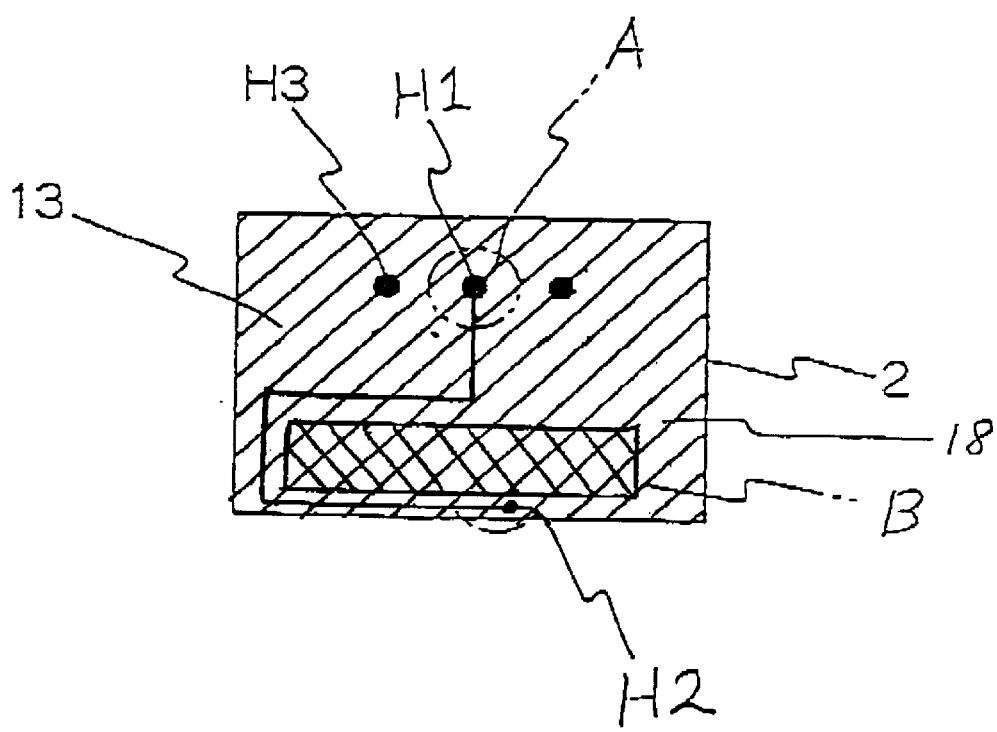
FIG. 17E is a plane view illustrative of a signal layer in a multilayer substrate body of a novel strip line shielded loop magnetic detector in a first preferred modification to the sixth embodiment in accordance with the present invention.
Figure 17F:
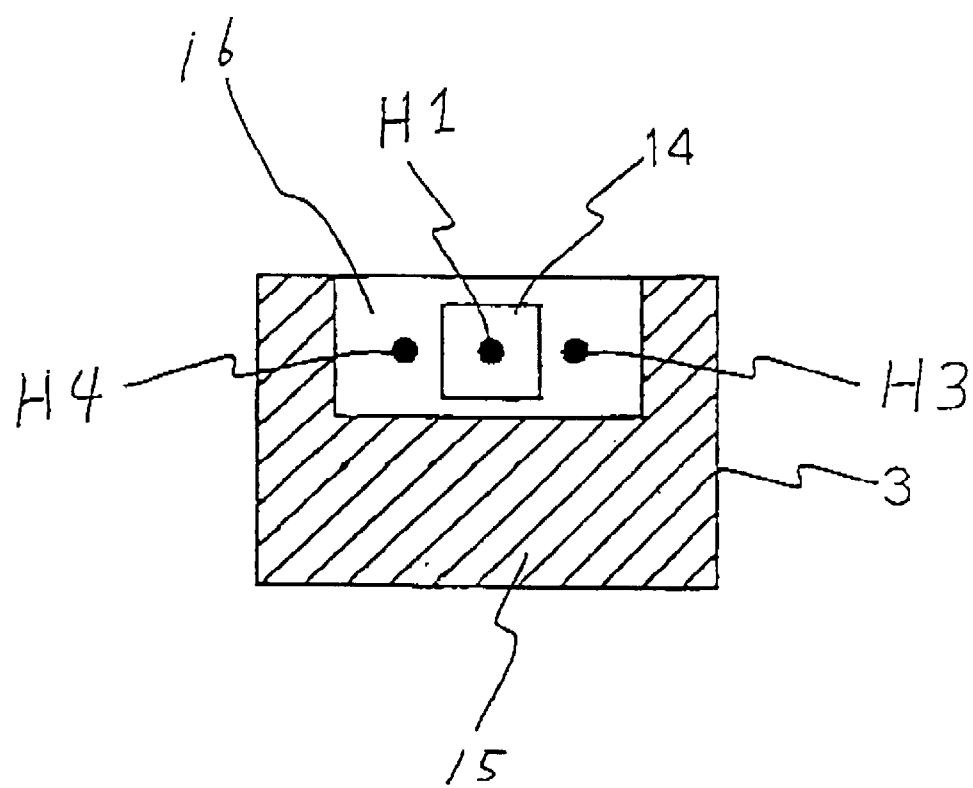
FIG. 17F is a plane view illustrative of a fixing layer in a multilayer substrate body of a novel strip line shielded loop magnetic detector in a first preferred modification to the sixth embodiment in accordance with the present invention.

A first preferred modification to the above sixth embodiment will subsequently be described with reference to FIGS. 16B, 17D, 17E and 17F, wherein the rectangle-shaped dielectric region 7 and the rectangle-shaped magnetic region 17 forming the looped face defined by the electrically conductive patterns 11 of the second and first ground layers 1 respectively are positioned so closer to the contact side of the detector 10 as possible to shorten the distance between the looped face and the objective interconnection 6 for the purpose of a possible large improvement in spatial resolution of the detector 1, provided that in the view vertical to the interface between the signal layer 2 and the ground layer 1, the electrically conductive strip line pattern 13 extends in the signal layer along a center line of the electrically conductive pattern 11 of each of the first and second ground layers 1. FIG. 16B is a schematic perspective view illustrative of a novel strip line shielded loop magnetic detector having a multilayer substrate body comprising two ground layers, a signal layer and a fixing layer in a first preferred modification to the sixth embodiment in accordance with the present invention. FIG. 17D is a plane view illustrative of each of two ground layers in a multilayer substrate body of a novel strip line shielded loop magnetic detector in a first preferred modification to the sixth embodiment in accordance with the present invention. FIG. 17E is a plane view illustrative of a signal layer in a multilayer substrate body of a novel strip line shielded loop magnetic detector in a first preferred modification to the sixth embodiment in accordance with the present invention. FIG. 17F is a plane view illustrative of a fixing layer in a multilayer substrate body of a novel strip line shielded loop magnetic detector in a first preferred modification to the sixth embodiment in accordance with the present invention.

The description of the first preferred modification will focus on the differences from the above sixth embodiment. In the first ground layer 1, the rectangle-shaped magnetic region 17 forms the looped face defined by the looping portion of the electrically conductive pattern 11. In the second ground layer 1, the rectangle-shaped dielectric region 7 forms the looped face defined by the looping portion of the electrically conductive pattern 11. In accordance with this first preferred modification, the rectangle-shaped dielectric region 7 and the rectangle-shaped magnetic region 17 as the looped face, through which the magnetic flux penetrates, are positioned so closer to the contact side of the detector 10 as possible to shorten the distance between the looped face and the objective interconnection 6 for the purpose of a possible large improvement in spatial resolution of the detector 1, provided that in the view vertical to the interface between the signal layer 2 and the ground layer 1, the electrically conductive strip line pattern 13 extends in the signal layer along center lines of the lead portion and the looping portion of the electrically conductive pattern 11 of each of the first and second ground layers 1. Namely, as the rectangle-shaped dielectric region 7 and the rectangle-shaped magnetic region 17 as the looped face are displaced closer to the contact side to the objective interconnection 6 to shorten the distance between the looped face and the objective interconnection 6 for the purpose of the large improvement in spatial resolution of the detector 10, then the electrically conductive strip line pattern 13 extending in the signal layer 2 is also displaced closer to the contact side, so that the electrically conductive strip line pattern 13 extends along the center lines of the looping portion of the electrically conductive pattern 11 of each of the first and second ground layers 1 in the vertical view to the interface between the signal layer 2 and each of the first and second ground layers 1.

Figure 16C:
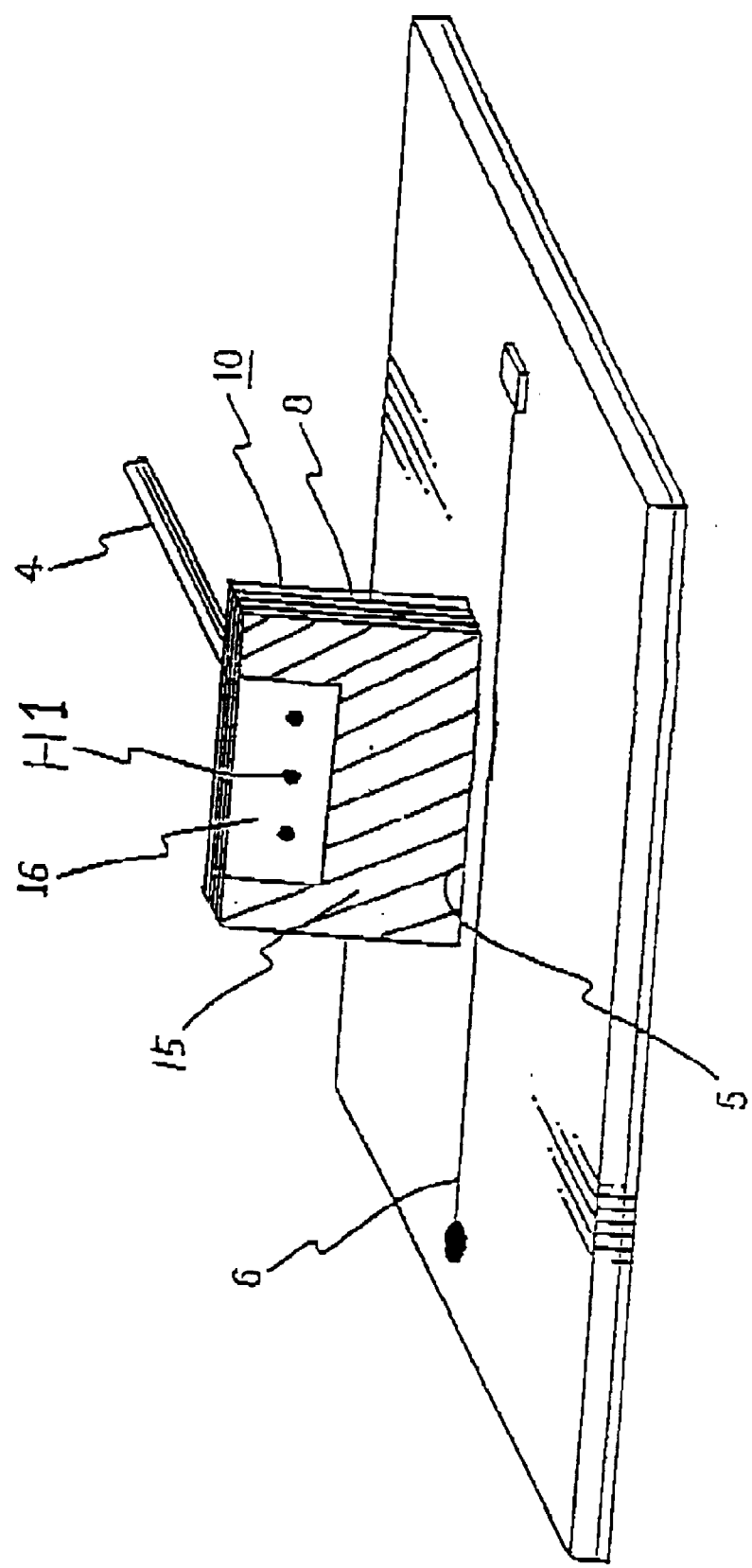
FIG. 16C is a schematic perspective view illustrative of a novel strip line shielded loop magnetic detector having a multilayer substrate body comprising two ground layers, a signal layer and two fixing layers in a second preferred modification to the above sixth embodiment and also to the above first preferred modification in accordance with the present invention.
Figure 17G:
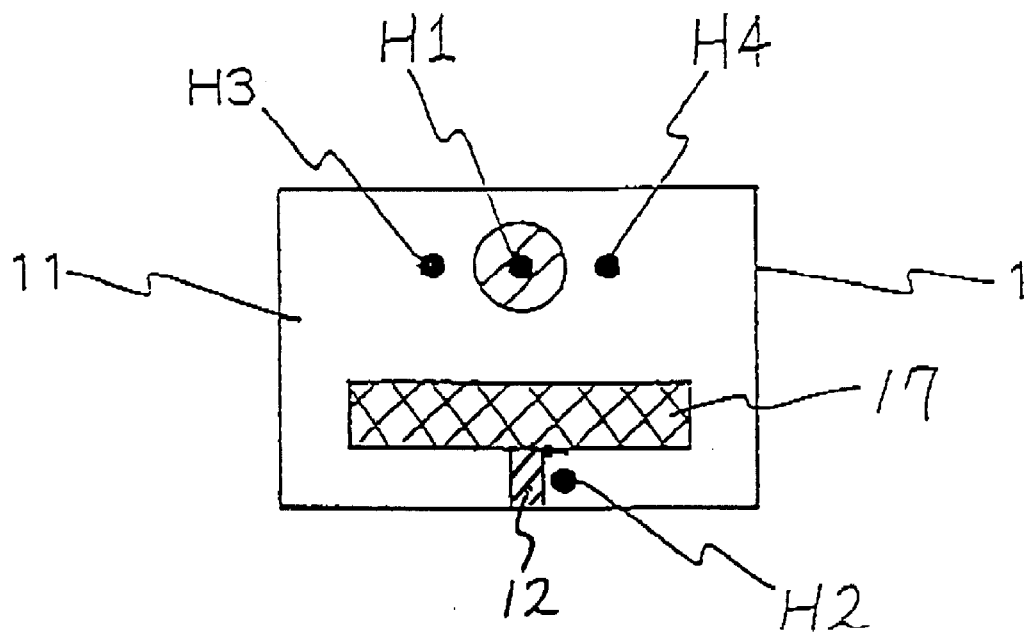
FIG. 17G is a plane view illustrative of each of two ground layers in a multilayer substrate body of a novel strip line shielded loop magnetic detector in a second preferred modification to the above sixth embodiment and also to the above first preferred modification in accordance with the present invention.
Figure 17H:
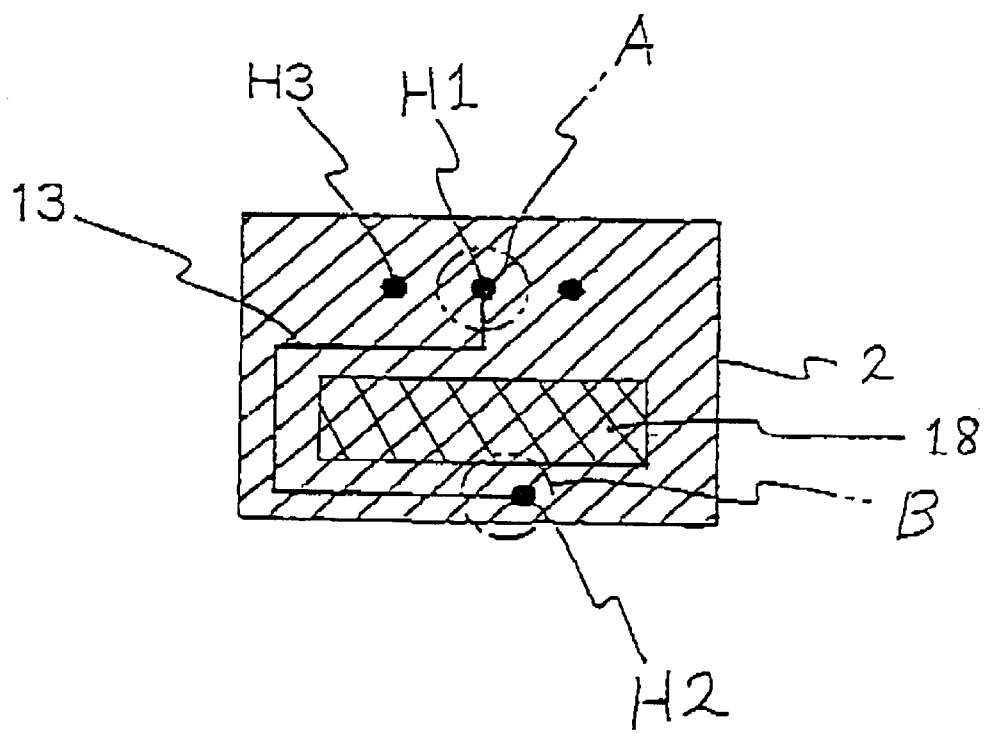
FIG. 17H is a plane view illustrative of a signal layer in a multilayer substrate body of a novel strip line shielded loop magnetic detector in a second preferred modification to the above sixth embodiment and also to the above first preferred modification in accordance with the present invention.
Figure 17I:
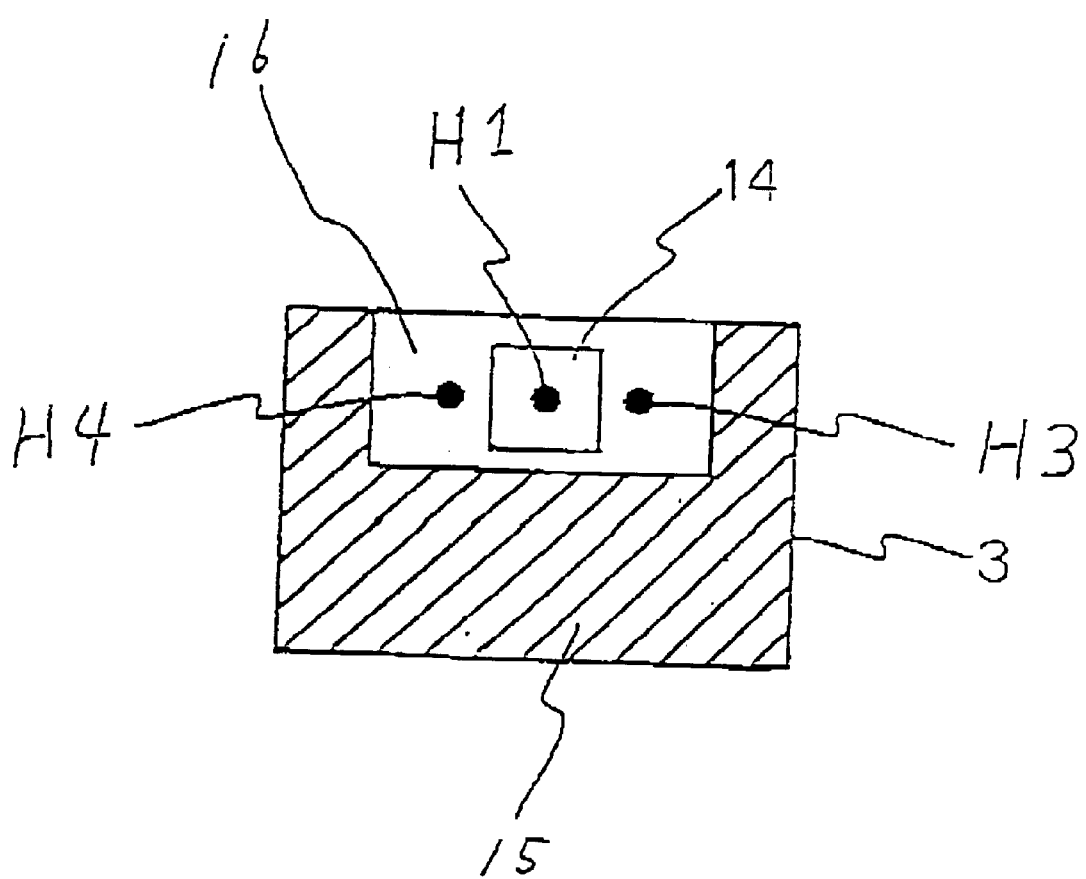
FIG. 17I is a plane view illustrative of a primary fixing layer in a multilayer substrate body of a novel strip line shielded loop magnetic detector in a second preferred modification to the above sixth embodiment and also to the above first preferred modification in accordance with the present invention.
Figure 17J:
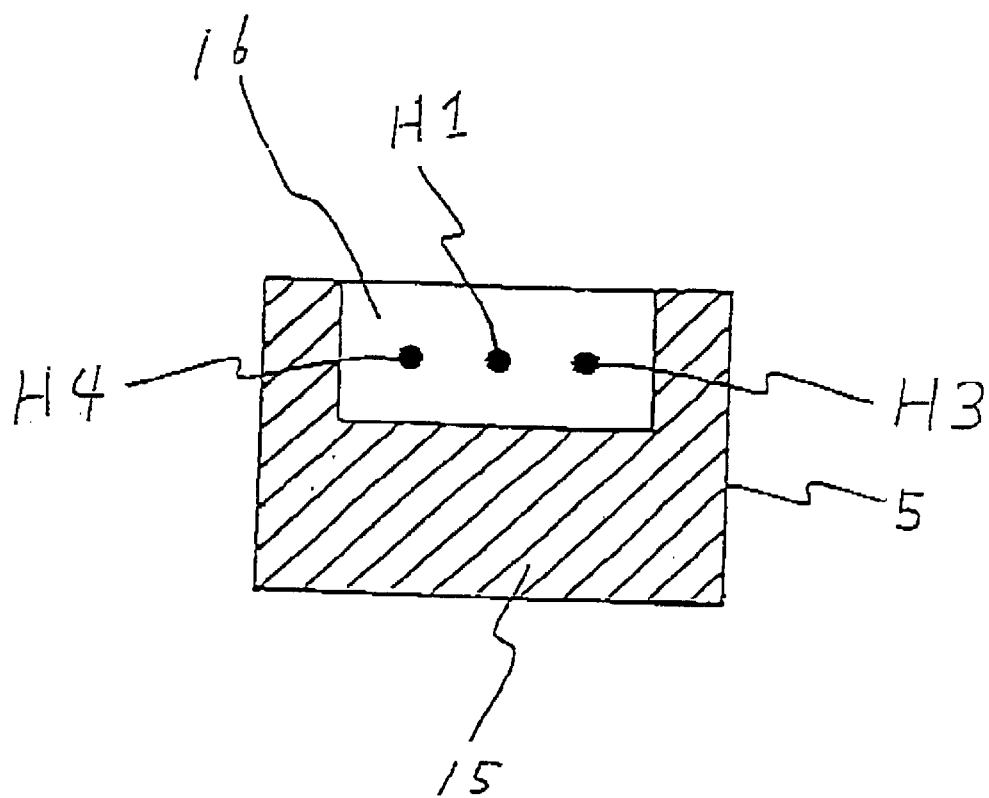
FIG. 17J is a plane view illustrative of a secondary fixing layer in a multilayer substrate body of a novel strip line shielded loop magnetic detector in a second preferred modification to the above sixth embodiment and also to the above first preferred modification in accordance with the present invention.
Figure 17K:
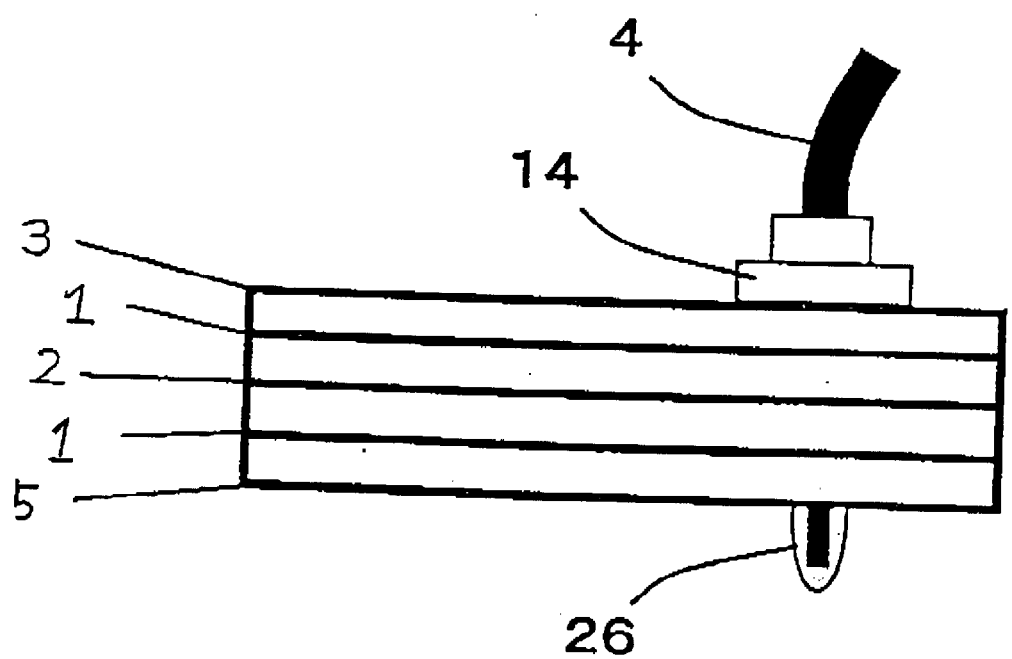
FIG. 17K is a cross sectional elevation view illustrative of a lamination structure of the multilayer substrate body of a novel strip line shielded loop magnetic detector in a second preferred modification to the above sixth embodiment and also to the above first preferred modification in accordance with the present invention.

A second preferred modification to the above sixth embodiment and also to the above first preferred modification will subsequently be described with reference to FIGS. 16C, 17G, 17H, 17I, 17J and 17K, wherein a secondary fixing layer is additionally provided in contact with a first ground layer, so that the first layer is sandwiched between the signal layer and the secondary fixing layer, whereby the primary and secondary fixing layers sandwich the first and second ground layers which further sandwich the signal layer. FIG. 16C is a schematic perspective view illustrative of a novel strip line shielded loop magnetic detector having a multilayer substrate body comprising two ground layers, a signal layer and two fixing layers in a second preferred modification to the above sixth embodiment and also to the above first preferred modification in accordance with the present invention. FIG. 17G is a plane view illustrative of each of two ground layers in a multilayer substrate body of a novel strip line shielded loop magnetic detector in a second preferred modification to the above sixth embodiment and also to the above first preferred modification in accordance with the present invention. FIG. 17H is a plane view illustrative of a signal layer in a multilayer substrate body of a novel strip line shielded loop magnetic detector in a second preferred modification to the above sixth embodiment and also to the above first preferred modification in accordance with the present invention. FIG. 17I is a plane view illustrative of a primary fixing layer in a multilayer substrate body of a novel strip line shielded loop magnetic detector in a second preferred modification to the above sixth embodiment and also to the above first preferred modification in accordance with the present invention. FIG. 17J is a plane view illustrative of a secondary fixing layer in a multilayer substrate body of a novel strip line shielded loop magnetic detector in a second preferred modification to the above sixth embodiment and also to the above first preferred modification in accordance with the present invention. FIG. 17K is a cross sectional elevation view illustrative of a lamination structure of the multilayer substrate body of a novel strip line shielded loop magnetic detector in a second preferred modification to the above sixth embodiment and also to the above first preferred modification in accordance with the present invention.

The description of the second preferred modification will focus on the differences from the above sixth embodiment and also from the above first preferred modification. With reference to FIGS. 16C, 17G, 17H, 17I, 17J and 17K, a secondary fixing layer 5 is additionally provided in contact with the first ground layer 1, so that the first ground layer 1 is sandwiched between the signal layer 2 and the secondary fixing layer 5, provided that lamination structures of the first ground layer 1, the signal layer 2, the second ground layer 1 and the primary fixing layer 3 are the same as in the above sixth embodiment and also in the above first preferred modification. Namely, in the above sixth embodiment and also in the above first preferred modification, the multilayer structure comprises the single signal layer, the single fixing layer and the two ground layers. By contrast, in this second preferred modification to the above sixth embodiment and also in the above first preferred modification, the multilayer structure comprises the single signal layer, the two fixing layers and the two ground layers. In detail, the signal layer 2 is sandwiched between the first and second ground layers 1. The first and second ground layers 1 are further sandwiched between the primary and secondary fixing layers 3 and 4, wherein the primary fixing layer 3 is in contact with the second ground layer 1 and the secondary fixing layer 5 is in contact with the first ground layer 1. A connector 14 is provided on the primary ground layer 1 so that a external coaxial line 4 is connected through the connector 14 and through the first via hole H1 penetrating the primary fixing layer 3, the second ground layer 1, and the signal layer 2, the first ground layer 1 and the secondary fixing layer 5 to a solder 26 on the secondary fixing layer 5. The secondary fixing layer 5 is structurally different from the primary fixing layer 3 only in that the connector 14 is not provided. Namely, the secondary fixing layer 5 also has a first via hole H1 which is positioned in correspondence with the first via hole H1 of the first ground layer 1. The secondary fixing layer 5 also has a third via hole H3 which is positioned in correspondence with the third via hole H3 of the first ground layer 1. The secondary fixing layer 5 also has a fourth via hole H4 which is positioned in correspondence with the fourth via hole H4 of the first ground layer 1. The secondary fixing layer 5 comprises a dielectric region 15 entirely extending except in the vicinity of the first, third and fourth via holes H1, H3 and H4. The secondary fixing layer 5 has a dielectric region 15 entirely extending except for a rectangle-shaped conductive region 16 which includes the third and fourth via holes H1, H3 and H4.

An additional provision of the secondary fixing layer 5 provides the following advantages. The secondary fixing layer 5 has almost the same dielectric and conductive region patterns as the primary fixing layer 3. Further, the primary and secondary fixing layers 3 and 5 sandwich the second and first ground layers 1 which further sandwich the single signal layer 2. The additional provision of the secondary fixing layer 5 improves the symmetry in conductive and dielectric region patterns in the thickness direction vertical to the surfaces of the above laminated layers 1, 2, 3 and 5, thereby improving the stability in signal transmission on the electrically conductive strip line pattern 13 of the signal layer 2. Further, the secondary fixing layer 5 is provided for covering the first ground layer 1, whereby the secondary fixing layer 5 protects the conductive and dielectric patterns of the first ground layer 1. Furthermore, the additional provision of the secondary fixing layer 5 forms five-layered lamination structures. The increase in the number of the lamination layers improves the mechanical strength of the multilayer structure, thereby suppressing the multilayer structure from being bent.

Seventh Embodiment

Figure 18:
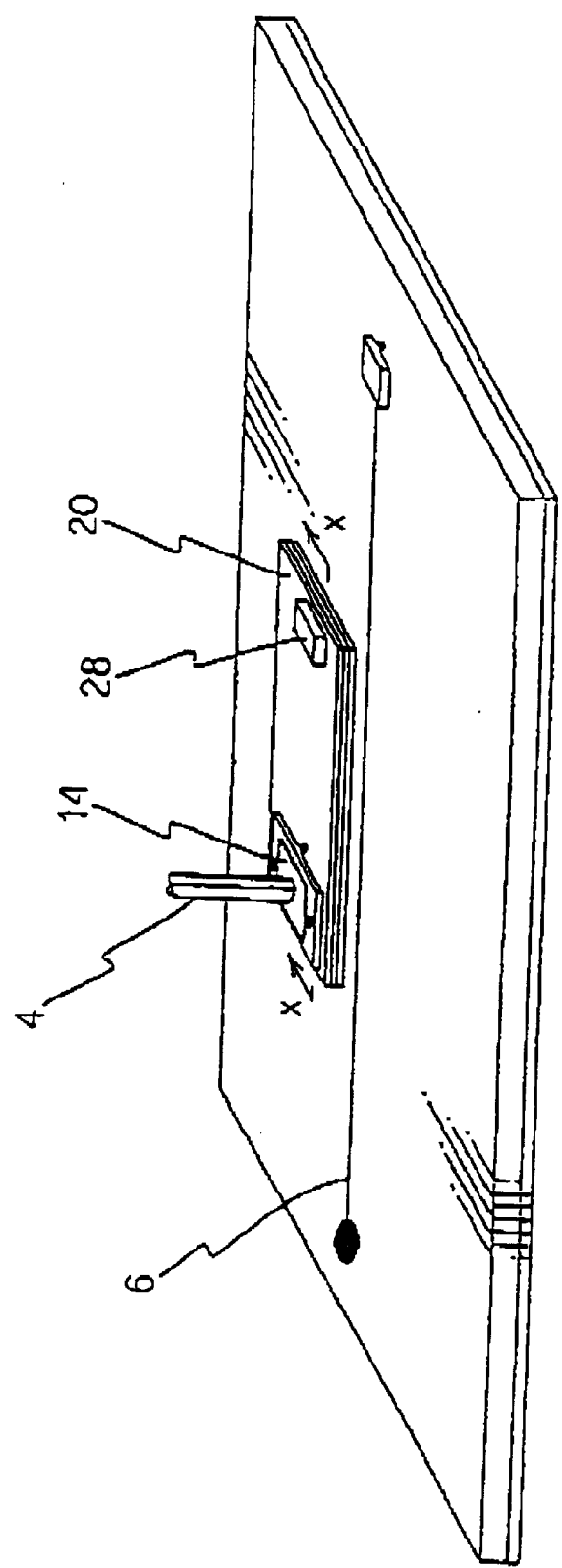
FIG. 18 is a schematic perspective view illustrative of a novel micro-strip line loop magnetic detector having a multilayer substrate body comprising a ground layer, first and second signal layers sandwiching the ground layer and a fixing layer in contact with the second signal layer in a seventh embodiment in accordance with the,present invention.
Figure 19A:
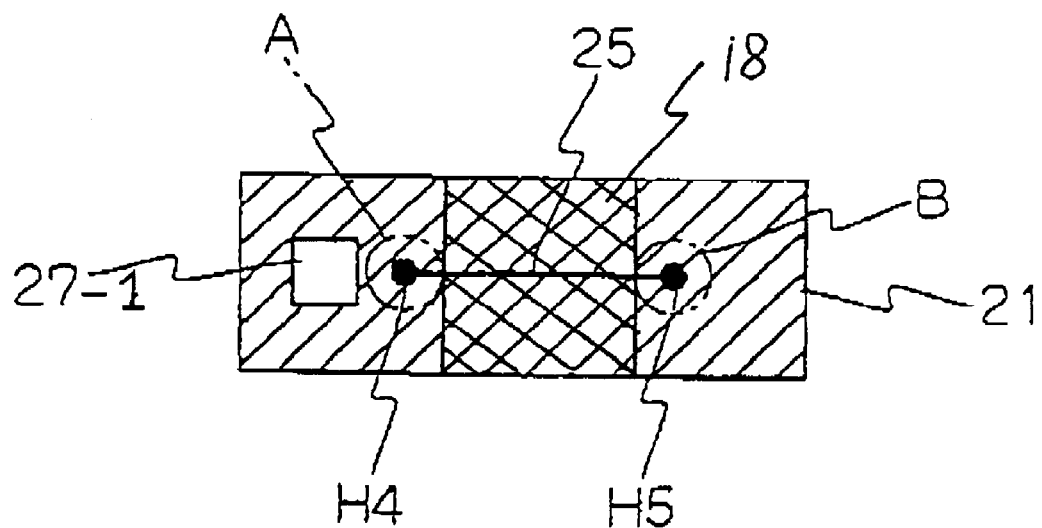
FIG. 19A is a plane view illustrative of a first signal layer in a multilayer substrate body of a novel micro-strip line loop magnetic detector in a seventh embodiment in accordance with the present invention.
Figure 19B:
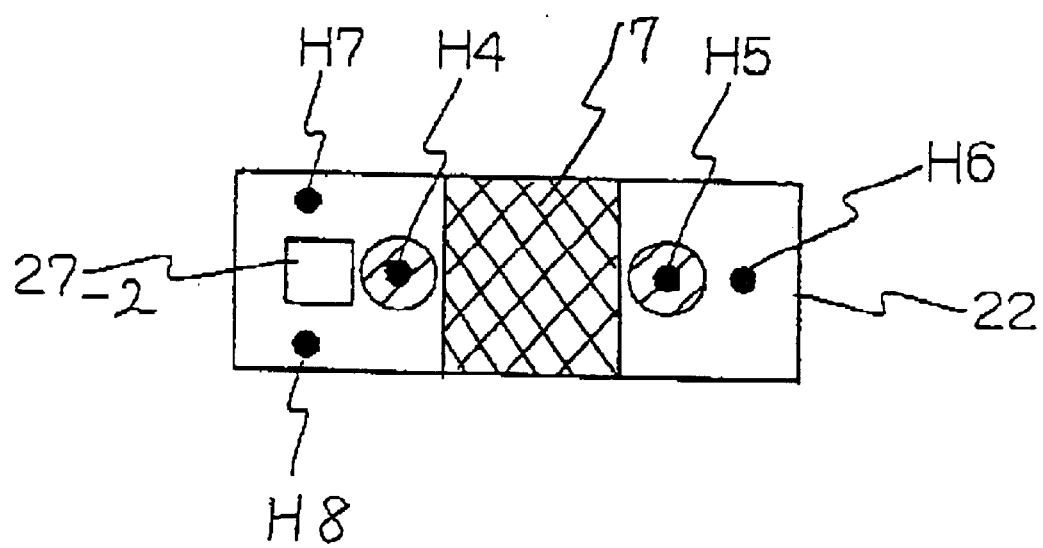
FIG. 19B is a plane view illustrative of a ground layer in a multilayer substrate body of a novel micro-strip line loop magnetic detector in a seventh embodiment in accordance with the present invention.
Figure 19C:
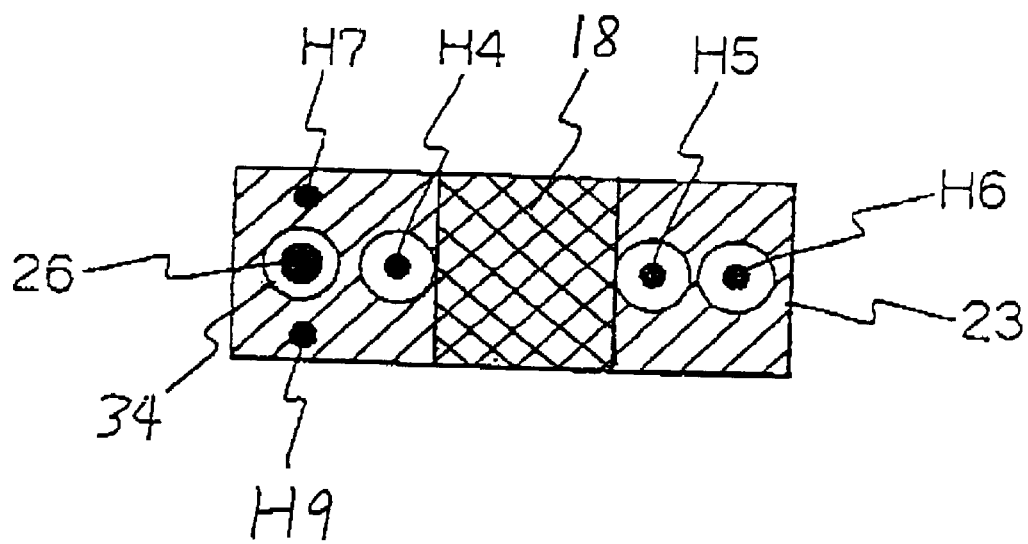
FIG. 19C is a plane view illustrative of a second signal layer in a multilayer substrate body of a novel micro-strip line loop magnetic detector in a seventh embodiment in accordance with the present invention.
Figure 19D:
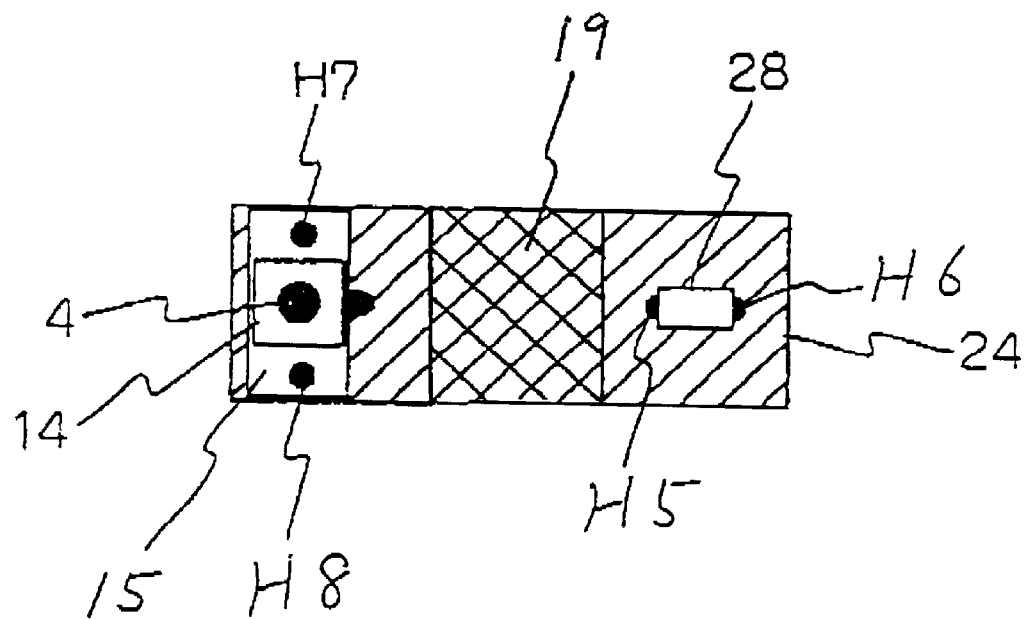
FIG. 19D is a plane view illustrative of a fixing layer in a multilayer substrate body of a novel micro-strip line loop magnetic detector in a seventh embodiment in accordance with the present invention.
Figure 20A:
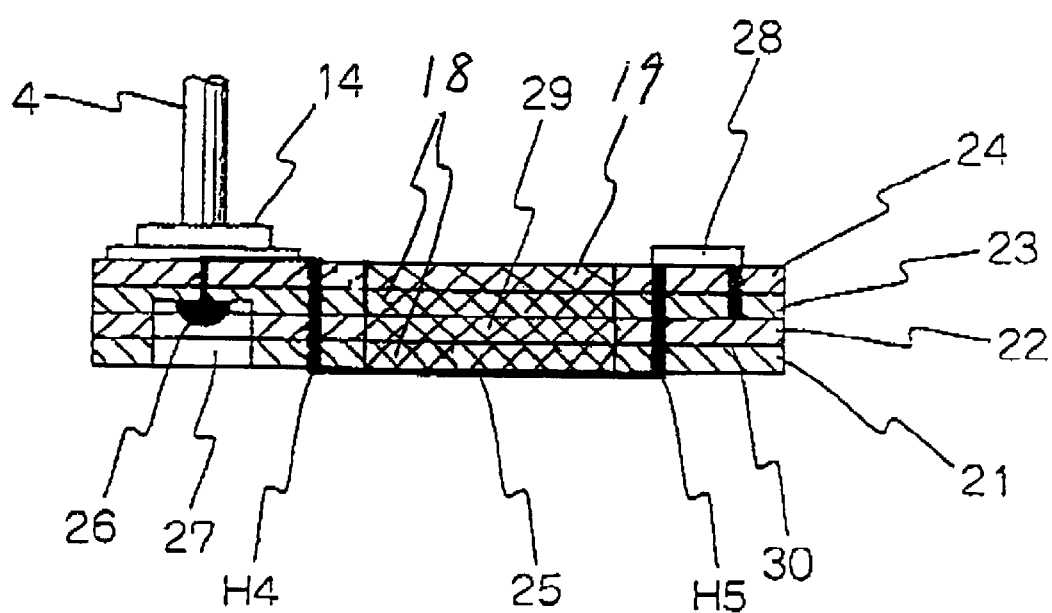
FIG. 20A is a cross sectional elevation view illustrative of a novel micro-strip line loop magnetic detector having an electrically conductive micro-strip line pattern extending through a multilayer substrate body comprising a ground layer, first and second signal layers sandwiching the ground layer and a fixing layer in contact with the second signal layer in a seventh embodiment in accordance with the present invention.

A seventh embodiment according to the present invention will be described in detail with reference to FIGS. 18, 19A, 19B, 19C, 19D and 20A. FIG. 18 is a schematic perspective view illustrative of a novel micro-strip line loop magnetic detector having a multilayer substrate body comprising a ground layer, first and second signal layers sandwiching the ground layer and a fixing layer in contact with the second signal layer in a seventh embodiment in accordance with the present invention. FIG. 19A is a plane view illustrative of a first signal layer in a multilayer substrate body of a novel micro-strip line loop magnetic detector in a seventh embodiment in accordance with the present invention. FIG. 19B is a plane view illustrative of a ground layer in a multilayer substrate body of a novel micro-strip line loop magnetic detector in a seventh embodiment in accordance with the present invention. FIG. 19C is a plane view illustrative of a second signal layer in a multilayer substrate body of a novel micro-strip line loop magnetic detector in a seventh embodiment in accordance with the present invention. FIG. 19D is a plane view illustrative of a fixing layer in a multilayer substrate body of a novel micro-strip line loop magnetic detector in a seventh embodiment in accordance with the present invention. FIG. 20A is a cross sectional elevation view illustrative of a novel micro-strip line loop magnetic detector having an electrically conductive micro-strip line pattern extending through a multilayer substrate body comprising a ground layer, first and second signal layers sandwiching the ground layer and a fixing layer in contact with the second signal layer in a seventh embodiment in accordance with the present invention. The novel device for detecting a magnetic field in this embodiment is structurally different from that of the second embodiment in further provision of a magnetic region in a center region of a dielectric looped face surrounded by an electrically conductive micro-strip line pattern to cause a concentration of a magnetic flux which penetrates the dielectric looped face thereby improving a sensitivity of the device.

The novel device 20 for detecting a magnetic field has a multilayer substrate body comprising laminations of a first signal layer 21, a ground layer 22, a second signal layer 23 and a fixing layer 24.

The first signal layer 21 is made of a dielectric substance. The first signal layer 21 has an opposite surface to a contact surface in contact with the ground layer 22. The first signal layer 21 has an electrically conductive micro-strip line pattern 25 which extends in a shape of a first straight line segment on the opposite surface. The first signal layer 21 has first and second via holes H4 and H5 formed at first and second ends of the first straight line segment of the electrically conductive micro-strip line pattern 25 respectively. The first straight line segment of the electrically conductive micro-strip line pattern 25 extends on a longitudinal center line of the first signal layer 21. The first signal layer 21 has a magnetic region 18 between the first and second via holes H4 and H5. The magnetic region 18 is made of a dielectric substance showing a magnetic property. The magnetic region 18 is rectangular-shaped. The first straight line segment of the electrically conductive micro-strip line pattern 25 extends to pass through the magnetic region 18. The first signal layer 21 further has a square-shaped opening 27-1 which is positioned outside of the first end "A" of the first straight line segment of the electrically conductive micro-strip line pattern 25. The square-shaped opening 27-1 is positioned on the longitudinal center line of the first signal layer 21.

The ground layer 22 comprises an electrically conductive region having first and second via holes H4 and H5 which are positioned in correspondence with the first and second via holes H4 and H5 of the first signal layer 21. The ground layer 22 has a magnetic region 17 which is made of a dielectric substance showing a magnetic property. The magnetic region 17 is rectangular-shaped and extends in correspondence with the magnetic region 18 of the signal layer 21. The ground layer 22 further has first and second isolation regions around the first and second via holes H4 and H5 respectively, so that the first and second via holes H4 and H5 are electrically isolated from the electrically conductive region of the ground layer 22. The ground layer 22 furthermore has a square-shaped opening 27-2 which is positioned outside of the first isolation region around the first via hole H4. The position of the square-shaped opening 27-2 of the ground layer 22 is correspondent to the square-shaped opening 27-1 of the first signal layer 21. The ground layer 22 still further has a third via hole H6 which is positioned outside of the second isolation region around the second via hole H5. The first, second and third via holes H4, H5 and H6 and the square-shaped opening 27-2 are aligned on the longitudinal center line of the ground layer 22. The ground layer 22 further has fourth and fifth via holes H7 and H8 which are positioned in opposite sides of the square-shaped opening 27-2, so that the fourth and fifth via holes H7 and H8 and the square-shaped opening 27-2 are aligned on a line perpendicular to the longitudinal center line of the ground layer.

The second signal layer 23 is made of a dielectric substance. The second signal layer 23 has first, second, third, fourth and fifth via holes H4, H5, H6, H7 and H8 which are positioned in correspondence with the first, second, third, fourth and fifth via holes H4, H5, H6, H7 and H8 of the ground layer 22. The second signal layer 23 has a magnetic region 18 between the first and second via holes H4 and H5. The magnetic region 18 is made of a dielectric substance showing a magnetic property. The magnetic region 18 of the second signal layer 23 is rectangular-shaped and extends in correspondence with the magnetic region 18 of the first signal layer 21. The second signal layer 23 further has a pad 34 which is positioned in correspondence with the square-shaped opening 27-2 of the ground layer 22. A solder 26 is provided on the pad 34 for connecting a first extending micro-strip line pattern from the electrically conductive micro-strip line pattern 25 and an extending signal line from an external coaxial line 4. The second signal layer 23 has first, second and third conductive regions around the first, second and third via holes H4, H5 and H6 respectively.

The fixing layer 24 is made of a dielectric substance. The fixing layer 24 has first, second, third, fourth and fifth via holes H4, H5, H6, H7 and H8 which are positioned in correspondence with the first, second, third, fourth and fifth via holes H4, H5, H6, H7 and H8 of the second signal layer 23. The fixing layer 24 has a magnetic region 19 between the first and second via holes H4 and H5. The magnetic region 19 is made of a dielectric substance showing a magnetic property. The magnetic region 19 of the fixing layer 24 is rectangular-shaped and extends in correspondence with the magnetic region 18 of the first and second signal layers 21 and 23. The fixing layer 24 also has a connector 14 for connecting the external coaxial line 4 at the corresponding position to the conductive pad 34 of the second signal layer 23. The fixing layer 24 has an electrically conductive pad 15 which extends over the fourth and fifth via holes H7 and H8. The connector 14 is provided on this electrically conductive pad 15. The fixing layer 24 furthermore has a chip resistance 28 between the second and third via holes H5 and H6.

With reference to FIG. 20A, the electrically conductive micro-strip line pattern 25 has not only the above described first straight line segment on the bottom surface of the first signal layer 21 but also second and third straight line segments which extend within the first and second via holes respectively to penetrate the first signal layer 21, the ground layer 22, the second signal layer 23 and the fixing layer 24, whereby the series connection of the first, second and third line segments of the electrically conductive micro-strip line pattern 25 define a wide U-shape and a dielectric looped face which is rectangular-shaped and surrounded in three quarter of omni-directions, wherein the dielectric looped face is vertical to an interface between the first signal layer 21, the ground layer 22, the second signal layer 23 and the fixing layer 24. Further, the laminations of the magnetic regions 17, 18 and 19 extend on the enter region of the rectangular-shaped dielectric looped face, so that the magnetic flux is concentrated to penetrate the laminations of the magnetic regions 17, 18, and 19. Namely, the magnetic flux is concentrated to penetrate the center region of the rectangular-shaped dielectric looped face defined by the electrically conductive micro-strip line pattern 25, whereby the sensitivity of the device is improved. The electrically conductive micro-strip line pattern 25 has not only the first, second and third straight line segments but also a first extension to the solder 26 and a second extension from the chip resistance through the third via hole H6 to the ground layer 22, whereby the electrically conductive micro-strip line pattern 25 is electrically connected to the external coaxial line 4 and the electrically conductive region of the ground layer 22. The magnetic regions 18 of the first and second signal layers 21 and 23 and the magnetic region 19 of the fixing layer 24 are positioned within the rectangular-shaped dielectric looped face defined by the electrically conductive microstrip line pattern 25, so that the magnetic flux is concentrated to penetrate the magnetic regions 18 and 19, whereby the concentrated magnetic flux penetrates the rectangular-shaped dielectric looped face defined by the electrically conductive micro-strip line pattern 25.

The measurement of the magnetic field generated by an objective interconnection 6 is carried out by use of the above novel magnetic field detector 20 as follows.

With reference again to FIG. 18, the novel magnetic field detector 20 is positioned so that the bottom surface of the first signal layer 21 of the multilayer substrate body is just over the objective interconnection 6 generating the magnetic field which is intended to be measured, wherein the bottom surface of the first signal layer 21 of the multilayer substrate body faces toward the objective interconnection 6, and further so that the dielectric looped face defined by the electrically conductive micro-strip line pattern 25 is also in parallel to the objective interconnection 6 and just over the objective interconnection 6. As a result, the magnetic flux in the vicinity of the objective interconnection 6 penetrates the rectangular-shaped dielectric looped face defined by the electrically conductive micro-strip line pattern 25. As a result, even if an adjacent interconnection not illustrated is positioned very close to the objective interconnection 6 and this adjacent interconnection generates an additional magnetic field, then the magnetic flux generated by the objective interconnection 6 penetrates the dielectric looped face defined by the electrically conductive micro-strip line pattern 25, whilst the magnetic flux generated by the adjacent interconnection does not penetrate the dielectric looped face defined by the electrically conductive micro-strip line pattern 25, for which reason the novel magnetic field detector 20 is capable of selectively detecting only the magnetic field generated by the objective interconnection 6 without receiving any substantive disturbance due to the magnetic field generated by the adjacent interconnection.

The above electrically conductive micro-strip line pattern 25 may be formed by an etching process or a sputtering process. This structure enables a remarkable scaling down of the detector body. Particularly, the above structure enables the dielectric looped face surrounded by the electrically conductive micro-strip line pattern 25 to be positioned extremely adjacent to the objective interconnection 6 which generates the magnetic field to be measured, so that even if any adjacent interconnection not illustrated is positioned very close to the objective interconnection 6, the above novel magnetic field detector 20 is capable of detecting only the magnetic field generated by the objective interconnection 6 without, however, receiving any influence of a disturbing magnetic field generated by the adjacent interconnection. The above electrically conductive micro-strip line pattern is formed to position the dielectric looped face closer to the bottom side of the multilayer substrate body so that the dielectric looped face is positioned closer to the objective interconnection 6, whereby the detector 20 can detect only the magnetic field extremely adjacent to the objective interconnection 6 without, however, receiving any influence of a disturbing magnetic field generated by the adjacent interconnection. This improves the spatial resolution of the detector 20.

The above electrically conductive micro-strip line pattern 25 is formed by the etching or sputtering process without being hand-made, for which reason it is possible to form highly accurate and largely scaled down magnetic field detector 20.

In detection of the magnetic field, the device 20 is positioned just over the objective interconnection 6 so that the dielectric looped face is in parallel to the objective interconnection 6 and positioned just over the objective interconnection 6. In order to increase the sensitivity of the device 20, it is preferable that the electrically conductive micro-strip line pattern 25 extends as long as possible in the direction along which the objective interconnection 6 extends unless a spatial resolution of the detector 20 is deteriorated due to a high frequency of the magnetic field generated by the objective interconnection 6. In order to ensure a high spatial resolution of the device 20, it is preferable that the electrically conductive micro-strip line pattern 25 extends as close as possible to the bottom surface of the first signal layer 21 of the multilayer substrate body of the device 20 so that the dielectric looped face receives the magnetic field in the vicinity of the objective interconnection 6 without, however, receiving any substantive influence of the disturbing magnetic field generated by the adjacent interconnection.

The provision of the fixing layer 23 allows securely electrical and mechanical connection of the detector 20 to the external coaxial line 4.

Figure 19E:
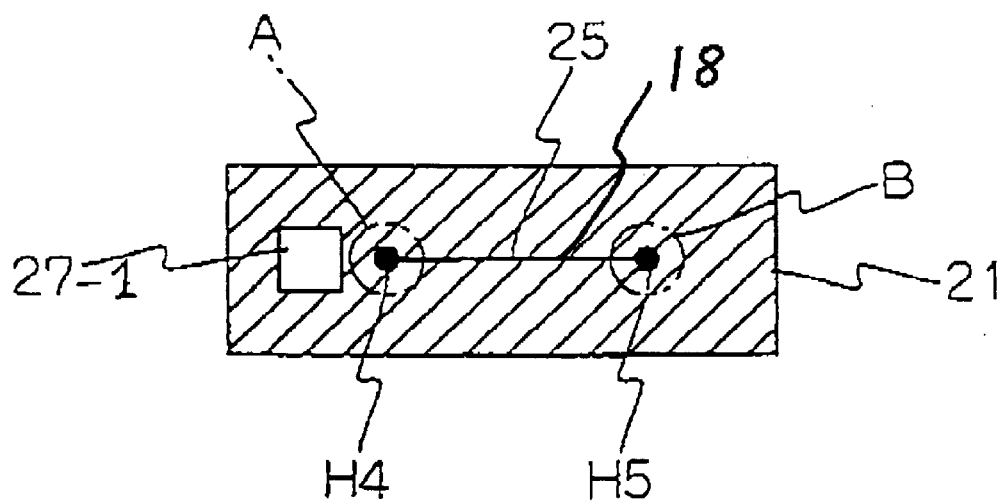
FIG. 19E is a plane view illustrative of a first signal layer in a multilayer substrate body of a novel micro-strip line loop magnetic detector in a first preferred modification to the seventh embodiment in accordance with the present invention.
Figure 19F:
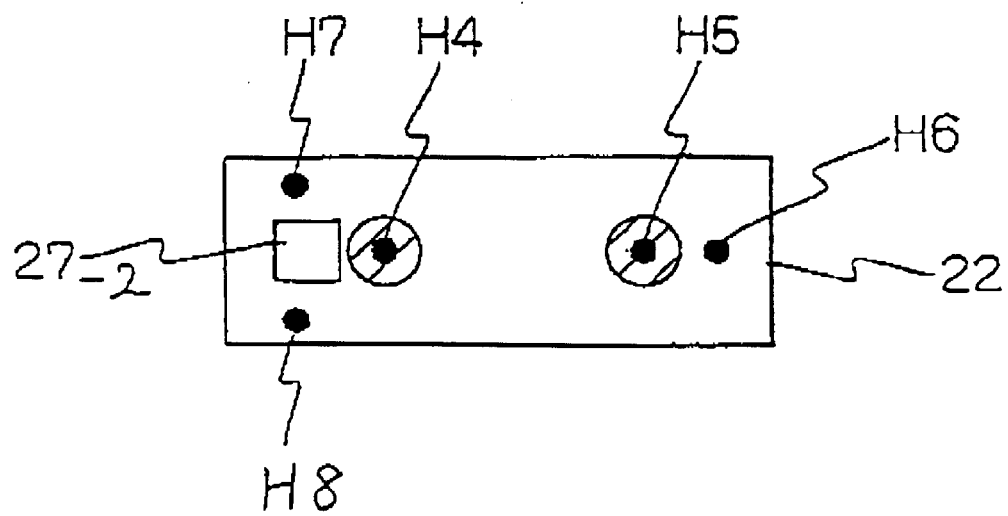
FIG. 19F is a plane view illustrative of a ground layer in a multilayer substrate body of a novel micro-strip line loop magnetic detector in a first preferred modification to the seventh embodiment in accordance with the present invention.
Figure 19G:
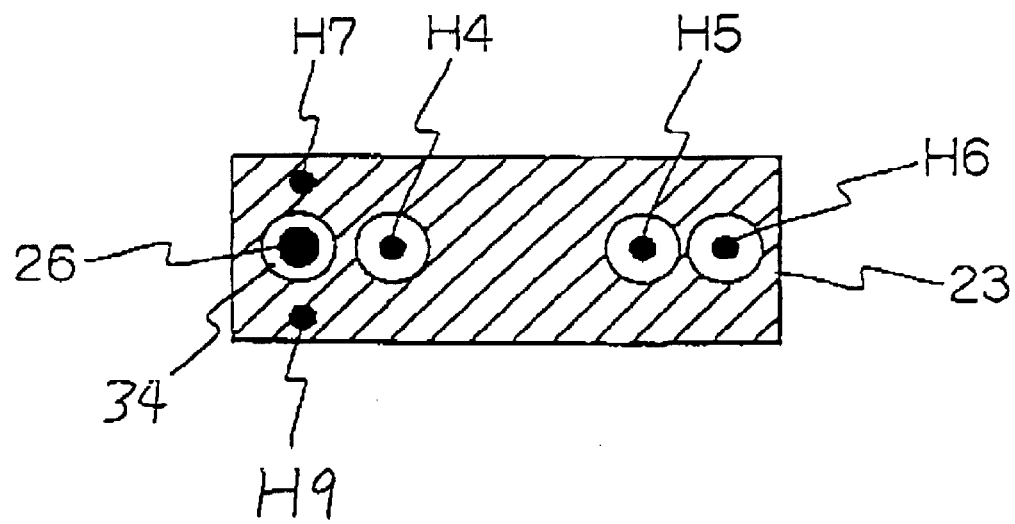
FIG. 19G is a plane view illustrative of a second signal layer in a multilayer substrate body of a novel micro-strip line loop magnetic detector in a first preferred modification to the seventh embodiment in accordance with the present invention.
Figure 19H:
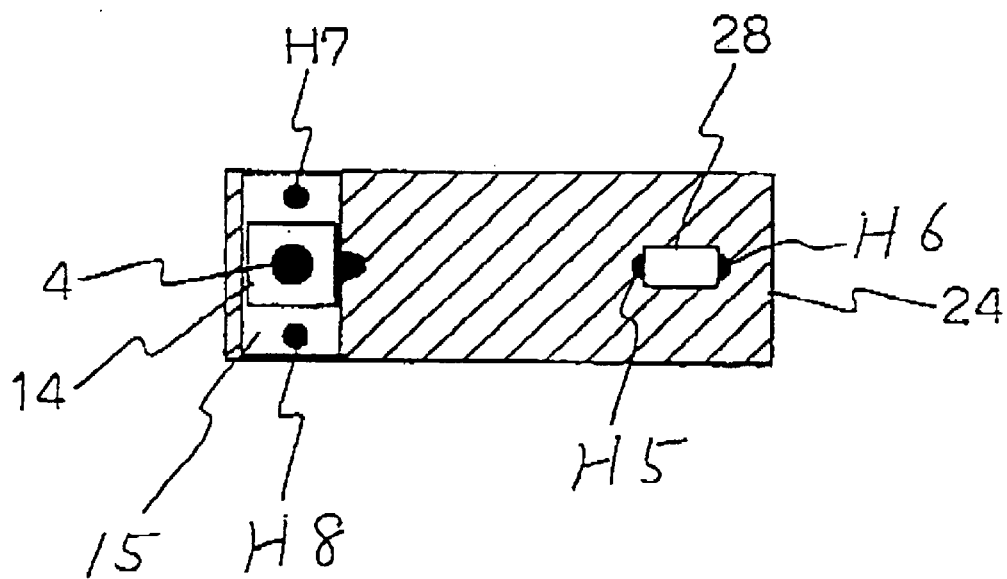
FIG. 19H is a plane view illustrative of a fixing layer in a multilayer substrate body of a novel micro-strip line loop magnetic detector in a first preferred modification to the seventh embodiment in accordance with the present invention.
Figure 20B:
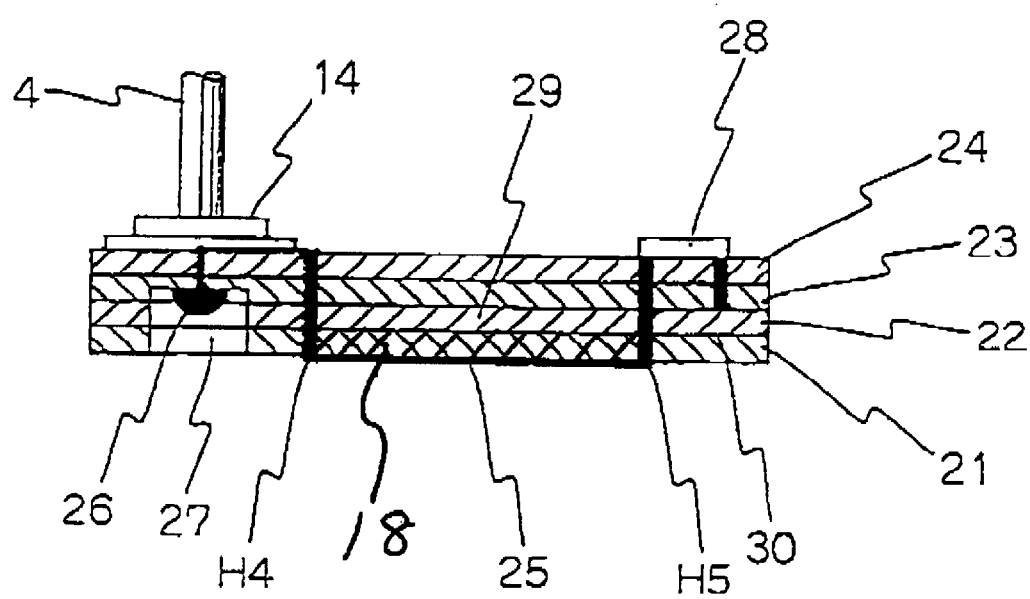
FIG. 20B is a cross sectional elevation view illustrative of a novel micro-strip line loop magnetic detector having an electrically conductive micro-strip line pattern extending through a multilayer substrate body comprising a ground layer, first and second signal layers sandwiching the ground layer and a fixing layer in contact with the second signal layer in a first preferred modification to the seventh embodiment in accordance with the present invention.

A first preferred modification to the above seventh embodiment will subsequently be described with reference to FIGS. 19E, 19F, 19G and 19H, wherein the magnetic -region is selectively formed only in the first signal layer 21 which is closer to the objective interconnection 6, provided that the magnetic region has the same width as the electrically conductive micro-strip line pattern 25 so that the magnetic region extends in correspondence with the electrically conductive micro-strip line pattern 25 in view vertical to the contact surface of the first signal layer 21 closer to the objective interconnection 6, in order to concentrate the magnetic flux adjacent to the electrically conductive micro-strip line pattern 25, whereby the spatial resolution of the detector 20 is further improved. FIG. 19E is a plane view illustrative of a first signal layer in a multilayer substrate body of a novel micro-strip line loop magnetic detector in a first preferred modification to the seventh embodiment in accordance with the present invention. FIG. 19F is a plane view illustrative of a ground layer in a multilayer substrate body of a novel micro-strip line loop magnetic detector in a first preferred modification to the seventh embodiment in accordance with the present invention. FIG. 19G is a plane view illustrative of a second signal layer in a multilayer substrate body of a novel micro-strip line loop magnetic detector in a first preferred modification to the seventh embodiment in accordance with the present invention. FIG. 19H is a plane view illustrative of a fixing layer in a multilayer substrate body of a novel micro-strip line loop magnetic detector in a first preferred modification to the seventh embodiment in accordance with the present invention. FIG. 20B is a cross sectional elevation view illustrative of a novel micro-strip line loop magnetic detector having an electrically conductive micro-strip line pattern extending through a multilayer substrate body comprising a ground layer, first and second signal layers sandwiching the ground layer and a fixing layer in contact with the second signal layer in a first preferred modification to the seventh embodiment in accordance with the present invention.

The first signal layer 21 has a magnetic region 18 between the first and second via holes H4 and H5. The magnetic region 18 is made of a dielectric substance showing a magnetic property. The magnetic region 18 is rectangular-shaped. The first straight line segment of the electrically conductive micro-strip line pattern 25 extends to pass through the magnetic region 18. The magnetic region 18 has substantially the same width as the electrically conductive micro-strip line pattern 25 so that the magnetic region extends in correspondence with the electrically conductive micro-strip line pattern 25 in view vertical to the contact surface of the first signal layer 21 closer to the objective interconnection 6. The ground layer 22 and the second signal layer 23 as well as the fixing layer 24 have no magnetic region. The magnetic region 25 is selectively formed only in the first signal layer 21 which is closer to the objective interconnection 6, provided that the magnetic region has the same width as the electrically conductive micro-strip line pattern 25 so that the magnetic region extends in correspondence with the electrically conductive micro-strip line pattern 25 in view vertical to the contact surface of the first signal layer 21 closer to the objective interconnection 6, in order to concentrate the magnetic flux adjacent to the electrically conductive micro-strip line pattern 25, whereby the spatial resolution of the detector 20 is further improved.

Eighth Embodiment

Figure 21:
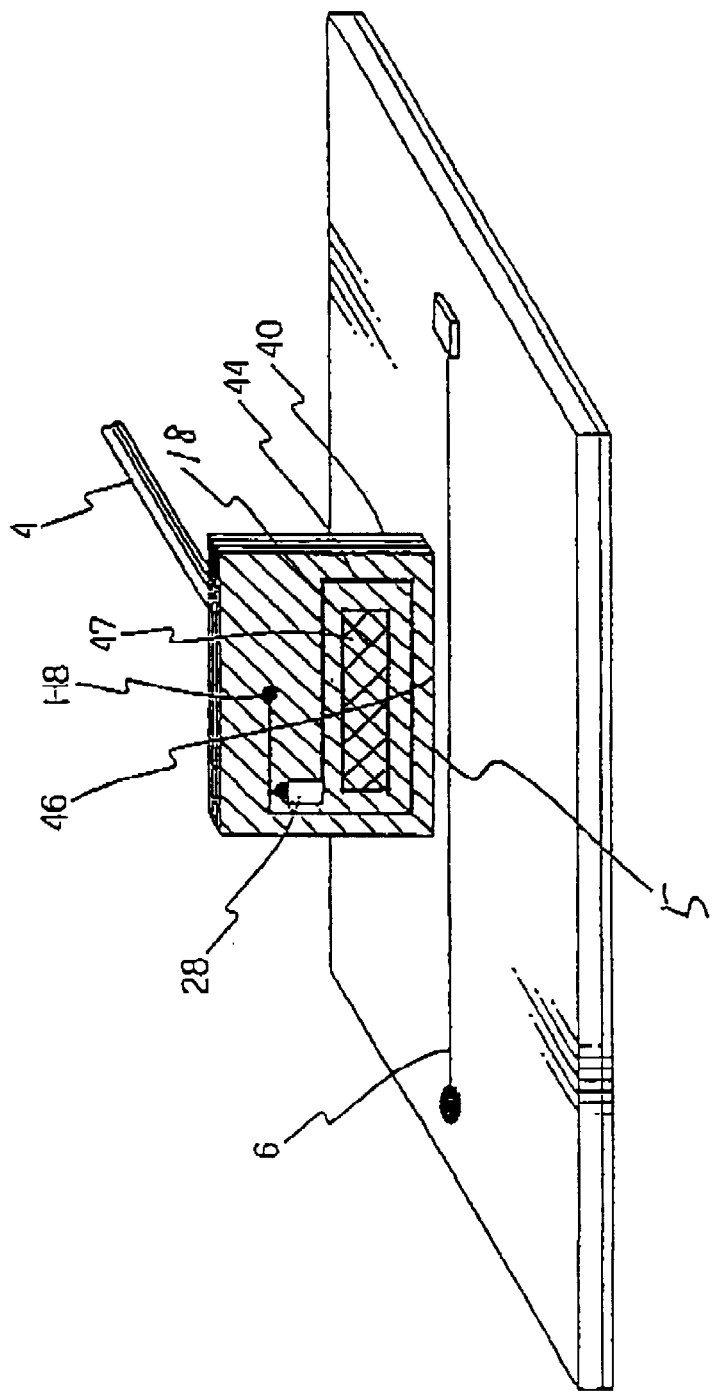
FIG. 21 is a schematic perspective view illustrative of a novel micro-strip line magnetic detector having a multilayer substrate body comprising a ground layer, a signal layer and a fixing layer in an eighth embodiment in accordance with the present invention.
Figure 22A:
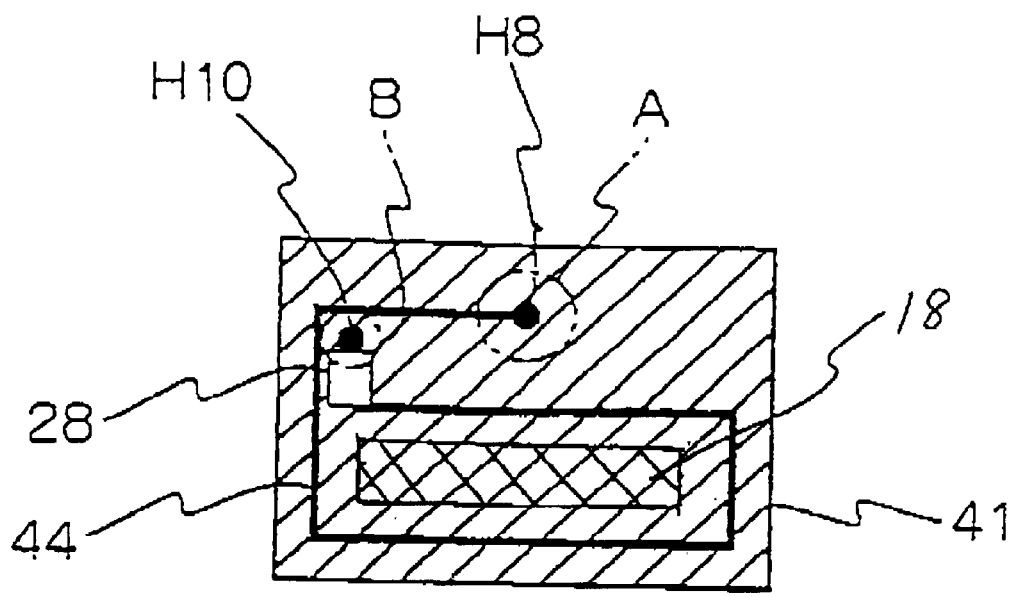
FIG. 22A is a plane view illustrative of a signal layer in a multilayer substrate body of a novel micro-strip line magnetic detector in an eighth embodiment in accordance with the present invention.
Figure 22B:
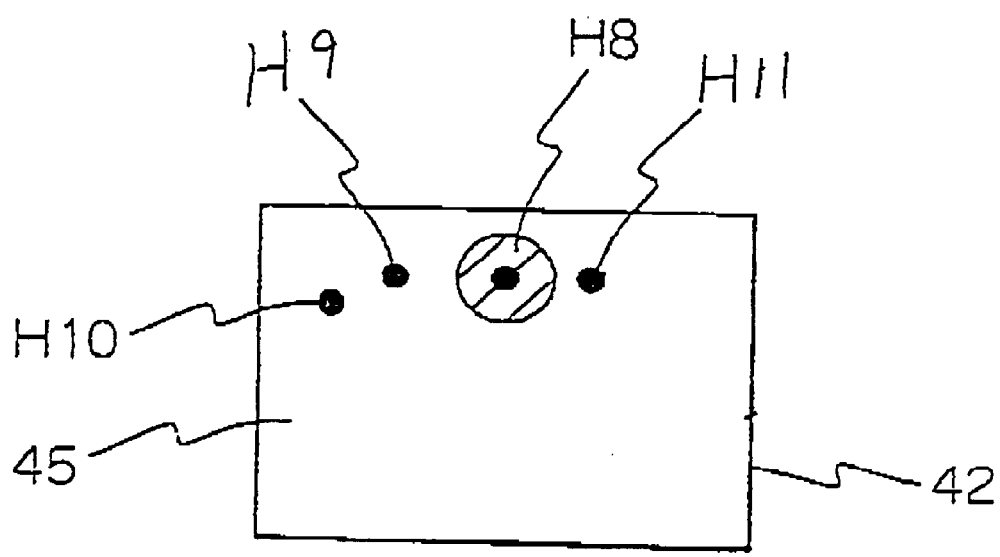
FIG. 22B is a plane view illustrative of a ground layer in a multilayer substrate body of a novel micro-strip line magnetic detector in an eighth embodiment in accordance with the present invention.
Figure 22C:
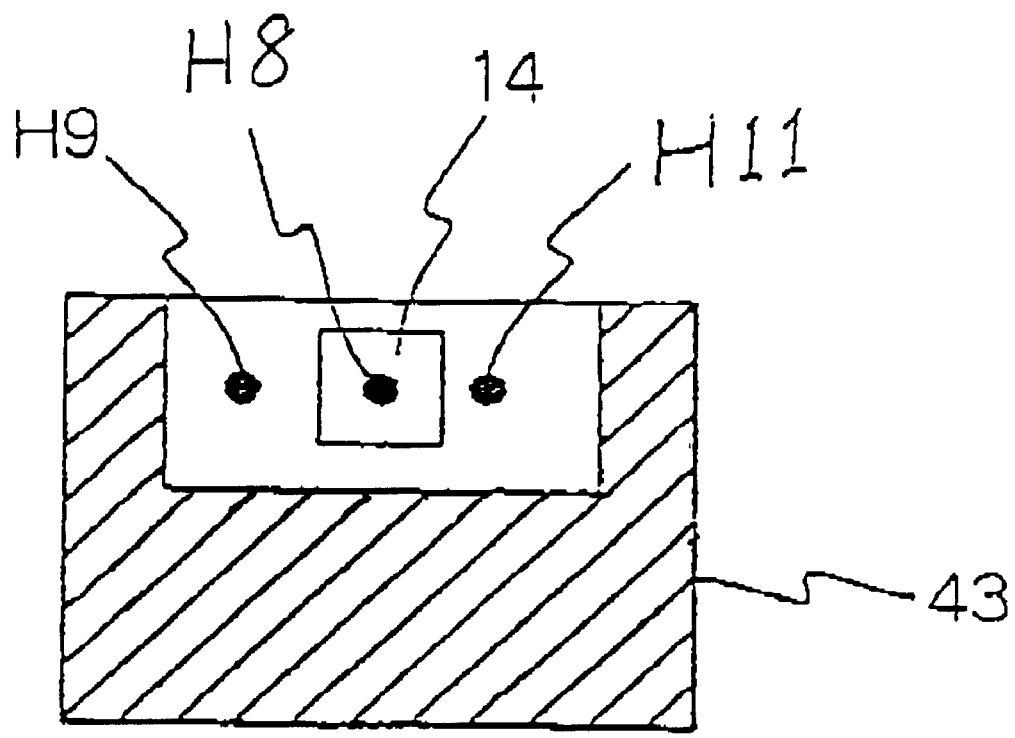
FIG. 22C is a plane view illustrative of a fixing layer in a multilayer substrate body of a novel micro-strip line magnetic detector in an eighth embodiment in accordance with the present invention.

An eighth embodiment according to the present invention will be described in detail with reference to FIGS. 21, 22A, 22B and 22C. FIG. 21 is a schematic perspective view illustrative of a novel micro-strip line magnetic detector having a multilayer substrate body comprising a ground layer, a signal layer and a fixing layer in an eighth embodiment in accordance with the present invention. FIG. 22A is a plane view illustrative of a signal layer in a multilayer substrate body of a novel micro-strip line magnetic detector in an eighth embodiment in accordance with the present invention. FIG. 22B is a plane view illustrative of a ground layer in a multilayer substrate body of a novel micro-strip line magnetic detector in an eighth embodiment in accordance with the present invention. FIG. 22C is a plane view illustrative of a fixing layer in a multilayer substrate body of a novel micro-strip line magnetic detector in an eighth embodiment in accordance with the present invention. The novel device for detecting a magnetic field in this embodiment is structurally different from that of the third embodiment in further provision of a magnetic region in a center region of a dielectric looped face surrounded by an electrically conductive micro-strip line pattern to cause a concentration of a magnetic flux which penetrates the dielectric looped face thereby improving a sensitivity of the device.

The device for detecting a magnetic field has a multilayer substrate body comprising laminations of a signal layer 41, a ground layer 42 and a fixing layer 43.

The signal layer 41 is made of a dielectric substance. The signal layer 41 has an opposite surface to a contact surface in contact with the ground layer 42. The signal layer 41 has an electrically conductive micro-strip line pattern 44 which extends in the form of a generally rectangular shape comprising series connections of straight line segments on the opposite surface, thereby to form a dielectric looped face surrounded in almost omni-directions by the straight line segments. The dielectric looped face is parallel to an interface between the signal layer 41 and the ground layer 42. The signal layer 41 has a magnetic region 18 which is made of a dielectric substance showing a magnetic property. The magnetic region 18 is rectangular-shaped and extends within the center region of the rectangular-shaped dielectric looped face defined by the electrically conductive micro-strip line 44, so that the magnetic flux is concentrated to penetrate the magnetic region 18 on the center region of the dielectric looped face defined by the electrically conductive micro-strip line pattern 44. The signal layer 41 has first and second via holes H8 and H10 formed at first and second ends "A" and "B" of the electrically conductive micro-strip line pattern 44. The signal layer 41 further has a chip resistance 28 which is connected with the second via hole H10 so that the electrically conductive micro-strip line pattern 44 is connected through the chip resistance 28 to the electrically conductive region 45 of the ground layer 42, wherein the chip resistance serves as a terminating resistance.

The ground layer 42 comprises an electrically conductive region 45 so that the second end "B" of the electrically conductive micro-strip line pattern 44 is electrically connected to the electrically conductive region 45 of the ground layer 42, whereby the electrically conductive region 45 of the ground layer 42 serves as a ground. The ground layer 42 has no magnetic region. The ground layer 42 has first and second via holes H8 and H10 at corresponding positions to the first and second via holes H8 and H10 of the signal layer 41, so that the first end "A" of the electrically conductive micro-strip line pattern 44 is electrically connected to an external coaxial line 4. The ground layer 42 further has an isolation region around the first via hole H8 so that the first via hole H8 of the ground layer 42 is electrically isolated by the isolation region from the electrically conductive region 45 of the ground layer 42. The ground layer 42 furthermore has third and fourth via holes H9 and H11 which are positioned in opposite sides of the isolation region around the first via hole H8, so that the first, third and fourth via holes H8, H9 and H1 are aligned in horizontal direction.

The fixing layer 43 is provided in contact with the ground layer 42 for the purpose exclusively of fixing the external coaxial line 4. The fixing layer 43 has a connector 14 for connecting the external coaxial line 4. The fixing layer 43 also has a first via hole H8 which is positioned in correspondence with the first via hole H8 of the ground layer 42. The fixing layer 43 also has a third via hole H9 which is positioned in correspondence with the third via hole H9 of the ground layer 42. The fixing layer 43 also has a fourth via hole H10 which is positioned in correspondence with the fourth via hole H10 of the ground layer 42. The connector 14 is positioned in correspondence with the first via hole H8 so that the first end "A" of the electrically conductive micro-strip line pattern 44 is electrically connected through the first via hole H8 to the external coaxial line 4 connected by the connector 14 to the first via hole H8. The fixing layer 43 comprises a dielectric region entirely extending except in the vicinity of the first, third and fourth via holes H8, H9 and H10. The fixing layer 43 has no magnetic region.

The first end "A" of the electrically conductive micro-strip line pattern 44 of the signal layer 41 is connected through the first via hole H8 to the external coaxial line 4. The second end "B" of the electrically conductive micro-strip line pattern 44 is connected through the second via hole H10 to the electrically conductive region 45 of the ground layer 42.

The measurement of the magnetic field generated by an objective interconnection 6 is carried out by use of the above novel magnetic field detector 40 as follows.

With reference again to FIG. 21, the novel magnetic field detector 40 is positioned so that the bottom side 5 of the multilayer substrate body is just over the objective interconnection 6 generating the magnetic field which is intended to be measured, wherein the bottom side 5 of the multilayer substrate body is in parallel to the objective interconnection 6, so that the dielectric looped face defined by the electrically conductive micro-strip line pattern 44 of the signal layer 41 is also in parallel to the objective interconnection 6. Further, the dielectric looped face defined by the electrically conductive strip line pattern 44 of the signal layer 41 is positioned in the vicinity of the objective interconnection 6, so that the magnetic flux in the vicinity of the objective interconnection 6 penetrates the center region of the dielectric looped face defined by the electrically conductive micro-strip line pattern 44. As a result, even if an adjacent interconnection not illustrated is positioned very close to the objective interconnection 6 and this adjacent interconnection generates an additional magnetic field, then the magnetic flux generated by the objective interconnection 6 penetrates the dielectric looped face defined by the electrically conductive micro-strip line pattern 44, whilst the magnetic flux generated by the adjacent interconnection does not penetrate the dielectric looped face defined by the electrically conductive micro-strip line pattern 44, for which reason the novel magnetic field detector 40 is capable of selectively detecting only the magnetic field generated by the objective interconnection 6 without receiving any substantive disturbance due to the magnetic field generated by the adjacent interconnection.

The above electrically conductive micro-strip line pattern 44 may be formed by an etching process or a sputtering process. This structure enables a remarkable scaling down of the detector body. Particularly, the above structure enables the dielectric looped face surrounded by the electrically conductive micro-strip line pattern 44 to be positioned extremely adjacent to the objective interconnection 6 which generates the magnetic field to be measured, so that even if any adjacent interconnection not illustrated is positioned very close to the objective interconnection 6, the above novel magnetic field detector 40 is capable of detecting only the magnetic field generated by the objective interconnection 6 without, however, receiving any influence of a disturbing magnetic field generated by the adjacent interconnection. The above electrically conductive micro-strip line pattern 44 is formed to position the dielectric looped face closer to the bottom side of the multilayer substrate body so that the dielectric looped face is positioned closer to the objective interconnection 6, whereby the detector 40 can detect only the magnetic field extremely adjacent to the objective interconnection 6 without, however, receiving any influence of a disturbing magnetic field generated by the adjacent interconnection. This improves the spatial resolution of the detector 40.

The above electrically conductive micro-strip line pattern 44 is formed by the etching or sputtering process without being hand-made, for which reason it is possible to form highly accurate and largely scaled down magnetic field detector 40.

In detection of the magnetic field, the device 40 is positioned just over the objective interconnection 6 so that the dielectric looped face is in parallel to the objective interconnection 6 and positioned just over the objective interconnection 6. In order to increase the sensitivity of the device 40, it is preferable that the electrically conductive micro-strip line pattern 44 extends as long as possible in the direction along which the objective interconnection 6 extends unless a spatial resolution of the detector is deteriorated due to a high frequency of the magnetic field generated by the objective interconnection 6. In order to ensure a high spatial resolution of the device 40, it is preferable that the electrically conductive micro-strip line pattern 44 extends as close to the bottom side of the multilayer substrate body of the device 40 as possible so that the dielectric looped face receives the magnetic field in the vicinity of the objective interconnection 6 without, however, receiving any substantive influence of the disturbing magnetic field generated by the adjacent interconnection.

The provision of the fixing layer 43 allows securely electrical and mechanical connection of the detector 40 to the external coaxial line 4.

Ninth Embodiment

Figure 23A:
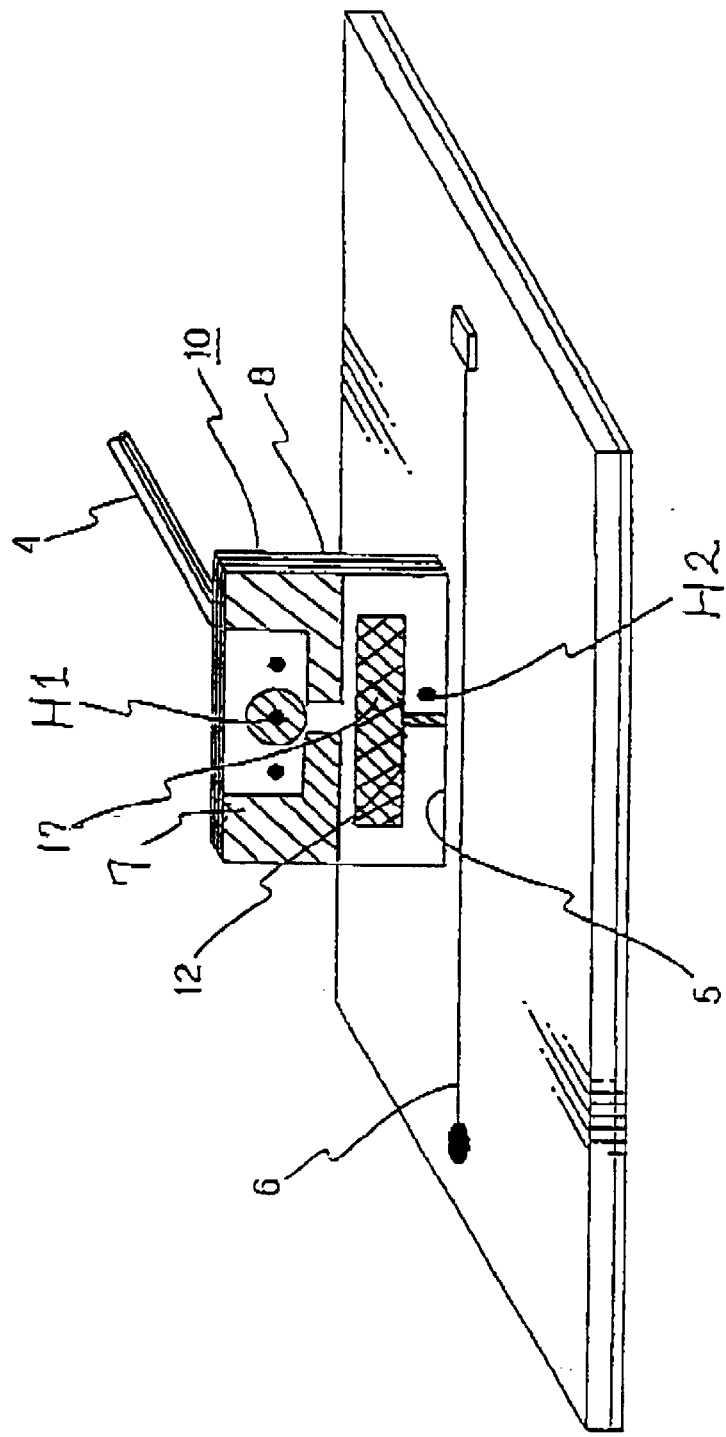
FIG. 23A is a schematic perspective view illustrative of a novel micro-strip line magnetic detector having a multilayer substrate body comprising a ground layer, a signal layer and a fixing layer in a ninth embodiment in accordance with the present invention.
Figure 24A:
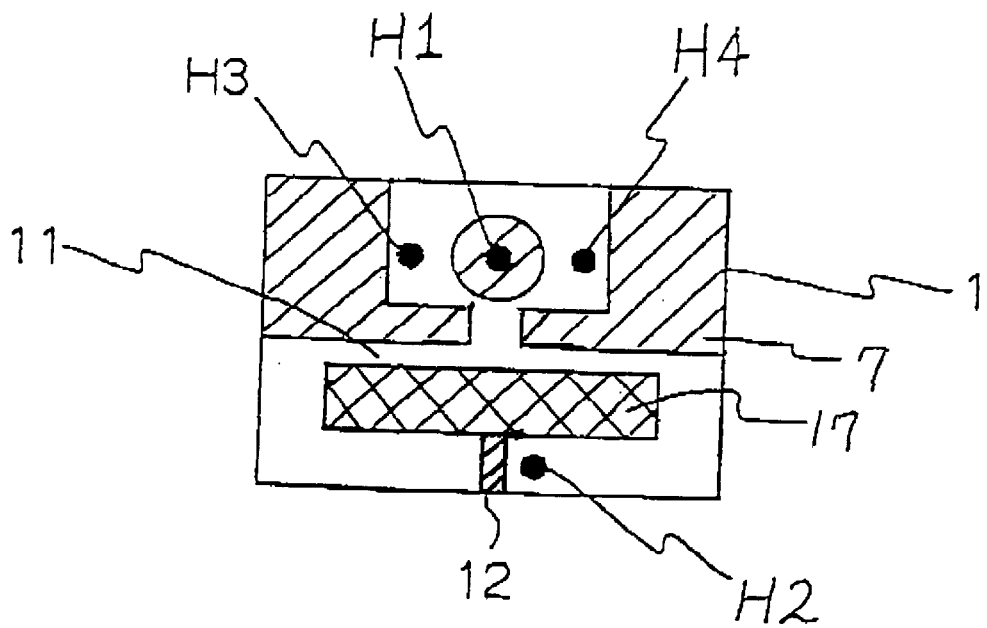
FIG. 24A is a plane view illustrative of a ground layer in a multilayer substrate body of a novel micro-strip line magnetic detector in a ninth embodiment in accordance with the present invention.
Figure 24B:
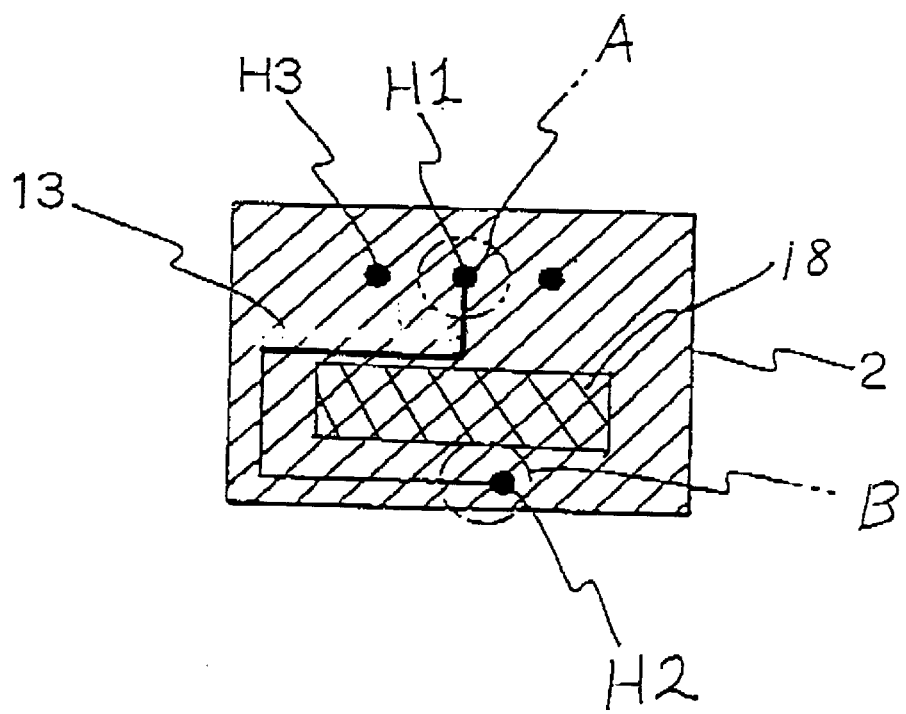
FIG. 24B is a plane view illustrative of a signal layer in a multilayer substrate body of a novel micro-strip line magnetic detector in a ninth embodiment in accordance with the present invention.
Figure 24C:
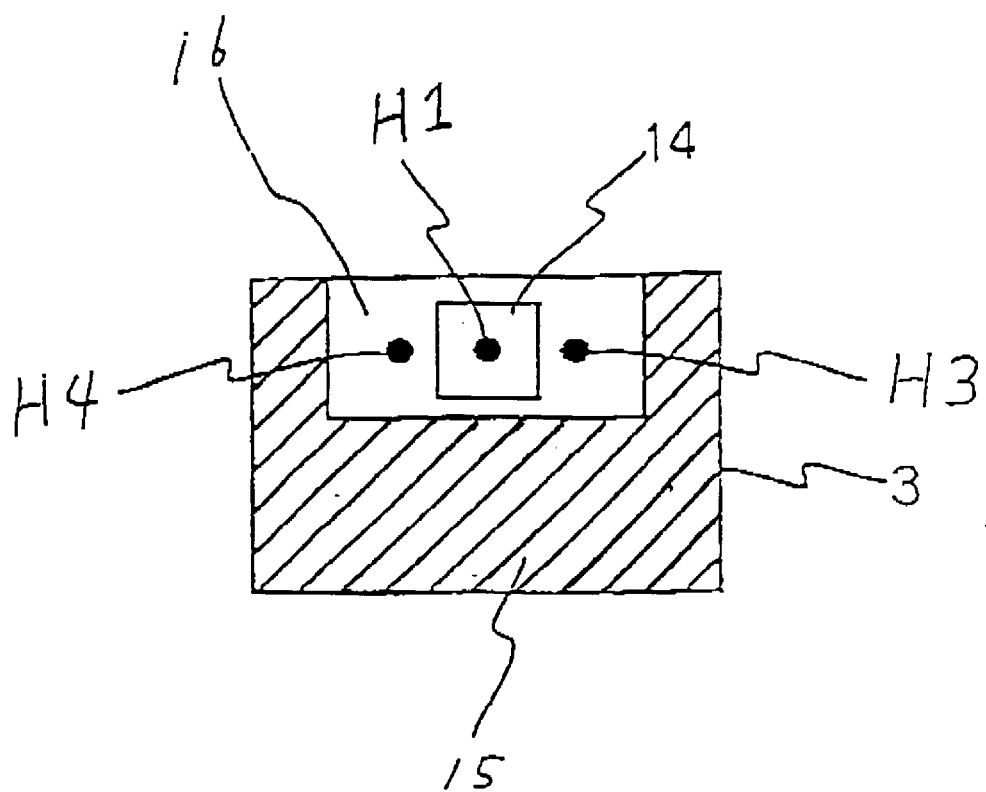
FIG. 24C is a plane view illustrative of a fixing layer in a multilayer substrate body of a novel micro-strip line magnetic detector in a ninth embodiment in accordance with the present invention.
Figure 24D:
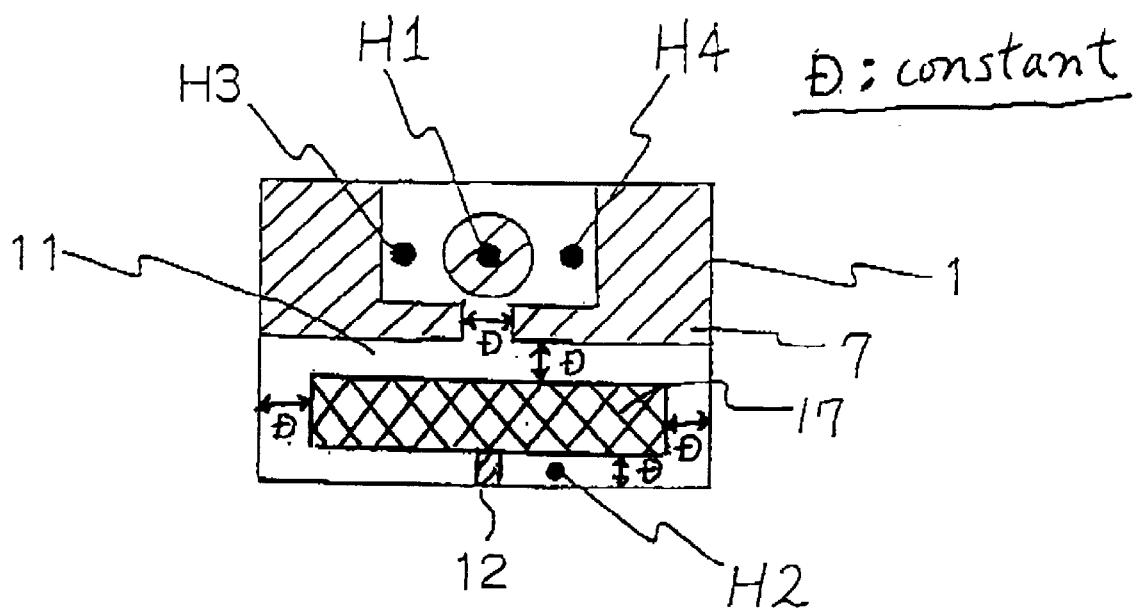
FIG. 24D is a plane view illustrative of a ground layer in a multilayer substrate body of a novel micro-strip line magnetic detector in a first preferred modification to the ninth embodiment in accordance with the present invention.

A ninth embodiment according to the present invention will be described in detail with reference to FIGS. 23A, 24A, 24B and 24C. FIG. 23A is a schematic perspective view illustrative of a novel strip line shielded loop magnetic detector having a multilayer substrate body comprising two ground layers, a signal layer and a fixing layer in a ninth embodiment in accordance with the present invention. FIG. 24A is a plane view illustrative of each of two ground layers in a multilayer substrate body of a novel strip line shielded loop magnetic detector in a ninth embodiment in accordance with the present invention. FIG. 24B is a plane view illustrative of a signal layer in a multilayer substrate body of a novel strip line shielded loop magnetic detector in a ninth embodiment in accordance with the present invention. FIG. 24C is a plane view illustrative of a fixing layer in a multilayer substrate body of a novel strip line shielded loop magnetic detector in a ninth embodiment in accordance with the present invention. The novel device for detecting a magnetic field in this embodiment is structurally different from that of the fifth embodiment in further provision of a magnetic region in a center region of a dielectric looped face surrounded by an electrically conductive micro-strip line pattern but only in a signal layer and a first ground layer without provision of any magnetic region in a second ground layer and a fixing layer in contact with the second ground layer in order to cause a concentration of a magnetic flux which penetrates the dielectric looped face thereby improving a sensitivity of the device.

The novel strip line shielded loop magnetic detector 10 for detecting a magnetic field has a multilayer substrate body 8 which comprises laminations of a signal layer 2 and first and second ground layers 1 sandwiching the signal layer 2 as well as a fixing layer 3.

The signal layer 2 is made of a dielectric substance. The signal layer 2 has an electrically conductive strip line pattern 13 which comprises series connections of the following first to fourth straight strip line segments extending to form a modified U-shape and also form a dielectric looped face surrounded by the modified U-shape of the electrically conductive strip line pattern 13 in three quarter of omni-directions. The dielectric looped face is in parallel to interfaces between the signal layer 2 and the first and second ground layers 1. The dielectric looped face further has a magnetic region 18 which is made of a dielectric substance showing a magnetic property. The magnetic region 18 is rectangular-shaped and extends on a center region of the dielectric looped face defined by the electrically conductive micro-strip line pattern 13, thereby to allow a magnetic flux to be concentrated to penetrate the magnetic region 18 or the center region of the dielectric looped face defined by the electrically conductive micro-strip line pattern 13. The electrically conductive strip line pattern 13 has a first end "A" and a second end "B". A first via hole H1 is formed at the first end of the electrically conductive strip line pattern 13 in the signal layer 2. A second via hole H2 is formed at the second end of the electrically conductive strip line pattern 13 in the signal layer 2. Third and fourth via holes H3 and H4 are further formed at opposite side positions of said first via hole H1 so that the first, third and fourth via holes H1, H3 and H4 are aligned in a horizontal direction and positioned at upper positions of the signal layer 2. The second via hole is positioned at a lower position of the signal layer 2. The first via hole H1 is positioned on a vertical center line. The third and fourth via holes H3 and H4 are positioned in opposite sides of the first via hole H1 at the same level as the first via hole H1 so that the first, third and fourth via holes H1, H3 and H4 are aligned horizontally and symmetrically with reference to the vertical center line of the signal layer 2. The second via hole H2 is displaced from the vertical center line to the same side as the fourth via hole. The electrically conductive strip line pattern 13 mainly extends in the same side as the third via hole H3. The electrically conductive strip line pattern 13 extends from the first end "A" at the first via hole H1 downwardly and further extends in the horizontal direction into the same side as the third via hole H3, and furthermore extends downwardly along the side of the signal layer 2, and moreover extends in the horizontal direction toward the opposite side to pass through the vertical center line and to reach the second via hole H2, whereby the dielectric looped face is defined to be rectangular-shaped and positioned mainly in the same side as the third via hole H3. As described above, the electrically conductive strip line pattern 13 has the following first to fourth straight strip line segments. A first straight strip line segment of the electrically conductive strip line pattern 13 is connected to the first end "A" and extends in a direction vertical to the contact side of the detector 1 and has a level over the magnetic region 18. A second straight strip line segment of the electrically conductive strip line pattern 13 is connected to the first straight strip line segment and also extends in a direction parallel to the contact side of the detector 1 and has a level over the magnetic region 18. A third straight strip line segment of the electrically conductive strip line pattern 13 is connected to the second straight strip line segment and also extends in a direction vertical to the contact side of the detector 1 and also extends on a vertically extending intermediate line between the edge of the rectangle-shaped magnetic region 18 and the side edge of the detector 1. A fourth straight strip line segment of the electrically conductive strip line pattern 13 is connected to the third straight strip line segment and extends in a direction parallel to the contact side of the detector 1 on a horizontally extending intermediate line between the bottom side of the rectangle-shaped magnetic region 18 and the contact side of the detector 1. Consequently, it is preferable that the electrically conductive strip line pattern 13 extends in the signal layer 2 so that, in the vertical view to the interfaces of the signal layer 2 and the ground layer 1, the electrically conductive strip line pattern 13 as a signal line extends along a center line of the electrically conductive pattern 11 of the ground layer 1 in order to ensure stable transmission characteristics. It is also preferable that a left side width of the electrically conductive pattern 11 defined to be the distance between the left side edge of the rectangle-shaped magnetic region 18 and the left side of the ground layer is not more than approximately 10 times of a width of the electrically conductive strip line pattern 13 as a signal line in order to improve the stability of the transmission characteristics. The electrically conductive pattern 11 may optionally comprise a metal foil.

Each of the first and second ground layers 1 comprises an electrically conductive pattern 11 which is electrically connected only to the second end "B" of the electrically conductive strip line pattern 13 so that the each of the first and second ground layers 1 serves as a ground. The each of the first and second ground layers 1 has a first via hole H1 at a position corresponding to the first via hole H1 of the signal layer 2. The each of the first and second ground layers 1 also has a second via hole H2 at a position corresponding to the second via hole H2 of the signal layer 2. The each of the first and second ground layers 1 also has a third via hole H3 at a position corresponding to the third via hole H3 of the signal layer 2. The each of the first and second ground layers 1 also has a fourth via hole H4 at a position corresponding to the fourth via hole H4 of the signal layer 2. The each of the first and second ground layers 1 further has an isolation region around the first via hole H1 so that the first via hole H1 is electrically isolated from the electrically conductive pattern 11. The second, third and fourth via holes H2, H3 and H4 are electrically and structurally connected with the electrically conductive pattern 11. The electrically conductive pattern 11 extends in the vicinity of the first, third and fourth via holes H1, H3 and H4 and also extends on a selected region in correspondence with the electrically conductive strip line pattern 13 in a view vertical to the interface between the signal layer 2 and each of the first and second ground layers 1. Namely, the electrically conductive pattern 11 comprises a rectangular-shaped small top region and a looping region connected through a vertically extending connecting region to the rectangular-shaped small top region. The each of the first and second ground layers 1 has three dielectric regions 7. The first one of the three dielectric regions 7 extends on a right top region of each of the first and second ground layers 1. The second one of the three dielectric regions 7 extends on a left top region of each of the first and second ground layers 1. The first and second ones of the three dielectric regions 7 define the rectangular-shaped small top region and the vertically extending connecting region of the electrically conductive pattern 11. The third one of the three dielectric regions 7 has a slender rectangle-shaped region of a horizontal longitudinal axis with an additional region vertically extending from the slender rectangle shape region to a contact side of each of the first and second ground layers 1 so that the additional region forms a gap 12 in the bottom side region of the electrically conductive pattern 11. The first ground layer 1 has a magnetic region 17 as shown in FIG. 24A, whilst the second ground layer has no magnetic region as shown in FIG. 15A. The magnetic region 17 having a rectangle-shape is formed only in the first ground layer 1 on the slender rectangle-shaped region of the third one of the three dielectric regions 7. The magnetic region 17 exists on the rectangle-shaped region of the third one of the three dielectric regions 7 but does not extend on the gap 12. The gap 12 comprises the dielectric substance of the dielectric regions 7. The magnetic region 17 is made of a dielectric substance showing a magnetic property. The magnetic region 17 of the first ground layer 1 is almost omni-directionally surrounded by the looping portion of the electrically conductive pattern 11. The magnetic region 17 of the first ground layer 1 is positioned in correspondence with the magnetic region 18 of the signal layer 2 in view vertical to the interface of the signal layer 2 and the ground layer 1. The structure of the second ground layer 1 is the same as shown in FIG. 15A. A magnetic flux penetrates the magnetic regions 17 and 18 on the center region of the dielectric looped face defined by the electrically conductive strip line pattern 13. The first and second ones of the three dielectric regions 7 are provided to increase an area of the dielectric region of each of the first and second ground layers 1 and also decrease an area of the electrically conductive pattern 11 of each of the first and second ground layers 1.

The fixing layer 3 is provided in contact with the second ground layer 1 for the purpose exclusively of fixing the external coaxial line 4. The fixing layer 3 has a connector 14 for connecting the external coaxial line 4. The fixing layer 3 also has a first via hole H1 which is positioned in correspondence with the first via hole H1 of the second ground layer 1. The fixing layer 3 also has a third via hole H3 which is positioned in correspondence with the third via hole H3 of the second ground layer 1. The fixing layer 3 also has a fourth via hole H4 which is positioned in correspondence with the fourth via hole H4 of the second ground layer 1. The connector 14 is positioned in correspondence with the first via hole H1 so that the first end "A" of the electrically conductive strip line pattern 13 is electrically connected through the first via hole H1 to the external coaxial line 4 connected by the connector 14 to the first via hole H1. The fixing layer 3 comprises a dielectric region 15 entirely extending except in the vicinity of the first, third and fourth via holes H1, H3 and H4. The dielectric region 15 of the fixing layer 3 has no magnetic region differently from the ground layers 1 and the signal layer 2.

The first end "A" of the electrically conductive strip line pattern 13 of the signal layer 2 is connected through the first via hole H1 to the external coaxial line 4. The electrically conductive strip line pattern 13 extends to pass through the corresponding position to the gap 12, so that the second end "B" of the electrically conductive strip line pattern 13 is connected through the second via hole H2 to the electrically conductive pattern of each of the first and second ground layers 1.

The measurement of the magnetic field generated by an objective interconnection 6 is carried out by use of the above novel magnetic field detector 10 as follows.

With reference again to FIG. 23A, the novel magnetic field detector 10 is positioned so that the bottom side 5 of the multilayer substrate body 8 is just over the objective interconnection 6 generating the magnetic field which is intended to be measured, wherein the bottom side 5 of the multilayer substrate body 8 is in parallel to the objective interconnection 6, so that the dielectric looped face defined by the electrically conductive strip line pattern 13 of the signal layer 2 is also in parallel to the objective interconnection 6. Further, the magnetic region 17 of the first ground layer 1 and the magnetic region 18 on the center region of the dielectric looped face defined by the electrically conductive strip line pattern 13 of the signal layer 2 are positioned in the vicinity of the objective interconnection 6, so that the magnetic flux in the vicinity of the objective interconnection 6 penetrates the magnetic region 17 of the first ground layer 1 and the magnetic region 18 on the center region of the dielectric looped face defined by the electrically conductive strip line pattern 13. As a result, even if an adjacent interconnection not illustrated is positioned very close to the objective interconnection 6 and this adjacent interconnection generates an additional magnetic field, then the magnetic flux generated by the objective interconnection 6 penetrates the magnetic region 17 of the first ground layer 1 and the magnetic region 18 on the center region of the dielectric looped face defined by the electrically conductive strip line pattern 13, whilst the magnetic flux generated by the adjacent interconnection different from the objective interconnections 6 does not penetrate the magnetic region 17 of the first ground layer 1 and the magnetic region 18 on the center region of the dielectric looped face defined by the electrically conductive strip line pattern 13, for which reason the novel magnetic field detector 10 is capable of selectively detecting only the magnetic field generated by the objective interconnection 6 without receiving any substantive disturbance due to the magnetic field generated by the adjacent interconnections different from the objective interconnections 6.

The above electrically conductive strip line pattern 13 may be formed by an etching process or a sputtering process. This structure enables a remarkable scaling down of the detector body 8. Particularly, the above structure enables the dielectric looped face surrounded by the electrically conductive strip line pattern 13 to be positioned extremely adjacent to the objective interconnection 6 which generates the magnetic field to be measured, so that even if any adjacent interconnection not illustrated is positioned very close to the objective interconnection 6, the above novel magnetic field detector 10 is capable of detecting only the magnetic field generated by the objective interconnection 6 without, however, receiving any influence of a disturbing magnetic field generated by the adjacent interconnection. The above electrically conductive strip line pattern 13 is formed so that the magnetic region 17 of the first ground layer 1 and the magnetic region 18 on the center region of the dielectric looped face are positioned closer to the bottom side or contact side of the multilayer substrate body 8 whereby the magnetic region 17 of the first ground layer 1 and the magnetic region 18 on the center region of the dielectric looped face are positioned closer to the objective interconnection 6. As a result, the detector 10 can detect only the magnetic field extremely adjacent to the objective interconnection 6 without, however, receiving any influence of a disturbing magnetic field generated by the adjacent interconnection different from the objective interconnection 6. This improves the spatial resolution of the detector 10.

The above electrically conductive strip line pattern 13 is formed by the etching or sputtering process without being hand-made, for which reason it is possible to form highly accurate and largely scaled down magnetic field detector 10.

In detection of the magnetic field, the device 10 is positioned just over the objective interconnection 6 so that the dielectric looped face is in parallel to the objective interconnection 6 and positioned just over the objective interconnection 6. In order to increase the sensitivity of the device 10, it is preferable that the electrically conductive strip line pattern 13 extends as long as possible in the direction along which the objective interconnection 6 extends unless a spatial resolution of the detector is deteriorated due to a high frequency of the magnetic field generated by the objective interconnection 6. In order to ensure a high spatial resolution of the device 10, it is preferable that the electrically conductive strip line pattern 13 extends as close as possible to the bottom side of the multilayer substrate body 8 of the device 10 so that the dielectric looped face receives the magnetic field in the vicinity of the objective interconnection 6 without, however, receiving any substantive influence of the disturbing magnetic field generated by the adjacent interconnection.

The provision of the fixing layer 3 allows securely electrical and mechanical connection of the detector 10 to the external coaxial line 4.

As a modification, it is also possible to provide a terminating resistance at the second end "B" of the electrically conductive strip line pattern 13 to obtain a non-reflective terminal.

Figure 23B:
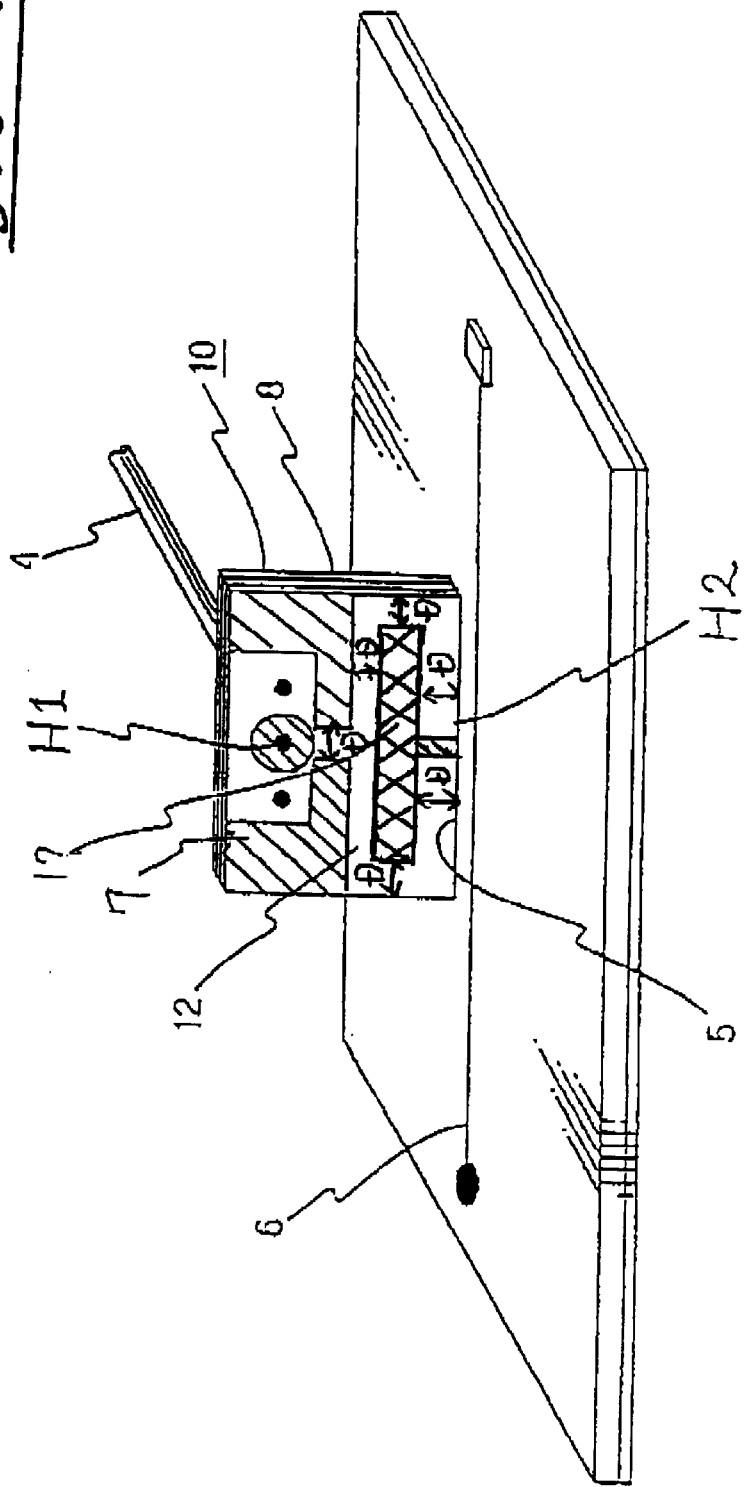
FIG. 23B is a schematic perspective view illustrative of a novel micro-strip line magnetic detector having a multilayer substrate body comprising a ground layer, a signal layer and a fixing layer in a first preferred modification to the ninth embodiment in accordance with the present invention.

A first preferred modification to the above ninth embodiment will subsequently be described with reference to FIGS. 23B, 24D, 24E and 24F, wherein the electrically conductive pattern 11 has a constant width "D" in order to ensure the stability of the transmission characteristics. FIG. 23B is a schematic perspective view illustrative of a novel strip line shielded loop magnetic detector having a multilayer substrate body comprising two ground layers, a signal layer and a fixing layer in a first preferred modification to the ninth embodiment in accordance with the present invention. FIG.

Figure 24E:
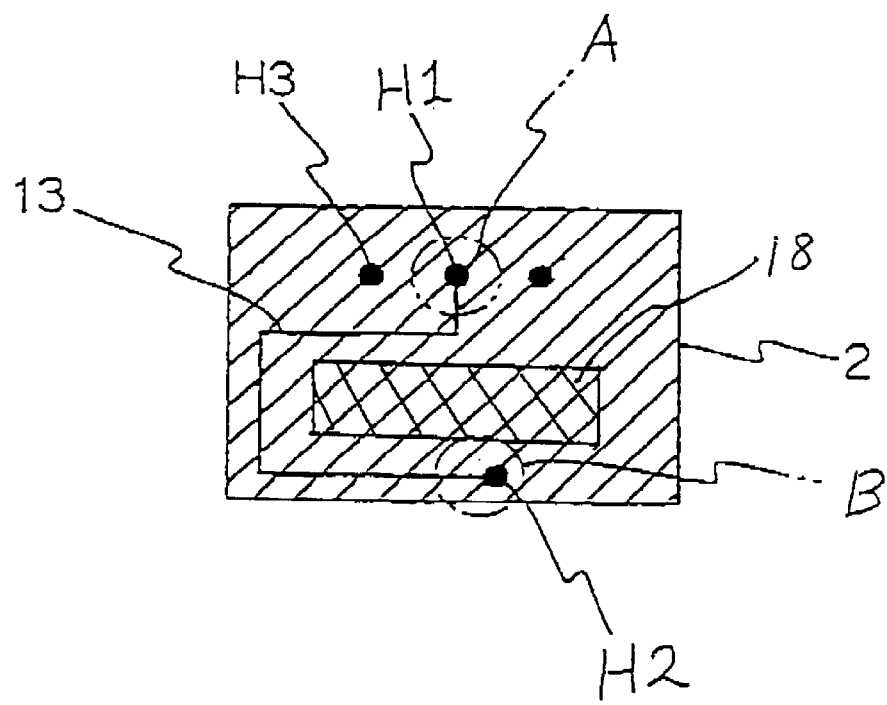
FIG. 24E is a plane view illustrative of a signal layer in a multilayer substrate body of a novel micro-strip line magnetic detector in a first preferred modification to the ninth embodiment in accordance with the present invention.
Figure 24F:
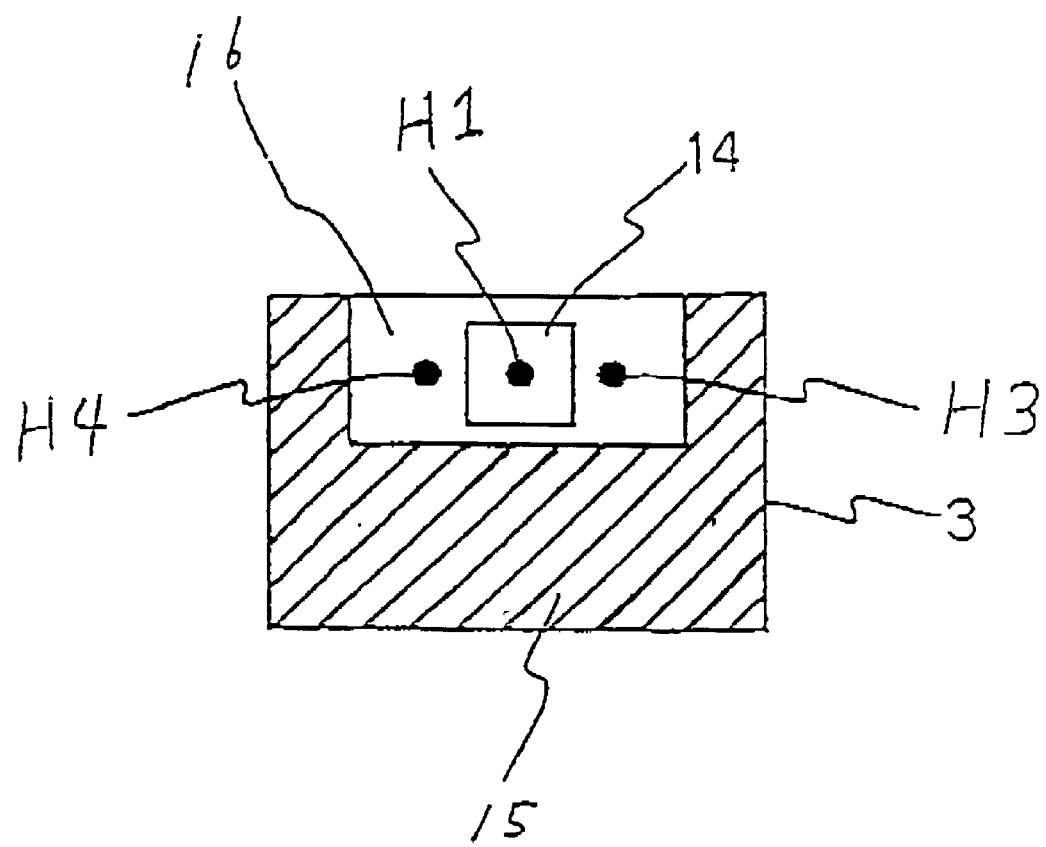
FIG. 24F is a plane view illustrative of a fixing layer in a multilayer substrate body of a novel micro-strip line magnetic detector in a first preferred modification to the ninth embodiment in accordance with the present invention.

24D is a plane view illustrative of each of two ground layers in a multilayer substrate body of a novel strip line shielded loop magnetic detector in a first preferred modification to the ninth embodiment in accordance with the present invention. FIG. 24E is a plane view illustrative of a signal layer in a multilayer substrate body of a novel strip line shielded loop magnetic detector in a first preferred modification to the ninth embodiment in accordance with the present invention. FIG. 24F is a plane view illustrative of a fixing layer in a multilayer substrate body of a novel strip line shielded loop magnetic detector in a first preferred modification to the ninth embodiment in accordance with the present invention.

The description of the first preferred modification will focus on the differences from the above fifth embodiment. The electrically conductive pattern 11 of each of the first and second ground layers 1 has a lead portion and a looping portion. In the first ground layer, the lead portion of the electrically conductive pattern 11 extends in a direction vertical to the contact side of the detector 10 between the first hole H1 and the rectangle-shaped magnetic region 17. In the second ground layer, the lead portion of the electrically conductive pattern 11 extends in a direction vertical to the contact side of the detector 10 between the first hole H1 and the rectangle-shaped dielectric region 7. The looping portion of the electrically conductive pattern 11 of the first ground layer 1 extends to loop or surround the rectangle-shaped magnetic region 17. The looping portion of the electrically conductive pattern 11 of the second ground layer 1 extends to loop or surround the rectangle-shaped dielectric region 7. In accordance with this first preferred modification, the electrically conductive pattern 11 is constant in width "D" throughout the lead portion and the looping portion. Namely, the lead portion and the looping portion of the electrically conductive pattern 11 have the constant width "D" to improve the stability of the transmission characteristic. The constant width "D" of the lead portion and the looping portion of the electrically conductive pattern 11 of each of the first and second ground layers 1 is not more than approximately 10 times of the width of the electrically conductive strip line pattern 13. Further, the electrically conductive strip line pattern 13 extends along center lines of the lead portion and the looping portion of the electrically conductive pattern 11, in the vertical view to the interfaces of the signal layer 2 and the ground layers 1, in order to ensure stable transmission characteristics. The electrically conductive pattern 11 may optionally comprise a metal foil.

Figure 23C:
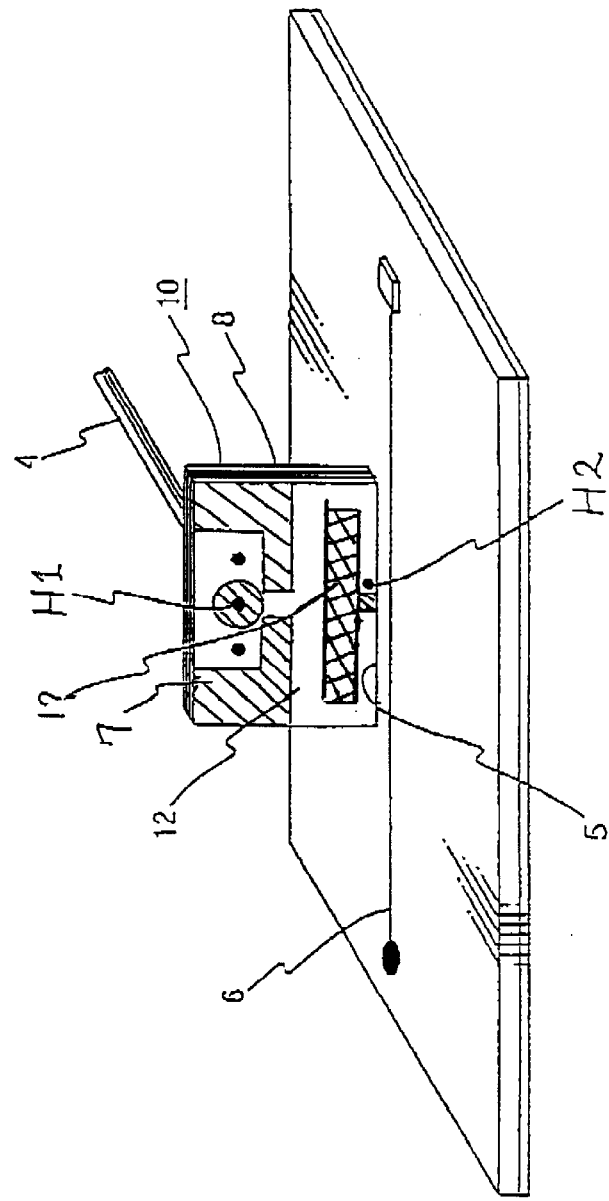
FIG. 23C is a schematic perspective view illustrative of a novel micro-strip line magnetic detector having a multilayer substrate body comprising a ground layer, a signal layer and a fixing layer in a second preferred modification to the ninth embodiment in accordance with the present invention.
Figure 24G:
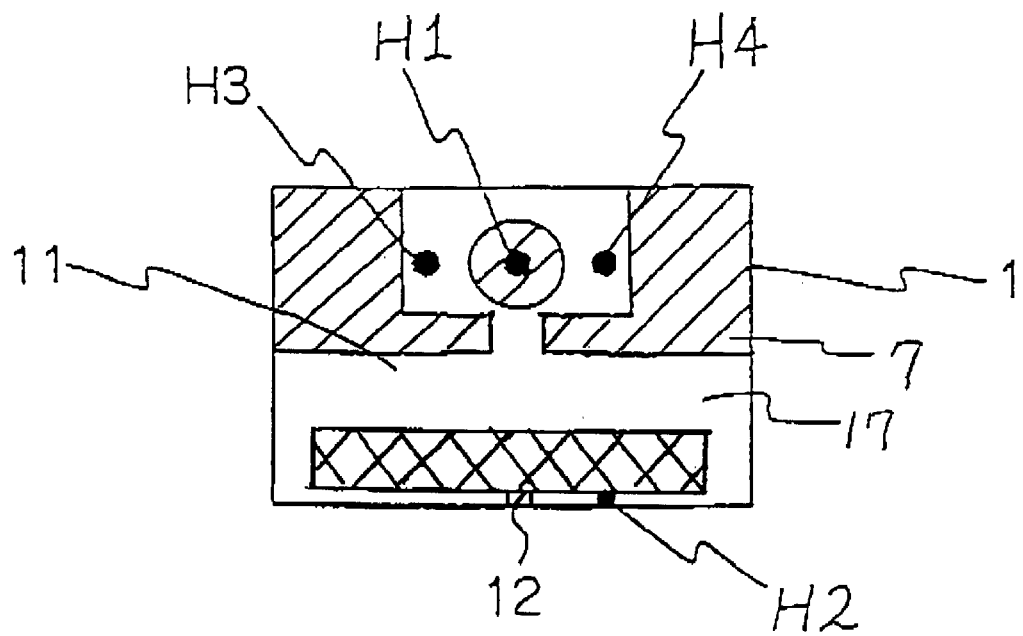
FIG. 24G is a plane view illustrative of a ground layer in a multilayer substrate body of a novel micro-strip line magnetic detector in a second preferred modification to the ninth embodiment in accordance with the present invention.
Figure 24H:
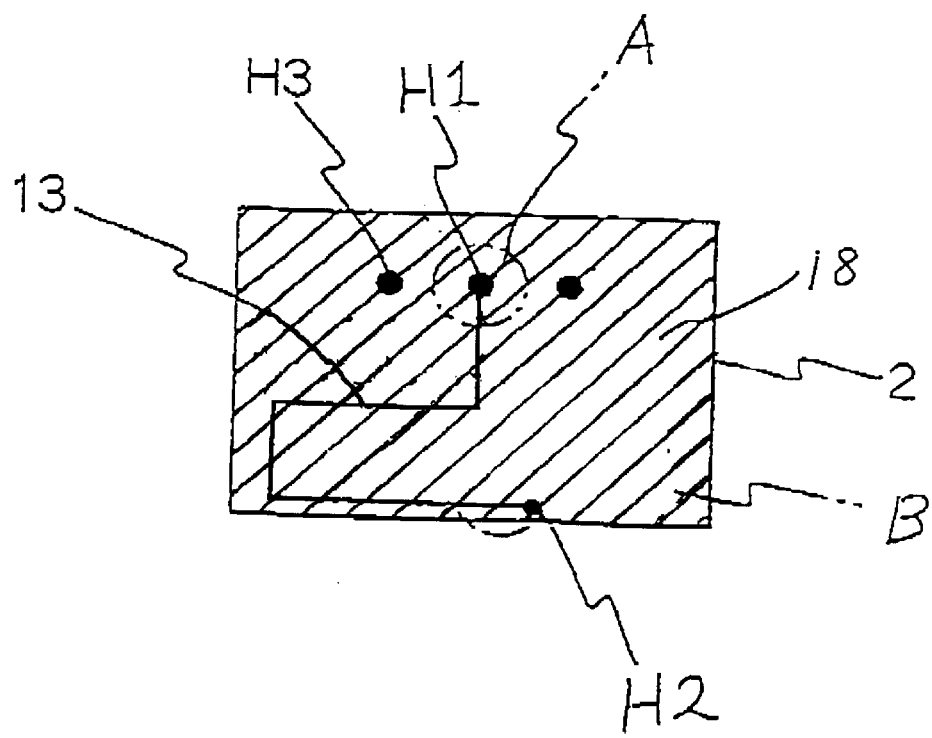
FIG. 24H is a plane view illustrative of a signal layer in a multilayer substrate body of a novel micro-strip line magnetic detector in a second preferred modification to the ninth embodiment in accordance with the present invention.
Figure 24I:
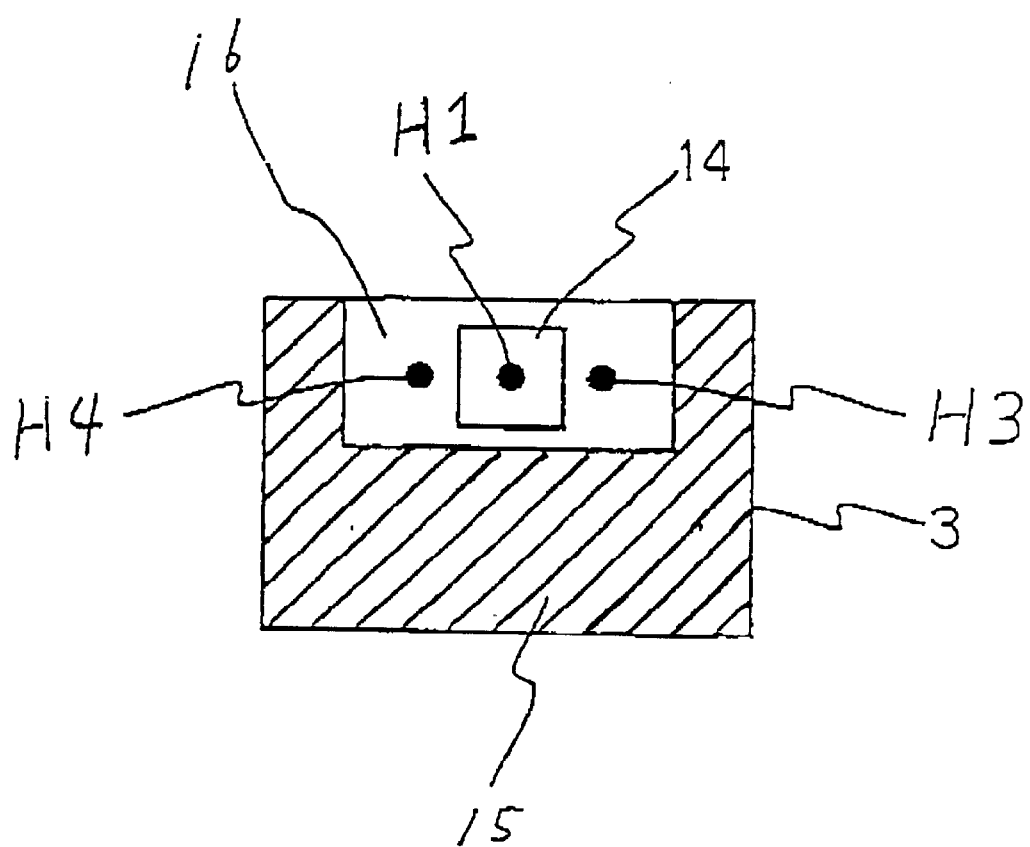
FIG. 24I is a plane view illustrative of a fixing layer in a multilayer substrate body of a novel micro-strip line magnetic detector in a second preferred modification to the ninth embodiment in accordance with the present invention.

A second preferred modification to the above ninth embodiment will subsequently be described with reference to FIGS. 23C, 24G, 24H and 24I, wherein the rectangle-shaped dielectric region 7 and the rectangle-shaped magnetic region 17 forming the looped face defined by the electrically conductive patterns 11 of the second and first ground layers 1 respectively are positioned so closer to the contact side of the detector 1 as possible to shorten the distance between the looped face and the objective interconnection 6 for the purpose of a possible large improvement in spatial resolution of the detector 1, provided that in the view vertical to the interface between the signal layer 2 and the ground layer 1, the electrically conductive strip line pattern 13 extends in the signal layer along a center line of the electrically conductive pattern 11 of each of the first and second ground layers 1. FIG. 23C is a schematic perspective view illustrative of a novel strip line shielded loop magnetic detector having a multilayer substrate body comprising two ground layers, a signal layer and a fixing layer in a second preferred modification to the ninth embodiment in accordance with the present invention. FIG. 24G is a plane view illustrative of each of two ground layers in a multilayer substrate body of a novel strip line shielded loop magnetic detector in a second preferred modification to the ninth embodiment in accordance with the present invention. FIG. 24H is a plane view illustrative of a signal layer in a multilayer substrate body of a novel strip line shielded loop magnetic detector in a second preferred modification to the ninth embodiment in accordance with the present invention. FIG. 24I is a plane view illustrative of a fixing layer in a multilayer substrate body of a novel strip line shielded loop magnetic detector in a second preferred modification to the ninth embodiment in accordance with the present invention.

The description of the second preferred modification will focus on the differences from the above first preferred modification. In the first ground layer 1, the rectangle-shaped magnetic region 17 forms the looped face defined by the looping portion of the electrically conductive pattern 11. In the second ground layer 1, the rectangle-shaped dielectric region 7 forms the looped face defined by the looping portion of the electrically conductive pattern 11. In accordance with this second preferred modification, the rectangle-shaped dielectric region 7 and the rectangle-shaped magnetic region 17 as the looped face, through which the magnetic flux penetrates, are positioned so closer to the contact side of the detector 10 as possible to shorten the distance between the looped face and the objective interconnection 6 for the purpose of a possible large improvement in spatial resolution of the detector 1, provided that in the view vertical to the interface between the signal layer 2 and the ground layer 1, the electrically conductive strip line pattern 13 extends in the signal layer along center lines of the lead portion and the looping portion of the electrically conductive pattern 11 of each of the first and second ground layers 1. Namely, as the rectangle-shaped dielectric region 7 and the rectangle-shaped magnetic region 17 as the looped face are displaced closer to the contact side to the objective interconnection 6 to shorten the distance between the looped face and the objective interconnection 6 for the purpose of the large improvement in spatial resolution of the detector 10, then the electrically conductive strip line pattern 13 extending in the signal layer 2 is also displaced closer to the contact side, so that the electrically conductive strip line pattern 13 extends along the center lines of the looping portion of the electrically conductive pattern 11 of each of the first and second ground layers 1 in the vertical view to the interface between the signal layer 2 and each of the first and second ground layers 1.

Figure 23D:
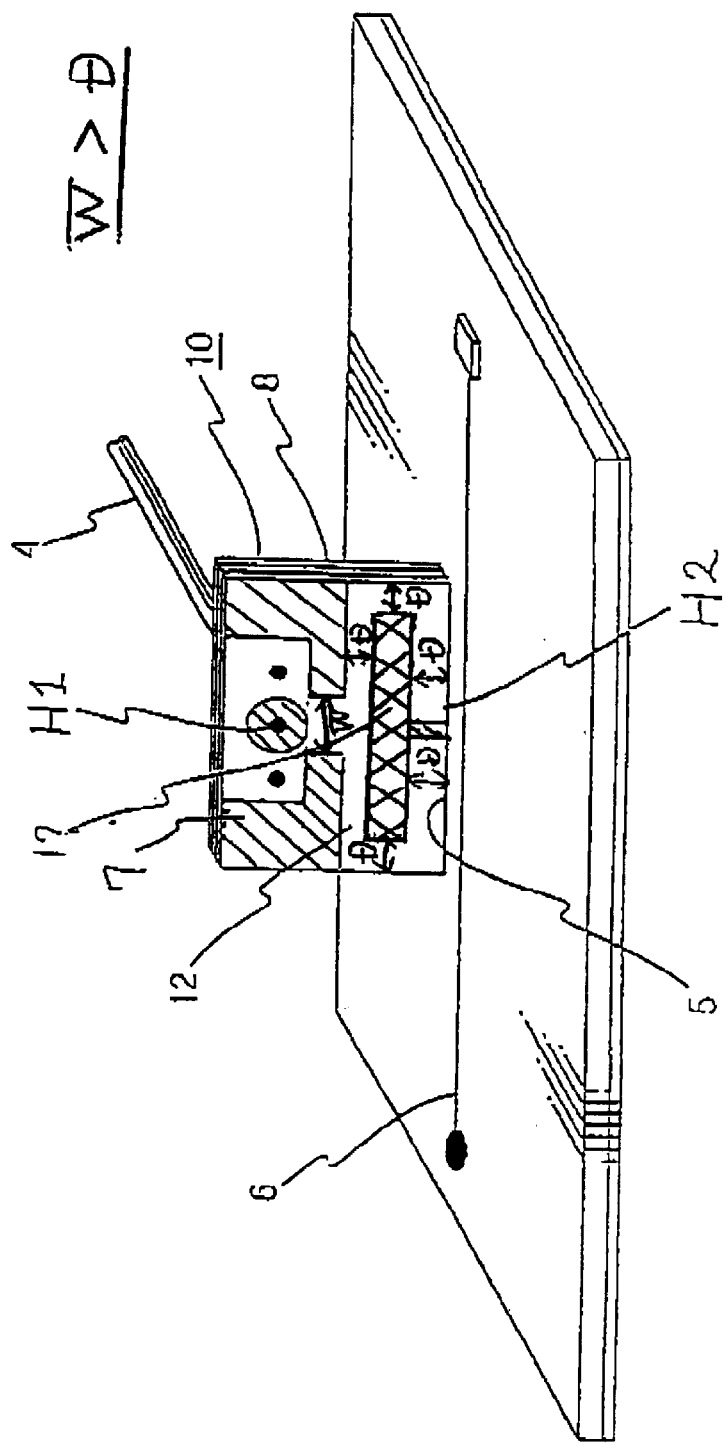
FIG. 23D is a schematic perspective view illustrative of a novel micro-strip line magnetic detector having a multilayer substrate body comprising a ground layer, a signal layer and a fixing layer in a third preferred modification to the ninth embodiment in accordance with the present invention.
Figure 24J:
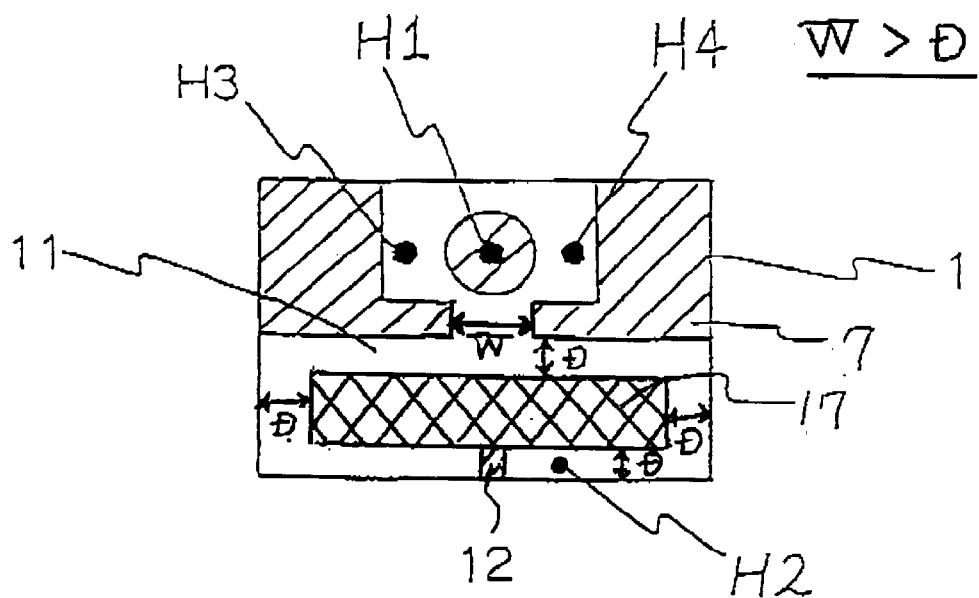
FIG. 24J is a plane view illustrative of a ground layer in a multilayer substrate body of a novel micro-strip line magnetic detector in a third preferred modification to the ninth embodiment in accordance with the present invention.
Figure 24K:
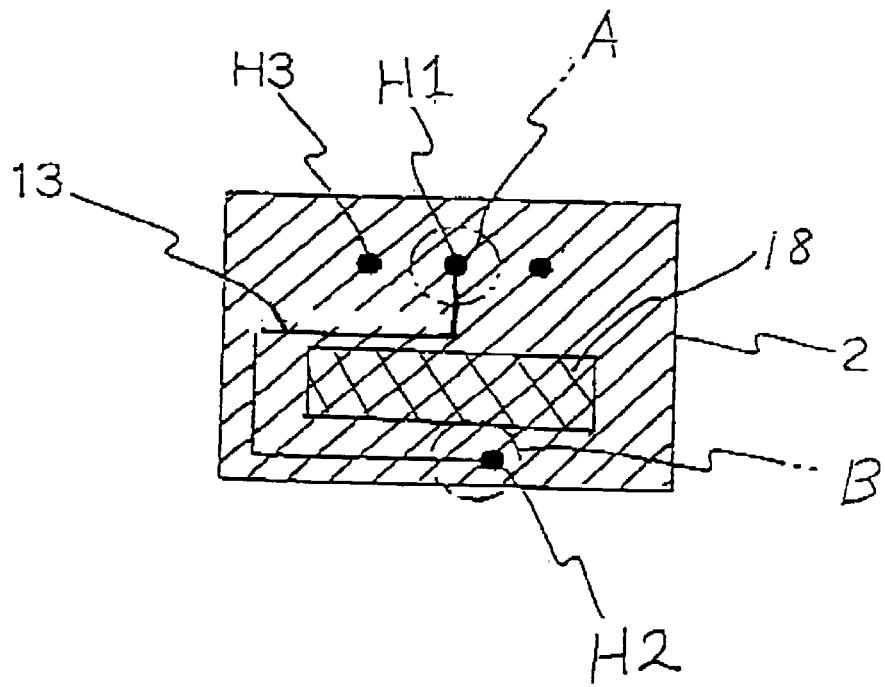
FIG. 24K is a plane view illustrative of a signal layer in a multilayer substrate body of a novel micro-strip line magnetic detector in a third preferred modification to the ninth embodiment in accordance with the present invention.
Figure 24L:
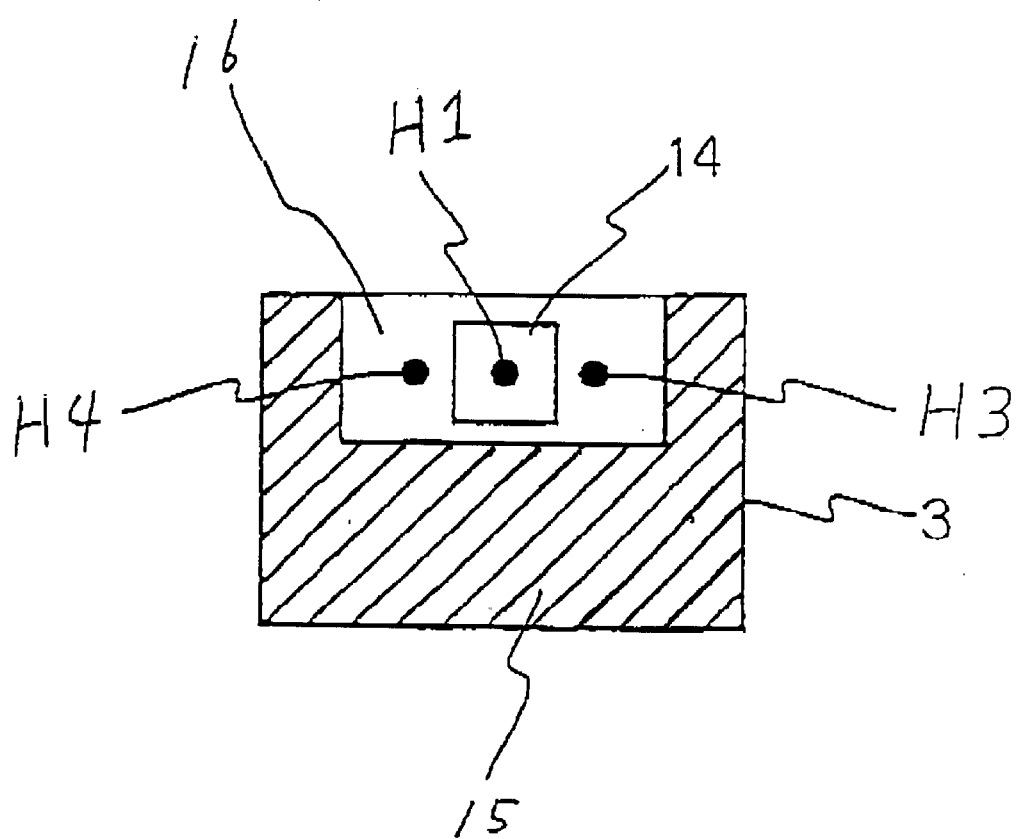
FIGS. 24L–24Q is a plane view illustrative of a fixing layer in a multilayer substrate body of a novel micro-strip line magnetic detector in a third preferred modification to the ninth embodiment in accordance with the present invention.

A third preferred modification to the above ninth embodiment will subsequently be described with reference to FIGS. 23D, 24J, 24K and 24L, wherein the lead portion of the electrically conductive pattern 11 of each of the first and second ground layers 1 vertically extends between the first hole H1 and the rectangle-shaped dielectric region 7 or the rectangle-shaped magnetic region 17 and the width "W" of the lead portion is increased to be wider but within a few times than the width "D" of the looping portion of the electrically conductive pattern 11 which loops or surrounds the rectangle-shaped dielectric region 7 or the rectangle-shaped magnetic region 17 in order to improve the shielding characteristic for shielding the electrically conductive strip line pattern 13 as a stripe line from a majority of the electric field as the unnecessary component from the objective interconnection 6. FIG. 23D is a schematic perspective view illustrative of a novel strip line shielded loop magnetic detector having a multilayer substrate body comprising two ground layers, a signal layer and a fixing layer in a third preferred modification to the ninth embodiment in accordance with the present invention. FIG. 24J is a plane view illustrative of each of two ground layers in a multilayer substrate body of a novel strip line shielded loop magnetic detector in a third preferred modification to the ninth embodiment in accordance with the present invention. FIG. 24K is a plane view illustrative of a signal layer in a multilayer substrate body of a novel strip line shielded loop magnetic detector in a third preferred modification to the ninth embodiment in accordance with the present invention. FIG. 24L is a plane view illustrative of a fixing layer in a multilayer substrate body of a novel strip line shielded loop magnetic detector in a third preferred modification to the ninth embodiment in accordance with the present invention.

The description of the third preferred modification will focus on the differences from the above first preferred modification. The lead portion of the electrically conductive pattern 11 of the first ground layer 1 vertically extends between the first hole H1 and the rectangle-shaped magnetic region 17 and the width "W" of the lead portion is increased to be wider but within a few times than the width "D" of the looping portion of the electrically conductive pattern 11 which loops or surrounds the rectangle-shaped magnetic region 7. Further, the lead portion of the electrically conductive pattern 11 of the second ground layer 1 vertically extends between the first hole H1 and the rectangle-shaped dielectric region 7 and the width "W" of the lead portion is increased to be wider but within a few times than the width "D" of the looping portion of the electrically conductive pattern 11 which loops or surrounds the rectangle-shaped dielectric region 7 in order to improve the shielding characteristic for shielding the electrically conductive strip line pattern 13 as a stripe line from a majority of the electric field as the unnecessary component from the objective interconnection 6. The lead portion of the electrically conductive pattern 11 has the constant width "W", whilst the looping portion of the electrically conductive pattern 11 has the other constant width "D" which is narrower by not more than a few times than the constant width "W" of the lead portion. Differently from the looping portion of the electrically conductive pattern 1, the variation in width "W" of the lead portion of the electrically conductive pattern 11 provides almost no influence to the spatial resolution of the detector. For this reason, the lead portion of the electrically conductive pattern 11 is widen to improve the shielding characteristic of the electrically conductive strip line pattern 13 without any substantive deterioration in the spatial resolution of the detector. Not only the necessary magnetic field but also the unnecessary electric field generated by the objective interconnection 6 are applied to the detector. The unnecessary electric field has a larger vertical component than a horizontal component, for which reason the vertically extending lead portion of the electrically conductive pattern 11 is likely to receive a greater influence from the unnecessary electric field than the looping portion of the electrically conductive pattern 11. Therefore, the looping portion of the electrically conductive pattern 11 remains in width at "D", whilst the lead portion of the electrically conductive pattern 11 is widen from "D" to "W" to improve the shielding characteristic of the electrically conductive strip line pattern 13 for shielding the electrically conductive strip line pattern 13 from the influence of the unnecessary electric field without any substantive deterioration in the spatial resolution of the detector.

Figure 23E:
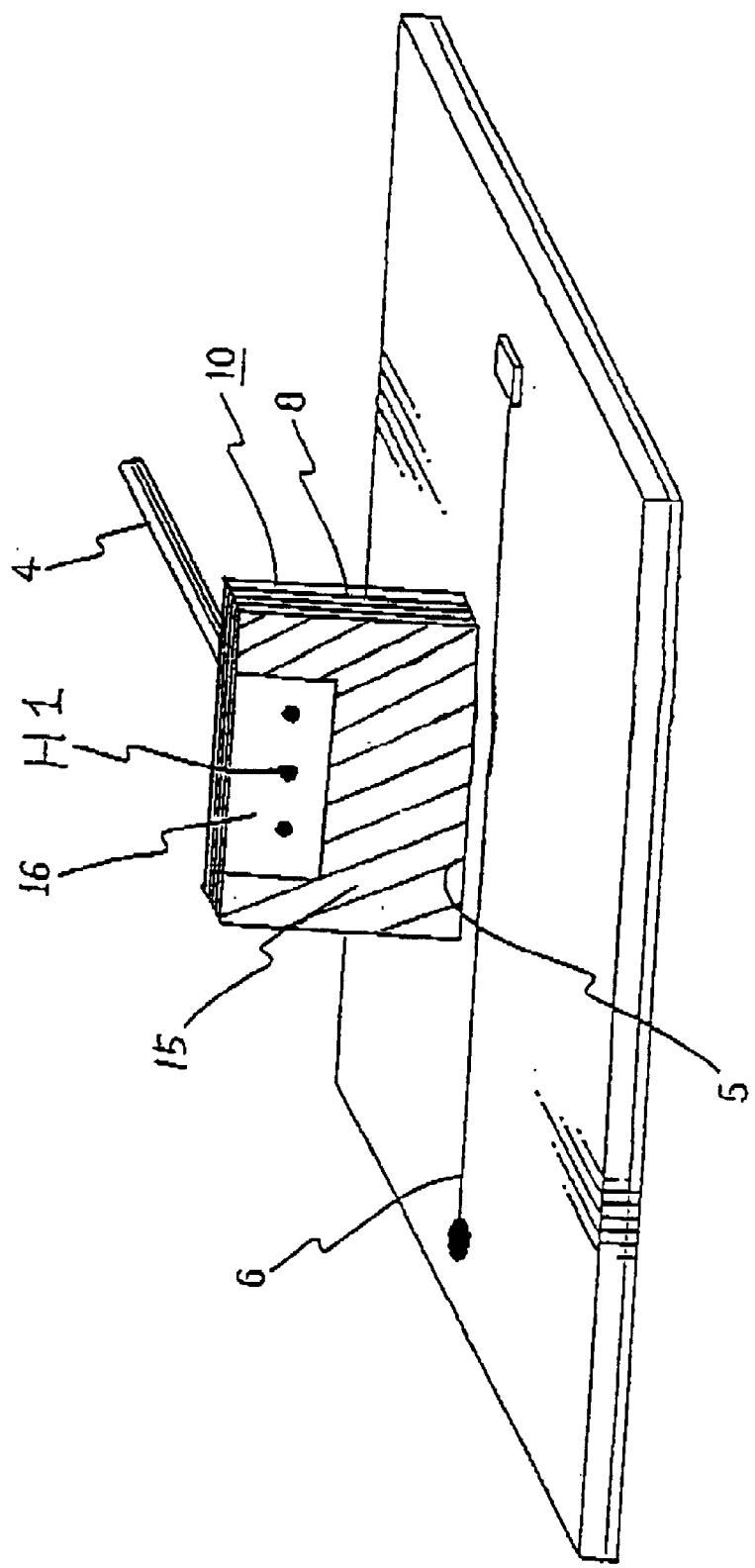
Figure 24M:
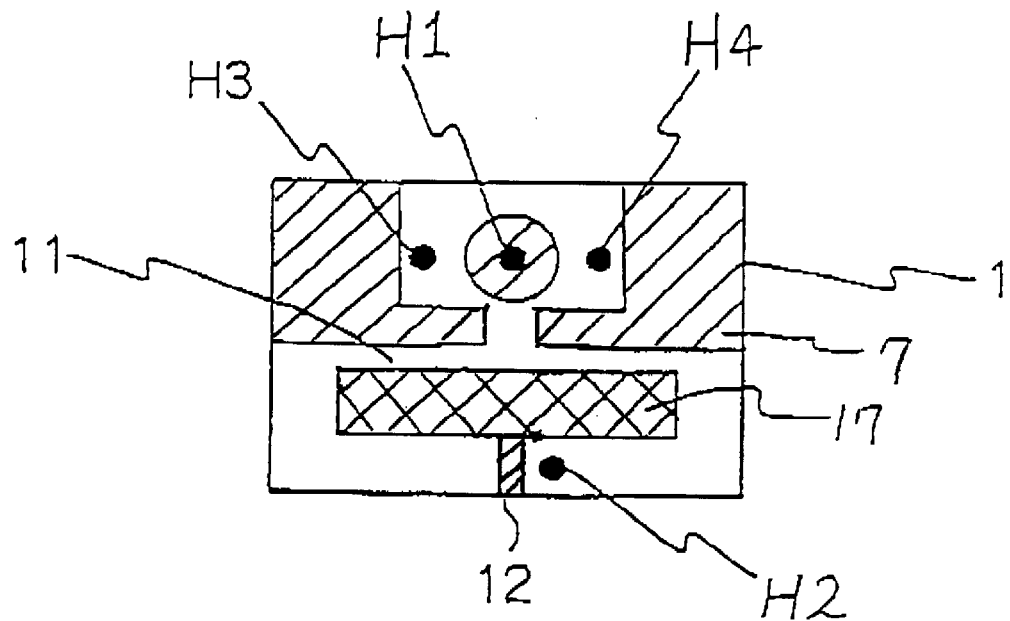
Figure 24N:
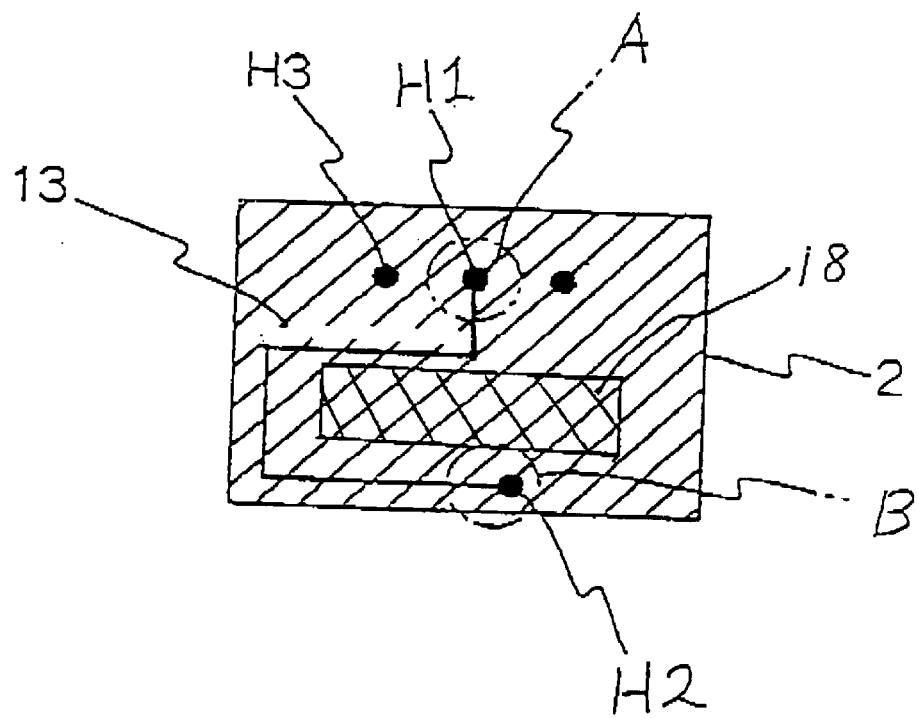
Figure 24O:
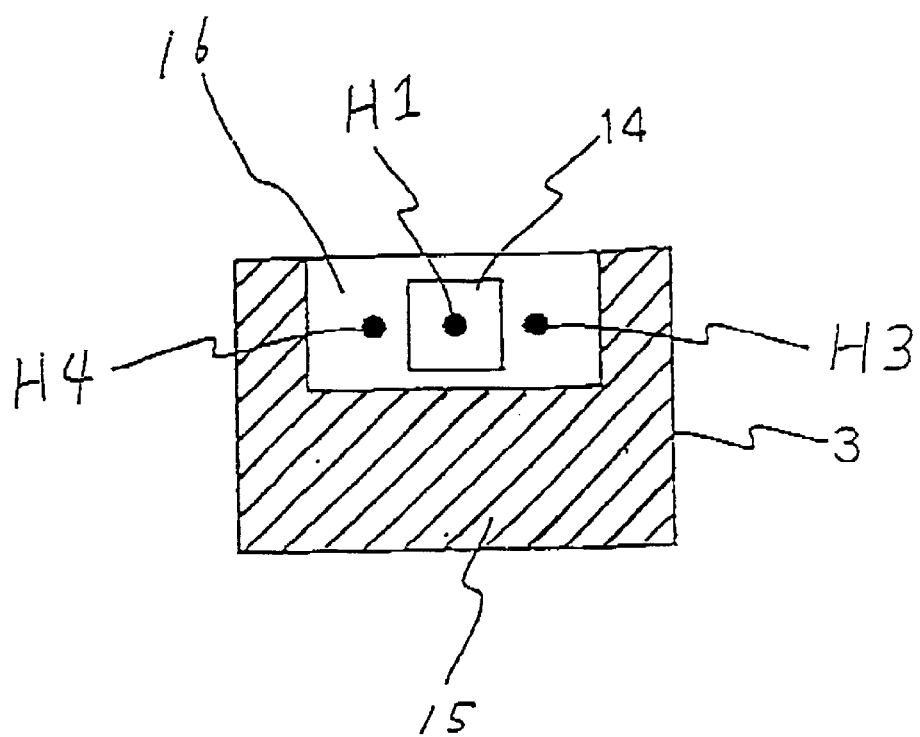
Figure 24P:
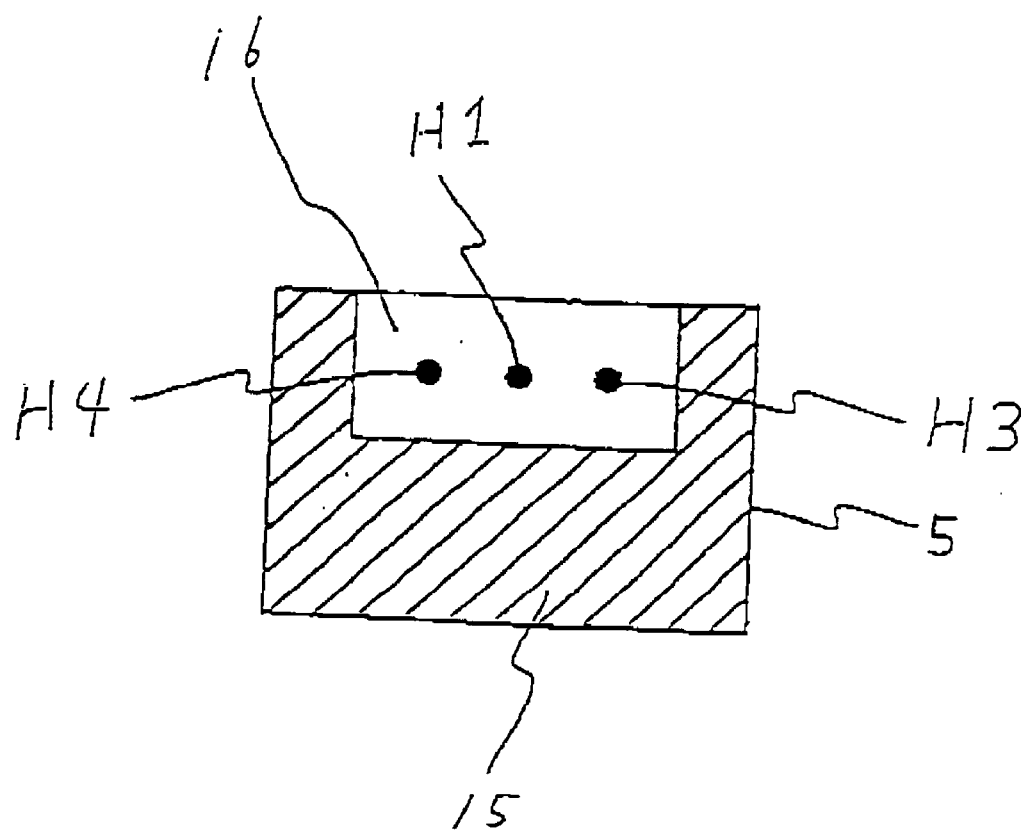
Figure 24Q:
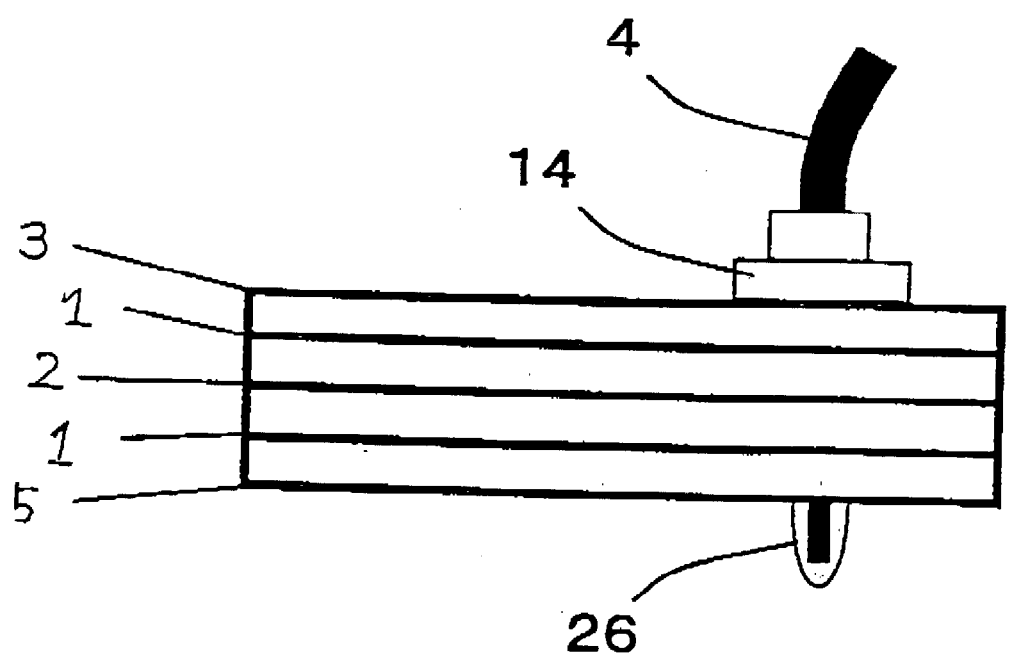

A fourth preferred modification to the above ninth embodiment and also to the above first, second and third preferred modifications will subsequently be described with reference to FIGS. 23E, 24M, 24N, 24O, 24P and 24Q, wherein a secondary fixing layer is additionally provided in contact with a first ground layer, so that the first layer is sandwiched between the signal layer and the secondary fixing layer, whereby the primary and secondary fixing layers sandwich the first and second ground layers which further sandwich the signal layer. FIG. 23E is a schematic perspective view illustrative of a novel strip line shielded loop magnetic detector having a multilayer substrate body comprising two ground layers, a signal layer and two fixing layers in a fourth preferred modification to the above ninth embodiment and also to the above first, second and third preferred modifications in accordance with the present invention. FIG. 24M is a plane view illustrative of each of two ground layers in a multilayer substrate body of a novel strip line shielded loop magnetic detector in a fourth preferred modification to the above ninth embodiment and also to the above first, second and third preferred modifications in accordance with the present invention. FIG. 24N is a plane view illustrative of a signal layer in a multilayer substrate body of a novel strip line shielded loop magnetic detector in a fourth preferred modification to the above ninth embodiment and also to the above first, second and third preferred modifications in accordance with the present invention. FIG. 24O is a plane view illustrative of a primary fixing layer in a multilayer substrate body of a novel strip line shielded loop magnetic detector in a fourth preferred modification to the above ninth embodiment and also to the above first, second and third preferred modifications in accordance with the present invention. FIG. 24P is a plane view illustrative of a secondary fixing layer in a multilayer substrate body of a novel strip line shielded loop magnetic detector in a fourth preferred modification to the above ninth embodiment and also to the above first, second and third preferred modifications in accordance with the present invention. FIG. 24Q is a cross sectional elevation view illustrative of a lamination structure of the multilayer substrate body of a novel strip line shielded loop magnetic detector in a fourth preferred modification to the above ninth embodiment and also to the above first, second and third preferred modifications in accordance with the present invention.

The description of the fourth preferred modification will focus on the differences from the above ninth embodiment and also from the above first, second and third preferred modifications. With reference to FIGS. 23E, 24M, 24N, 24O, 24P and 24Q, a secondary fixing layer 5 is additionally provided in contact with the first ground layer 1, so that the first ground layer 1 is sandwiched between the signal layer 2 and the secondary fixing layer 5, provided that lamination structures of the first ground layer 1, the signal layer 2, the second ground layer 1 and the primary fixing layer 3 are the same as in the above ninth embodiment and also in the above first, second and third preferred modifications. Namely, in the above ninth embodiment and also in the above first, second and third preferred modifications, the multilayer structure comprises the single signal layer, the single fixing layer and the two ground layers. By contrast, in this fourth preferred modification to the above ninth embodiment and also to the above first, second and third preferred modifications, the multilayer structure comprises the single signal layer, the two fixing layers and the two ground layers. In detail, the signal layer 2 is sandwiched between the first and second ground layers 1. The first and second ground layers 1 are further sandwiched between the primary and secondary fixing layers 3 and 4, wherein the primary fixing layer 3 is in contact with the second ground layer 1 and the secondary fixing layer 5 is in contact with the first ground layer 1. A connector 14 is provided on the primary ground layer 1 so that a external coaxial line 4 is connected through the connector 14 and through the first via hole H1 penetrating the primary fixing layer 3, the second ground layer 1, and the signal layer 2, the first ground layer 1 and the secondary fixing layer 5 to a solder 26 on the secondary fixing layer 5. The secondary fixing layer 5 is structurally different from the primary fixing layer 3 only in that the connector 14 is not provided. Namely, the secondary fixing layer 5 also has a first via hole H1 which is positioned in correspondence with the first via hole H1 of the first ground layer 1. The secondary fixing layer 5 also has a third via hole H3 which is positioned in correspondence with the third via hole H3 of the first ground layer 1. The secondary fixing layer 5 also has a fourth via hole H4 which is positioned in correspondence with the fourth via hole H4 of the first ground layer 1. The secondary fixing layer 5 comprises a dielectric region 15 entirely extending except in the vicinity of the first, third and fourth via holes H1, H3 and H4. The secondary fixing layer 5 has a dielectric region 15 entirely extending except for a rectangle-shaped conductive region 16 which includes the third and fourth via holes H1, H3 and H4.

An additional provision of the secondary fixing layer 5 provides the following advantages. The secondary fixing layer 5 has almost the same dielectric and conductive region patterns as the primary fixing layer 3. Further, the primary and secondary fixing layers 3 and 5 sandwich the second and first ground layers 1 which further sandwich the single signal layer 2. The additional provision of the secondary fixing layer 5 improves symmetry in conductive and dielectric region patterns in the thickness direction vertical to the surfaces of the above laminated layers 1, 2, 3 and 5, thereby improving the stability in signal transmission on the electrically conductive strip line pattern 13 of the signal layer 2. Further, the secondary fixing layer 5 is provided for covering the first ground layer 1, whereby the secondary fixing layer 5 protects the conductive and dielectric patterns of the first ground layer 1. Furthermore, the additional provision of the secondary fixing layer 5 forms five-layered lamination structures. The increase in the number of the lamination layers improves the mechanical strength of the multilayer structure, thereby suppressing the multilayer structure from being bent.

Tenth Embodiment

Figure 25:
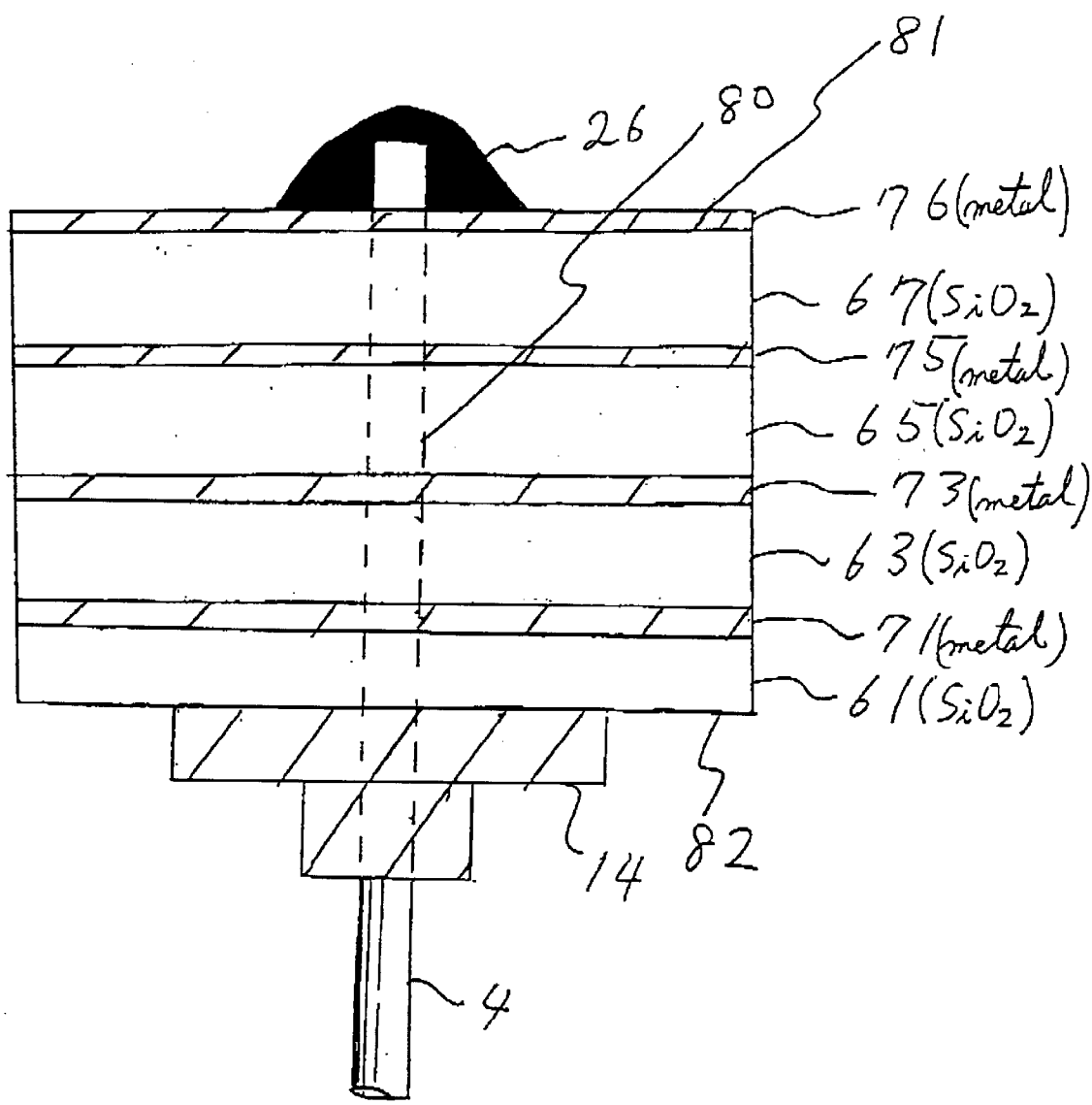
FIG. 25 is a cross sectional elevation view illustrative of a modified multi-layer substrate useable in accordance with the present invention, wherein plural silicon oxide substrates and electrically conductive layers are alternately laminated in a tenth embodiment in accordance with the present invention.

A tenth embodiment according to the present invention will be described in detail with reference to FIG. 25, which is a cross sectional elevation view illustrative of a modified multi-layer substrate useable in accordance with the present invention, wherein plural silicon oxide substrates and electrically conductive layers are alternately laminated in a tenth embodiment in accordance with the present invention. In the foregoing embodiments, the electrically conductive patterns and conductive regions are formed on printed circuit boards. In this embodiment, however, the electrically conductive patterns and conductive regions are formed on silicon dioxide layers or substrates. The above novel device may be formed in the multilayer printed circuit boards. This means that the above novel device may also be formed in the multilayer silicon dioxide layers.

The novel device for detecting a magnetic field comprises a dielectric body comprising laminations of four silicon dioxide layers 61, 63, 65 and 67. A through hole 80 is formed in the dielectric body to penetrate between first and second surfaces 81 and 82 opposite to each other. An electrically conductive pad 76 made of a metal is provided on the first surface 81 of the dielectric body. The electrically conductive pad 76 has an opening positioned in correspondence with the through hole 80. A connector 14 is provided on the second surface 82 of the dielectric body and covers the through hole 80 for connecting an external coaxial line 4 to the through hole 80. The external coaxial line 4 extends through the through hole 80 and the opening of the electrically conductive pad 76. An end of the external coaxial line 4 is electrically connected with the electrically conductive pad 76 through a solder 26. A second interface 73 between the silicon dioxide layers 63 and 65 has an electrically conductive pattern extending to form a dielectric looped face surrounded by the electrically conductive pattern. The electrically conductive pattern may comprise any one of the electrically conductive micro-strip line patterns of the second, third and fourth embodiments or the electrically conductive strip line patterns of the first and fifth embodiments. The dielectric looped face is in parallel to the interface between the silicon dioxide layers 61, 63, 65 and 67, thereby to allow a magnetic flux to penetrate the dielectric looped face. The electrically conductive pattern has a first end which is electrically connected through a first contact hole not illustrated to the electrically conductive pad 76 so that the electrically conductive pattern 73 is electrically connected through the solder 26 to the external coaxial line 4. The electrically conductive pattern 73 also has a second end. The remaining two interfaces between the silicon dioxide layers 61 and 63 and between the silicon dioxide layers 65 and 67 have first and second electrically conductive ground patterns 71 and 75 which are electrically connected through second and third contact holes not illustrated to the second end of the electrically conductive pattern 73. The electrically conductive ground patterns 71 and 75 serve as grounds to the electrically conductive pattern 73 forming the dielectric looped face.

The above electrically conductive pattern may be formed by an etching process or a sputtering process on or in the dielectric body comprising the multilayer silicon dioxide layers 61, 63, 65 and 67. The above structure enables a remarkable scaling down of the detector. Particularly, the above structure enables the dielectric looped face surrounded by the electrically conductive pattern to be positioned extremely adjacent to an objective interconnection which generates a magnetic field to be measured, so that even if an adjacent interconnection is positioned very close to the objective interconnection, the above novel magnetic field detector is capable of detecting only the magnetic field generated by the objective interconnection without, however, receiving any influence of a disturbing magnetic field generated by the adjacent interconnection. The electrically conductive pattern 73 is formed to position the dielectric looped face closer to a contact side of the device so that the dielectric looped face is positioned closer to the objective interconnection, whereby the detector can detect only the magnetic field extremely adjacent to the objective interconnection. The above electrically conductive pattern is formed by the etching or sputtering process without being hand-made, for which reason it is possible to form highly accurate and largely scaled down magnetic field detector. The electrically conductive pattern may comprise any electrically conductive material, for example, not only any available metals, but also any available alloys, superconductors, refractory metal silicide materials and elemental and compound semiconductors. In detection of the magnetic field, the device is positioned just over the objective interconnection so that the dielectric looped face is in parallel to the objective interconnection and positioned just over the objective interconnection. In order to increase the sensitivity, it is preferable that the electrically conductive pattern extends as long as possible in the direction along which the objective interconnection extends unless a spatial resolution of the detector is deteriorated due to a high frequency of the magnetic field generated by the objective interconnection. In order to ensure a high spatial resolution, it is preferable that the electrically conductive pattern extends as close to the contact side of the device as possible so that the dielectric looped face receives the magnetic field in the vicinity of the objective interconnection without, however, receiving any substantive influence of the disturbing magnetic field generated by the adjacent interconnection.

Whereas modifications of the present invention will be apparent to a person having ordinary skill in the art, to which the invention pertains, it is to be understood that embodiments as shown and described by way of illustrations are by no means intended to be considered in a limiting sense. Accordingly, it is to be intended to cover by claims all modifications which fall within the spirit and scope of the present invention.

What is claimed is:

1. A device for detecting a magnetic field comprising:
   a dielectric body;
   at least an electrically conductive pattern so extending in said dielectric body as to form a dielectric looped face at least partially surrounded by said at least electrically conductive pattern, and said at least electrically conductive pattern having a first end electrically connected to an external electrically conductive line and a second end; and
   at least an electrically conductive ground region formed in said dielectric body, said at least electrically conductive ground region being electrically connected to said second end of said at least electrically conductive pattern and being electrically isolated from other parts of said at least electrically conductive pattern than said second end, so that said at least electrically conductive ground region serves as a ground to said at least electrically conductive pattern.

2. The device as claimed in claim 1, wherein said electrically conductive ground region has a loop-forming region surrounding said dielectric looped face and a lead region extending from said loop-forming region toward said first end of said electrically conductive pattern.

3. The device as claimed in claim 2, wherein said loop-forming region and said lead region are uniform in width.

4. The device as claimed in claim 3, wherein said loop-forming region and said lead region have a width of not more than about ten times of a width of said electrically conductive pattern.

5. The device as claimed in claim 3, wherein said electrically conductive pattern extends on a center line of said loop-forming region and said lead region.

6. The device as claimed in claim 1, wherein said electrically conductive ground region extends symmetrically in a direction along a contact side of said dielectric body.

7. The device as claimed in claim 2, wherein said lead region is wider than said loop-forming region.

8. The device as claimed in claim 2, wherein said looped face is displaced toward a contact side of said dielectric body, so that said loop-forming region between said contact side and said looped face has a smaller width than said loop-forming region between said looped face and said lead region.

9. The device as claimed in claim 1, wherein said dielectric body includes a magnetic region made of a dielectric substance exhibiting a magnetic property, and said magnetic region extends in correspondence with at least a part of said dielectric looped face, so that a magnetic flux is concentrated to penetrate said at least magnetic part of said dielectric looped face.

10. The device as claimed in claim 9, wherein said magnetic region extends in correspondence with an entire part of said dielectric looped face.

11. The device as claimed in claim 10, wherein an entire part of said dielectric body, except for said electrically conductive pattern and said electrically conductive ground region, comprises a dielectric substance exhibiting a magnetic property.

12. The device as claimed in claim 9, wherein said magnetic region is displaced toward a contact side of said dielectric body, so that said loop-forming region between said contact side and said looped face has a smaller width than said loop-forming region between said looped face and said lead region.

13. The device as claimed in claim 1, wherein said electrically conductive pattern comprises an electrically conductive strip line pattern.

14. The device as claimed in claim 13, wherein said electrically conductive strip line pattern extends to form a kind of spiral so that said dielectric looped face is almost omni-directionally surrounded by said electrically conductive strip line pattern.

15. The device as claimed in claim 14, wherein said kind of spiral of said electrically conductive strip line pattern comprises series connections of plural straight line segments.

16. The device as claimed in claim 14, wherein said kind of spiral of said electrically conductive strip line pattern comprises series connections of plural straight line segments and plural curved line segments.

17. The device as claimed in claim 14, wherein said kind of spiral of said electrically conductive strip line pattern comprises series connections of plural curved line segments.

18. The device as claimed in claim 13, wherein said electrically conductive strip line pattern extends to form a generally U-shape, so that said dielectric looped face is surrounded in approximately three quarter of omni-directions.

19. The device as claimed in claim 18, wherein said generally U-shape of said electrically conductive strip line pattern comprises series connections of plural straight line segments.

20. The device as claimed in claim 18, wherein said generally U-shape of said electrically conductive strip line pattern comprises series connections of plural straight line segments and plural curved line segments.

21. The device as claimed in claim 18, wherein said generally U-shape of said electrically conductive strip line pattern comprises series connections of plural curved line segments.

22. The device as claimed in claim 13, wherein said electrically conductive strip line pattern extends to form generally a circuit so that said dielectric looped face is almost omni-directionally surrounded by said electrically conductive strip line pattern.

23. The device as claimed in claim 22, wherein said generally circuit of said electrically conductive strip line pattern comprises series connections of plural straight line segments.

24. The device as claimed in claim 22, wherein said generally circuit of said electrically conductive strip line pattern comprises series connections of at least a plurality of ones selected from straight and curved line segments.

25. The device as claimed in claim 1, wherein said second end of said electrically conductive pattern is connected through a resistance to said electrically conductive ground region.

26. The device as claimed in claim 13, wherein said dielectric body comprises laminations of a signal layer and first and second ground layers sandwiching said signal layer, so that interfaces between said signal layer and said first and second ground layers are parallel to said dielectric looped face;
wherein said signal layer is made of a dielectric substance, and said electrically conductive strip line pattern is formed only within said signal layer and comprises series connections of three straight strip line segments extending to form a generally U-shape; and
wherein each of said first and second ground layers comprises an electrically conductive region, so that said electrically conductive region of each of said first and second ground layers serves as a ground, and first one of said first and second ground layers has a dielectric region being almost omni-directionally surrounded by said electrically conductive region, so that said dielectric region is positioned to be partially surrounded by said generally U-shape of said electrically conductive strip line pattern in a view vertical to said dielectric looped face which is in parallel to an interface between said signal layer and each of said first and second ground layers.

27. The device as claimed in claim 26, wherein said dielectric region of said first one of said first and second ground layers has a rectangular shaped part having a longitudinal direction in parallel to a contact side of each of said first and second ground layers, and said dielectric region further has an additionally extending region which extends from said rectangular shaped part to said contact side so as to form a gap in a contact side region of said electrically conductive region,
wherein said first end of said electrically conductive strip line pattern is connected through a first hole to said external conductive line and said first hole penetrates said first and second ground layers, and said first hole in said first one of said first and second ground layers is surrounded by an isolation region, so that said first hole is isolated from said electrically conductive region, and
wherein said electrically conductive strip line pattern extends in said signal layer so that said electrically conductive strip line pattern passes over said gap in said view vertical to said dielectric looped face whereby said second end of said electrically conductive strip line pattern is connected through a second hole to an electrically conductive region of second one of said first and second ground layers.

28. The device as claimed in claim 27, wherein said dielectric body further comprises a primary fixing layer laminated on said second one of said first and second ground layers, and said primary fixing layer has a connector for connecting said external conductive line to said first hole, so as to electrically connect said external conductive line to said first end of said electrically conductive strip line pattern, and said primary fixing layer comprises a dielectric region, and an electrically conductive region extending in the vicinity of said connector and being surrounded by said dielectric region.

29. The device as claimed in claim 28, wherein said dielectric body further comprises a secondary fixing layer laminated on said first one of said first and second ground layers, and said secondary fixing layer comprises a dielectric region, and an electrically conductive region, and said dielectric region and said electrically conductive region are substantially the same in pattern as said primary fixing layer.

30. The device as claimed in claim 26, wherein said dielectric looped face of said signal layer is made of a dielectric substance which exhibits a magnetic property, and said dielectric region of each of said first and second ground layers positioned in correspondence with said dielectric looped face is also made of a dielectric substance which exhibits a magnetic property.

31. The device as claimed in claim 1, wherein said electrically conductive pattern comprises an electrically conductive micro-strip line pattern.

32. The device as claimed in claim 31, wherein said electrically conductive micro-strip line pattern extends to form a kind of spiral so that said dielectric looped face is completely omni-directionally surrounded by said electrically conductive strip line pattern.

33. The device as claimed in claim 32, wherein said kind of spiral of said electrically conductive micro-strip line pattern comprises series connections of plural straight line segments.

34. The device as claimed in claim 32, wherein said kind of spiral of said electrically conductive micro-strip line pattern comprises series connections of plural straight line segments and plural curved line segments.

35. The device as claimed in claim 32, wherein said kind of spiral of said electrically conductive micro-strip line pattern comprises series connections of plural curved line segments.

36. The device as claimed in claim 32, wherein said electrically conductive micro-strip line pattern extends to form a generally U-shape, so that said dielectric looped face is surrounded by said electrically conductive micro-strip line pattern in at least approximately three quarter of omni-directions.

37. The device as claimed in claim 36, wherein said generally U-shape of said electrically conductive micro-strip line pattern comprises series connections of plural straight line segments.

38. The device as claimed in claim 36, wherein said generally U-shape of said electrically conductive micro-strip line pattern comprises series connections of plural straight line segments and plural curved line segments.

39. The device as claimed in claim 36, wherein said generally U-shape of said electrically conductive micro-strip line pattern comprises series connections of plural curved line segments.

40. The device as claimed in claim 32, wherein said electrically conductive micro-strip line pattern extends to form generally a circuit so that said dielectric looped face is omni-directionally surrounded by said electrically conductive micro-strip line pattern.

41. The device as claimed in claim 32, wherein said generally circuit of said electrically conductive micro-strip line pattern comprises series connections of plural straight line segments.

42. The device as claimed in claim 40, wherein said generally circuit of said electrically conductive micro-strip line pattern comprises series connections of plural straight line segments and plural curved line segments.

43. The device as claimed in claim 40, wherein said generally circuit of said electrically conductive micro-strip line pattern comprises series connections of plural curved line segments.

44. The device as claimed in claim 31, wherein said dielectric body comprises laminations of at least a ground layer and at least a signal layer so that an interface between said at least ground layer and said at least signal layer is vertical to said dielectric looped face;

wherein said at least signal layer is made of a dielectric substance, and said at least signal layer has an opposite surface to a contact surface in contact with said at least ground layer, and said electrically conductive micro-strip line pattern extends in a shape of a first straight line segment on said opposite surface, and said at least signal layer has first and second holes formed at first and second ends respectively of said first straight line segment of said electrically conductive micro-strip line pattern; and wherein said at least ground layer comprises an electrically conductive region having first and second holes which are positioned in correspondence with said first and second holes of said at least signal layer, and said electrically conductive micro-strip line pattern further has second and third straight line segments which extend within said first and second holes respectively to penetrate both said at least signal layer and said at least ground layer, so that said second straight line segment in said first hole provides a connection between said external conductive line and said first end of said first straight line segment, whilst said third straight line segment in said second hole provides a connection between said electrically conductive region of said at least ground layer and said second end of said first straight line segment, whereby series connections of said first, second and third straight line segments of said electrically conductive micro-strip line pattern form a U-shape and whereby said dielectric looped face is surrounded in three quarter of omni-directions by said U-shape of said series connections of said first, second and third straight line segments.

45. The device as claimed in claim 44, wherein said dielectric body further comprises a secondary signal layer laminated on said at least ground layer so that said signal layer and said secondary signal layer sandwich said at least ground layer, and said secondary signal layer has first and second holes formed at corresponding positions to said first and second holes of said at least ground layer so that said second and third straight line segments further extend through said first and second holes of said secondary signal layer; and wherein said at least ground layer has at least a first isolation region extending around said first hole so that said second straight line segment of said electrically conductive micro-strip line pattern is isolated by said first isolation region from said electrically conductive region of said at least ground layer.

46. The device as claimed in claim 45, wherein said dielectric body further comprises a primary fixing layer laminated on said secondary signal layer so that said secondary signal layer is sandwiched by said at least ground layer and said primary fixing layer, and said primary fixing layer has a connector for connecting said external conductive line to said first hole so as to connect said external conductive line to said first end of said electrically conductive strip line pattern, and said primary fixing layer comprises a dielectric region, and an electrically conductive region extending in the vicinity of said connector and being surrounded said dielectric region.

47. The device as claimed in claim 46, wherein said dielectric body further comprises a secondary fixing layer laminated on said first one of said first and second ground layers, and said secondary fixing layer comprises a dielectric region, and an electrically conductive region, and said dielectric region and said electrically conductive region are substantially the same in pattern as said primary fixing layer.

48. The device as claimed in claim 46, wherein said primary fixing layer and said secondary signal layer have third holes formed at corresponding positions to each other, and said second and third holes of said primary fixing layer are connected through a resistance to each other, and said electrically conductive micro-strip line pattern further has a fourth straight line segment extending in said third holes of said primary fixing layer and said secondary signal layer, and said fourth straight line segment extends to connect said resistance to said electrically conductive region of said at least ground layer; and wherein said at least ground layer further has a second isolation region extending around said second hole so that said third straight line segment of said electrically conductive micro-strip line pattern is isolated by said second isolation region from said electrically conductive region of said at least ground layer.

49. The device as claimed in claim 44, wherein said dielectric looped face of said at least signal layer is made of a dielectric substance which exhibits a magnetic property.

50. The device as claimed in claim 31, wherein said dielectric body comprises laminations of a signal layer and a ground layer so that an interface between said signal layer and said ground layer is parallel to said dielectric looped face;

wherein said signal layer is made of a dielectric substance, and said signal layer has an opposite surface to a contact surface in contact with said ground layer, and said electrically conductive micro-strip line pattern extends in a generally rectangular shape comprising series connections of at least four straight line segments on said opposite surface, and said signal layer has first and second holes formed at first and second ends of said electrically conductive micro-strip line pattern;

wherein said ground layer comprises an electrically conductive region so that said second end of said electrically conductive micro-strip line pattern is electrically connected to said electrically conductive region of said ground layer whereby said ground layer serves as a ground; and wherein said ground layer has at least a first hole formed at a corresponding position to said first hole of said signal layer so that said first end of said electrically conductive micro-strip line pattern is electrically connected to said external conductive line, and said ground layer further has an isolation region around said first hole so that said first hole of said ground layer is electrically isolated by said isolation region from said electrically conductive region of said ground layer.

51. The device as claimed in claim 50, wherein said opposite surface of said signal layer has a resistance in the vicinity of said second hole so that said second end of said electrically conductive micro-strip line pattern is connected through said resistance to said electrically conductive region of said ground layer.

52. The device as claimed in claim 51, wherein said dielectric body further comprises a primary fixing layer laminated on said ground layer so that said ground layer is sandwiched by said signal layer and said primary fixing layer, and said primary fixing layer has a connector for connecting said external conductive line to said first hole so as to connect said external conductive line to said first end of said electrically conductive micro-strip line pattern, and said primary fixing layer comprises a dielectric region and an electrically conductive region extending in the vicinity of said connector and being surrounded said dielectric region.

53. The device as claimed in claim 52, wherein said dielectric body further comprises a secondary fixing layer laminated on said first one of said first and second ground layers, and said secondary fixing layer comprises a dielectric region, and an electrically conductive region, and said dielectric region and said electrically conductive region are substantially the same in pattern as said primary fixing layer.

54. The device as claimed in claim 52, wherein said dielectric looped face of said signal layer surrounded by said electrically conductive micro-strip line pattern is made of a dielectric which exhibits a magnetic property.

55. The device as claimed in claim 31, wherein said dielectric body comprises laminations of a signal layer and a ground layer so that an interface between said signal layer and said ground layer is parallel to said dielectric looped face;
  wherein said signal layer is made of a dielectric substance, and said signal layer has an opposite surface to a contact surface in contact with said ground layer, and said electrically conductive micro-strip line pattern extends in a generally spiral shape comprising series connections of plural straight line segments on said opposite surface, and said signal layer has first and second holes formed at first and second ends of said electrically conductive micro-strip line pattern;
  wherein said ground layer comprises an electrically conductive region so that said second end of said electrically conductive micro-strip line pattern is electrically connected to said electrically conductive region of said ground layer whereby said ground layer serves as a ground; and
  wherein said ground layer has at least a first hole formed at a corresponding position to said first hole of said signal layer so that said first end of said electrically conductive micro-strip line pattern is electrically connected to said external conductive line, and said ground layer further has an isolation region around said first hole so that said first hole of said ground layer is electrically isolated by said isolation region from said electrically conductive region of said ground layer.

56. The device as claimed in claim 55, wherein said opposite surface of said signal layer has a resistance in the vicinity of said second hole so that said second end of said electrically conductive micro-strip line pattern is connected through said resistance to said electrically conductive region of said ground layer.

57. The device as claimed in claim 55, wherein said dielectric body further comprises a primary fixing layer laminated on said ground layer so that said ground layer is sandwiched by said signal layer and said primary fixing layer, and said primary fixing layer has a connector for connecting said external conductive line to said first hole so as to connect said external conductive line to said first end of said electrically conductive micro-strip line pattern, and said primary fixing layer comprises a dielectric region which has an electrically conductive region extending in the vicinity of said connector and being surrounded said dielectric region.

58. The device as claimed in claim 57, wherein said dielectric body further comprises a secondary fixing layer laminated on said first one of said first and second ground layers, and said secondary fixing layer comprises a dielectric region, and an electrically conductive region, and said dielectric region and said electrically conductive region are substantially the same in pattern as said primary fixing layer.

59. The device as claimed in claim 56, wherein said dielectric looped face of said signal layer surrounded by said electrically conductive micro-strip line pattern is made of a dielectric which exhibits a magnetic property.

60. The device as claimed in claim 1, wherein said electrically conductive pattern is made of one selected from the group consisting of metals, alloys, elemental semiconductors, compound semiconductors, refractory metal silicides and superconductors.

61. The device as claimed in claim 1, wherein said electrically conductive pattern so extends that said dielectric looped face is positioned close to a contact side of said dielectric body, so that a magnetic flux close to a magnetic field source generating a magnetic field penetrates said dielectric looped face, so that said device has a high spatial resolution.

62. The device as claimed in claim 1, wherein said dielectric looped face has a low aspect ratio of a vertical size to said contact side to a horizontal size to said contact side, so that said device has a high spatial resolution and a high sensitivity.

63. The device as claimed in claim 1, wherein said electrically conductive ground region extends not to cover said dielectric looped face in a view vertical to said dielectric looped face, thereby to allow a magnetic flux penetrate an entire region of said dielectric looped face.

64. The device as claimed in claim 1, wherein said electrically conductive ground region selectively extends to have a necessary minimum area for allowing said electrically conductive ground region to serve as a ground to said electrically conductive pattern.

65. The device as claimed in claim 64, wherein said electrically conductive pattern is buried in said dielectric body to be shielded, and
  wherein said electrically conductive ground region selectively extends to cover said electrically conductive pattern so as to reduce an area of said electrically conductive ground region, provided that only said second end of said electrically conductive ground region is electrically connected to said electrically conductive ground region.

66. The device as claimed in claim 1, wherein said dielectric body comprises multilayer-structured printed circuit boards.

67. The device as claimed in claim 1, wherein said dielectric body comprises multilayer-structured silicon dioxide layers, and at least one of said multilayer-structured silicon dioxide layers has said electrically conductive pattern.

68. The device as claimed in claim 63, wherein said multilayer-structured silicon dioxide layers are provided on a silicon dioxide substrate.

69. The device as claimed in claim 1, wherein said external conductive line comprises an external coaxial line.

70. A structure for fixing an external conductive line to a magnetic field detector which comprises a dielectric body, an electrically conductive pattern having first and second ends and so extending in said dielectric body as to form a dielectric looped face at least partially surrounded by said electrically conductive pattern, and an electrically conductive ground region being formed in said dielectric body and being electrically connected to only said second end of said electrically conductive pattern, so that said electrically conductive ground region serves as a ground to said electrically conductive pattern, wherein said structure comprises:
a primary fixing layer provided on said dielectric body;
a via hole extending between said first end of said electrically conductive pattern and an opposite surface of said primary fixing layer to an interface with said dielectric body; and
a connector being provided on said opposite surface of said primary fixing layer and covering said via hole for connecting said external conductive line to said via hole so as to electrically connect said external conductive line to said fist end of said electrically conductive pattern.

71. The structure as claimed in claim 70, wherein said primary fixing layer comprises a dielectric region extending except in the vicinity of said connector and an electrically conductive region extending in the vicinity of said connector.

72. The structure as claimed in claim 71, further comprising a secondary fixing layer laminated on said first one of said first and second ground layers, and said secondary fixing layer comprises a dielectric region, and an electrically conductive region, and said dielectric region and said electrically conductive region are substantially the same in pattern as said primary fixing layer.

73. The structure as claimed in claim 70, wherein said external conductive line comprises an external coaxial line.

74. A structure for fixing an external conductive line to a magnetic field detector which comprises a dielectric body, an electrically conductive pattern having first and second ends and so extending in said dielectric body as to form a dielectric looped face at least partially surrounded by said electrically conductive pattern, and an electrically conductive ground region being formed in said dielectric body and being electrically connected to only said second end of said electrically conductive pattern, so that said electrically conductive ground region serves as a ground to said electrically conductive pattern,
wherein said structure comprises:
a through hole being formed in said dielectric body to penetrate between first and second surfaces opposite to each other;
an electrically conductive pad on said first surface of said dielectric body, and said electrically conductive pad having an opening positioned in correspondence with said through hole; and
a connector being provided on said second surface of said dielectric body and covering said through hole for connecting said external conductive line to said through hole so that said external conductive line extends through said through hole and said opening of said electrically conductive pad, whereby an end of said external conductive line is electrically connected with said electrically conductive pad.

75. The structure as claimed in claim 74, wherein said external conductive line comprises an external coaxial line.

76. A device for detecting a magnetic field comprising laminations of a signal layer and first and second ground layers sandwiching said signal layer,
wherein said signal layer is made of a dielectric substance, and said signal layer has an electrically conductive strip line pattern which comprises series connections of at least three straight strip line segments extending to form a generally U-shape and also form a dielectric looped face surrounded in three quarter of omni-directions by said generally U-shape of said electrically conductive strip line pattern, so that said dielectric looped face is in parallel to interfaces between said signal layer and said first and second ground layers, thereby to allow a magnetic flux to penetrate said dielectric looped face, and said electrically conductive strip line pattern has a first end electrically connected to an external conductive line and a second end; and
wherein each of said first and second ground layers comprises an electrically conductive region which is electrically connected to said second end of said electrically conductive strip line pattern, so that said each of said first and second ground layers serves as a ground, and said each of said first and second ground layers has a dielectric region being almost omnidirectionally surrounded by said electrically conductive region so that said dielectric region is positioned to be partially surrounded by said generally U-shape of said electrically conductive strip line pattern in a view vertical to said dielectric looped face.

77. The device as claimed in claim 76, wherein said electrically conductive region of each of said first and second ground layers has a loop-forming region surrounding said dielectric looped face and a lead region extending from said loop-forming region toward said first end of said electrically conductive strip line pattern.

78. The device as claimed in claim 77, wherein said loop-forming region and said lead region are uniform in width.

79. The device as claimed in claim 78, wherein said loop-forming region and said lead region have a width of not more than about ten times of a width of said electrically conductive strip line pattern.

80. The device as claimed in claim 78, wherein said electrically conductive strip line pattern extends on a center line of said loop-forming region and said lead region.

81. The device as claimed in claim 76, wherein said electrically conductive region of each of said first and second ground layers extends symmetrically in a direction along a contact side of said dielectric body.

82. The device as claimed in claim 77, wherein said lead region is wider than said loop-forming region.

83. The device as claimed in claim 77, wherein said looped face is displaced toward a contact side of said dielectric body, so that said loop-forming region between said contact side and said looped face has a smaller width than said loop-forming region between said looped face and said lead region.

84. The device as claimed in claim 76, wherein said dielectric region has a rectangular shaped part having a longitudinal direction in parallel to a contact side of each of said first and second ground layers, and said dielectric region further has an additionally extending region which extends from said rectangular shaped part to said contact side so as to form a gap in a contact side region of said electrically conductive region,
wherein said first end of said electrically conductive strip line pattern is connected through a first hole to said external conductive line and said first hole penetrates said first and second ground layers, and said first hole in said first and second ground layers is surrounded by an isolation region to be isolated from said electrically conductive region, and
wherein said electrically conductive strip line pattern extends to pass over said gap in said view vertical to said dielectric looped face so that said second end of said electrically conductive strip line pattern is connected through a second hole to said electrically conductive region of each of said first and second ground layers.

85. The device as claimed in claim 84, further comprising a primary fixing layer laminated on any one of said first and second ground layers, wherein said primary fixing layer has a connector for connecting said external conductive line to said first hole so as to connect said external conductive line to said first end of said electrically conductive strip line pattern, and said primary fixing layer comprises a dielectric region which has an electrically conductive region extending in the vicinity of said connector and being surrounded said dielectric region.

86. The device as claimed in claim 85, further comprising a secondary fixing layer laminated on said first one of said first and second ground layers, and said secondary fixing layer comprises a dielectric region, and an electrically conductive region, and said dielectric region and said electrically conductive region are substantially the same in pattern as said primary fixing layer.

87. The device as claimed in claim 83, wherein said dielectric looped face of said signal layer is made of a dielectric substance which exhibits a magnetic property, and said dielectric region of each of said first and second ground layers is also made of a dielectric substance which exhibits a magnetic property.

88. The device as claimed in claim 83, wherein said electrically conductive pattern is made of one selected from the group consisting of metals, alloys, elemental semiconductors, compound semiconductors, refractory metal silicides and superconductors.

89. The device as claimed in claim 83, wherein said electrically conductive pattern so extends that said dielectric looped face is positioned close to a contact side of said dielectric body, so that a magnetic flux close to a magnetic field source generating a magnetic field penetrates said dielectric looped face, so that said device has a high spatial resolution.

90. The device as claimed in claim 88, wherein said dielectric looped face has a low aspect ratio of a vertical size to said contact side to a horizontal size to said contact side, so that said device has a high spatial resolution and a high sensitivity.

91. The device as claimed in claim 83, wherein said external conductive line comprises an external coaxial line.

92. A device for detecting a magnetic field comprising laminations of at least a ground layer and at least a signal layer,
wherein said at least signal layer is made of a dielectric substance, and said at least signal layer has an opposite surface to a contact surface in contact with said at least ground layer, and said at least signal layer has an electrically conductive micro-strip line pattern which extends in a shape of a first straight line segment on said opposite surface, and said at least signal layer has first and second holes formed at first and second ends respectively of said first straight line segment of said electrically conductive micro-strip line pattern; and
wherein said at least ground layer comprises an electrically conductive region having first and second holes which are positioned in correspondence with said first and second holes of said at least signal layer, so that said electrically conductive micro-strip line pattern further has second and third straight line segments which extend within said first and second holes respectively to penetrate both said at least signal layer and said at least ground layer, and so that said second straight line segment provides a connection between an external conductive line and said first end of said first straight line segment, whilst said third straight line segment provides a connection between said electrically conductive region of said at least ground layer and said second end of said first straight line segment, whereby series connections of said first, second and third straight line segments of said electrically conductive micro-strip line pattern form a U-shape and also form a dielectric looped face surrounded in three quarter of omni-directions by said series connections of said first, second and third straight line segments, so that said dielectric looped face is vertical to an interface between said at least ground layer and said at least signal layer.

93. The device as claimed in claim 92, wherein said electrically conductive region of said ground layer has a loop-forming region surrounding said dielectric looped face and a lead region extending from said loop-forming region toward said first end of said electrically conductive strip line pattern.

94. The device as claimed in claim 93, wherein said loop-forming region and said lead region are uniform in width.

95. The device as claimed in claim 94, wherein said loop-forming region and said lead region have a width of not more than about ten times of a width of said electrically conductive strip line pattern.

96. The device as claimed in claim 94, wherein said electrically conductive strip line pattern extends on a center line of said loop-forming region and said lead region.

97. The device as claimed in claim 92, wherein said electrically conductive region of said ground layer extends symmetrically in a direction along a contact side of said dielectric body.

98. The device as claimed in claim 93, wherein said lead region is wider than said loop-forming region.

99. The device as claimed in claim 93, wherein said looped face is displaced toward a contact side of said dielectric body, so that said loop-forming region between said contact side and said looped face has a smaller width than said loop-forming region between said looped face and said lead region.

100. The device as claimed in claim 92, further comprising a secondary signal layer laminated on said at least ground layer, wherein said signal layer and said secondary signal layer sandwich said at least ground layer, and said secondary signal layer has first and second holes formed at corresponding positions to said first and second holes of said at least ground layer so that said second and third straight line segments further extend through said first and second holes of said secondary signal layer; and
wherein said at least ground layer has at least a first isolation region extending around said first hole so that said second straight line segment of said electrically conductive micro-strip line pattern is isolated by said first isolation region from said electrically conductive region of said at least ground layer.

101. The device as claimed in claim 100, further comprising a primary fixing layer laminated on said secondary signal layer, wherein said secondary signal layer is sandwiched by said at least ground layer and said primary fixing layer, and said primary fixing layer has a connector for connecting said external conductive line to said first hole so as to connect said external conductive line to said electrically conductive strip line pattern, and said primary fixing layer comprises a dielectric region and an electrically conductive region extending in the vicinity of said connector and being surrounded said dielectric region.

102. The device as claimed in claim 101, wherein said primary fixing layer and said secondary signal layer have third holes formed at corresponding positions to each other, and said second and third holes of said primary fixing layer are connected through a resistance to each other, and said electrically conductive micro-strip line pattern further has a fourth straight line segment extending in said third holes of said primary fixing layer and said secondary signal layer, and said fourth straight line segment extends to connect said resistance to said electrically conductive region of said at least ground layer; and wherein said at least ground layer further has a second isolation region extending around said second hole so that said third straight line segment of said electrically conductive micro-strip line pattern is isolated by said second isolation region from said electrically conductive region of said at least ground layer.

103. The device as claimed in claim 92, wherein said dielectric looped face of said at least signal layer is made of a dielectric substance which exhibits a magnetic property.

104. The device as claimed in claim 92, wherein said electrically conductive pattern is made of one selected from the groups consisting of metals, alloys, elemental semiconductors, compound semiconductors, refractory metal silicides and superconductors.

105. The device as claimed in claim 92, wherein said electrically conductive pattern so extends that said dielectric looped face is positioned close to a contact side of said dielectric body, so that a magnetic flux close to a magnetic field source generating a magnetic field penetrates said dielectric looped face, so that said device has a high spatial resolution.

106. The device as claimed in claim 105, wherein said dielectric looped face has a low aspect ratio of a vertical size to said contact side to a horizontal size to said contact side, so that said device has a high spatial resolution and a high sensitivity.

107. The device as claimed in claim 92 wherein said external conductive line comprises an external coaxial line.

108. A device for detecting a magnetic field comprising laminations of a signal layer and a ground layer;
wherein said signal layer is made of a dielectric substance, and said signal layer has an opposite surface to a contact surface in contact with said ground layer, and said signal layer has an electrically conductive micro-strip line pattern which extends in a generally rectangular shape comprising series connections of at least four straight line segments on said opposite surface, thereby to form a dielectric looped face surrounded in almost omni-directions by said at least four straight line segments so that said dielectric looped face is parallel to an interface between said signal layer and said ground layer, and said signal layer has first and second holes formed at first and second ends of said electrically conductive micro-strip line pattern;
wherein said ground layer comprises an electrically conductive region so that said second end of said electrically conductive micro-strip line pattern is electrically connected to said electrically conductive region of said ground layer whereby said ground layer serves as a ground; and
wherein said ground layer has at least a first hole formed at a corresponding position to said first hole of said signal layer so that said first end of said electrically conductive micro-strip line pattern is electrically connected to said external conductive line, and said ground layer further has an isolation region around said first hole so that said first hole of said ground layer is electrically isolated by said isolation region from said electrically conductive region of said ground layer.

109. The device as claimed in claim 108, wherein said electrically conductive region of said ground layer has a loop-forming region surrounding said dielectric looped face and a lead region extending from said loop-forming region toward said first end of said electrically conductive micro-strip line pattern.

110. The device as claimed in claim 109, wherein said loop-forming region and said lead region are uniform in width.

111. The device as claimed in claim 110, wherein said loop-forming region and said lead region have a width of not more than about ten times of a width of said electrically conductive micro-strip line pattern.

112. The device as claimed in claim 110, wherein said electrically conductive strip line pattern extends on a center line of said loop-forming region and said lead region.

113. The device as claimed in claim 108, wherein said electrically conductive region of said ground layers extends symmetrically in a direction along a contact side of said dielectric body.

114. The device as claimed in claim 108, wherein said lead region is wider than said loop-forming region.

115. The device as claimed in claim 108, wherein said looped face is displaced toward a contact side of said dielectric body, so that said loop-forming region between said contact side and said looped face has a smaller width than said loop-forming region between said looped face and said lead region.

116. The device as claimed in claim 108, wherein said opposite surface of said signal layer has a resistance in the vicinity of said second hole so that said second end of said electrically conductive micro-strip line pattern is connected through said resistance to said electrically conductive region of said ground layer.

117. The device as claimed in claim 116, further comprising a primary fixing layer laminated on said ground layer, wherein said ground layer is sandwiched by said signal layer and said primary fixing layer, and said primary fixing layer has a connector for connecting said external conductive line to said first hole so as to connect said external conductive line to said first end of said electrically conductive micro-strip line pattern, and said primary fixing layer comprises a dielectric region and an electrically conductive region extending in the vicinity of said connector and being surrounded said dielectric region.

118. The device as claimed in claim 108, wherein said dielectric looped face of said signal layer surrounded by said electrically conductive micro-strip line pattern is made of a dielectric which exhibits a magnetic property.

119. The device as claimed in claim 108, wherein said electrically conductive pattern is made of one selected from the groups consisting of metals, alloys, elemental semiconductors, compound semiconductors, refractory metal silicides and superconductor.

120. The device as claimed in claim 108, wherein said electrically conductive pattern so extends that said dielectric looped face is positioned close to a contact side of said dielectric body, so that a magnetic flux close to a magnetic field source generating a magnetic field penetrates said dielectric looped face, so that said device has a high spatial resolution.

121. The device as claimed in claim 120, wherein said dielectric looped face has a low aspect ratio of a vertical size to said contact side to a horizontal size to said contact side, so that said device has a high spatial resolution and a high sensitivity.

122. The device as claimed in claim 108, wherein said external conductive line comprises an external coaxial line.

123. A device for detecting a magnetic field comprising laminations of a signal layer and a ground layer;

wherein said signal layer is made of a dielectric substance, and said signal layer has an opposite surface to a contact surface in contact with said ground layer, and said signal layer has an electrically conductive micro-strip line pattern which extends in a generally spiral shape comprising series connections of plural straight line segments on said opposite surface, thereby to form a dielectric looped face surrounded in omni-directions by said plural straight line segments so that said dielectric looped face is parallel to an interface between said signal layer and said ground layer, and said signal layer has first and second holes formed at first and second ends of said electrically conductive micro-strip line pattern;

wherein said ground layer comprises an electrically conductive region so that said second end of said electrically conductive micro-strip line pattern is electrically connected to said electrically conductive region of said ground layer whereby said ground layer serves as a ground; and wherein said ground layer has at least a first hole formed at a corresponding position to said first hole of said signal layer so that said first end of said electrically conductive micro-strip line pattern is electrically connected to said external conductive line, and said ground layer further has an isolation region around said first hole so that said first hole of said ground layer is electrically isolated by said isolation region from said electrically conductive region of said ground layer.

124. The device as claimed in claim 123, wherein said electrically conductive region of said ground layer has a loop-forming region surrounding said dielectric looped face and a lead region extending from said loop-forming region toward said first end of said electrically conductive micro-strip line pattern.

125. The device as claimed in claim 124, wherein said loop-forming region and said lead region are uniform in width.

126. The device as claimed in claim 125, wherein said loop-forming region and said lead region have a width of not more than about ten times of a width of said electrically conductive micro-strip line pattern.

127. The device as claimed in claim 125, wherein said electrically conductive strip line pattern extends on a center line of said loop-forming region and said lead region.

128. The device as claimed in claim 123, wherein said electrically conductive region of said ground layers extends symmetrically in a direction along a contact side of said dielectric body.

129. The device as claimed in claim 123, wherein said lead region is wider than said loop-forming region.

130. The device as claimed in claim 123, wherein said looped face is displaced toward a contact side of said dielectric body, so that said loop-forming region between said contact side and said looped face has a smaller width than said loop-forming region between said looped face and said lead region.

131. The device as claimed in claim 130, wherein said opposite surface of said signal layer has a resistance in the vicinity of said second hole so that said second end of said electrically conductive micro-strip line pattern is connected through said resistance to said electrically conductive region of said ground layer.

132. The device as claimed in claim 130, further comprising a primary fixing layer laminated on said ground layer, wherein said ground layer is sandwiched by said signal layer and said primary fixing layer, and said primary fixing layer has a connector for connecting said external conductive line to said first hole so as to connect said electrically conductive micro-strip line pattern, and said primary fixing layer comprises a dielectric region and an electrically conductive region extending in the vicinity of said connector and being surrounded said dielectric region.

133. The device as claimed in claim 123, wherein said dielectric looped face of said signal layer surrounded by said electrically conductive micro-strip line pattern is made of a dielectric which exhibits a magnetic property.

134. The device as claimed in claim 123, wherein said electrically conductive pattern is made of one selected from the group consisting of metals, alloys, elemental semiconductors, compound semiconductors, refractory metal suicides, and superconductors.

135. The device as claimed in claim 123, wherein said electrically conductive pattern so extends that said dielectric looped face is positioned close to a contact side of said dielectric body, so that a magnetic flux close to a magnetic field source generating a magnetic field penetrates said dielectric looped face, so that said device has a high spatial resolution.

136. The device as claimed in claim 135, wherein said dielectric looped face has a low aspect ratio of a vertical size to said contact side to a horizontal size to said contact side, so that said device has a high spatial resolution and a high sensitivity.

137. The device as claimed in claim 123, wherein said external conductive line comprises an external coaxial line.

138. A device for detecting a magnetic field comprising laminations of a signal layer and first and second ground layers sandwiching said signal layer, wherein said signal layer is made of a dielectric substance, and said signal layer has an electrically conductive strip line pattern which comprises series connections of at least three straight strip line segments extending to form a generally U-shape and also form a dielectric looped face surrounded in three quarter of omni-directions by said generally U-shape of said electrically conductive strip line pattern, so that said dielectric looped face is in parallel to interfaces between said signal layer and said first and second ground layers, thereby to allow a magnetic flux to penetrate said dielectric looped face, and said electrically conductive strip line pattern has a first end electrically connected to an external conductive line and a second end; and wherein each of said first and second ground layers comprises: a dielectric region extending not to cover said U-shape of said electrically conductive strip line pattern in a view vertical to said dielectric looped face; and an electrically conductive region extending to cover said generally U-shape of said electrically conductive strip line pattern in said view vertical to said dielectric looped face, said electrically conductive region being electrically connected to said second end of said electrically conductive strip line pattern, so that said each of said first and second ground layers serves as a ground, and said electrically conductive region almost omni-directionally surrounds said dielectric region positioned to be partially surrounded by said generally U-shape of said electrically conductive strip line pattern in said view vertical to said dielectric looped face.

139. The device as claimed in claim 138, wherein said electrically conductive region of said ground layer has a loop-forming region surrounding said dielectric looped face and a lead region extending from said loop-forming region toward said first end of said electrically conductive micro-strip line pattern.

140. The device as claimed in claim 139, wherein said loop-forming region and said lead region are uniform in width.

141. The device as claimed in claim 140, wherein said loop-forming region and said lead region have a width of not more than about ten times of a width of said electrically conductive micro-strip line pattern.

142. The device as claimed in claim 140, wherein said electrically conductive strip line pattern extends on a center line of said loop-forming region and said lead region.

143. The device as claimed in claim 138, wherein said electrically conductive region of said ground layers extends symmetrically in a direction along a contact side of said dielectric body.

144. The device as claimed in claim 138, wherein said lead region is wider than said loop-forming region.

145. The device as claimed in claim 138, wherein said looped face is displaced toward a contact side of said dielectric body, so that said loop-forming region between said contact side and said looped face has a smaller width than said loop-forming region between said looped face and said lead region.

146. The device as claimed in claim 145, wherein said dielectric region positioned to be partially surrounded by said generally U-shape of said electrically conductive strip line pattern has a rectangular shaped part having a longitudinal direction in parallel to a contact side of each of said first and second ground layers, and said dielectric region further has an additionally extending region which extends from said rectangular shaped part to said contact side so as to form a gap in a contact side region of said electrically conductive region,
  wherein said first end of said electrically conductive strip line pattern is connected through a first hole to said external conductive line and said first hole penetrates said first and second ground layers, and said first hole in said first and second ground layers is surrounded by an isolation region to be isolated from said electrically conductive region, and
  wherein said electrically conductive strip line pattern extends to pass over said gap in said view vertical to said dielectric looped face so that said second end of said electrically conductive strip line pattern is connected through a second hole to said electrically conductive region of each of said first and second ground layers.

147. The device as claimed in claim 146, further comprising a primary fixing layer laminated on any one of said first and second ground layers, wherein said primary fixing layer has a connector for connecting said external conductive line to said first hole so as to connect said external conductive line to said first end of said electrically conductive strip line pattern, and said primary fixing layer comprises a dielectric region which has an electrically conductive region extending in the vicinity of said connector and being surrounded said dielectric region.

148. The device as claimed in claim 147, further comprising a secondary fixing layer laminated on said first one of said first and second ground layers, and said secondary fixing layer comprises a dielectric region, and an electrically conductive region, and said dielectric region and said electrically conductive region are substantially the same in pattern as said primary fixing layer.

149. The device as claimed in claim 136, wherein said dielectric looped face of said signal layer is made of a dielectric substance which exhibits a magnetic property, and said dielectric region of each of said first and second ground layers is also made of a dielectric substance which exhibits a magnetic property.

150. The device as claimed in claim 136, wherein said electrically conductive pattern is made of one selected from the groups consisting of metals, alloys, elemental semiconductors, compound semiconductors, refractory metal silicides and superconductors.

151. The device as claimed in claim 138, wherein said electrically conductive pattern so extends that said dielectric looped face is positioned close to a contact side of said dielectric body, so that a magnetic flux close to a magnetic field source generating a magnetic field penetrates said dielectric looped face, so that said device has a high spatial resolution.

152. The device as claimed in claim 151, wherein said dielectric looped face has a low aspect ratio of a vertical size to said contact side to a horizontal size to said contact side, so that said device has a high spatial resolution and a high sensitivity.

153. The device as claimed in claim 138, wherein said external conductive line comprises an external coaxial line.

154. A device for detecting a magnetic field comprising:
  a dielectric body comprising laminations of silicon dioxide layers;
  a through hole being formed in said dielectric body to penetrate between first and second surfaces opposite to each other;
  an electrically conductive pad on said first surface of said dielectric body, and said electrically conductive pad having an opening positioned in correspondence with said through hole;
  a connector being provided on said second surface of said dielectric body and covering said through hole for connecting an external conductive line to said through hole so that said external conductive line extends through said through hole and said opening of said electrically conductive pad, whereby an end of said external conductive line is electrically connected with said electrically conductive pad,
  wherein at least an interface between said silicon dioxide layers has an electrically conductive pattern extending to form a dielectric looped face surrounded by said electrically conductive pattern, so that said dielectric looped face is in parallel to said interface between said silicon dioxide layers, thereby to allow a magnetic flux to penetrate said dielectric looped face, and said electrically conductive pattern has a first end which is electrically connected through a first contact hole to said electrically conductive pad so that said electrically conductive pattern is electrically connected to said external conductive line, and said electrically conductive pattern also has a second end, and
  wherein at least another interface between said silicon dioxide layers has an electrically conductive ground pattern which is electrically connected through a second contact hole to said second end of said electrically conductive pattern, so that said electrically conductive ground pattern serves as a ground.

155. The device as claimed in claim 154, wherein a plurality of said interfaces between said silicon dioxide layers have the same electrically conductive pattern.

156. The device as claimed in claim 154, wherein said electrically conductive pattern comprises an electrically conductive strip line pattern.

157. The device as claimed in claim 156, wherein said electrically conductive strip line pattern extends to form a kind of spiral so that said dielectric looped face is omni-directionally surrounded by said electrically conductive strip line pattern.

158. The device as claimed in claim 156, wherein said electrically conductive strip line pattern extends to form a generally U-shape, so that said dielectric looped face is surrounded in three quarter of omni-directions.

159. The device as claimed in claim 156, wherein said electrically conductive strip line pattern extends to form generally a circuit so that said dielectric looped face is omni-directionally surrounded by said electrically conductive strip line pattern.

160. The device as claimed in claim 154, wherein said second end of said electrically conductive pattern is connected through a resistance to said electrically conductive ground region.

161. The device as claimed in claim 154, wherein said electrically conductive pattern is made of one selected from the group consisting of metals, alloys, elemental semiconductors, compound semiconductors, refractory metal silicides, and superconductors.

162. The device as claimed in claim 154, wherein said electrically conductive pattern so extends that said dielectric looped face is positioned close to a contact side of said dielectric body, so that a magnetic flux close to a magnetic field source generating a magnetic field penetrates said dielectric looped face, so that said device has a high spatial resolution.

163. The device as claimed in claim 154, wherein said dielectric looped face has a low aspect ratio of a vertical size to said contact side to a horizontal size to said contact side, so that said device has a high spatial resolution and a high sensitivity.

164. The device as claimed in claim 154, wherein said electrically conductive ground region extends not to cover said dielectric looped face in a view vertical to said dielectric looped face, thereby to allow a magnetic flux penetrate an entire region of said dielectric looped face.

165. The device as claimed in claim 154, wherein said electrically conductive ground region selectively extends to have a necessary minimum area for allowing said electrically conductive ground region to serve as a ground to said electrically conductive pattern.

166. The device as claimed in claim 154, wherein said external conductive line comprises an external coaxial line.

* * * * *